United States Patent
Fallon et al.

(10) Patent No.: US 10,212,417 B2
(45) Date of Patent: Feb. 19, 2019

(54) ASYMMETRIC DATA DECOMPRESSION SYSTEMS

(71) Applicant: Realtime Adaptive Streaming LLC, Tyler, TX (US)

(72) Inventors: James J. Fallon, Armonk, NY (US); Stephen J. McErlain, Astoria, NY (US)

(73) Assignee: Realtime Adaptive Streaming LLC, Tyler, TX (US)

( * ) Notice: Subject to any disclaimer, the term of this patent is extended or adjusted under 35 U.S.C. 154(b) by 0 days.

(21) Appl. No.: 15/382,263

(22) Filed: Dec. 16, 2016

(65) Prior Publication Data
US 2017/0257629 A1 Sep. 7, 2017

Related U.S. Application Data

(63) Continuation of application No. 14/876,276, filed on Oct. 6, 2015, now Pat. No. 9,769,477, which is a
(Continued)

(51) Int. Cl.
*H04N 7/12* (2006.01)
*H04N 19/103* (2014.01)
(Continued)

(52) U.S. Cl.
CPC .......... *H04N 19/103* (2014.11); *H03M 7/30* (2013.01); *H03M 7/3084* (2013.01);
(Continued)

(58) Field of Classification Search
CPC .... H03M 7/30; H03M 7/3084; H03M 7/6094; H04N 19/164; H04N 19/176; H04N 19/103
See application file for complete search history.

(56) References Cited

U.S. PATENT DOCUMENTS 3,394,352 A 7/1968 Wernikoff et al.
3,490,690 A 1/1970 Apple et al.
(Continued)

FOREIGN PATENT DOCUMENTS

DE 4127518 2/1992
EP 0 164677 12/1985
(Continued)

OTHER PUBLICATIONS

Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, dated Jul. 27, 2009, 15 pages.
(Continued)

*Primary Examiner* — Tesfaldet Bocure
(74) *Attorney, Agent, or Firm* — Shami Messinger PLLC

(57) ABSTRACT

A system having one or more different asymmetric data decompression algorithms and a processor. A first asymmetric data decompression routine is configured to produce decompressed data with a higher data rate for a given data throughput than a second asymmetric data decompression routine of the plurality of different asymmetric data decompression routines. The processor is configured to analyze one or more data parameters from one or more data blocks containing video data and to select two or more different data decompression routines.

14 Claims, 4 Drawing Sheets

Related U.S. Application Data continuation of application No. 14/733,565, filed on Jun. 8, 2015, now Pat. No. 9,762,907, which is a continuation of application No. 14/577,286, filed on Dec. 19, 2014, now abandoned, which is a continuation of application No. 14/134,933, filed on Dec. 19, 2013, now Pat. No. 8,929,442, which is a continuation of application No. 14/033,245, filed on Sep. 20, 2013, now Pat. No. 8,934,535, which is a continuation of application No. 13/154,239, filed on Jun. 6, 2011, now Pat. No. 8,553,759, which is a continuation of application No. 12/123,081, filed on May 19, 2008, now Pat. No. 8,073,047, which is a continuation of application No. 10/076,013, filed on Feb. 13, 2002, now Pat. No. 7,386,046.

(60) Provisional application No. 60/268,394, filed on Feb. 13, 2001.

(51) Int. Cl.
  *H03M 7/30* (2006.01)
  *H04N 19/176* (2014.01)
  *H04N 19/164* (2014.01)

(52) U.S. Cl.
  CPC ........ *H03M 7/6094* (2013.01); *H04N 19/164* (2014.11); *H04N 19/176* (2014.11)

(56) References Cited

U.S. PATENT DOCUMENTS

| | | |
|---|---|---|
| 3,560,639 A | 2/1971 | Centanni |
| 4,021,782 A | 5/1977 | Hoerning |
| 4,032,893 A | 6/1977 | Moran |
| 4,054,951 A | 10/1977 | Jackson et al. |
| 4,122,440 A | 10/1978 | Langdon, Jr. et al. |
| 4,127,518 A | 11/1978 | Coy et al. |
| 4,302,775 A | 11/1981 | Widergren et al. |
| 4,325,085 A | 4/1982 | Gooch |
| 4,360,840 A | 11/1982 | Wolfrun et al. |
| 4,386,416 A | 5/1983 | Giltner et al. |
| 4,394,774 A | 7/1983 | Widergren et al. |
| 4,464,650 A | 8/1984 | Eastman |
| 4,467,317 A | 8/1984 | Langdon, Jr. et al. |
| 4,494,108 A | 1/1985 | Langdon, Jr. et al. |
| 4,499,499 A | 2/1985 | Brickman et al. |
| 4,558,302 A | 12/1985 | Welch |
| 4,568,983 A | 2/1986 | Bobick |
| 4,574,351 A | 3/1986 | Dang et al. |
| 4,593,324 A | 6/1986 | Ohkubo et al. |
| 4,626,829 A | 12/1986 | Hauck |
| 4,646,061 A | 2/1987 | Bledsoe |
| 4,652,856 A | 3/1987 | Mohiuddin et al. |
| 4,682,150 A | 7/1987 | Mathes et al. |
| 4,701,745 A | 10/1987 | Waterworth |
| 4,729,020 A | 3/1988 | Schaphorst et al. |
| 4,730,348 A | 3/1988 | MacCrisken |
| 4,745,559 A | 5/1988 | Willis et al. |
| 4,748,638 A | 5/1988 | Freidman et al. |
| 4,750,135 A | 6/1988 | Boilen |
| 4,754,351 A | 6/1988 | Wright |
| 4,804,959 A | 2/1989 | Makansi et al. |
| 4,813,040 A | 3/1989 | Futato |
| 4,814,746 A | 3/1989 | Miller et al. |
| 4,827,340 A | 5/1989 | Pirsch |
| 4,862,167 A | 8/1989 | Copeland, III |
| 4,866,601 A | 9/1989 | DuLac et al. |
| 4,870,415 A | 9/1989 | Van Maren et al. |
| 4,872,009 A | 10/1989 | Tsukiyama et al. |
| 4,876,541 A | 10/1989 | Storer |
| 4,888,812 A | 12/1989 | Dinan et al. |
| 4,890,282 A | 12/1989 | Lambert et al. |
| 4,897,717 A | 1/1990 | Hamilton et al. |
| 4,906,991 A | 3/1990 | Fiala et al. |
| 4,906,995 A | 3/1990 | Swanson |
| 4,924,456 A | 5/1990 | Maxwell et al. |
| 4,929,946 A | 5/1990 | O'Brien et al. |
| 4,953,324 A | 9/1990 | Hermann |
| 4,956,808 A | 9/1990 | Aakre et al. |
| 4,965,675 A | 10/1990 | Hori et al. |
| 4,988,998 A | 1/1991 | O'Brien |
| 5,003,307 A | 3/1991 | Whiting et al. |
| 5,016,009 A | 5/1991 | Whiting et al. |
| 5,027,376 A | 6/1991 | Freidman et al. |
| 5,028,922 A | 7/1991 | Huang |
| 5,034,914 A | 7/1991 | Osterlund |
| 5,045,848 A | 9/1991 | Fascenda |
| 5,045,852 A | 9/1991 | Mitchell et al. |
| 5,046,027 A | 9/1991 | Taaffe et al. |
| 5,046,119 A | 9/1991 | Hoffert et al. |
| 5,049,881 A | 9/1991 | Gibson et al. |
| 5,079,630 A | 1/1992 | Golin |
| 5,091,782 A | 2/1992 | Krause et al. |
| 5,097,261 A | 3/1992 | Langdon, Jr. et al. |
| 5,103,306 A | 4/1992 | Weiman |
| 5,109,226 A | 4/1992 | MacLean, Jr. et al. |
| 5,109,433 A | 4/1992 | Notenboom |
| 5,109,451 A | 4/1992 | Aono et al. |
| 5,113,522 A | 5/1992 | Dinwiddie, Jr. et al. |
| 5,115,309 A | 5/1992 | Hang |
| 5,121,342 A | 6/1992 | Szymborski |
| 5,126,739 A | 6/1992 | Whiting et al. |
| 5,128,963 A | 7/1992 | Akagiri |
| 5,132,992 A | 7/1992 | Yurt et al. |
| 5,146,221 A | 9/1992 | Whiting et al. |
| 5,150,430 A | 9/1992 | Chu |
| 5,155,484 A | 10/1992 | Chambers, IV |
| 5,159,336 A | 10/1992 | Rabin et al. |
| 5,167,034 A | 11/1992 | MacLean, Jr. et al. |
| 5,175,543 A | 12/1992 | Lantz |
| 5,179,651 A | 1/1993 | Taaffe et al. |
| 5,187,793 A | 2/1993 | Keith et al. |
| 5,191,431 A | 3/1993 | Hasegawa et al. |
| 5,204,756 A | 4/1993 | Chevion et al. |
| 5,209,220 A | 5/1993 | Hiyama et al. |
| 5,212,742 A | 5/1993 | Normile et al. |
| 5,226,176 A | 7/1993 | Westaway et al. |
| 5,227,878 A | 7/1993 | Puri et al. |
| 5,227,893 A | 7/1993 | Ett |
| 5,231,492 A | 7/1993 | Dangi et al. |
| 5,235,419 A | 8/1993 | Krause |
| 5,237,460 A | 8/1993 | Miller et al. |
| 5,237,675 A | 8/1993 | Hannon, Jr. |
| 5,243,341 A | 9/1993 | Seroussi et al. |
| 5,243,348 A | 9/1993 | Jackson |
| 5,247,638 A | 9/1993 | O'Brien et al. |
| 5,247,646 A | 9/1993 | Osterlund et al. |
| 5,249,053 A | 9/1993 | Jain |
| 5,253,325 A | 10/1993 | Clark |
| 5,263,168 A | 11/1993 | Toms et al. |
| 5,265,180 A | 11/1993 | Golin |
| 5,267,333 A | 11/1993 | Aono |
| 5,270,832 A | 12/1993 | Balkanski et al. |
| 5,274,474 A | 12/1993 | Medina |
| 5,276,898 A | 1/1994 | Kiel et al. |
| 5,280,600 A | 1/1994 | Van Maren et al. |
| 5,287,420 A | 2/1994 | Barrett |
| 5,289,580 A | 2/1994 | Latif et al. |
| 5,293,379 A | 3/1994 | Carr |
| 5,293,576 A | 3/1994 | Mihm, Jr. et al. |
| 5,307,497 A | 4/1994 | Feigenbaum et al. |
| 5,309,555 A | 5/1994 | Akins et al. |
| 5,319,682 A | 6/1994 | Clark |
| 5,331,425 A | 7/1994 | Ozaki et al. |
| 5,333,212 A | 7/1994 | Ligtenberg |
| 5,341,440 A | 8/1994 | Earl et al. |
| 5,347,600 A | 9/1994 | Barnsley et al. |
| 5,353,132 A | 10/1994 | Katsuma |
| 5,354,315 A | 10/1994 | Armstrong |
| 5,355,498 A | 10/1994 | Provino et al. |
| 5,357,614 A | 10/1994 | Pattisam et al. |
| 5,367,629 A | 11/1994 | Chu et al. |

(56) References Cited

U.S. PATENT DOCUMENTS

| | | |
|---|---|---|
| 5,373,290 A | 12/1994 | Lempel et al. |
| 5,374,916 A | 12/1994 | Chu |
| 5,379,036 A | 1/1995 | Storer |
| 5,379,351 A | 1/1995 | Fandrianto et al. |
| 5,379,356 A | 1/1995 | Purcell et al. |
| 5,379,757 A | 1/1995 | Hiyama et al. |
| 5,381,145 A | 1/1995 | Allen et al. |
| 5,389,922 A | 2/1995 | Seroussi et al. |
| 5,394,534 A | 2/1995 | Kulakowski et al. |
| 5,396,228 A | 3/1995 | Garahi |
| 5,400,401 A | 3/1995 | Wasilewski et al. |
| 5,402,146 A | 3/1995 | Rodriguez et al. |
| 5,403,639 A | 4/1995 | Belsan et al. |
| 5,406,278 A | 4/1995 | Graybill et al. |
| 5,406,279 A | 4/1995 | Anderson et al. |
| 5,408,542 A | 4/1995 | Callahan |
| 5,410,671 A | 4/1995 | Elgamal et al. |
| 5,412,384 A | 5/1995 | Chang et al. |
| 5,414,850 A | 5/1995 | Whiting |
| 5,420,639 A | 5/1995 | Perkins |
| 5,434,983 A | 7/1995 | Yaso et al. |
| 5,437,020 A | 7/1995 | Wells et al. |
| 5,452,287 A | 9/1995 | Dicecco et al. |
| 5,454,079 A | 9/1995 | Roper et al. |
| 5,454,107 A | 9/1995 | Lehman et al. |
| 5,455,576 A | 10/1995 | Clark, II et al. |
| 5,455,578 A | 10/1995 | Bhandari |
| 5,455,680 A | 10/1995 | Shin |
| 5,461,679 A | 10/1995 | Normile et al. |
| 5,463,390 A | 10/1995 | Whiting et al. |
| 5,467,087 A | 11/1995 | Chu |
| 5,467,134 A | 11/1995 | Laney et al. |
| 5,471,206 A | 11/1995 | Allen et al. |
| 5,473,376 A | 12/1995 | Auyeung |
| 5,475,388 A | 12/1995 | Gormish et al. |
| 5,479,210 A | 12/1995 | Cawley et al. |
| 5,479,587 A | 12/1995 | Campbell et al. |
| 5,479,633 A | 12/1995 | Wells et al. |
| 5,479,638 A | 12/1995 | Assar et al. |
| 5,483,470 A | 1/1996 | Alur et al. |
| 5,486,826 A | 1/1996 | Remillard |
| 5,488,364 A | 1/1996 | Cole |
| 5,488,365 A | 1/1996 | Seroussi et al. |
| 5,495,244 A | 2/1996 | Jeong et al. |
| 5,500,672 A | 3/1996 | Fujii |
| 5,504,842 A | 4/1996 | Gentile |
| 5,506,844 A | 4/1996 | Rao |
| 5,506,872 A | 4/1996 | Mohler |
| 5,506,944 A | 4/1996 | Gentile |
| 5,521,940 A | 5/1996 | Lane et al. |
| 5,524,272 A | 6/1996 | Podowski et al. |
| 5,528,628 A | 6/1996 | Park et al. |
| 5,530,845 A | 6/1996 | Hiatt et al. |
| 5,532,835 A | 7/1996 | Nakagaki et al. |
| 5,533,051 A | 7/1996 | James |
| 5,535,311 A | 7/1996 | Zimmerman |
| 5,535,356 A | 7/1996 | Kim et al. |
| 5,535,369 A | 7/1996 | Wells et al. |
| 5,537,658 A | 7/1996 | Bakke et al. |
| 5,539,865 A | 7/1996 | Gentile |
| 5,542,031 A | 7/1996 | Douglass et al. |
| 5,544,290 A | 8/1996 | Gentile |
| 5,546,395 A | 8/1996 | Sharma et al. |
| 5,546,475 A | 8/1996 | Bolle et al. |
| 5,553,160 A | 9/1996 | Dawson |
| 5,555,377 A | 9/1996 | Christensen et al. |
| 5,557,551 A | 9/1996 | Craft |
| 5,557,668 A | 9/1996 | Brady |
| 5,557,749 A | 9/1996 | Norris |
| 5,561,421 A | 10/1996 | Smith et al. |
| 5,561,824 A | 10/1996 | Carreiro et al. |
| 5,563,961 A | 10/1996 | Rynderman et al. |
| 5,574,952 A | 11/1996 | Brady et al. |
| 5,574,953 A | 11/1996 | Rust et al. |
| 5,576,953 A | 11/1996 | Hugentobler |
| 5,577,248 A | 11/1996 | Chambers, IV |
| 5,581,715 A | 12/1996 | Verinsky et al. |
| 5,583,500 A | 12/1996 | Allen et al. |
| 5,586,264 A | 12/1996 | Belknap et al. |
| 5,586,285 A | 12/1996 | Hasbun et al. |
| 5,590,306 A | 12/1996 | Watanabe et al. |
| 5,590,317 A | 12/1996 | Iguchi et al. |
| 5,590,331 A | 12/1996 | Lewis et al. |
| 5,596,602 A | 1/1997 | Couwenhoven |
| 5,596,674 A | 1/1997 | Bhandari et al. |
| 5,598,388 A | 1/1997 | Van Maren et al. |
| 5,602,764 A | 2/1997 | Eskandari-Gharnin et al. |
| 5,603,002 A | 2/1997 | Hashimoto |
| 5,604,824 A | 2/1997 | Chui et al. |
| 5,606,706 A | 2/1997 | Takamoto et al. |
| 5,610,657 A | 3/1997 | Zhang |
| 5,611,024 A | 3/1997 | Campbell et al. |
| 5,612,788 A | 3/1997 | Stone |
| 5,613,069 A | 3/1997 | Walker |
| 5,615,017 A | 3/1997 | Choi |
| 5,615,287 A | 3/1997 | Fu et al. |
| 5,619,995 A | 4/1997 | Lobodzinski |
| 5,621,820 A | 4/1997 | Rynderman et al. |
| 5,623,483 A | 4/1997 | Agrawal et al. |
| 5,623,623 A | 4/1997 | Kim et al. |
| 5,623,701 A | 4/1997 | Bakke et al. |
| 5,625,809 A | 4/1997 | Dysart et al. |
| 5,627,534 A | 5/1997 | Craft |
| 5,627,995 A | 5/1997 | Miller et al. |
| 5,629,732 A | 5/1997 | Moskowitz et al. |
| 5,630,092 A | 5/1997 | Carreiro et al. |
| 5,635,632 A | 6/1997 | Fay et al. |
| 5,635,932 A | 6/1997 | Shinagawa et al. |
| 5,638,498 A | 6/1997 | Tyler et al. |
| 5,640,158 A | 6/1997 | Okayama et al. |
| 5,642,506 A | 6/1997 | Lee |
| 5,649,032 A | 7/1997 | Burt et al. |
| 5,652,795 A | 7/1997 | Dillon et al. |
| 5,652,857 A | 7/1997 | Shimoi et al. |
| 5,652,917 A | 7/1997 | Maupin et al. |
| 5,654,703 A | 8/1997 | Clark, II |
| 5,655,138 A | 8/1997 | Kikinis |
| 5,664,226 A | 9/1997 | Czako et al. |
| 5,666,560 A | 9/1997 | Moertl et al. |
| 5,668,737 A | 9/1997 | Iler |
| 5,671,355 A | 9/1997 | Collins |
| 5,671,389 A | 9/1997 | Saliba |
| 5,671,413 A | 9/1997 | Shipman et al. |
| 5,673,370 A | 9/1997 | Laney |
| 5,675,333 A | 10/1997 | Boursier et al. |
| 5,675,789 A | 10/1997 | Ishii et al. |
| 5,684,478 A | 11/1997 | Panaoussis |
| 5,686,916 A | 11/1997 | Bakhmutsky |
| 5,692,159 A | 11/1997 | Shand |
| 5,694,619 A | 12/1997 | Konno |
| 5,696,927 A | 12/1997 | MacDonald et al. |
| 5,703,793 A | 12/1997 | Wise et al. |
| 5,708,511 A | 1/1998 | Gandhi et al. |
| 5,710,562 A | 1/1998 | Gormish et al. |
| 5,715,477 A | 2/1998 | Kikinis |
| 5,717,393 A | 2/1998 | Nakano et al. |
| 5,717,394 A | 2/1998 | Schwartz et al. |
| 5,719,862 A | 2/1998 | Lee et al. |
| 5,721,958 A | 2/1998 | Kikinis |
| 5,724,475 A | 3/1998 | Kirsten |
| 5,729,228 A | 3/1998 | Franaszek et al. |
| 5,734,744 A | 3/1998 | Wittenstein et al. |
| 5,740,395 A | 4/1998 | Wells et al. |
| 5,742,773 A | 4/1998 | Blomfield-Brown et al. |
| 5,748,122 A | 5/1998 | Shinagawa et al. |
| 5,748,904 A | 5/1998 | Huang et al. |
| 5,757,852 A | 5/1998 | Jericevic et al. |
| 5,764,774 A | 6/1998 | Liu |
| 5,765,027 A | 6/1998 | Wang et al. |
| 5,767,898 A | 6/1998 | Urano et al. |
| 5,768,445 A | 6/1998 | Troeller et al. |
| 5,768,525 A | 6/1998 | Kralowetz et al. |
| 5,771,340 A | 6/1998 | Nakazato et al. |
| 5,771,354 A | 6/1998 | Crawford |

(56) References Cited

U.S. PATENT DOCUMENTS

| | | |
|---|---|---|
| 5,774,715 A | 6/1998 | Madany et al. |
| 5,778,411 A | 7/1998 | DeMoss et al. |
| 5,781,767 A | 7/1998 | Inoue et al. |
| 5,784,572 A | 7/1998 | Rostoker et al. |
| 5,784,631 A | 7/1998 | Wise |
| 5,787,487 A | 7/1998 | Hashimoto et al. |
| 5,794,229 A | 8/1998 | French et al. |
| 5,796,864 A | 8/1998 | Callahan |
| 5,799,110 A | 8/1998 | Israelsen et al. |
| 5,801,842 A | 9/1998 | Medina |
| 5,805,834 A | 9/1998 | McKinley et al. |
| 5,805,932 A | 9/1998 | Kawashima et al. |
| 5,807,036 A | 9/1998 | Lostlen |
| 5,808,660 A | 9/1998 | Sekine et al. |
| 5,809,176 A | 9/1998 | Yajima |
| 5,809,295 A | 9/1998 | Straub et al. |
| 5,809,299 A | 9/1998 | Cloutier et al. |
| 5,809,337 A | 9/1998 | Hannah et al. |
| 5,812,195 A | 9/1998 | Zhang |
| 5,812,789 A | 9/1998 | Diaz et al. |
| 5,812,883 A | 9/1998 | Rao |
| 5,815,718 A | 9/1998 | Tock |
| 5,818,368 A | 10/1998 | Langley |
| 5,818,369 A | 10/1998 | Withers |
| 5,818,530 A | 10/1998 | Canfield et al. |
| 5,819,215 A | 10/1998 | Dobson et al. |
| 5,822,781 A | 10/1998 | Wells et al. |
| 5,825,424 A | 10/1998 | Canfield et al. |
| 5,825,830 A | 10/1998 | Kopf |
| 5,832,037 A | 11/1998 | Park |
| 5,832,126 A | 11/1998 | Tanaka |
| 5,832,443 A | 11/1998 | Kolesnik et al. |
| 5,835,788 A | 11/1998 | Blumer et al. |
| 5,836,003 A | 11/1998 | Sadeh |
| 5,838,821 A | 11/1998 | Matsubara et al. |
| 5,838,927 A | 11/1998 | Gillon |
| 5,838,996 A | 11/1998 | deCarmo |
| 5,839,100 A | 11/1998 | Wegener |
| 5,841,979 A | 11/1998 | Schulhof et al. |
| 5,845,083 A | 12/1998 | Hamadani et al. |
| 5,847,760 A | 12/1998 | Elmaliach et al. |
| 5,847,762 A | 12/1998 | Canfield et al. |
| 5,850,565 A | 12/1998 | Wightman |
| 5,856,797 A | 1/1999 | Kawauchi |
| 5,860,083 A | 1/1999 | Sukegawa |
| 5,861,824 A | 1/1999 | Ryu et al. |
| 5,861,920 A | 1/1999 | Mead et al. |
| 5,864,342 A | 1/1999 | Kajiya et al. |
| 5,864,678 A | 1/1999 | Riddle |
| 5,867,114 A | 2/1999 | Barbir |
| 5,867,167 A | 2/1999 | Deering |
| 5,867,602 A | 2/1999 | Zandi et al. |
| 5,870,036 A | 2/1999 | Franaszek et al. |
| 5,870,087 A | 2/1999 | Chau |
| 5,872,530 A | 2/1999 | Domyo et al. |
| 5,873,065 A | 2/1999 | Akagiri et al. |
| 5,874,907 A | 2/1999 | Craft |
| 5,881,104 A | 3/1999 | Akahane |
| 5,883,975 A | 3/1999 | Narita et al. |
| 5,884,269 A | 3/1999 | Cellier et al. |
| 5,886,655 A | 3/1999 | Rust |
| 5,887,115 A | 3/1999 | Boyce et al. |
| 5,887,165 A | 3/1999 | Martel et al. |
| 5,889,961 A | 3/1999 | Dobbek |
| 5,892,847 A | 4/1999 | Johnson |
| 5,901,278 A | 5/1999 | Kurihara et al. |
| 5,907,801 A | 5/1999 | Albert et al. |
| 5,909,557 A | 6/1999 | Betker et al. |
| 5,909,559 A | 6/1999 | So |
| 5,912,636 A | 6/1999 | Gormish et al. |
| 5,915,079 A | 6/1999 | Vondran, Jr. et al. |
| 5,915,252 A | 6/1999 | Misheski et al. |
| 5,917,438 A | 6/1999 | Ando |
| 5,918,068 A | 6/1999 | Shafe |
| 5,918,225 A | 6/1999 | White et al. |
| 5,920,326 A | 7/1999 | Rentschler et al. |
| 5,923,860 A | 7/1999 | Olarig |
| 5,930,358 A | 7/1999 | Rao |
| 5,936,616 A | 8/1999 | Torborg, Jr. et al. |
| 5,938,737 A | 8/1999 | Smallcomb et al. |
| 5,943,692 A | 8/1999 | Marberg |
| 5,945,933 A | 8/1999 | Kalkstein |
| 5,949,355 A | 9/1999 | Panaoussis |
| 5,949,968 A | 9/1999 | Gentile |
| 5,951,623 A | 9/1999 | Reynar et al. |
| 5,953,506 A | 9/1999 | Kalra et al. |
| 5,955,976 A | 9/1999 | Heath |
| 5,956,490 A | 9/1999 | Buchholz et al. |
| 5,960,465 A | 9/1999 | Adams |
| 5,964,842 A | 10/1999 | Packard |
| 5,968,149 A | 10/1999 | Jaquette et al. |
| 5,969,927 A | 10/1999 | Schirmer et al. |
| 5,973,630 A | 10/1999 | Heath |
| 5,974,235 A | 10/1999 | Nunally et al. |
| 5,974,387 A | 10/1999 | Kageyama |
| 5,974,471 A | 10/1999 | Belt |
| 5,978,483 A | 11/1999 | Thompson, Jr. et al. |
| 5,982,360 A | 11/1999 | Wu et al. |
| 5,982,723 A | 11/1999 | Kamatani |
| 5,982,937 A | 11/1999 | Accad |
| 5,987,022 A | 11/1999 | Geiger et al. |
| 5,987,432 A | 11/1999 | Zusman et al. |
| 5,987,590 A | 11/1999 | Wing So |
| 5,990,810 A | 11/1999 | Williams |
| 5,990,884 A | 11/1999 | Douma et al. |
| 5,990,955 A | 11/1999 | Koz |
| 5,991,515 A | 11/1999 | Fall et al. |
| 5,996,033 A | 11/1999 | Chiu-Hao |
| 6,000,009 A | 12/1999 | Brady |
| 6,002,411 A | 12/1999 | Dye |
| 6,003,115 A | 12/1999 | Spear et al. |
| 6,008,743 A | 12/1999 | Jaquette |
| 6,009,491 A | 12/1999 | Roppel et al. |
| 6,011,901 A | 1/2000 | Kirsten |
| 6,014,694 A | 1/2000 | Aharoni et al. |
| 6,020,904 A | 2/2000 | Clark |
| 6,021,198 A | 2/2000 | Anigbogu et al. |
| 6,021,433 A | 2/2000 | Payne |
| 6,023,233 A | 2/2000 | Craven et al. |
| 6,023,755 A | 2/2000 | Casselman |
| 6,026,217 A | 2/2000 | Adiletta |
| 6,028,725 A | 2/2000 | Blumenau |
| 6,031,937 A | 2/2000 | Graffagnino |
| 6,031,939 A | 2/2000 | Gilbert et al. |
| 6,032,148 A | 2/2000 | Wilkes |
| 6,032,197 A | 2/2000 | Birdwell et al. |
| 6,038,346 A | 3/2000 | Ratnakar |
| 6,057,790 A | 5/2000 | Igata et al. |
| 6,058,459 A | 5/2000 | Owen et al. |
| 6,061,398 A | 5/2000 | Satoh et al. |
| 6,061,473 A | 5/2000 | Chen et al. |
| 6,065,094 A | 5/2000 | Akiyama |
| 6,070,179 A | 5/2000 | Craft |
| 6,073,232 A | 6/2000 | Kroeker et al. |
| 6,075,470 A | 6/2000 | Little et al. |
| 6,078,541 A | 6/2000 | Kitagawa et al. |
| 6,078,958 A | 6/2000 | Echeita et al. |
| 6,088,699 A | 7/2000 | Gampper et al. |
| 6,091,777 A | 7/2000 | Guetz et al. |
| 6,092,071 A | 7/2000 | Bolan et al. |
| 6,092,123 A | 7/2000 | Steffan et al. |
| 6,092,145 A | 7/2000 | Kigami et al. |
| 6,094,634 A | 7/2000 | Yahagi et al. |
| 6,097,520 A | 8/2000 | Kadnier |
| 6,097,845 A | 8/2000 | Ng et al. |
| 6,098,114 A | 8/2000 | McDonald et al. |
| 6,104,389 A | 8/2000 | Ando |
| 6,105,130 A | 8/2000 | Wu et al. |
| 6,112,250 A | 8/2000 | Appelman |
| 6,115,384 A | 9/2000 | Parzych |
| 6,117,187 A | 9/2000 | Staelin |
| 6,121,903 A | 9/2000 | Kalkstein |
| 6,128,412 A | 10/2000 | Satoh |
| 6,134,631 A | 10/2000 | Jennings, III |

(56) References Cited

U.S. PATENT DOCUMENTS

| | | | |
|---|---|---|---|
| 6,141,053 A | 10/2000 | Saukkonen |
| 6,145,020 A | 11/2000 | Barnett |
| 6,145,069 A | 11/2000 | Dye |
| 6,158,000 A | 12/2000 | Collins |
| 6,169,241 B1 | 1/2001 | Shimizu |
| 6,169,499 B1 | 1/2001 | Cooper |
| 6,170,007 B1 | 1/2001 | Venkatraman et al. |
| 6,170,047 B1 | 1/2001 | Dye |
| 6,170,049 B1 | 1/2001 | So |
| 6,172,936 B1 | 1/2001 | Kitazaki |
| 6,172,987 B1 | 1/2001 | Razazian et al. |
| 6,173,381 B1 | 1/2001 | Dye |
| 6,175,650 B1 | 1/2001 | Sindhu et al. |
| 6,175,856 B1 | 1/2001 | Riddle |
| 6,181,711 B1 | 1/2001 | Zhang et al. |
| 6,182,125 B1 | 1/2001 | Borella et al. |
| 6,185,625 B1 | 2/2001 | Tso et al. |
| 6,185,659 B1 | 2/2001 | Milillo et al. |
| 6,192,082 B1 | 2/2001 | Moriarty et al. |
| 6,192,155 B1 | 2/2001 | Fan |
| 6,195,024 B1 | 2/2001 | Fallon |
| 6,195,125 B1 | 2/2001 | Udagawa et al. |
| 6,195,391 B1 | 2/2001 | Hancock et al. |
| 6,195,465 B1 | 2/2001 | Zandi et al. |
| 6,198,842 B1 | 3/2001 | Yeo |
| 6,198,850 B1 | 3/2001 | Banton |
| 6,208,273 B1 | 3/2001 | Dye et al. |
| 6,215,904 B1 | 4/2001 | Lavellee |
| 6,215,983 B1 | 4/2001 | Dogan et al. |
| 6,216,157 B1 | 4/2001 | Vishwanath et al. |
| 6,219,754 B1 | 4/2001 | Belt et al. |
| 6,222,886 B1 | 4/2001 | Yogeshwar |
| 6,225,922 B1 | 5/2001 | Norton |
| 6,226,667 B1 | 5/2001 | Matthews et al. |
| 6,226,740 B1 | 5/2001 | Iga |
| 6,229,850 B1 | 5/2001 | Linzer et al. |
| 6,230,223 B1 | 5/2001 | Olarig |
| 6,233,017 B1 | 5/2001 | Chaddha |
| 6,236,341 B1 | 5/2001 | Dorward et al. |
| 6,237,054 B1 | 5/2001 | Freitag, Jr. |
| 6,243,829 B1 | 6/2001 | Chan |
| 6,253,264 B1 | 6/2001 | Sebastian |
| 6,257,693 B1 | 7/2001 | Miller et al. |
| 6,272,178 B1 | 8/2001 | Nieweglowski et al. |
| 6,272,627 B1 | 8/2001 | Mann |
| 6,272,628 B1 | 8/2001 | Aguilar et al. |
| 6,282,641 B1 | 8/2001 | Christensen |
| 6,285,458 B1 | 9/2001 | Yada |
| 6,298,408 B1 | 10/2001 | Park |
| 6,308,311 B1 | 10/2001 | Carmichael et al. |
| 6,309,424 B1 | 10/2001 | Fallon |
| 6,310,563 B1 | 10/2001 | Har et al. |
| 6,317,714 B1 | 11/2001 | Del Castillo et al. |
| 6,317,818 B1 | 11/2001 | Zwiegincew et al. |
| 6,327,304 B1 | 12/2001 | Miller et al. |
| 6,330,622 B1 | 12/2001 | Shaefer |
| 6,333,745 B1 | 12/2001 | Shimomura et al. |
| 6,336,153 B1 | 1/2002 | Izumida et al. |
| 6,341,196 B1 | 1/2002 | Ando et al. |
| 6,345,307 B1 | 2/2002 | Booth |
| 6,356,589 B1 | 3/2002 | Gebler et al. |
| 6,356,937 B1 | 3/2002 | Montville et al. |
| 6,370,631 B1 | 4/2002 | Dye |
| 6,374,353 B1 | 4/2002 | Settsu et al. |
| 6,385,656 B1 | 5/2002 | Appelman |
| 6,388,584 B1 | 5/2002 | Dorward et al. |
| 6,392,567 B2 | 5/2002 | Satoh |
| 6,404,919 B1 | 6/2002 | Nishigaki et al. |
| 6,404,931 B1 | 6/2002 | Chen et al. |
| 6,407,680 B1 | 6/2002 | Lai et al. |
| 6,421,387 B1 | 7/2002 | Rhee |
| 6,421,733 B1 | 7/2002 | Tso et al. |
| 6,434,168 B1 | 8/2002 | Kari |
| 6,434,695 B1 | 8/2002 | Esfahani et al. |
| 6,442,659 B1 | 8/2002 | Blumenau |
| 6,449,658 B1 | 9/2002 | Lafe et al. |
| 6,449,682 B1 | 9/2002 | Toorians |
| 6,452,602 B1 | 9/2002 | Morein |
| 6,452,933 B1 | 9/2002 | Duffield et al. |
| 6,459,429 B1 | 10/2002 | Deering |
| 6,463,509 B1 | 10/2002 | Teoman et al. |
| 6,487,640 B1 | 11/2002 | Lipasti |
| 6,489,902 B2 | 12/2002 | Heath |
| 6,505,239 B1 | 1/2003 | Kobata |
| 6,507,611 B1 | 1/2003 | Imai et al. |
| 6,513,113 B1 | 1/2003 | Kobayashi |
| 6,523,102 B1 | 2/2003 | Dye et al. |
| 6,526,174 B1 | 2/2003 | Graffagnino |
| 6,529,633 B1 | 3/2003 | Easwar et al. |
| 6,532,121 B1 | 3/2003 | Rust et al. |
| 6,539,438 B1 | 3/2003 | Ledzius et al. |
| 6,539,456 B2 | 3/2003 | Stewart |
| 6,542,644 B1 | 4/2003 | Satoh |
| 6,557,001 B1 | 4/2003 | Dvir et al. |
| 6,577,254 B2 | 6/2003 | Rasmussen |
| 6,590,609 B1 | 7/2003 | Kitade et al. |
| 6,597,812 B1 | 7/2003 | Fallon et al. |
| 6,601,104 B1 | 7/2003 | Fallon |
| 6,604,040 B2 | 8/2003 | Kawasaki et al. |
| 6,604,158 B1 | 8/2003 | Fallon |
| 6,606,040 B2 | 8/2003 | Abdat |
| 6,606,413 B1 | 8/2003 | Zeineh |
| 6,608,867 B2 | 8/2003 | Zhong et al. |
| 6,609,223 B1 | 8/2003 | Wolfgang |
| 6,618,728 B1 | 9/2003 | Rail |
| 6,624,761 B2 | 9/2003 | Fallon |
| 6,633,244 B2 | 10/2003 | Avery |
| 6,633,968 B2 | 10/2003 | Zwiegincew et al. |
| 6,650,261 B2 | 11/2003 | Nelson et al. |
| 6,658,463 B1 | 12/2003 | Dillon et al. |
| 6,658,492 B1 | 12/2003 | Kawahara et al. |
| 6,661,839 B1 | 12/2003 | Ishida et al. |
| 6,661,845 B1 | 12/2003 | Herath |
| 6,704,840 B2 | 3/2004 | Nalawadi et al. |
| 6,708,220 B1 | 3/2004 | Olin |
| 6,711,709 B1 | 3/2004 | York |
| 6,717,534 B2 | 4/2004 | Yokose |
| 6,723,225 B2 | 4/2004 | Scheps |
| 6,731,814 B2 | 5/2004 | Zeck et al. |
| 6,735,195 B1 | 5/2004 | Mehta |
| 6,744,926 B1 | 6/2004 | Nishigaki |
| 6,745,282 B2 | 6/2004 | Okada et al. |
| 6,748,457 B2 | 6/2004 | Fallon et al. |
| 6,756,922 B2 | 6/2004 | Ossia |
| 6,768,749 B1 | 7/2004 | Osler et al. |
| 6,792,151 B1 | 9/2004 | Barnes et al. |
| 6,810,434 B2 | 10/2004 | Muthujumaraswathy et al. |
| 6,813,689 B2 | 11/2004 | Baxter, III |
| 6,819,271 B2 | 11/2004 | Geiger et al. |
| 6,822,589 B1 | 11/2004 | Dye et al. |
| 6,856,651 B2 | 2/2005 | Singh |
| 6,862,278 B1 | 3/2005 | Chang et al. |
| 6,868,500 B1 | 3/2005 | Kutz et al. |
| 6,879,266 B1 | 4/2005 | Dye et al. |
| 6,885,316 B2 | 4/2005 | Mehring |
| 6,885,319 B2 | 4/2005 | Geiger et al. |
| 6,885,643 B1 | 4/2005 | Teramoto et al. |
| 6,888,893 B2 | 5/2005 | Li et al. |
| 6,909,383 B2 | 6/2005 | Shokrollahi et al. |
| 6,909,745 B1 | 6/2005 | Puri et al. |
| 6,920,150 B1 | 7/2005 | Pauls et al. |
| 6,938,073 B1 | 8/2005 | Mendhekar et al. |
| 6,944,740 B2 | 9/2005 | Abali et al. |
| 6,952,409 B2 | 10/2005 | Jolitz |
| 6,959,005 B1* | 10/2005 | Osler .................. H04L 29/06 370/445 |
| 6,959,110 B1 | 10/2005 | Danskin et al. |
| 6,959,359 B1 | 10/2005 | Suzuki et al. |
| 6,963,608 B1 | 11/2005 | Wu |
| 6,990,247 B2 | 1/2006 | Schwartz |
| 6,993,597 B2 | 1/2006 | Nakagawa et al. |
| 7,003,171 B1 | 2/2006 | Takeo |
| 7,007,099 B1 | 2/2006 | Donati et al. |
| 7,024,460 B2 | 4/2006 | Koopmas |

(56) References Cited

U.S. PATENT DOCUMENTS

| | | |
|---|---|---|
| 7,039,116 B1 | 5/2006 | Zhang et al. |
| 7,050,639 B1 | 5/2006 | Barnes et al. |
| 7,054,493 B2 | 5/2006 | Schwartz |
| 7,069,342 B1 | 6/2006 | Biederman |
| 7,079,051 B2 | 7/2006 | Storer et al. |
| 7,088,387 B1 | 8/2006 | Freeman et al. |
| 7,089,391 B2 | 8/2006 | Geiger et al. |
| 7,096,481 B1 | 8/2006 | Forecast et al. |
| 7,102,544 B1 | 9/2006 | Liu |
| 7,127,518 B2 | 10/2006 | Vange et al. |
| 7,129,860 B2 | 10/2006 | Alvarez, II |
| 7,130,913 B2 | 10/2006 | Fallon |
| 7,143,432 B1 | 11/2006 | Brooks et al. |
| 7,161,506 B2 | 1/2007 | Fallon |
| 7,181,608 B2 | 2/2007 | Fallon et al. |
| 7,190,284 B1 | 3/2007 | Dye et al. |
| 7,245,636 B1 | 7/2007 | Hans et al. |
| 7,257,158 B1 | 8/2007 | Figueredo et al. |
| 7,319,667 B1 | 1/2008 | Biederman |
| 7,321,937 B2 | 1/2008 | Fallon |
| RE40,092 E | 2/2008 | Kang |
| 7,327,287 B2 | 2/2008 | Martinian et al. |
| 7,330,912 B1 | 2/2008 | Fox et al. |
| 7,352,300 B2 | 4/2008 | Fallon |
| 7,358,867 B2 | 4/2008 | Fallon |
| 7,376,772 B2 | 5/2008 | Fallon |
| 7,378,992 B2 | 5/2008 | Fallon |
| 7,386,046 B2 | 6/2008 | Fallon et al. |
| 7,395,345 B2 | 7/2008 | Fallon |
| 7,400,274 B2 | 7/2008 | Fallon et al. |
| 7,415,530 B2 | 8/2008 | Fallon |
| 7,417,568 B2 | 8/2008 | Fallon et al. |
| 7,496,586 B1 | 2/2009 | Bonwick et al. |
| 7,548,657 B2 | 6/2009 | Deaven |
| 7,552,069 B2 | 6/2009 | Kepecs |
| 7,565,441 B2 | 7/2009 | Romanik et al. |
| 7,711,938 B2 | 5/2010 | Wise et al. |
| 7,714,747 B2 | 5/2010 | Fallon |
| 7,777,651 B2 | 8/2010 | Fallon et al. |
| 8,004,431 B2 | 8/2011 | Reznik |
| 8,054,879 B2 | 11/2011 | Fallon et al. |
| 8,073,047 B2 | 12/2011 | Fallon et al. |
| 8,090,936 B2 | 1/2012 | Fallon et al. |
| 8,112,619 B2 | 2/2012 | Fallon et al. |
| 8,275,897 B2 | 9/2012 | Fallon |
| 8,502,707 B2 | 8/2013 | Fallon |
| 8,504,710 B2 | 8/2013 | Fallon |
| 8,553,759 B2 | 10/2013 | Fallon et al. |
| 8,643,513 B2 | 2/2014 | Fallon |
| 8,692,695 B2 | 4/2014 | Fallon et al. |
| 8,717,203 B2 | 5/2014 | Fallon |
| 8,717,204 B2 | 5/2014 | Fallon et al. |
| 8,719,438 B2 | 5/2014 | Fallon |
| 8,723,701 B2 | 5/2014 | Fallon et al. |
| 8,742,958 B2 | 6/2014 | Fallon et al. |
| 8,756,332 B2 | 6/2014 | Fallon |
| 8,832,044 B1 | 9/2014 | Gipp et al. |
| 8,832,551 B2 | 9/2014 | Muser |
| 8,867,610 B2 | 10/2014 | Fallon et al. |
| 8,880,862 B2 | 11/2014 | Fallon et al. |
| 8,929,442 B2 | 1/2015 | Fallon et al. |
| 8,933,825 B2 | 1/2015 | Fallon |
| 8,934,535 B2 | 1/2015 | Fallon et al. |
| 9,054,728 B2 | 6/2015 | Fallon |
| 9,116,908 B2 | 8/2015 | Fallon |
| 9,141,992 B2 | 9/2015 | Fallon et al. |
| 9,143,546 B2 | 9/2015 | Fallon et al. |
| 9,667,751 B2 | 5/2017 | Fallon et al. |
| 9,762,907 B2 | 9/2017 | Fallon et al. |
| 9,769,477 B2 | 9/2017 | Fallon et al. |
| 9,792,128 B2 | 10/2017 | Fallon et al. |
| 9,792,308 B2 | 10/2017 | Fallon et al. |
| 9,859,919 B2 | 1/2018 | Fallon et al. |
| 9,967,368 B2 | 5/2018 | Fallon et al. |
| 10,019,458 B2 | 7/2018 | Fallon |
| 2001/0019630 A1 | 9/2001 | Johnson |
| 2001/0031092 A1 | 10/2001 | Zeck et al. |
| 2001/0032128 A1 | 10/2001 | Kepecs |
| 2001/0047473 A1 | 11/2001 | Fallon |
| 2001/0052038 A1 | 12/2001 | Fallon et al. |
| 2001/0054131 A1 | 12/2001 | Alvarez, II et al. |
| 2002/0037035 A1 | 3/2002 | Singh |
| 2002/0069354 A1 | 6/2002 | Fallon et al. |
| 2002/0078241 A1 | 6/2002 | Vidal et al. |
| 2002/0080871 A1 | 6/2002 | Fallon et al. |
| 2002/0097172 A1 | 7/2002 | Fallon |
| 2002/0101367 A1 | 8/2002 | Geiger et al. |
| 2002/0104891 A1 | 8/2002 | Otto |
| 2002/0126755 A1 | 9/2002 | Li et al. |
| 2002/0169950 A1 | 11/2002 | Esfahani et al. |
| 2002/0191692 A1 | 12/2002 | Fallon et al. |
| 2002/0196166 A1 | 12/2002 | Satoh et al. |
| 2003/0030575 A1 | 2/2003 | Frachtenberg et al. |
| 2003/0034905 A1 | 2/2003 | Anton et al. |
| 2003/0058873 A1 | 3/2003 | Geiger et al. |
| 2003/0084238 A1 | 5/2003 | Okada et al. |
| 2003/0090397 A1 | 5/2003 | Rasmussen |
| 2003/0142874 A1 | 7/2003 | Schwartz |
| 2003/0191876 A1 | 10/2003 | Fallon |
| 2004/0042506 A1 | 3/2004 | Fallon et al. |
| 2004/0056783 A1 | 3/2004 | Fallon |
| 2004/0073710 A1 | 4/2004 | Fallon |
| 2004/0073746 A1 | 4/2004 | Fallon |
| 2006/0015650 A1 | 1/2006 | Fallon |
| 2006/0181441 A1 | 8/2006 | Fallon |
| 2006/0181442 A1 | 8/2006 | Fallon |
| 2006/0184687 A1 | 8/2006 | Fallon |
| 2006/0184696 A1 | 8/2006 | Fallon |
| 2006/0190644 A1 | 8/2006 | Fallon |
| 2006/0195601 A1 | 8/2006 | Fallon |
| 2007/0043939 A1 | 2/2007 | Fallon et al. |
| 2007/0050514 A1 | 3/2007 | Fallon |
| 2007/0050515 A1 | 3/2007 | Fallon |
| 2007/0067483 A1 | 3/2007 | Fallon |
| 2007/0083571 A1 | 4/2007 | Meller et al. |
| 2007/0083746 A1 | 4/2007 | Fallon et al. |
| 2007/0096954 A1 | 5/2007 | Boldt et al. |
| 2007/0109154 A1 | 5/2007 | Fallon |
| 2007/0109155 A1 | 5/2007 | Fallon |
| 2007/0109156 A1 | 5/2007 | Fallon |
| 2007/0174209 A1 | 7/2007 | Fallon |
| 2008/0232457 A1 | 9/2008 | Fallon et al. |
| 2008/0239917 A1 | 10/2008 | Mukaide |
| 2008/0279462 A1 | 11/2008 | Celi |
| 2009/0125698 A1 | 5/2009 | Dye |
| 2009/0154545 A1 | 6/2009 | Fallon et al. |
| 2009/0157712 A1 | 6/2009 | De Peuter et al. |
| 2009/0287839 A1 | 11/2009 | Fallon et al. |
| 2010/0011012 A1 | 1/2010 | Rawson |
| 2010/0316114 A1 | 12/2010 | Fallon et al. |
| 2010/0318684 A1 | 12/2010 | Fallon |
| 2010/0332700 A1 | 12/2010 | Fallon |
| 2011/0023052 A1 | 1/2011 | Huang et al. |
| 2011/0037626 A1 | 2/2011 | Fallon |
| 2011/0199243 A1 | 8/2011 | Fallon et al. |
| 2011/0208833 A1 | 8/2011 | Fallon |
| 2011/0231642 A1 | 9/2011 | Fallon et al. |
| 2011/0235697 A1 | 9/2011 | Fallon et al. |
| 2011/0285559 A1 | 11/2011 | Fallon |
| 2012/0124016 A1 | 5/2012 | Barsness et al. |
| 2012/0194362 A1 | 8/2012 | Fallon et al. |
| 2012/0239921 A1 | 9/2012 | Fallon |
| 2013/0297575 A1 | 11/2013 | Fallon et al. |
| 2014/0022098 A1 | 1/2014 | Fallon |
| 2014/0022099 A1 | 1/2014 | Fallon et al. |
| 2014/0022100 A1 | 1/2014 | Fallon et al. |
| 2014/0023135 A1 | 1/2014 | Fallon et al. |
| 2014/0028480 A1 | 1/2014 | Fallon et al. |
| 2014/0105270 A1 | 4/2014 | Fallon et al. |
| 2014/0105271 A1 | 4/2014 | Fallon et al. |
| 2014/0218220 A1 | 8/2014 | Fallon |
| 2015/0009051 A1 | 1/2015 | Fallon |
| 2015/0012507 A1 | 1/2015 | Fallon |
| 2015/0113182 A1 | 4/2015 | Fallon |

(56) References Cited

U.S. PATENT DOCUMENTS

| | | |
|---|---|---|
| 2015/0268969 A1 | 9/2015 | Fallon et al. |
| 2015/0270849 A1 | 9/2015 | Fallon |
| 2015/0334390 A1 | 11/2015 | Fallon et al. |
| 2016/0029018 A1 | 1/2016 | Fallon et al. |
| 2016/0127512 A1 | 5/2016 | Fallon et al. |
| 2016/0127513 A1 | 5/2016 | Fallon et al. |
| 2016/0162505 A1 | 6/2016 | Fallon |
| 2016/0261278 A1 | 9/2016 | Fallon |
| 2018/0143840 A1 | 5/2018 | Fallon et al. |

FOREIGN PATENT DOCUMENTS

| | | |
|---|---|---|
| EP | 0 185098 | 6/1986 |
| EP | 0283798 | 9/1988 |
| EP | 0405572 | 1/1991 |
| EP | 0493130 | 7/1992 |
| EP | 0587437 | 3/1994 |
| EP | 0595406 | 5/1994 |
| EP | 0718751 | 6/1996 |
| EP | 905939 | 9/1998 |
| EP | 0905939 A2 | 9/1998 |
| EP | 0 928 070 A2 | 7/1999 |
| GB | 2162025 | 1/1986 |
| JP | 04-241681 | 8/1992 |
| JP | 05088793 A | 4/1993 |
| JP | 6051989 | 2/1994 |
| JP | 9188009 | 7/1997 |
| JP | H11-331305 | 5/1998 |
| JP | 11149376 | 6/1999 |
| JP | H 11 331305 | 11/1999 |
| JP | 200050268 A | 2/2000 |
| WO | WO 9414273 | 6/1994 |
| WO | WO 9429852 | 12/1994 |
| WO | WO 9502873 | 1/1995 |
| WO | WO 95/29437 A1 | 11/1995 |
| WO | WO 97/27546 A1 | 7/1997 |
| WO | WO 97/39421 | 10/1997 |
| WO | WO 9748212 | 12/1997 |
| WO | WO 98/19450 | 5/1998 |
| WO | WO 98/40842 A1 | 9/1998 |
| WO | WO9839699 A2 | 9/1998 |
| WO | WO 9908186 | 2/1999 |
| WO | WO 0036754 A1 | 6/2000 |
| WO | WO 00/46688 | 8/2000 |
| WO | WO 00/51243 A1 | 8/2000 |
| WO | WO2000051243 | 8/2000 |
| WO | WO 01/050325 | 7/2001 |
| WO | WO 01/057642 | 8/2001 |
| WO | WO 01/057659 | 8/2001 |
| WO | WO 01/63772 | 8/2001 |
| WO | WO 02/13058 A2 | 2/2002 |
| WO | WO 02/39591 | 5/2002 |
| WO | WO 2008/087466 A1 | 7/2008 |

OTHER PUBLICATIONS

Reply to Realtime's Response to Blue Coat Defendants' Objections to Report and Recommendation of United States Magistrate Judge Regarding Motion for Partial Summary Judgment of Invalidity for Indefiniteness Entered Jun. 23, 2009, in Realtime Data, LLC d/b/a/IXO v. Packeteer, Inc. et al., Civil Action No. 6:08-cv-00144-LED; U.S. District Court for the Eastern District of Texas, Jul. 31, 2009, 3 pgs.

Realtime Data's Sur-Reply in Opposition to the Defendants' Joint Objections to Report and Recommendation of Magistrate Regarding Motion for Partial Summary Judgment of Invalidity for Indefiniteness, in Realtime Data, LLC d/b/a/IXO v. Packeteer, Inc. et al., Civil Action No. 6:08-cv-00144-LED; U.S. District Court for the Eastern District of Texas, dated Aug. 3, 2009, 3 pages.

"A-T Financial Offers Manipulation, Redistribution of Ticker III", Inside Market Data, vol. 4 No. 14, Sep. 5, 1989, 1 page.

"Add-on Options for the XpressFiles", Intelligent Compression Technologies, http://web.archive.org/web/19980518053418/ictcompress.com/options_X.html, 1998, 2 pages.

Andrews et al., "A Mean-Removed Variation of Weighted Universal Vector Quantization for Image Coding", IEEE, 1993, pp. 302-309.

Asserted Claims Chart for U.S. Pat. No. 6,624,761, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 4 pages.

Asserted Claims Chart for U.S. Pat. No. 7,161,506,Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 5 pages.

Asserted Claims Chart for U.S. Pat. No. 7,400,274, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 6 pages.

Asserted Claims Chart for U.S. Pat. No. 7,417,568, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 13 pages.

Asserted Claims Chart for U.S. Pat. No. 7,714,747, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 19 pages.

Barton, Rich, S&P ComStock Network Character Set Definition, 19.2 KB Network, Version 1.7.0, Feb. 10, 1995, 29 pages.

Beech, W. A., et al., "AX.25 Link Access Protocol for Amateur Packet Radio," Version 2.2, Revision: Jul. 1998, 143 pages.

Bormann, Carsten, "Providing Integrated Services over Low-bitrate Links", Network Working Group Request for Comments: 2689, Category: Informational, Sep. 1999, 14 pages.

ComStock Services Pamphlet, McGraw-Hill Financial Services Company, purportedly published by Jul. 19, 1995, 6 pages.

Cormack, Gordon V., "Data Compression on a Database System", Communications of the ACM, vol. 28, No. 12, Dec. 1985, pp. 1336-1342.

Danskin, John Moffatt, "Compressing the X Graphics Protocol: A Dissertation Presented to the Facult of Princeton University in Candidacy for the Degree of Doctor of Philosophy," Jan. 1995, 147 pages.

"Data Networks and Open System Communications", Information Technology—Abstract Syntax Notation One (ASN. 1) Specification of Basic Notation, International Telecommunication Union, ITU-T Telecommunication Standardization Sector of ITU X.680, Jul. 1994.

Defendants' Invalidity Contentions, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 19 pages.

Degermark, Mikael, "IP Header Compression", Network Working Group Request for Comments: 2507, Category: Standards Track, Feb. 1999, 47 pages.

Developer's Guide, Version 1.0.2, S&P ComStock, Feb. 15, 1994, 186 pages.

Domanski, Dr. Bernie, "All the news you can eat, Department: Dr. Bernie's Digestions and Digressions", Demand Technology's Capacity Management Review, vol. 25, No. 7, Jul. 1997, pp. 24, 18-22.

Effros, Michelle and Philip A. Chou, "Weighted Universal Transform Coding: Universal Image Compression with the Karhunen-Loeve Transform", IEEE, 1995, pp. 61-64.

Engan, Mathias, "IP Header Compression over PPP", Network Working Group Request for Comments: 2509, Category: 2509, Feb. 1999, 10 pages.

Exhibit A, Invalidity Claim Charts A1-A45 for U.S. Pat. No. 6,624,761, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 616 pages.

Exhibit B, Invalidity Claim Charts B1-B45 for U.S. Pat. No. 7,161,506, Realtime Data, LLC D/B/A IXO v. CME Group Inc., et al. , 6:09-cv-327-LED-JDL, 6:10-cv-246-LED-JDL, United States District Court for the Eastern District of Texas Tyler Division, Oct. 19, 2010, 1513 pages.

(56) References Cited

OTHER PUBLICATIONS

Exhibit C, Invalidity Claim Charts C1-C7, C9-C31, C33-C45 for U.S. Pat. No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 1528 pages.
Exhibit D, Invalidity Claim Charts D1-D7, D9-D45 for U.S. Pat. No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 2458 pages.
Exhibit E, Invalidity Claim Charts E1-E7, E9, E11, E13-E15, E17-E30, E32-E45 for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 3312 pages.
Greene, Tim, "Squeeze your 'Net links", NetworkWorld, vol. 14, No. 28, Jul. 14, 1997, pp. 1 and 56.
Helck, Christopher J., "Encapsulated Ticker: Ver 1.0", Jul. 14, 1993, 22 pages.
"High-performance schema-specific compression for XML data formats.", XML-Xpress: Product Overview, Intelligent Compression Technologies, http://web.archive.org/web/20020818002535/www.ictcompress.com/products_xmlxpress, 2001, 2 pages.
Hsu, William H. and Amy E. Zwarico, "Automatic Synthesis of Compression Techniques for Heterogeneous Files", Software—Practice and Experience, vol. 25 (10), Oct. 1995, pp. 1097-1116.
"ICT's XML-Xpress", Intelligent Compression Technologies, Dec. 2000, 6 pages.
"Information processing systems—Data communication—High-level data link control procedures—Frame structure", UNI ISO 3309, 1984, 11 pages.
Installing and Administering PPP, Edition 1, Hewlett-Packard Company, 1997, 169 pages.
"Introducing XpressFiles", Intelligent Compression Technologies, http://web.archive.org/web/19980518053310/ictcompress.com/xpressfiles.html, 1998, 1 page.
"Ion's RemoteScript speeds transmission", Seybold Report on Publishing Systems, vol. 22 No. 5, Nov. 9, 1992, pp. 21-23.
Jacobson, V., "Compressing TCP/IP Headers for Low-Speed Serial Links," Feb. 1990, 45 pages.
Kulkosky, Victor, "Upping the Ante", Wall Street & Technology, vol. 11 No. 5, Oct. 1993, pp. 8-11.
Liefke, Hartmut and Dan Suciu, "An Extensible Compressor for XML Data," SIGMOD Record, vol. 29, No. 1, Mar. 2000, pp. 57-62.
Liefke, Hartmut and Dan Suciu, "XMill: an Efficient Compressor for XML Data," 2000, pp. 153-164.
Liefke, Hartmut and Dan Suciu, Xmill: an Efficient Compressor for XML Data, Oct. 18, 1999, 25 pages.
McGregor, Glenn, "The PPP Internet Protocol Control Protocol (IPCP)", Network Working Group Request for Comments: 1332, Obsoletes: RFC 1172, May 1992, 14 pages.
Obviousness Chart for U.S. Pat. No. 6,624,761, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 19 pages.
Obviousness Chart for U.S. Pat. No. 7,161,506, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 49 pages.
Obviousness Chart for U.S. Pat. No. 7,400,274, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 41 pages.
Obviousness Chart for U.S. Pat. No. 7,417,568, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 75 pages.
Obviousness Chart for U.S. Pat. No. 7,714,747, *Realtime Data, LLC D/B/A IXO v. CME Group Inc., et al.*, 6:09-cv-327-LED-JDL, 6:10-cv-246-LED-JDL, United States District Court for the Eastern District of Texas Tyler Division, Oct. 19, 2010, 97 pages.
Open Financial Exchange Specification 2.0, Intuit Inc., Microsoft Corp., Apr. 28, 2000, 537 pages.
Rand, Dave, "The PPP Compression Control Protocol (CCP)", Network Working Group Request for Comments: 1962, Category: Standards Track, Jun. 1996, 9 pages.
Rogers, Amy, "Bandwidth Bargain IT hot on products that squeeze more out of the pipe", No. 673, Jul. 21, 1997, pp. 1 and 65.
Roth, Mark A. and Scott J. Van Horn, "Database Compression", SIGMOD Record, vol. 22, No. 3, Sep. 1993, pp. 31-39.
Schmerken, Ivy, "Time Running Out for Old Technologies", Wall Street Computer Review, Apr. 1990, pp. 14-16, 23-24, 28, 56.
"Scrolling News", Inside Market Data, Feb. 27, 1995, 2 pages.
Simpson, W., "PPP in HDLC-like Framing", Network Working Group Request for Comments: 1662, STD 51, Obsoletes 1549, Category: Standards Track, Jul. 1994, 26 pages.
Suciu, Dan, Data Management on the Web, AT&T Labs, Apr. 4, 2000, 52 slides.
Suciu, Dan, "Data Management on the Web: Abstract," University of Washington Computer Science & Engineering, Apr. 4, 2000, 1 page.
"Telekurs Buys S&P Trading Systems and Its Ticker III Feed", Inside Market Data, vol. 4, No. 11, Jul. 10, 1989, 1 page.
"Telekurs May Debut 128 KPS Ticker by Year's End", Inside Market Data, Jul. 18, 1994, 2 pages.
"Telekurs Now Carries All Dow Jones' News on 56-Kbps Ticker," Inside Market Data, Dec. 20, 1993, 2 pages.
"Telekurs Sells No. American Division in Mgmt. Buyout", Inside Market Data, Oct. 23, 1995, 2 pages.
"Telekurs to Launch New Int'l Feed/Internet Server", Wall Street & Technology, vol. 15, No. 1, Jan. 1997, p. 14.
"The Technology Behind XpressFiles", Intelligent Compression Technologies, http://web.archive.org/web/19980518053634/ictcompress.com/technical_X.html, 1998, 1 page.
TID Information: Revisions to TID Program Since the Dawn of Time!!! Version 1.0, 23 pages; TID Codes 1, 1 page; TID Codes 2, 1 page, purportedly by Jul. 19, 1995.
TypeWorld: The First and Only Newspaper for Electronic Publishing, vol. 16 No. 9, Jun. 17, 1992, 3 pages.
"XpressFiles White Paper", Intelligent Compression Technologies, 1999-2001, 3 pages.
U.S. Appl. No. 60/309,218, filed Jul. 31, 2001.
Telekurs Manual, Jan. 11, 1993, 184 pages.
Danskin, et al., "Fast Higher Bandwidth X," Dartmouth College, Hanover, NH, 1995, 8 pages.
Hoffman, Roy, "Data Compression in Digital Systems," Digital Multimedia Standards Series, Chapman & Hall, 1997, 426 pages.
Defendants' Invalidity Contentions, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 34 pages.
Appendix A, Obviousness Chart for U.S. Pat. No. 7,777,651, not dated, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 466 pages.
Appendix B, § 112 Invalidity Arguments for U.S. Pat. No. 7,777,651, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-

(56) References Cited

OTHER PUBLICATIONS

JDL, United States District Court for the Eastern District of Texas Tyler Division, Feb. 4, 2011, 75 pages.
Exhibit 1, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 161 pages, citing Aakre et al., U.S. Pat. No. 4,956,808.
Exhibit 2, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 206 pages, citing Albert et al., U.S. Pat. No. 5,907,801.
Exhibit 3, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 95 pages, citing B. Andrews, P. Chou, M. Effros and R. Gray "A Mean-Removed Variation of Weighted Universal Vector Quantization for Image Coding," IEEE 0-8186-3392-1/93, 302-309 (1993).
Exhibit 4, Prior Art Chart for U.S. Pat. No. 7,777,651, 144 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Barnes et al., U.S. Pat. No. 6,792,151.
Exhibit 5, Prior Art Chart for U.S. Pat. No. 7,777,651, 216 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Birdwell et al., U.S. Pat. No. 6,032,197.
Exhibit 6, Prior Art Chart for U.S. Pat. No. 7,777,651, 257 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Bledsoe, U.S. Pat. No. 4,646,061.
Exhibit 7, Prior Art Chart for U.S. Pat. No. 7,777,651, 169 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Brickman et al., U.S. Pat. No. 4,499,499.
Exhibit 8, Prior Art Chart for U.S. Pat. No. 7,777,651, 396 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing C. Bormann et al., "Robust Header Compression (ROHC)," Network Working Group Internet-Draft Sep. 18, 2000.
Exhibit 9, Prior Art Chart for U.S. Pat. No. 7,777,651, 253 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Carr, U.S. Pat. No. 5,293,379.
Exhibit 10, Prior Art Chart for U.S. Pat. No. 7,777,651, 205 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cellier et al., U.S. Pat. No. 5,884,269.
Exhibit 11, Prior Art Chart for U.S. Pat. No. 7,777,651, 181 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Chu, U.S. Pat. No. 5,374,916 & 5,467,087.
Exhibit 12, Prior Art Chart for U.S. Pat. No. 7,777,651, 175 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Cisco IOS Data Compression White Paper (Cisco Systems Inc., 1997).
Exhibit 13, Prior Art Chart for U.S. Pat. No. 7,777,651, 590 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Comstock—S&P ComStock Developers Guides (McGraw-Hill, 1994); Rich Barton, "S&P ComStock Network Character Set Definition" (Feb. 10, 1995).
Exhibit 14, Prior Art Chart for U.S. Pat. No. 7,777,651, 186 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing D.J. Craft. "A fast hardware data

(56) References Cited

OTHER PUBLICATIONS compression algorithm and some algorithmic extensions," IBM J. Res. Develop. vol. 42, No. 6 (Nov. 6, 1998).

Exhibit 15, Prior Art Chart for U.S. Pat. No. 7,777,651, 142 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Deering, U.S. Pat. No. 6,459,429.

Exhibit 16, Prior Art Chart for U.S. Pat. No. 7,777,651, 284 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Dye et al., U.S. Pat. No. 7,190,284 and International Publication No. WO 00/45516.

Exhibit 17, Prior Art Chart for U.S. Pat. No. 7,777,651, 269 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Earl et al., U.S. Pat. No. 5,341,440.

Exhibit 18, Prior Art Chart for U.S. Pat. No. 7,777,651, 132 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Eastman et al., U.S. Pat. No. 4,464,650.

Exhibit 19, Prior Art Chart for U.S. Pat. No. 7,777,651, 125 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, llc d/b/a ixo* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Elgamal et at, U.S. Pat. No. 5,410,671.

Exhibit 20, Prior Art Chart for U.S. Pat. No. 7,777,651, 122 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-.

Exhibit 21, Prior Art Chart for U.S. Pat. No. 7,777,651, 379 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Fascenda, U.S. Pat. No. 5,045,848.

Exhibit 22, Prior Art Chart for U.S. Pat. No. 7,777,651, 218 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Frachtenberg et al., U.S. Patent. Pub. 2003/0030575.

Exhibit 23, Prior Art Chart for U.S. Pat. No. 7,777,651, 247 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Franaszek et al., U.S. Pat. No. 5,870,036.

Exhibit 24, Prior Art Chart for U.S. Pat. No. 7,777,651, 327 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing French et al., U.S. Pat. No. 5,794,229.

Exhibit 25, Prior Art Chart for U.S. Pat. No. 7,777,651, 225 pages, Exhibit 24, Prior Art Chart for U.S. Pat. No. 7,777,651, 327 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Geiger et al., U.S. Pat. No. 5,987,022.

Exhibit 26, Prior Art Chart for U.S. Pat. No. 7,777,651, 219 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gentile, U.S. Pat. No. 5,504,842.

Exhibit 27, Prior Art Chart for U.S. Pat. No. 7,777,651, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDl, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, 167 pages, citing Giltner et al., U.S. Pat. No. 4,386,416.

Exhibit 28, Prior Art Chart for U.S. Pat. No. 7,777,651, 156 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Gooch, U.S. Pat. No. 4,325,085.

Exhibit 29, Prior Art Chart for U.S. Pat. No. 7,777,651, 132 pages, *Realtime Data, LLC D/B/A IXO* v. *Morgan Stanley, et al.*, 6:09-cv-326-LED-JDL, 6:10-cv-248-LED-JDL, 6:10-cv-426-LED-JDL, *Realtime Data, LLC D/B/A IXO* v. *CME Group Inc., et al.*, 6:09-cv-327-LED-JDL, 6:10-cv-246-LED-JDL, 6:10-cv-424-LED-JDL, *Realtime Data, LLC D/B/A IXO* v. *Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hauck, U.S. Pat. No. 4,626,829.

(56) References Cited

OTHER PUBLICATIONS

Exhibit 30, Prior Art Chart for U.S. Pat. No. 7,777,651, 161 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Heath, U.S. Pat. No. 5,955,976.
Exhibit 31, Prior Art Chart for U.S. Pat. No. 7,777,651, 359 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hewlett-Packard Company, "Installing and Administering PPP," B2355-90137, HP 9000 Networking, E0948 (1st Ed. 1997).
Exhibit 32, Prior Art Chart for U.S. Pat. No. 7,777,651, 229 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Hsu & Zwarico, Automatic Synthesis of Compression Techniques for Heterogeneous Files, Software-Practice & Experience, vol. 25(10), pp. 1097-1116 (Oct. 1995).
Exhibit 33, Prior Art Chart for U.S. Pat. No. 7,777,651, 206 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XML-Xpress White Paper (Intelligent Compression Technologies Inc., 2000) & website.
Exhibit 34, Prior Art Chart for U.S. Pat. No. 7,777,651, 138 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing ICT XpressFiles White Paper (Intelligent Compression Technologies Inc., 1999) & website.
Exhibit 35, Prior Art Chart for U.S. Pat. No. 7,777,651, 128 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Iseda et al., E.P. 0405572 A2.
Exhibit 36, Prior Art Chart for U.S. Pat. No. 7,777,651, 205 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing J. Danskin. "Compressing the X Graphics Protocol," Princeton University (Jan. 1995).
Exhibit 37, Prior Art Chart for U.S. Pat. No. 7,777,651, 159 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kalkstein, U.S. Pat. No. 5,945,933.
Exhibit 38, Prior Art Chart for U.S. Pat. No. 7,777,651, 402 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kari, U.S. Pat. No. 6,434,168; International Publication No. WO97/48212 Al.
Exhibit 39, Prior Art Chart for U.S. Pat. No. 7,777,651, 209 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Koopmas et al., U.S. Pat. No. 7,024,460.
Exhibit 40, Prior Art Chart for U.S. Pat. No. 7,777,651, 214 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Pat. No. 5,825,830.
Exhibit 41, Prior Art Chart for U.S. Pat. No. 7,777,651, 281 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Kopf, U.S. Pat. No. 5,825,830.
Exhibit 42, Prior Art Chart for U.S. Pat. No. 7,777,651, 340 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Lane et al., U.S. Pat. No. 5,521,940.
Exhibit 43, Prior Art Chart for U.S. Pat. No. 7,777,651, 164 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Langdon, Jr. et al., U.S. Pat. No. 4,494,108.
Exhibit 44, Prior Art Chart for U.S. Pat. No. 7,777,651, 211 pages, *Realtime Data, LLC D/B/A IXO v. Morgan Stanley, et al.*, 6:09-cv-326-LED-JDL, 6:10-cv-248-LED-JDL, 6:10-cv-426-LED-JDL,

(56) References Cited

OTHER PUBLICATIONS

*Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Lavallee, U.S. Pat. No. 6,215,904.
Exhibit 45, Prior Art Chart for U.S. Pat. No. 7,777,651, 103 pages, *Realtime Data, LLC D/B/A Ixo* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing M. Effros, P. Chou & R.M. Gray. "Variable Dimension Weighted Universal Vector Quantization and Noiseless Coding," IEEE 1068-0314/94 (1994).
Exhibit 46, Prior Art Chart for U.S. Pat. No. 7,777,651, 414 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing MacCrisken, U.S. Pat. No. 4,730,348.
Exhibit 47, Prior Art Chart for U.S. Pat. No. 7,777,651, 319 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Madany et al., U.S. Pat. No. 5,774,715.
Exhibit 48, Prior Art Chart for U.S. Pat. No. 7,777,651, 228 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011,citing Mark A. Roth and Scott J. Van Horn, "Database Compression" SIGMOD Record, vol. 22, No. 3 (1993).
Exhibit 49, Prior Art Chart for U.S. Pat. No. 7,777,651, 235 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. Thomson Reuters Corp., et al., 6:09-cv-333-LED-JDL, 6:10-cv-247-LED-JDL, 6:10-cy-425-LED-JDL, United States District Court for the Eastern District of Texas Tyler Division, Feb. 4, 2011, citing Miller et al., U.S. Pat. No. 4,814,746.
Exhibit 50, Prior Art Chart for U.S. Pat. No. 7,777,651, 172 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing O'Brien et al., U.S. Pat. No. 4,929,946.

Exhibit 51, Prior Art Chart for U.S. Pat. No. 7,777,651, 30 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cy-425-LED-JDL, United States District Court for the Eastern District of Texas Tyler Division, Feb. 4, 2011, citing Osler et al., U.S. Pat. No. 6,768,749.
Exhibit 52, Prior Art Chart for U.S. Pat. No. 7,777,651, 103 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing P. G. Howard, F. Kossenti, S. Forchammer, and W. J. Rucklidge [1998]. "The Emerging JBIG2 Standard", IEEE Transactions on Circuits and Systems for Video Technology 8:7, 838-848.
Exhibit 53, Prior Art Chart for U.S. Pat. No. 7,777,651, 218 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Panaoussis, U.S. Pat. No. 5,949,355.
Exhibit 54, Prior Art Chart for U.S. Pat. No. 7,777,651, 335 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Payne et al, U.S. Pat. No. 6,021,433.
Exhibit 55, Prior Art Chart for U.S. Pat. No. 7,777,651, 273 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing Reynar et al, U.S. Pat. No. 5,951,623.
Exhibit 56, Prior Art Chart for U.S. Pat. No. 7,777,651, 399 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1144: V. Jacobson, "Compressing TCP/IP Headers for Low-Speed Serial Links," Network Working Group, Request for Comments: 1144 (Feb. 1990).
Exhibit 57, Prior Art Chart for U.S. Pat. No. 7,777,651, 103 pages, *Realtime Data, LLC D/B/A IXO* v. *Morgan Stanley, et al.,* 6:09-cv-326-LED-JDL, 6:10-cv-248-LED-JDL, 6:10-cv-426-LED-JDL, *Realtime Data, LLC D/B/A IXO* v. *CME Group Inc., et al.,* 6:09-cv-327-LED-JDL, 6:10-cv-246-LED-JDL, 6:10-cv-424-LED-JDL, *Realtime Data, LLC D/B/A IXO* v. *Thomson Reuters Corp., et al.,* 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 1661: Point-to-Point Protocol Working Group, "The Point-to-Point Protocol," RFC 1661

(56) References Cited

OTHER PUBLICATIONS (William Simpson ed., Internet Engineering Task Force 1994); RFC 1662: Point-to-Point Protocol Working Group, "PPP in HDLC-like Framing," RFC 1662 (William Simpson ed., Internet Engineering Task Force 1994); RFC 1962: Dave Rand, "The PPP compression Control Protocol (CCP)," RFC 1962 (Internet Engineering Task Force 1996); RFC 1332: Glenn McGregor, "The PPP Internet Protocol Control Protocol (IPCP)," RFC 1332 (Internet Engineering Task Force 1992); RFC 2509: Mathias Engan et al., "IP Header Compression over IP," RFC 2509 (Internet Society 1999).

Exhibit 58, Prior Art Chart for U.S. Pat. No. 7,777,651, 218 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing RFC 2507: Mikael Degermark et al., "IP Header Compression," RFC 2507 (Internet Society 1999).

Exhibit 59, Prior Art Chart for U.S. Pat. No. 7,777,651, 335 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Roper et al., U.S. Pat. No. 5,454,079.

Exhibit 60, Prior Art Chart for U.S. Pat. No. 7,777,651, 273 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Sebastian, U.S. Pat. No. 6,253,264 and International Publication no. WO/1998/039699.

Exhibit 61, Prior Art Chart for U.S. Pat. No. 7,777,651, 399 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Pat. No. 5,243,341.

Exhibit 62, Prior Art Chart for U.S. Pat. No. 7,777,651, 322 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Seroussi et al., U.S. Pat. No. 5,389,922.

Exhibit 63, Prior Art Chart for U.S. Pat. No. 7,777,651, 102 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Shin, U.S. Pat. No. 5,455,680.

Exhibit 64, Prior Art Chart for U.S. Pat. No. 7,777,651, 126 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Taaffe et al., U.S. Pat. No. 5,179,651.

Exhibit 65, Prior Art Chart for U.S. Pat. No. 7,777,651, 313 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Telekurs Ticker—"Telekurs Ticker Service: Programmer's Reference," Telekurs (North America), Inc. (Jan. 11, 1993); C. Helck. "Encapsulated Ticker: Ver. 1.0," Telekurs NA, 1-22 (Jul. 14, 1993); A-T Financial Offers Manipulation, Redistribution of Ticker III, Micro Ticker Report, v 4, n 14 (Sep. 5, 1989); V. Kulkosky, "Upping the Ante" Wall Street & Technology, v11 n5 pp. 8-11 (Oct. 1993); "Telekurs to Launch New Int'l Feed/Internet Server," Wall Street & Technology, v15 n1 pp. 14 (Jan. 1997); I. Schmerken, "Time running out for old technologies", Wall Street Computer Review, v7 n7 p14(7) (Apr. 1990); Scrolling News, Inside Market Data, v 10, n 11 (Feb. 27, 1995); Telekurs Buys S&P Trading Systems and Its Ticker III Feed, Micro Ticker Report, v 4, n 11 (Jul. 10, 1989); Telekurs May Debut 128 KPS Ticker by Year's End, Inside Market Data, v 9, n 21 (Jul. 18, 1994); Telekurs Now Carries All Dow Jones' News on 56-KBPS Ticker, Inside Market Data, v9, n7 (Dec. 20, 1993); Telekurs Sells No. American Division in MGMT. Buyout, Inside Market Data, v11, n3 (Oct. 23, 1995).

Exhibit 66, Prior Art Chart for U.S. Pat. No. 7,777,651, 265 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Tyler et al., U.S. Pat. No. 5,638,498.

Exhibit 67, Prior Art Chart for U.S. Pat. No. 7,777,651, 86 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing UNI International Standard ISO 3309-1984 (E) [1984]. "Information Processing Systems—Data Communication—High-level Data Link Control Procedures—Frame Structure," 1-6 (1984).

Exhibit 68, Prior Art Chart for U.S. Pat. No. 7,777,651, 236 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-Led-Jdl, 6:10-cv-247-LED-JDL, 6:10-cv-425-LED-JDL, United States District Court for the Eastern District of Texas Tyler Division, Feb. 4, 2011, citing Unwired Planet, EP 0928070 A2.

Exhibit 69, Prior Art Chart for U.S. Pat. No. 7,777,651, 80 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL,

(56) References Cited

OTHER PUBLICATIONS

*Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Vange et al., U.S. Pat. No. 7,127,518.
Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Wernikoff et at, U.S. Pat. No. 3,394,352.
Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing Willis et al., U.S. Pat. No. 4,745,559; Boilen, U.S. Pat. No. 4,750,135.
Exhibit 72, Prior Art Chart for U.S. Pat. No. 7,777,651, 277 pages, Exhibit 71, Prior Art Chart for U.S. Pat. No. 7,777,651, 253 pages, Exhibit 70, Prior Art Chart for U.S. Pat. No. 7,777,651, 197 pages, *Realtime Data, LLC D/B/A IXO v. Morgan Stanley, et al.*, 6:09-cv-326-LED-JDL, 6:10-cv-248-LED-JDL, 6:10-cv-426-LED-JDL, *Realtime Data, LLC D/B/A IXO v. CME Group Inc., et al.*, 6:09-cv-327-LED-JDL, 6:10-cv-246-LED-JDL, 6:10-cv-424-LED-JDL, *Realtime Data, LLC D/B/A IXO v. Thomson Reuters Corp., et al.*, 6:09-cv-333-LED-JDL, 6:10-cv-247-LED-JDL, 6:10-cv-425-LED-JDL, United States District Court for the Eastern District of Texas Tyler Division, Feb. 4, 2011, citing XMill—Hartmut Liefke & Dan Suciu, "XMill: an Efficient Compressor for XML Data," University of Pennsylvania, Philadelphia, Pennsylvania, MS-CIS-99-26 (Oct. 18, 1999); Hartmut Liefke & Dan Suciu, "XMill: an Efficient Compressor for XML Data," Proceedings of SIGMOD, 2000; Hartmut Liefke & Dan Suciu, "An Extensible Compressor for XML Data," SIGMOD Record, vol. 29, No. 1 (Mar. 2000); Dan Suciu, "Data Management on the Web," Presentation at University of Washington College of Computer Science & Engineering, Seattle, WA (Apr. 4, 2000).
Bormann et al., "Robust Header Compression (ROHC)," Network Working Group Internet-Draft, Sep. 18, 2000, 111 pages.
Effros, M., P.A. Chou and R.M. Gray, "Variable Dimension Weighted Universal Vector Quantization and Noiseless Coding," IEEE 1068-0314/94, 1994, pp. 2-11.
Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 17 pages.
Appendix A: U.S. Pat. No. 6,624,761 (The "761 Patent"), from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 37 pages.
Appendix B: U.S. Pat. No. 7,161,506 (The "506 Patent"), from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 63 pages.
Appendix C: U.S. Pat. No. 7,400,274 (The 274 Patent), from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 95 pages.
Appendix D: U.S. Pat. No. 7,417,568 (The 568 Patent), from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 147 pages.
Appendix E: U.S. Pat. No. 7,714,747 (The "747 Patent"), from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Oct. 29, 2010, 137 pages.
Appendix F: Comparison of FAST to the Prior Art, from Defendant Bloomberg L.P.'s Invalidity Contentions Pursuant to Patent Local Rule 3-3, *Realtime Data, LLC D/B/A IXO vs. Thomson Reuters Corp., et al.*, 6:2009-cv-00333 LED-JDL, 6:2010-cv-00247 LED-JDL, 6.
Defendant Bloomberg L.P.'s Invalidity Contentions Pursuant to Patent Local Rule 3-3 Regarding U.S. Pat. No. 7,777,651, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 21 pages.
Appendix G: U.S. Pat. No. 7,777,651 (The 651 Patent), Defendant Bloomberg L.P.'s Invalidity Contentions Pursuant to Patent Local Rule 3-3 Regarding U.S. Pat. No. 7,777,651, *Realtime Data, LLC D/B/A IXO vs. Thomson Reuters Corp., et al.*, 6:2009-cv-00333 LED-JDL, 6:2010-cv-00247 LED-JDL, 6:2010-cv-00425 LED-JDL, Feb. 4, 2011, 480 pages.
Rice, Robert F., "Some Practical Universal Noiseless Coding Techniques", Jet Propulsion Laboratory, Pasadena, California, JPL Publication 79-22, Mar. 15, 1979; 140 pgs.
Anderson, J., et al. "Codec squeezes color teleconferencing through digital telephone lines," Electronics 1984, pp. 13-15.
Venbrux, Jack, "A VLSI Chip Set for High-Speed Lossless Data Compression", IEEE Trans. on Circuits and Systems for Video Technology, vol. 2, No. 4, Dec. 1992, pp. 381-391.
"Fast Dos Soft Boot", IBM Technical Disclosure Bulletin, Feb. 1994, vol. 37, Issue No. 2B, pp. 185-186.
"Operating System Platform Abstraction Method", IBM Technical Disclosure Bulletin, Feb. 1995, vol. 38, Issue No. 2, pp. 343-344.
Murashita, K., et al., "High-Speed Statistical Compression using Self-Organized Rules and Predetermined Code Tables", IEEE, 1996 Data Compression Conference.
Coene, W., et al. "A Fast Route for Application of Rate-distortion Optimal Quantization in an MPEG Video Encoder" Proceedings of the International Conference on Image Processing, US., New York, IEEE, Sep. 16, 1996, pp. 825-828.
Rice, Robert, "Lossless Coding Standards for Space Data Systems", IEEE 1058-6393197, Nov. 3-6, 1996, pp. 577-585.
Millman, Howard, "Image and video compression", Computerworld, vol. 33, Issue No. 3, Jan. 18, 1999, pp. 78.
"IBM boosts your memory", Geek.com [online], Jun. 26, 2000 [retrieved on Jul. 6, 2007, www.geek.com/ibm-boosts-your-memory/, 7 pages.
"IBM Research Breakthrough Doubles Computer Memory Capacity", IBM Press Release [online], Jun. 26, 2000 [retrieved on Jul. 6, 20071, www-03.ibm.com/press/us/en/pressrelease/1653.wss, 3 pages.
"ServerWorks to Deliver IBM's Memory expansion Technology in Next-Generation Core Logic for Servers", ServerWorks Press Release [online], Jun. 27, 2000 [retrieved on Jul. 14, 20001, http://www.serverworks.com/news/press/000627.html, 1 page.
Abali, B., et al., "Memory Expansion Technology (MXT) Software support and performance", IBM Journal of Research and Development, vol. 45, Issue No. 2, Mar. 2001, pp. 287-301.
Franaszek, P. A., et al., "Algorithms and data structures for compressed-memory machines", IBM Journal of Research and Development, vol. 45, Issue No. 2, Mar. 2001, pp. 245-258.
Franaszek, P. A,, et al., "On internal organization in compressed random-access memories", IBM Journal of Research and Development, vol. 45, Issue No. 2, Mar. 2001, pp. 259-270.
Smith, T.B., et al., "Memory Expansion Technology (MXT) Competitive impact", IBM Journal of Research and Development, vol. 45, Issue No. 2, Mar. 2001, pp. 303-309.

(56) References Cited

OTHER PUBLICATIONS

Tremaine, R. B., et al., "IBM Memory Expansion Technology (MXT)", IBM Journal of Research and Development, vol. 45, Issue No. 2, Mar. 2001, pp. 271-285.
Yeh, Pen-Shu, "The CCSDS Lossless Data Compression Recommendation for Space Applications", Chapter 16, Lossless Compression Handbook, Elsevier Science (USA), 2003, pp. 311-326.
Expand Networks Accelerator 4000 Series User's Guide, 1999, 101 pgs.
Tridgell, Andrew; "Efficient Algorithms for Sorting and Synchronization"; A thesis submitted for the degree of Doctor of Philosophy at the Australian National University; Feb. 1999; pp. iii-106.
Jung, et al.; "Performance optimization of wireless local area networks through VLSI data compression"; Wireless Networks, vol. 4, 1998; pp. 27-39.
Baker, K. et al., "Lossless Data Compression for Short Duration 3D Frames in Positron Emission Tomography," 0/7803-1487, May 1994, pp. 1831-1834.
Maier, Mark W.; "Algorithm Evaluation for the Synchronous Data Compression Standard"; University of Alabama: 1995, pp. 1-10.
Bassiouni, et al.; "A Scheme for Data Compression in Supercomputers"; IEEE; 1988; pp. 272-278.
Welch, Terry A.; "A Technique for High-Performance Data Compression"; IEEE; Jun. 1984; pp. 8-19.
ALDC: Adaptive Lossless Data Compression; IBM; 1994, 2 pgs.
ALDC-Macro: Adaptive Lossless Data Compression; IBM Corporation; 1994, 2 pgs.
ALDC1-20S: Adaptive Lossless Data Compression; IBM Corporation; 1994, 2 pgs.
ALDC1-40S: Adaptive Lossless Data Compression; IBM Corporation; 1994, 2 pgs.
ALDC1-5S: Adaptive Lossless Data Compression; IBM Corporation; 1994, 2 pgs.
Craft, David J.; "Data Compression Choice No Easy Call"; Computer Technology Review; vol. XIV, No. 1; Jan. 1994, 2 pgs.
Costlow, Terry; "Sony designs faster, denser tape drive"; Electronic Engineering Times; May 20, 1996, pp. 86-87.
Wilson, Ron; "IBM ups compression ante"; Electronic Engineering Times; Aug. 16, 1993; pp. 1-94.
"IBM Announces New Feature for 3480 Subsystem"; Tucson Today; vol. 12, No. 337, Jul. 25, 1989, 1 pg.
Syngress Media, Inc.; "CCA Citrix Certified Administrator for MetaFrame 1.8 Study Guide"; 2000, 568 pgs.
International Telecommunication Union; "Data Compression Procedures for Data Circuit Terminating Equipment (DCE) Using Error Correction Procedures"; Geneva, 1990, 29 pgs.
Cheng, et al.; "A fast, highly reliable data compression chip and algorithm for storage systems"; IBM J. Res. Develop.; vol. 40, No. 6, Nov. 1996; pp. 603-613.
Cisco Systems; "Cisco IOS Data Compression"; 1997; pp. 1-10.
Craft, D. J.; "A fast hardware data compression algorithm and some algorithmic extensions"; IBM J. Res. Develop.; vol. 42; No. 6; Nov. 6, 1998; pp. 733-746.
Rustici, Robert; "Enhanced CU-SeeMe" 1995, Zero in Technologies, Inc., 308 pgs.
White Pine Software; "CU-SeeMe Pro: Quick Start Guide"; Version 4.0 for Windows; 1999, 86 pgs.
"CU-SeeMe Reflector"; www.geektimes.com/michael/CU-SeeMe/faqs/reflectors.html; accessed on Dec. 2, 2008, 5 pgs.
Daniels, et al.; "Citrix WinFrame 1.6 Beta"; May 1, 1996; license. icopyright.net/user/downloadLicense.act?lic=3.7009-9123; accessed Dec. 2, 2008, 4 pgs.
Held, et al.; "Data Compression"; Third Edition; John Wiley & Sons Ltd.; 1991, 150 pgs.
Data Compression Applications and Innovations Workshop; Proceedings of a Workshop held in Conjunction with the IEEE Data Compression Conference; Snowbird, Utah; Mar. 31, 1995, 64 pgs.
Britton, et al.; "Discovery Desktop Conferencing with NetMeeting 2.0"; IDG Books Worldwide, inc.; 1997, 244 pgs.

Sattler, Michael; "Internet TV with CU-SeeMe"; Sams.Net Publishing; 1995; First Edition, 80 pgs.
IBM Microelectronics Comdex Fall '93 Booth Location, 1 pg.
Disz, et al.; "Performance Model of the Argonne Voyager Multimedia Sewer"; IEEE; 1997; pp. 316-327.
"Downloading and Installing NetMeeting"; www.w4mq.comlhelplh3.htm; accessed on Dec. 2, 2008; 6 pgs.
Fox, et al.; "Adapting to Network and Client Variability via On-Demand Dynamic Distillation"; ASPLOS VII; Oct. 1996; pp. 160-170.
Fox, et al.; "Adapting to Network and Client Variation Using Infrastructural Proxies: Lessons and Perspectives"; IEEE Personal Communications, Aug. 1998; pp. 10-19.
Han, et al.; "CU-SeeMe VR Immersive Desktop Teleconferencing"; Department of Computer Science; Cornell University; To appear in ACM Multimedia 1996, 9 pgs.
Howard, et al.; "Parallel Lossless Image Compression Using Huffman and Arithmetic Coding"; 1992; pp. 1-9.
Howard, Paul G.; "Text Image Compression Using Soft Pattern Matching"; The Computer Journal; vol. 40, No. 213; 1997; pp. 146-156.
Howard, et al.; "The Emerging JBIG2 Standard"; IEEE Transactions on Circuits and Systems for Video Technology, vol. 8, No. 7, Nov. 1998; pp. 838-848.
Craft, D. J.; "A fast hardware data compression algorithm and some algorithmic extensions"; Journal of Research and Development; vol. 42, No. 6, Nov. 1998; pp. 733-745.
"Direct Access Storage Device Compression and Decompression Data Flow"; IBM Technical Disclosure Bulletin; vol. 38, No. 11; Nov. 1995; pp. 291-295.
ICA Timeline, Sep. 24, 2007, 3 pgs.
Converse, et al.; "Low Bandwidth X Extension"; Protocol Version 1 .O; X Consortium; Dec. 21, 1996, 55 pgs.
Magstar and IBM 3590 High Performance Tape Subsystem Technical Guide; Nov. 1996; IBM International Technical Support Organization, 288 pgs.
MetaFrame Administration Student Workbook; Jun. 1998; Citrix Professional Courseware; Citrix Systems, Inc, 113 pgs.
NCD Wincenter 3.1 : Bringing Windows to Every Desktop, 1998; 2 pgs.
Overview NetMeeting 2.1; Microsoft TechNet; technet.microsoft.com1en-usllibrary1cc767141 (printer).aspx; accessed Dec. 2, 2008; 7 pgs.
NetMeeting 2.1 Resource Kit; Microsoft TechNet; technet.microsoft.com1en-usllibrary1cc767142(printer).aspx; accessed on Dec. 2, 2008, 34 pgs.
Conferencing Standards: NetMeeting 2.1 Resource Kit: Microsoft TechNet; technet.microsoft.com/--us/library/cc767150(printer).aspx; accessed Dec. 2, 2008, 14 pgs.
Summers, Bob; "Official Microsoft NetMeeting Book," Microsoft Press, 1998, 374 pgs.
Zebrose, Katherine L.; "Integrating Hardware Accelerators into Internetworking Switches"; Telco Systems, 1995, 10 pages.
Simpson, et al.; "A Multiple Processor Approach to Data Compression"; ACM; 1998; pp. 641-649, 9 pgs.
"IBM Technology Products Introduces New Family of High-Performance Data Compression Products"; IBM; Aug. 16, 1993, 6 pgs.
ReadMe; PowerQuest Drive Image Pro; Version 3.00; 1994-1999; PowerQuest Corporation; p. 1-6.
Schulzrinne, et al., "RTP Profile for Audio and Video Conferences with Minimal Control," Jan. 1996, www.ietf.org/rfc/rfc1890.txt, accessed on Dec. 3, 2008; 17 pgs.
Zhu, C., "RTP Payload Format for H.263 Video Streams," Standards Track, Sep. 1997, pp. 1-12.
Simpson, W., "The Point-To-Point Protocol (PPP)," Standards Track, Jul. 1994, pp. i-52.
Reynolds, et al., "Assigned Numbers," Standards Track, Oct. 1994, pp. 1-230.
Deutsch, et al., "ZLIB Compressed Data Format Specification version 3.3," Informational, May 1996, pp. 1-10.
Deutsch, P., "DEFLATE Compressed Data Format Specification version 1.3," Informational, May 1996, pp. 1-15.

(56) References Cited

OTHER PUBLICATIONS

Rand, D., "The PPP Compression Control Protocol (CCP)," Standards Track, Jun. 1996, pp. 1-9.
Schneider, et al., "PPP LZS-DCP Compression Protocol (LZS-DCP)," Informational, Aug. 1996, pp. 1-18.
Friend, et al., "PPP Stac LZS Compression Protocol," Informational, Aug. 1996; pp. 1-20.
Schneider, et al., "PPP for Data Compression in Data Circuit-Terminating Equipment (DCE)," Informational, Aug. 1996, pp. 1-10.
Atkins, et al., "PGP Message Exchange Formats," Informational, Aug. 1996, pp. 1-21.
Castineyra, et al., "The Nimrod Routing Architecture," Informational, Aug. 1996, pp. 1-27.
Freed, et al., "Multipurpose Internet Mail Extensions (MIME) Part Four: Registration Procedures," Best Current Practice, Nov. 1996, pp. 1-21.
Shacham, et al., "IP Payload Compression Protocol (IPComp)," Standards Track, Dec. 1998, pp. 1-10.
Sidewinder 50 Product Manual, Seagate Technology, Inc., 1997, 189 pgs.
IBM RAMAC Virtual Array, IBM, Jul. 1997, 490 pgs.
Bruni, et al., "DB2 for OS/390 and Data Compression" IBM Corporation, Nov. 1998, 172 pgs.
Smith, Mark, "Thin Client/Server Computing Works," WindowsITPro, Nov. 1, 1998, pp. 1-13, license.icopyright.net/user/downloadLicense.act?lic=3.7009-8355, accessed Dec. 2, 2008.
International Telecommunication Union, "Information Technology—Digital Compression and Coding of Continuous-Tone Still Images-Requirements and Guidelines," 1993, 186 pgs.
International Telecommunications Union, "Information technology—Lossless and near-lossless compression of continuous-tone still images—Baseline," 1999, 75 pgs.
Davis, Andrew W., "The Video Answering Machine: Intel Proshare's Next Step," Advanced Imaging, vol. 12, No. 3, Mar. 1997, pp. 28, 30.
Abbott, III1, Walter D., "A Simple, Low Overhead Data Compression Algorithm for Converting Lossy Compression Processes to Lossless," Naval Postgraduate School Thesis; Dec. 1993, 93 pgs.
Thomborson. Clark, "V.42bis and Other Ziv-Lemoel Variants," IEEE, 1991, p. 460.
Thomborson, Clark, "The V.42bis Standard for Data-Compressing Modems," IEEE, Oct. 1992, pp. 41-53.
Sun, Andrew, "Using and Managing PPP," O'Reilly & Associates, Inc., 1999, 89 pgs.
"What is the V42bis Standard?," www.faqs.org/faqs/compression-faq/part1/section-10.html, accessed on Dec. 2, 2008, 2 pgs.
"The WSDC Download Guide: Drive Image Professional for DOS, OS/2, and Windows," wsdcds01 .watson.ibm.com/WSDC.nsf/Guides/Download/Applications-DriveImage.htm, Accessed Nov. 22, 1999, 4 pgs.
"The WSDC Download Guide: Drive Image Professional," wsdcds01.watson.ibm.com/wsdc.nsf/Guides/Download/Applications-DriveImage.htm, accessed on May 3, 2001, 5 pgs.
APPNOTE-TXT from pkware.txt, Version 6.3.2, PKWARE Inc., 1989, 52 pgs.
CU-SeeMe readme.txt, Dec. 2, 1995, 9 pgs.
CU-seeme txt from indstate.txt, Readme.Txt for CU-SeeMe version 0.90b1, Mar. 23, 1997, 5 pgs.
Cuseeme txt 19960221 .txt; Cuseeme.Txt, Feb. 21, 1996, 9 pgs.
Citrix Technology Guide, 1997, 413 pgs.
Lettieri, et al., "Data Compression in the V.42bis Modems," 1992, pp. 398-403.
High Performance x2/V.34+N.42bis 56K BPS Plug & Play External Voice/FAX/Data Modem User's Manual, 1997, 27 pgs.
H.323 Protocols Suite, www.protocols.com/pbook~h323.htm, 26 pages (referenced in Expert Report of Dr. James A. Storer on Invalidity filed on behalf of some of the defendants, filed in *Realtime Data, LLC D/B/A IXO v. Packeteer, Inc. et al.*, Civil Action No. 6:08-cv-00144-LED, U.S. District Court for the Eastern District of Texas, Jun. 10, 2009, and indicated as being last accessed in 2008, see e.g., Exhibit E, p. 12).
LBX X Consortium Algorithms; rzdocs.uni-hohenheim.de/aix~4.33/ext~doc/usr/share/man/info/en~US/a~do~lib./.x."1;1 X I 1R 6 Technical Specifications, Dec. 1996, 3 pgs.
Basics of Images; www.geom.uiuc.edu/events/courses/1996/cmwh/Stills/basics.html, 1996, 5 pgs.
Parties' Joint Claim Construction and Prehearing Statement Pursuant to P.R. 4-3, filed in *Realtime Data, LLC D/B/A/IXO v. Packeteer, Inc. et al.*, Civil Action No. 6:08-cv-00144-LED; U.S. District Court for the Eastern District of Texas, Feb. 18, 2009, 168 pages.
Declaration of Professor James A. Storer, Ph.D., relating to U.S. Pat. No. 6,604,158, Mar. 18, 2009, 10 pgs.
Declaration of Professor James A. Storer, Ph.D., relating to U.S. Pat. No. 6,601,104, Mar. 18, 2009, 8 pgs.
Declaration of Professor James A. Storer, Ph.D., relating to U.S. Pat. No. 7,321,937, May 4, 2009, 15 pgs.
Declaration of Professor James A. Storer, Ph.D., relating to U.S. Pat. No. 6,624,761, May 4, 2009, 6 pgs.
Declaration of Professor James A. Storer, Ph.D., relating to U.S. Pat. No. 7,378,992, May 20, 2009, 6 pgs.
Declaration of Professor James A. Storer, Ph.D., relating to U.S. Pat. No. 7,161,506, May 26, 2009, 5 pgs.
"Video Coding for Low Bit Rate Communication", International Telecommunication Union (ITU), Recommendation H.263, §3.4 (Mar. 1996) ("ITU H.263"), 52 pgs.
Order Adopting Report and Recommendation of United States Magistrate Judge, *Realtime Data, LLC D/B/A IXO v. Packeteer, Inc., et al.*, District Court for the Eastern District of Texas, No. 6:08cv144, Aug. 24, 2009, 2 pgs.
Second Amended Answer filed on behalf of Citrix Systems, Inc, (includes allegations of inequitable conduct on at least pp. 24-43) filed in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 45 pgs.
Expert Report of James B. Gambrell on Inequitable Conduct filed on behalf of some of the defendants [Includes Appendices—Exhibits A-I] filed in *Realtime Data, LLC d/b/a/IXO v. Packeteer, Inc. et al.*, Civil Action No. 6:08-cv-00144-LED; U.S. District Court for the Eastern District of Texas, Jun. 10, 2009, 199 pgs.
Expert Report of Dr. James A. Storer on Invalidity filed on behalf of some of the defendants [Includes Appendices—Exhibits A-K (Exhibit A has been redacted pursuant to a protective order)] filed in *Realtime Data, LLC d/b/a IXO v. Packeteer, Inc. et al.*, Civil Action No. 6:08-cv-00144-LED; U.S. District Court for the Eastern District of Texas, Jun. 10, 2009, 1090 pgs.
Supplemental Expert Report of Dr. James A. Storer on Invalidity filed on behalf of some of the defendants [Includes Appendices—Exhibits 1-8] filed in *Realtime Data, LLC d/b/a/IXO v. Packeteer, Inc. et al.*, Civil Action No. 6:08-cv-00144-LED; U.S. District Court for the Eastern District of Texas, Jun. 19, 2009, 301 pgs.
Deposition of Dr. James A. Storer conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 27, 2009, 242 pgs.
Deposition of Brian Von Herzen conducted on behalf of the plaintiffs filed in *Realtime Data, LLC d/b/a/IXO v. Packeteer, Inc. et al.*, Civil Action No. 6:08-cv-00144-LED; U.S. District Court for the Eastern District of Texas, Feb. 26, 2009, 241 pgs.
Second Amended Complaint filed on behalf of the Plaintiff in *Realtime Data, LLC d/b/a/IXO v. Packeteer, Inc. et al.*, Civil Action No. 6:08-cv-00144-LED; U.S. District Court for the Eastern District of Texas, Feb. 10, 2009, 28 pgs.
Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 46 pgs.
Answers to the Second Amended Complaint and Counterclaims filed by F5 Networks, Inc, in *Realtime Data, LLC d/b/a/IXO v.*

(56) References Cited

OTHER PUBLICATIONS

*Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 17 pgs.
Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 37 pgs.
Answers to the Second Amended Complaint and Counterclaims filed by Expand Networks, Inc, Interstate Battery System of America, Inc., and O'Reilly Automotive, Inc. in *Realtime Data, LLC d/b/a/IXO v. Packeteer, Inc. et al.*, Civil Action No. 6:08-cv-00144-LED; U.S. District Court for the Eastern District of Texas, Feb. 17, 2009, 21 pgs.
Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Feb. 18, 2009, 84 pgs.
Plaintiffs Response to the Answers to the Second Amended Complaint and Counterclaims filed by Citrix Systems, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 24 pgs.
Plaintiff's Responses to the Answers to the Second Amended Complaint and Counterclaims filed by F5 Networks, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by Averitt Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 5 pgs.
Plaintiff's Responses to the Answers to the Second Amended Complaint and Counterclaims filed by DHL Express, Inc, in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 17 pgs.
Plaintiff's Responses to the Answers to the Second Amended Complaint and Counterclaims filed by Expand Networks, Inc, Interstate Battery System of America, Inc., and O'Reilly Automotive, Inc. in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 15 pgs.
Plaintiff's Responses to the Answers to the Second Amended Complaint and Counterclaims filed by Blue Coat Systems, Inc., Packeteer, Inc., 7-Eleven, Inc., ABM Industries, Inc., ABM Janitorial Services-South Central, Inc., and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 4, 2009, 34 pgs.
Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 5, 2009, 36 pgs.
Declaration of Jordan Adler in support of the Opening Claim Construction Brief filed in *Realtime Data, LLC d/b/a/IXO v. Packeteer, Inc. et al.*, Civil Action No. 6:08-cv-00144-LED; U.S. District Court for the Eastern District of Texas, Mar. 5, 2009, 214 pgs.
Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 22 pgs.
Declaration of Michele E. Moreland in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 168 pgs.
Declaration of James A. Storer in support Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Mar. 16, 2009, 27 pgs.
Joint Defendants Reply regarding Motion for Partial Summary Judgment for Invalidity of some of the Patents in Suit for Indefiniteness, including the '104 patent, filed on behalf of the defendants in *Realtime Data, LLC d/b/a/IXO v. Packeteer, Inc. et al.*, Civil Action No. 6:08-cv-00144-LE, Apr. 2, 2009, 20 pgs.
Responsive Briefs in Support of Claim Construction filed by Blue Coats Systems, Inc., Packeteer, Inc., 7-Eleven, Inc., ABM Industries, Inc., ABM Janitorial Services-South Central, Inc. and Build-A-Bear Workshop, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 451 pgs.
Responsive Briefs in Support of Claim Construction filed by F5 Networks, Inc. and Averitt Express, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 20 pgs.
Responsive Briefs in Support of Claim Construction filed by Citrix Systems, Inc., Expand Networks, Inc., DHL Express (USA), Inc., Interstate Battery System of America, Inc., and O'Reilly Automotive Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 377 pgs.
Declaration of Dr. James A. Storer filed in Support of the Brief in Support of Claim Construction filed on behalf of F5 Networks, Inc. in *Realtime Data, LLC d/b/a/IXO v. Packeteer, Inc. et al.*, Civil Action No. 6:08-cv-00144-LED; U.S. District Court for the Eastern District of Texas, Mar. 19, 2009, 778 pgs.
Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Mar. 20, 2009, 244 pgs.
Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 20 pgs.
Declaration of Karim Oussayef submitted in support of the Opposition of Plaintiff's Opposition to Defendant Citrix Systems, Inc.'s Motion to Exclude Dr. Brian Von Herzen's Opinions Regarding Claim Construction filed in *Realtime Data, LLC d/b/a/IXO v. Packeteer, Inc. et al.*, Civil Action No. 6:08-cv-00144-LED; U.S. District Court for the Eastern District of Texas, Apr. 6, 2009, 119 pgs.
Order of the Court Denying Defendant Citrix Systems, Inc.'s Motion to Exclude Dr. Brian Von Herzen's Opinions Regarding Claim Construction, *Realtime Data, LLC D/B/A Ixo v. Packeterr, Inc., et al.*, District COurt for the Eastern District of Texas, No. 6:08cv144, Apr. 6, 2009, 1 pg.
Parties Joint Submission of Terms to be Heard at the Markman Hearing filed in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 5 pgs.
Order of the Court Regarding the terms to be heard at the Markman Hearing in *Realtime Data, LLC d/b/a/IXO v. Packeteer, Inc. et al.*, Civil Action No. 6:08-cv-00144-LED; U.S. District Court for the Eastern District of Texas, Mar. 24, 2009, 2 pgs.

(56) References Cited

OTHER PUBLICATIONS

Transcript of the Markman Hearing held on Apr. 9, 2009 in *Realtime Data, LLC d/b/a/IXO* v. *Packeteer, Inc. et al.*, Civil Action No. 6:08-cv-00144-LED; U.S. District Court for the Eastern District of Texas, 174 pgs.
Plaintiff's Reply Claim Construction Brief filed in *Realtime Data, LLC d/b/a/IXO* v. *Packeteer, Inc. et al.*, Civil Action No. 6:08-cv-00144-LED; U.S. District Court for the Eastern District of Texas, Mar. 30, 2009, 30 pgs.
Declaration of Brian von Herzen in Support of the Plaintiff's Reply Claim Construction Brief filed in *Realtime Data, LLC d/b/a/IXO* v. *Packeteer, Inc. et al.*, Civil Action No. 6:08-cv-00144-LED; U.S. District Court for the Eastern District of Texas, Mar. 30, 2009, 25 pgs.
F5 Sur-Reply to Plaintiff's Claim Construction Brief filed by some of the defendants in *Realtime Data, LLC d/b/a/IXO* v. *Packeteer, Inc. et al.*, Civil Action No. 6:08-cv-00144-LED; U.S. District Court for the Eastern District of Texas, Apr. 3, 2009, 12 pg.
Citrix Sur-Reply to Plaintiff's Claim Construction Brief filed by some of the defendants in *Realtime Data, LLC d/b/a/IXO* v. *Packeteer, Inc. et al.*, Civil Action No. 6:08-cv-00144-LED; U.S. District Court for the Eastern District of Texas, Apr. 3, 2009, 13 pgs.
Blue Coat Sur-Reply to Plaintiff's Claim Construction Brief filed by some of the defendants in *Realtime Data, LLC d/b/a/IXO* v. *Packeteer, Inc. et al.*, Civil Action No. 6:08-cv-00144-LED; U.S. District Court for the Eastern District of Texas, Apr. 3, 2009, 12 pgs.
Declaration of Michele Moreland in Support of Sur-Replies to Plaintiff's Claim Construction Brief filed by some of the defendants in *Realtime Data, LLC d/b/a/IXO* v. *Packeteer, Inc. et al.*, Civil Action No. 6:08-cv-00144-LED; U.S. District Court for the Eastern District of Texas, Apr. 3, 2009, 8 pgs.
Declaration of James Storer in Support of Sur-Replies to Plaintiff's Claim Construction Brief filed by some of the defendants in *Realtime Data, LLC d/b/a/IXO* v. *Packeteer, Inc. et al.*, Civil Action No. 6:08-cv-00144-LED; U.S. District Court for the Eastern District of Texas, Apr. 7, 2009, 6 pgs.
Plaintiff's Motion for Leave to Supplement the Parties' Joint Claim Construction and Prehearing Statement filed in *Realtime Data, LLC d/b/a/IXO* v. *Packeteer, Inc. et al.*, Civil Action No. 6;08-cv-00144-LED; U.S. District Court for the Eastern District of Texas, Apr. 8, 2009, 123 pgs.
Motion for Reconsideration of the Court's Order Denying Plaintiff's Motion for Leave to Supplement the Parties' Joint Claim Construction and Prehearing Statement filed in *Realtime Data, LLC d/b/a/IXO* v. *Packeteer, Inc. et al.*, Civil Action No. 6:08-cv-00144-LED; U.S. District Court for the Eastern District of Texas, Jul. 13, 2009, 3 pgs.
Citrix Systems' Opposition to Realtime Data's Motion for Reconsideration of Realtime's Motion for Leave to Supplement the Parties' Joint Claim Construction, filed in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 6 pgs.
Notice of Agreement to Claim Term between Plaintiff and Defendant filed in *Realtime Data, LLC d/b/a/IXO* v. *Packeteer, Inc. et al.*, Civil Action No. 6:08-cv-00144-LED; U.S. District Court for the Eastern District of Texas, Apr. 22, 2009, 3 pgs.
Provisional Claim Construction Order issued by the Court on Jun. 2, 2009 in *Realtime Data, LLC d/b/a/IXO* v. *Packeteer, Inc. et al.*, Civil Action No. 6:08-cv-00144-LED; U.S. District Court for the Eastern District of Texas, 28 pgs.
Citrix Request for Consideration and Objections to the Provisional Claim Construction Order issued by the Court on Jun. 22, 2009 filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas, Jul. 9, 2009, 22 pgs.
Blue Coat Request for Consideration and Objections to the Provisional Claim Construction Order issued by the Court on Jun. 22, 2009 filed on behalf of some of the defendants in *Realtime Data, LLC d/b/a/IXO* v. *Packeteer, Inc. et al.*, Civil Action No. 6:08-cv-00144-LED, U.S. District Court for the Eastern District of Texas, Jul. 10, 2009, 9 pgs.
F5 Request for Consideration and Objections to the Provisional Claim Construction Order issued by the Court on Jun. 22, 2009 filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas, Jul. 10, 2009, 15 pgs.
Comtech AHA Corporation's Complaint in Intervention against the Plaintiff filed in *Realtime Data, LLC d/b/a/IXO* v. *Packeteer, Inc. et al.*, Civil Action No. 6:08-cv-00144-LED; U.S. District Court for the Eastern District of Texas, Apr. 6, 2009, 8 pgs.
Report and Recommendation of United States Magistrate Judge on Motion for Partial Summary Judgment issued on Jun. 23, 2009, in *Realtime Data, LLC d/b/a/IXO* v. *Packeteer, Inc. et al.*, Civil Action No. 6:08-cv-00144-LED; U.S. District Court for the Eastern District of Texas, 22 pgs.
Blue Coat Defendants' Report and Recommendations Regarding Motion for Partial Summary Judgment of Invalidity for Indefiniteness in *Realtime Data, LLC d/b/a/IXO* v. *Packeteer, Inc. et al.*, Civil Action No. 6:08-cv-00144-LED; U.S. District Court for the Eastern District of Texas, Jul. 8, 2009, 18 pgs.
Plaintiff's Objections to and Partially Unopposed Motion for Reconsideration of United States Magistrate Judge's Claim Construction Memorandum and Order, in *Realtime Data, LLC d/b/a/IXO* v. *Packeteer, Inc. et al.*, Civil Action No. 6:08-cv-00144-LED; U.S. District Court for the Eastern District of Texas, Jul. 13, 2009, 11 pgs.
Defendant Citrix Opposition to Realtime's Objections to and Partially Unopposed Motion for Reconsideration of Magistrate Love's Claim Construction Memorandum and Order filed by Citrix Systems, Inc., filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 8 pgs.
Defendant F5 Networks, Inc.'s Opposition to Plaintiff's Objections and Partially Unopposed Motion for Reconsideration of Magistrate Judge Love's Claim Construction and Order, filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 4 pgs.
Defendants' Response in Opposition to Realtime Data's Objections to and Partially Unopposed Motion for Reconsideration of Magistrate Judge Love's Claim Construction Memorandum and Order, filed on behalf of some of the defendants in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 9 pgs.
Realtime Data's Response in Opposition to Defendant Citrix Systems Objections to and Request for Reconsideration of Magistrate's Order Regarding Claim Construction, in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 13 pgs.
Plaintiff Realtime Data's Response in Opposition to Blue Coat Defendants' Objection to Magistrate's Memorandum Opinion and Order Regarding Claim Construction, in *Realtime Data, LLC d/b/a/IXO* v. *Packeteer, Inc. et al.*, Civil Action No. 6:08-cv-00144-LED; U.S. District Court for the Eastern District of Texas, Jul. 27, 2009, 9 pgs.
Plaintiff's selected Responses to Defendant Citrix System's Interrogatories and First Set of Requests for Admission filed in *Realtime Data, LLC d/b/a/IXO* v. *Packeteer, Inc. et al.*, Civil Action No. 6:08-cv-00144-LED; U.S. District Court for the Eastern District of Texas, Jul. 15, 2009, 151 pgs.
Script for Defendants' Joint Claim Construction Technology Tutorial Presented to the Magistrate Judge in *Realtime Data, LLC d/b/a/IXO* v. *Packeteer, Inc. et al.*, Civil Action No. 6:08-cv-00144-LED; U.S. District Court for the Eastern District of Texas, filed on Apr. 18, 2008 and terminated Feb. 2, 95 pgs.
Preliminary Data Sheet, 9600 Data Compressor Processor, Hi/fn, 1997-99, HIFN 000001-68, 68 pgs.

(56) References Cited

OTHER PUBLICATIONS

Data Sheet, 9751 Data Compression Processor, 1997-99, HIFN 000069-187, 119 pgs.
Signal Termination Guide, Application Note, Hi/fn, 1997-98, HIFN 000188-194, 7 pgs.
How LZS Data Compression Works, Application Note, Hi/fn, 1997-99, HIFN 000195-207, 13 pgs.
Reference Hardware, 9751 Compression Processor, Hi/fn, 1997-99, HIFN 000208-221, 14 pgs.
Using 9751 in Big Endian Systems, Application Note, Hi/fn, 1997-99, HIFN 000222-234, 13 pgs.
Specification Update, 9751 Compression Processor, Hi/fn, 1997-2000, HIFN 000235-245, 11 pgs.
9732AM Product Release, Hi/fn, 1994-99, HIFN 000246-302, 57 pgs.
Data Sheet, 9732A Data Compression Processor, Hi/fn, 1997-99, HIFN 000303-353, 51 pgs.
9711 to 7711 Migration, Application Note, Hi/fn, 1997-99, HIFN 000354-361, 8 pgs.
Specification Update, 9711 Data Compression Processor, Hi/fn, 1997-99, HIFN 000362-370, 9 pgs.
Differences Between the 9710 & 9711 Processors, Application Note, Hi/fn, 1997-99, HIFN 000371-77, 7 pgs.
Specification Update, 9710 Data Compression Processor, Hi/fn, 1997-99, HIFN 000378-388, 11 pgs.
9706/9706A Data Compression Coprocessor Data Sheet, Stac Electronics, 1991-97, HIFN 000389-473, 85 pgs.
9705/9705A Data Compression Coprocessor, Stac Electronics, 1988-96, HIFN 000474-562, 88 pgs.
9705/9705A Data Compression Coprocessor Data Sheet, Stac Electronics, 1988-96, HIFN 000563-649, 87 pgs.
9700/9701 Compression Coprocessors, Hi/fn, 1997, HIFN 000650-702, 53 pgs.
Data Sheet 9610 Data Compression Processor, Hi/fn, 1997-98, HIFN 000703-744, 42 pgs.
Specification Update 9610 Data Compression Processor, Hi/fn, 1997-99, HIFN 000745-751, 7 pgs.
9705 Data Compression Coprocessor, Stac Electronics, 1988-92, HIFN 000752-831, 80 pgs.
9705 Network Software Design Guide, Application Note, Stac Electronics, 1990-91, HIFN 000832-861, 30 pgs.
Data Sheet 9601 Data Compression Processor, Hi/fn, May 21, 1998, HIFN 000862-920, 59 pgs.
7751 Encryption Processor Reference Kit, Hi/fn, Apr. 1999, HIFN 000921-1114, 194 pgs.
Hardware Data Book, Hi/fn, Nov. 1998, HIFN 001115-1430, 316 pgs.
Data Compression Data Book, Hi/fn, Jan. 1999, HIFN 001431-1889, 459 pgs.
Reference Software 7751 Encryption Processor, Hi/fn, Nov. 1998, HIFN 002164-2201, 38 pgs.
Interface Specification for Synergize Encoding/Decoding Program, JPB, Oct. 10, 1997, HIFN 002215-2216, 2 pgs.
Anderson, Chip, Extended Memory Specification Driver, 1998, HIFN 002217-2264, 48 pgs.
Whiting, Doug, LZS Hardware API, Mar. 12, 1993, HIFN 002265-68, 4 pgs.
Whiting, Doug, Encryption in Sequoia, Apr. 28, 1997, HIFN 002309-2313, 5 pgs.
LZS221-C Version 4 Data Compression Software, Data Sheet, Hi/fn, 1994-97, HIFN 002508-2525, 18 pgs.
EXtended Memory Specification (XMS), ver. 2.0, Microsoft, Jul. 19, 1988, HIFN 002670-2683, 14 pgs.
King, Stanley, Just for Your Info—From Microsoft 2, May 4, 1992, HIFN 002684-2710, 27 pgs.
EXtended Memory Specification (XMS), ver. 2.0, Microsoft, Jul. 19, 1988, HIFN 002711-2724, 14 pgs.
Advanced LZS Technology (ALZS), Whitepaper, Hi/fn, Jun. 1, 1998, HIFN 002725-2727, 3 pgs.
Secure Tape Technology (STT) Whitepaper, Hi/fn, Jun. 1, 1998, HIFN 002728-2733, 6 pgs.
SSLRef 3.0 API Details, Netscape, Nov. 19, 1996, HIFN 002734-2778, 45 pgs.
LZS221-C Version 4 Data Compression Software Data Sheet, Hi/fn, 1994-97, HIFN 002779-2796, 18 pgs.
MPPC-C Version 4 Data Compression Software Data Sheet, Hi/fn, 1994-1997, HIFN 002797-2810, 14 pgs.
Magstar MP Hardware Reference B Series Models Document GA32-0365-01, 1996-1997, [IBM_1_601 pp. 1-338], 338 pages.
Magstar MP 3570 Tape Subsystem, Operator Guide, B-Series Models, 1998-1999, [IBM_1_601 pp. 339-525], 188 pages.
Preview, IBM Magstar 3590 Tape System Enhancements, Hardware Announcement, Feb. 16, 1999, [IBM_1_601 pp. 526-527], 2 pgs.
New IBM Magstar 3590 Models E11 and E1A Enhance Tape Drive Performance, Hardware Announcement, Apr. 20, 1999, [IBM_1_601 pp. 528-540] 13 pgs.
New IBM Magstar 3590 Model A60 Dramatically Enhances Tape Drive Performance, Hardware Announcement Jul. 27, 1999, [IBM_1_601 pp. 541-550] 10 pgs.
The IBM Magstar MP Tape Subsystem Provides Fast Access to Data, Sep. 3, 1996, Announcement No. 196-176, [IBM_1_601 pp. 551-563] 13 pgs.
IBM 3590 High Performance Tape Subsystem, Apr. 10, 1995, Announcement 195-106, [IBM_1_601 pp. 564-581] 18 pgs.
Standard ECMA-222 (Jun. 1995): ECMA—Standardizing Information and Communications Systems, Adaptive Lossless Data Compression Algorithm, [IBM_1_601 pp. 582-601] 20 pgs.
IBM 3590 and 3494 Revised Availability, Hardware Announcement Aug. 8, 1995, [IBM_743_1241 p. 1] 1 pg.
Direct Delivery of IBM 3494, 3466, and 3590 Storage Products, Hardware Announcement, Sep. 30, 1997, Announcement 197-297, [IBM_743_1241 pp. 2-3] 2 pgs.
IBM Magstar 3590 Enhances Open Systems, Hardware Announcement Feb. 9, 1996, Announcement 198-014, [IBM_743_1241 pp. 4-7] 4 pgs.
Hardware Withdrawal: IBM Magstar 3590 A00 Controller—Replacement Available, Announcement No. 197-267, Withdrawal Announcement, Dec. 9, 1997, [IBM_743_1241 p. 9] 1 pg.
IBM Magstar 3590 Tape Subsystem, Introduction and Planning Guide, Document No. GA32-0329007, [IBM_743_1241 pp. 10-499] 490 pgs.
NetMeeting 2.0 Reviewers Guide, Apr. 1997, [MSCS_298_339] 42 pgs.
Microsoft NetMeeting Compatible Products and Services Directory, Apr. 1997, [MSCS_242_297] 56 pgs.
Microsoft NetMeeting "Try This!" Guide, 1997, [MSCS_340_345] 6 pgs.
The Professional Companion to NetMeeting 2—The Technical Guide to Installing, Configuring, and Supporting NetMeeting 2.0 in Your Organization—Microsoft NetMeeting 2.0, 1996-97, [MSCS_2_241] 240 pgs.
CUSeeMe 3.1.2 User Guide, Nov. 1998, [RAD_1_220] 220 pgs.
MeetingPoint Conference Sewer Users Guide 3.0, Nov. 1997, [RAD_221_548] 328 pgs.
MeetingPoint Conference Sewer Users Guide 4.0.2, Dec. 1999, [RAD_549_818] 270 pgs.
MeetingPoint Conference Service Users Guide 3.5.1, Dec. 1998, [RAD_819_1062] 244 pgs.
Enhanced CUSeeMe—Authorized Guide, 1995-1996, [RAD_1063_1372] 310 pgs.
Meeting Point Reader File, Jun. 1999, [RAD_1437_1445] 9 pgs.
Press Release—White Pine Announces Launch of MeetingPoint Conferences Server, Oct. 9, 1997, [RAD_1738_1739] 2 pgs.
Press Release—Leading Network Service Providers Line Up to Support White Pine's MeetingPoint Conference Server Technology, Oct. 9, 1997, [RAD_1740_1743] 4 pgs.
BYTE—A New MeetingPoint for Videoconferencing, Oct. 9, 1997, [RAD_1744_1750] 7 pgs.
Declaration of Patrick Gogerty, *Realtime Data, LLC D/B/A Ixo v. Packeteer, Inc., et al.*, District Court for the Eastern District of Texas, No. 6:08cv144, executed May 8, 2009, 3 pgs.

(56) References Cited

OTHER PUBLICATIONS

Other Responses to Interrogatories, Requests for Admission, and Objections to Requests for Admission filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Deposition Transcript of persons involved in litigation, including inventor James Fallon, and third-party witnesses Jim Karp, Ke-Chiang Chu, and Frank V. DeRosa filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Office of Rebuttal Expert Reports of Dr. Brian Von Herzen, Lester L. Hewitt and Dr. James A. Storer, and Expert Reports of Dr. James A. Storer and Dr. Nathaniel Polish filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Proposed Amended Infringement Contentions filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Documents Concerning Agreements for Meiations and Mediation Proceedings Between Plaintiffs and Some of the Defendants filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Plaintiff's Oppostion to Joint Defendants' Motion for Parital Summary Judgment of Invalidity of some of the patents in Suit for indefiniteness, including the '104 patent, Blue Coat's response to this objection, Blue Coat's Reply to Plaintiff's response and Plaintiff's Sur-Reply to Blue Coat's Reply filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Plaintiffs Amended P.R. 3-1 Disclosures and Infringement Contentions, Defendants' Motions to Strick unauthorized portions of these disclosures, and Sur-Replies to these Motions filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
Expert Report of Dr. James A. Storer Regarding Non-Infringement that contains positions related to the validity of the patents in suit filed in *Realtime Data, LLC d/b/a/IXO v. Packeteer, Inc. et al.*, Civil Action No. 6:08-cv-00144-LED; U.S. District Court for the Eastern District of Texas, filed Apr. 18, 2008 and terminated Feb. 2, 2010. (PTO Notified—Document Not submitted).
*Thomson Reuters Corporation v. Realtime Data, LLC D/B/A IXO*, No. 09 CV 7868 (S.D.N.Y.) Sep. 23, 2009 Order Dismissing Case in Favor of Texas Action, 1 pg.
*Thomson Reuters Corporation v. Realtime Data, LLC D/B/A IXO*, No. 09 CV 7868 (S.D.N.Y.) Sep. 30, 2009 Response to Order re Transfer, 103 pgs.
*Thomson Reuters Corporation v. Realtime Data, LLC D/B/A IXO*, No. 09 CV 7868 (S.D.N.Y.) Oct. 17, 2009 Reply Letter regarding Judge Berman Sep. 23, 2009 Order re Transfer, 182 pgs.
*Thomson Reuters Corporation v. Realtime Data, LLC D/B/A IXO*, No. 09 CV 7868 (S.D.N.Y.) Oct. 15, 2009 Order Staying Case Until TX Action Decided, 3 pgs.
*Thomson Reuters Corporation v. Realtime Data, LLC D/B/A IXO*, No. 09 CV 7868 (S.D.N.Y.) Sep. 11, 2009 Complaint—DJ SD NY, 41 pgs.
*Thomson Reuters Corporation v. Realtime Data, LLC D/B/A IXO*, No. 09 CV 7868 (S.D.N.Y.) Sep. 11, 2009 Rule 7.1 Disclosure Statement for Thomson Reuters, 1 pg.
*Thomson Reuters Corporation v. Realtime Data, LLC D/B/A IXO*, No. 09 CV 7868 (S.D.N.Y.) Order-Stay Pending Transfer Motion Confirmed 10_15_09, 3 pgs.
Opinion and Order of United States Magistrate Judge regarding Claim Construction, *Realtime Data, LLC D/B/A Ixo v. Packeteer, Inc., et al.*, District Court for the Eastern District of Texas, No. 6:08cv144, issued Jun. 22, 2009, 75 pgs.
Script for Realtimes' Technology Tutorial Presented to the Magistrate Judge in *Realtime Data, LLC d/b/a/IXO v. Packeteer, Inc. et al.*, Civil Action No. 6:08-cv-00144-LED; U.S. District Court for the Eastern District of Texas, Mar. 16, 2009, 69 pgs.
Opinion and Order of United States Magistrate Judge regarding Plaintiff's Motion to Strike Unauthorized New Invalidity Theories from Defendant Citrix's Opening and Reply Briefs in Support of its Motion for Summary Judgment of Invalidity, *Realtime Data, LLD/B/A Ixov. Packeteer, Inc., et al.*, District Court for the Eastern District of Texas, No. 6:08cv144, issued Dec. 8, 2009, 10 pgs.
Defendant Citrix Systems, Inc.'s Notice Pursuant to 35 U.S.C. Section 282 Disclosures, *Realtime Data, LLC D/B/A Ixov. Packeteer, Inc., et al.*, District Court for the Eastern District of Texas, No. 6:08cv144, filed Dec. 11, 2009, 7 pgs.
Blue Coat Defendants' Notice Pursuant to 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 7 pgs.
Expand Networks' 35 U.S.C. Section 282 Disclosures, *Realtime Data, LLC D/B/A Ixo v. Packeteer, Inc., et al.*, District Court for the Eastern District of Texas, No. 6:08cv144, filed Dec. 11, 2009, 4 pgs.
Expand Networks' 35 U.S.C. Section 282 Disclosures (Amended), *Realtime Data, LLC D/B/A Ixo v. Packeteer, Inc., et al.*, District Court for the Eastern District of Texas, No. 6:08cv144, filed Dec. 11, 2009, 5 pgs.
Defendant Citrix Systems, Inc.'s Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 11, 2009, 3 pgs.
Order of United States Magistrate Judge regarding Motion to Limit the Number of Prior Art References to be Asserted at Trial, *Realtime Data, LLC D/B/A Ixo v. Packeteer, Inc., et al.*, District Court for the Eastern District of Texas, No. 6:08cv144, filed Dec. 21, 2009, 6 pgs.
Expand Defendants' Notice of Obviousness Combinations Pursuant to Court Order, *Realtime Data, LLC D/B/A Ixo v. Packeteer, Inc., et al.*, District Court for the Eastern District of Texas, No. 6:08cv144, filed Dec. 22, 2009, 3 pgs.
Blue Coat Systems, Inc. and 7-Eleven, Inc.'s Notice of Obviousness Combinations to be Used at Trial, *Realtime Data, LLC D/B/A Ixo v. Packeteer, Inc., et al.*, District Court for the Eastern District of Texas, No. 6:08cv144, filed Dec. 22, 2009, 38 pgs.
Defendant Citrix Systems, Inc's Notice of Other Prior Art References Within the Scope of the References Discussed at the Dec. 17, 2009 Hearing, *Realtime Data, LLC D/B/A Ixo v. Packeteer, Inc., et al.*, District Court for the Eastern District of Texas, No. 6:08cv144, filed Dec. 29, 2009, 6 pgs.
Docket Listing downloaded Mar. 10, 2010 for *Realtime Data, LLC D/B/A Ixo v. Packeteer, Inc., et al.*, District Court for the Eastern District of Texas, No. 6:08cv144, filed Apr. 18, 2008, 165 pgs.
CCITT Draft Recommendation T.4, RFC 804, Jan. 1981, 12 pgs.
SNA Formats, IBM Corporation, 14th Ed., Nov. 1993, 3 pgs.
Munteanu et al, "Wavelet-Based Lossless Compression Scheme with Progressive Transmission Capability," John Wiley & Sons, Inc., Int'l J. Imaging Sys. Tech., vol. 10, (1999) pp. 76-85.
Forchhammer and Jensen, "Data Compression of Scanned Halftone Images," IEEE Trans. Commun., vol. 42, Feb.-Apr. 1994, pp. 1881-1893.
Christopher Eoyang et al., "The Birth of the Second Generation: The Hitachi S-820/80," Proceedings of the 1998 ACM/IEEE Conference on Supercomputing, pp. 296-303 (1998).

(56) References Cited

OTHER PUBLICATIONS

Transcript for Hearing on Motions for Summary Judgment, *Realtime Data, LLC D/B/A IXO v. Packeteer, Inc. et al*, Civil Action No. 6:08-cv-00144-LED; U.S. District Court for the Eastern District of Texas, 133 pgs, Nov. 8, 2009.
Transcript for Motions Hearing (Including Supplemental Claim Construction Hearing), *Realtime Data, LLC d/b/a IXO v. Packeteer, Inc. et al*, Civil Action No. 6:08-cv-00144-LED; U.S. District Court for the Eastern District of Texas, 88 pgs, Nov. 10, 2009.
Nelson, "The Data Compression Book," M&T Books (2nd Ed. 1996), 283 pgs.
"The Authoritative Dictionary of IEEE Standards Terms," 7th Ed. 2000, p. 273.
Larousse Dictionary of Science and Technology, 1st Ed., 1995, p. 916.
Plaintiff Realtime Data's Motion to Strike Unauthorized New Invalidity Theories from Defendant Citrix's Opening and Reply Briefs in Support Its Motion for Summary Judgment of Invalidity of U.S. Pat. No. 7,352,300 (Sep. 22, 2009),14 pgs.
Realtime Data's Reply in Support of Its Motion to Strike Unauthorized New Invalidity Theories from Defendant Citrix's Opening and Reply Briefs in Support of Its Motion for Summary Judgment of Invalidity of U.S. Pat. No. 7,352,300 (Oct. 19, 2009), 17 pgs.
Defendant Citrix Systems, Inc.'s Sur-Reply in Opposition to Realtime Data LLC's Motion to Strike Unauthorized New Invalidity Theories from Citrix's Opening and Reply Briefs in Support of Its Motion for Summary Judgment of Invalidity of U.S. Pat. No. 7,352,300 (Oct. 30, 2009), 9 pgs.
Blue Coat Defendants' Response to Realtime Data, LLC's Notice Re Proposed Construction of "Data Storage Rate" (Nov. 11, 2009), 3 pgs.
Order for Supplemental Briefing on Blue Coat 7-11 Motion for Partial SJ on Non-infringement of U.S. Pat. No. 6,601,104 (Nov. 13, 2009), 6 pgs.
Memorandum Opinion and Order (Nov. 23, 2009), 15 pgs.
Memorandum Opinion and Order (Dec. 8, 2009), 10 pgs.
Expand's Conclusions of Fact and Law Regarding Defense of Inequitable Conduct Concerning the Unenforceability of U.S. Pat. No. 7,321,937 (Nov. 12, 2009), 3 pgs.
Realtime Data's Sur-reply Supplemental Claim Construction Brief Concerning Whether the Asserted Claims of the '104 Patent are Product Claims (Dec. 23, 2009), 6 pgs.
Order regarding Defendant Citrix Systems, Inc's Notice of Other Prior Art References Within the Scope of the References Discussed at the Dec. 17, 2009 Hearing (Dec. 30, 2009), 3 pgs.
Network Working group RFC 2068 (Jan. 1997), 163 pgs.
Network Working group RFC 2616 (Jun. 1999), 114 pgs.
Network Working group RFC 1945 (May 1996), 61 pgs.
Network Working group RFC 1950 (May 1996), 10 pgs.
Network Working group RFC 1951 (May 1996), 15 pgs.
Network Working group RFC 1952 (May 1996), 12 pgs.
Notice of Plaintiff Realtime Data LLC's Proposed Supplemental Construction of "Data Storage Rate" In Response to the Court's Comments During the Nov. 10, 2009 Supplemental Claim Construction Hearing (Nov. 10, 2009), 4 pgs.
Citrix's Amended Invalidity Contentions, Including Appendices G2-G8 (Dec. 15, 2009), 509 pgs.
"Plaintiff Realtime Data's Opposition to Defendant F5 Networks' Motion for Summary Judgment that Claims 18-20 of U.S. Pat. No. 7,311,937 are Invalid (Aug. 25, 2009)" Civil Action No. 6:08-cv-00144-LED Jury Trial Demanded Filed Under Seal; In the United States District Court for the Eastern District of Texas Tyler Division. [Under Seal—Document Not Submitted].
Declaration of Dr. James W. Modestino relating to U.S. Pat. No. 7,161,506, Mar. 15, 2010, 49 pgs.
Second Declaration of Dr. George T. Ligler under 37 C.F.R. §1.132 relating to U.S. Pat. No. 6,601,104, executed May 5, 2010, 3 pgs.
Realtime Data, LLC Complaint for Patent Infringement, *Realtime Data, LLC D/B/A IXO v. CME Group Inc., et al.* (II), District Court for the Eastern District of Texas, No. 6:10-cv-246, filed May 11, 2010, 24 pages.
Realtime Data, LLC Complaint for Patent Infringement, *Realtime Data, LLC D/B/A IXO v. Thompson Reuters Corporation, et al.* (II), District Court for the Eastern District of Texas, No. 6:10-cv-247, filed May 11, 2010, 15 pages.
Realtime Data, LLC Complaint for Patent Infringement, *Realtime Data, LLC D/B/A IXO v. Morgan Stanley, et al.* (II), District Court for the Eastern District of Texas, No. 6:10-cv-248, filed May 11, 2010, 27 pages.
Declaration of Padmaja Chinta in Support of Realtime Data's Reply Claim Construction Brief (including Exhibits A-S), *Realtime Data, LLC D/B/A IXO v. Packeteer, Inc., et al.*, District Court for the Eastern District of Texas, No. 6:08-cv-00144-LED, dated Mar. 30, 2009, 217 pgs.
Extended European search report issuing from European Patent Application 09150508.1, dated Aug. 3, 2010, 5 pgs.
Complaint, *Thomson Reuters Corporation v. Realtime Data, LLC D/B/A IXO*, Southern District of New York, No. 2:09-cv-7868-RMB, filed Sep. 11, 2009, 6 pages.
Realtime Data, LLC Complaint for Patent Infringement, *Realtime Data, LLC D/B/A IXO v. MetroPCS Texas, LLC et al.*, District Court for the Eastern District of Texas, No. 6:10-cv-00493, filed Sep. 23, 2010, 14 pages.
Complaint and Demand for Jury Trial, *Chicago Board Options Exchange, Incorporated v. Realtime Data, LLC D/B/A IXO*, United States District Court for the Northern District of Illinois, No. 09 CV 4486, filed Jul. 24, 2009, 6 pages.
Realtime's Response in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Jul. 27, 2009, 15 pgs.
Realtime Data's Sur-Reply in Opposition to the Defendants' Joint Objections to Report and Recommendation of Magistrate Regarding Motion for Partial Summary Judgment of Invalidity for Indefiniteness, in *Realtime Data, LLC d/b/a/IXO v. Packeteer, Inc. et al.*, Civil Action No. 6:08-cv-00144-LED; U.S. District Court for the Eastern District of Texas, Aug. 3, 2009, 3 pgs.
Defendants' Invalidity Contentions, *Realtime Data, LLC d/b/a IXO, vs. MetroPCS Texas, LLC, et al.*, Case No. 6:10-CV-00493-LED, in the United States District Court Eastern District of Texas Tyler Division, Jun. 17, 2011, 138 pages.
Appendix A, Claim Charts A-1 to A-25, from Invalidity Contentions, *Realtime Data LLC v. MetroPCS Texas, LLC, et al.*, Case No. 6:10-CV-00493-LED, Jun. 17, 2011, 173 pages.
Appendix B, Claim Charts B-1 to B-23, from *Realtime Data LLC v. MetroPCS Texas, LLC et al.*, Case No. 6:10-CV-00493-LED, Jun. 17, 2011, 809 pages.
Appendix C, Claim Charts C-1 to C-22, from *Realtime Data LLC v. MetroPCS Texas, LLC et al.*, Case No. 6:10-CV-00493-LED, Jun. 17, 2011, 530 pages.
Appendix D, Claim Charts D-1 to D-16, from *Realtime Data LLC v. MetroPCS Texas, LLC et al.*, Case No. 6:10-CV-00493-LED, Jun. 17, 2011, 253 pages.
Appendix E, Claim Charts E-1 to E-20, from *Realtime Data LLC v. MetroPCS Texas, LLC et al.*, Case No. 6:10-CV-00493-LED, Jun. 17, 2011, 397 pages.
Appendix F, Claim Charts F-1 to F-19, from *Realtime Data LLC v. MetroPCS Texas, LLC et al.*, Case No. 6:10-CV-00493-LED, Jun. 17, 2011, 462 pages.
Appendix G, Claim Charts G-1 to G-18, from *Realtime Data LLC v. MetroPCS Texas, LLC et al.*, Case No. 6:10-CV-00493-LED, Jun. 17, 2011, 548 pages.
Appendix H, Claim Charts H-1 to H-22, from *Realtime Data LLC v. MetroPCS Texas, LLC et al.*, Case No. 6:10-CV-00493-LED, Jun. 17, 2011, 151 pages.

(56) References Cited

OTHER PUBLICATIONS

Amir et al., "An Application Level Video Gateway," 1995, 11 pages.
Katz, Randy H. and Eric A. Brewer, "The Bay Area Research Wireless Access Network: Towards a Wireless Overlay Internetworking Architecture," Computer Science Division, EECS Department, U.C. Berkeley, 1995, 56 pages.
Katz, R.H. and E.A. Brewer, "The Bay Area Research Wireless Access Network (BARWAN)," UC Berkeley, 1995, 68 pages.
Bruckman, Alfred and Andreas UHL, "Selective Medical Image Compression Using Wavelet Techniques," Jun. 1998, 23 pages.
Crowley et al., "Dynamic Compression During System Save Operations," May 1, 1984, 3 pages.
Hershkovits, "Universal Data Compression with Finite-Memory," Feb. 1995, 99 pages.
Katz et al., "The Bay Area Research Wireless Access Networks (BARWAN)," 1996, 6 pages.
Klein, "Compression and Coding in Information Retrieval Systems," Jun. 1987, pp. vii-vm, 1-4, 10-15, 22-30, 43-48, 62-66, 86-89, 108-111.
Reghbati, "An Overview of Data Compression Techniques," Apr. 1981, pp. 71-75.
Defendants' Joint Preliminary Invalidity Contentions filed in *Realtime Data, LLC D/B/A IXO v. Packeteer, Inc., et al.*, Civil Action No. 6:08-cv-144-LED, United States District Court for the Eastern District of Texas Tyler Division, Dec. 8, 2008, 19 pages.
Appendix A, Claim Charts A-1 to A-46, from *Realtime Data, LLC v. Packeteer, Inc., et al.*, Civil Action No. 6:08-cv-144-LED, Dec. 8, 2008, 345 pages.
Appendix B, Claim Charts B-1 to B-17, from *Realtime Data, LLC v. Packeteer, Inc., et al.*, Civil Action No. 6:08-cv-144-LED, Dec. 8, 2008, 1893 pages.
Appendix C, Claim Charts C-1 to C-34, from *Realtime Data, LLC v. Packeteer, Inc., et al.*, Civil Action No. 6:08-cv-144-LED, Dec. 8, 2008, 1,055 pages.
Appendix D, Claim Charts D-1 to D-14, from *Realtime Data, LLC v. Packeteer, Inc., et al.*, Civil Action No. 6:08-cv-144-LED, Dec. 8, 2008, 197 pages.
Appendix E, Claim Charts E-1 to E-11, from *Realtime Data, LLC v. Packeteer, Inc., et al.*, Civil Action No. 6:08-cv-144-LED, Dec. 8, 2008, 735 pages.
Appendix F, Claim Charts F-1 to F-11, from *Realtime Data, LLC v. Packeteer, Inc., et al.*, Civil Action No. 6:08-cv-144-LED, Dec. 8, 2008, 775 pages.
Appendix G Claim Charts G-1 to G-8 from *Realtime Data, LLC v. Packeteer, Inc., et al.*, Civil Action No. 6:08-cv-144-LED, Dec. 8, 2008, 567 pages.
Appendix H, Claim Charts H-1 to H-18, from *Realtime Data, LLC v. Packeteer, Inc., et al.*, Civil Action No. 6:08-cv-144-LED, Dec. 8, 2008, 97 pages.
Appendix I, Claim Charts I-1 to I-18, from *Realtime Data, LLC v. Packeteer, Inc., et al.*, Civil Action No. 6:08-cv-144-LED, Dec. 8, 2008, 146 pages.
Appendix J, Prior Art Chart, from *Realtime Data, LLC v. Packeteer, Inc., et al.*, Civil Action No. 6:08-cv-144-LED, Dec. 8, 2008, 25 pages.
Realtime Data, LLC's [Corrected] P.R. 3-1 Disclosures and Preliminary Infringement Contentions filed in *Realtime Data, LLC D/B/A/IXO v. Packeteer, Inc., et al.*, Civil Action No. 6:08-cv-00144-LED, United States District Court for the Eastern District of Texas Tyler Division, Oct. 8, 2008, 591 pages.
Amended Answer and Counterclaims of Defendants Blue Coat Systems, Inc., Packeteer, Inc., 7-Eleven, Inc., ABM Industries, Inc., ABM Janitorial Services-South Central, Inc., and Build-A-Bear Workshop, Inc. to Plaintiff's First Amended Complaint for Patent Infringement filed in *Realtime Data, LLC d/b/a/IXO v. Packeteer, Inc., et al.*, Civil Action No, 6:08cv144-LED, United States District Court for the Eastern District of Texas Tyler Division, Oct. 28, 2008, 81 pages.

"Packeteer iShaper, PacketShaper and iShared Appliances Drive Intelligent Application Acceleration Across Coogee Resources Wide Area Network", Business Wire, accessed on Aug. 25, 2008, 2 pages.
Whiting, Doug, "Deflate vs. LZS", Nov. 2000, 2 pages.
"The Packeteer Q4 2005 Financial Conference Call", Jan. 26, 2006, 9 pages.
"Data Compression Ratio", Wikipedia, the free encyclopedia, accessed on Aug. 10, 2011 from http://en.wikipedia.org/wiki/Data_compression_ratio, 2 pages.
"Hard Disk Data Control Method", IBM Technical Disclosure Bulletin NN9302301, vol. 36, No. 2, Feb. 1993, pp. 301-302.
Defendants' Supplemental Invalidity Contentions, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed May 17, 2012, 54 pages.
Expert Report of Michael Brogioli Regarding Asserted Claims of U.S. Pat. Nos. 7,417,568 and 7,777,651, with Exhibit A: List of Materials Reviewed, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 26 pages.
Exhibit 1, Curriculum Vitae of Michael C. Brogioli, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 9 pages.
Exhibit 2, [Proposed] Order Adopting the Parties' Agreed Claim Constructions, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.
Exhibit 3, The Parties' Disputed Claim Constructions, revised May 3, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 6 pages.
Exhibit 4, E-Mail Correspondence between James Shalek and Brett Cooper, dated May 17 and 18, 2012, from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.
Exhibit 5, Source Code Chart for U.S. Pat. No. 7,417,568 comparing representative elements of the NQDSLIB source code (Apr. 29, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Jun. 15, 2012, 3 pages.
Exhibit 6, Source Code Chart for U.S. Pat. No. 7,417,568 comparing representative elements of the NQDSLIB source code (May 2, 2002 or earlier), from Expert Report, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v.

(56) References Cited

OTHER PUBLICATIONS

*Thomson Reuters, et al.*, Civil Action No. 1:11-cv-6698, United States District Court Southern District of New York, filed Jun. 15, 2012, 3 pages.
Exhibit 7, Source Code Chart for U.S. Pat. No. 7,777,651 comparing representative elements of the NQDSLIB source code (Apr. 29, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 21 pages.
Exhibit 8, Source Code Chart for U.S. Pat. No. 7,777,651 comparing representative elements of the NQDSLIB source code (May 2, 2002 or earlier), from Expert Report, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 21 pages.
Invalidity Expert Report of Dr. James A. Storer (Redacted), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 227 pages.
Defendants' Claim Construction Tutorial, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 15, 2012, 54 pages.
Opinion and Order (Markman), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 22, 2012, 41 pages.
Opinion and Order (Partial Motion for Summary Judgment re Written Description: "Data Packets"), filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 26, 2012, 8 pages.
Opinion and Order (Partial Motion for Summary Judgment re Data Decompression) filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 27, 2012, 21 pages.
Technology Tutorial (.exe file), presentation filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Jun. 2012 (submitted on accompanying CD-ROM).
Lilley, J. et al., "A Unified Header Compression Framework for Low-Bandwidth Links," MobiCom 2000, Aug. 6-11, 2000. Boston, MA, 12 pages.
"WAN Link Compression on HP Routers," Hewlett Packard Application Note, May 1995, 7 pages.

"User Manual for XMill," 2001, 21 pages.
"High Speed Network, Developer's Guide," Standard & Poor's Comstock, Version 1.1, 1994, pp. 1-42, and 53-124.
Larmouth, J., "ASN.1 Complete", Academic Press, 2000, pp. xxi-xxvii, 1-45, 115-130, 168-172, 174, 270-276, and 443-472.
Petty, J., "PPP Hewlett-Packard Packet-by-Packet Compression (HP PPC) Protocol," draft-ierf-ppext-hpppc-00.txt., Oct. 1993, 7 pages.
Friend, R., et al., "IP Payload Compression Using LZS," Network Working Group, Request for Comments: 2395, Category: Informational, Dec. 1998; 9 pages.
"Information technology—Abstract Syntax Notation One (ASN.1): Specification of basic notation," Series X: Data Networks and Open System Communications, OSI networking and system aspects—Abstract Syntax Notation One (ASN.1), International Telecommunication Union, ITU-T Recommendation X.680, Dec. 1997, 109 pages.
Information technology—ASN.1 encoding rules—Specification of Packed Encoding Rules (PER), Series X: Data Networks and Open System Communications, OSI networking and system aspects—Abstract Syntax Notation One (ASN.1), International Telecommunication Union, ITU-T Recommendation X.691, Dec. 1997, 51 pages.
Opinion and Order, filed in *Realtime Data, LLC d/b/a IXO* v. *Morgan Stanley, et al.*, Civil Action No. 1:11-cv-6696, *Realtime Data, LLC d/b/a IXO* v. *CME Group Inc., et al.*, Civil Action No. 1:11-cv-6697, and *Realtime Data, LLC d/b/a IXO* v. *Thomson Reuters, et al.*, Civil Action No. 1:11-cv-6698, United States District Court Southern District of New York, filed Sep. 24, 2012, 48 pages.
Memorandum Opinion and Order, filed in *Realtime Data, LLC d/b/a IXO,* v. *MetroPCS Texas, LLC, et al.*, Civil Action No. 6:10-cv-00493, United States District Court for the Eastern District of Texas, filed Oct. 1, 2012, 22 pages.
T-Mobile's Motion for Leave to Supplement Trial Witness List & Invalidity Contentions, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 16 pages.
Exhibit 2, Defendant T-Mobile's Supplemental Invalidity Contentions, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 13 pages.
Exhibit 3, FNLTD-74478, Flash Networks: Commercial Part Written by Flash Networks for Cegetel, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 6 pages.
Exhibit 4, FNLTD-74444, Response to Cegetel RFP: Technical Section, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 5 pages.
Exhibit 5, FNLTD-74926,Flash Networks Optimization Products Selected by AT&T Wireless, Flash Networks, Inc. Press Release, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 3 pages.
Exhibit 6, Flash Networks: Harmony, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 6 pages.
Exhibit 7, Declaration of Adi Weiser, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 4 pages.
Exhibit 8, Declaration of Yoav Weiss, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 4 pages.
Exhibit 9, Declaration of Richard Luthi, filed in *Realtime Data, LLC d/b/a IXO,* v. *MetroPCS Texas, LLC, et al.*, Civil Action No. 6:10-cv-00493, United States District Court for the Eastern District of Texas, filed Dec. 17, 2012, 4 pages.

(56) References Cited

OTHER PUBLICATIONS

Exhibit 13, Declaration of Gali Weiss, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 4 pages.
Exhibit 17, P.R. 3-1 Claim Chart for T-Mobile, U.S. Pat. No. 7,161,506, filed in *Realtime Data, LLC d/b/a IXO, v. MetroPCS Texas, LLC, et al.*, Civil Action No. 6:10-cv-00493, United States District Court for the Eastern District of Texas, filed Dec. 17, 2012, 33 pages.
"Flash Networks Introduces NettGain 1100, New Products for Carrriers & Enterprises that Enables Immediate Deployment of Wireless Data Solutions," Press Release, dated Mar. 20, 2001, 2 pages.
Amended Expert Report of Dr. Cliff Reader, filed in *Realtime Data, LLC d/b/a IXO, v. MetroPCS Texas, LLC, et al.*, Civil Action No. 6:10-cv-00493, United States District Court for the Eastern District of Texas, filed Jul. 30, 2012, 205 pages.
Final Judgment, filed in *Realtime Data, LLC d/b/a IXO, v. T-Mobile USA, Inc.*, Civil Action No. 6:10-cv-00493, United States District Court for the Eastern District of Texas, filed Mar. 28, 2013, 1 page.
Final Judgment Pursuant to Fed. R. Civ. P. 45(b), filed in *Realtime Data, LLC d/b/a IXO, v. CME Group Inc., et al.*, Civil Action No. 1:11-cv-06697, United States District Court Southern District of New York, dated Nov. 9, 2012, 10 pages.
Final Judgment Pursuant to Fed. R. Civ. P. 45(b), filed in *Realtime Data, LLC d/b/a IXO, v. Morgan Stanley, et al.*, Civil Action No. 1:11-cv-06696, United States District Court Southern District of New York, dated Nov. 9, 2012, 10 pages.
Final Judgment Pursuant to Fed. R. Civ. P. 45(b), filed in *Realtime Data, LLC d/b/a IXO, v. Thomson Reuters Corporation, et al.*, Civil Action No. 1:11-cv-06698, United States District Court Southern District of New York, dated Nov. 9, 2012, 6 pages.
Opinion and Order (Motion 10), filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Aug. 2, 2012, 13 pages.
Supplemental Order, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Nov. 9, 2012, 5 pages.
Memorandum & Order, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Aug. 2, 2012, 13 pages.
Amended Opinion & Order, filed in *Realtime Data, LLC d/b/a IXO v. Morgan Stanley, et al.*, Civil Action No. 1:11-cv-6696, *Realtime Data, LLC d/b/a IXO v. CME Group Inc., et al.*, Civil Action No. 1:11-cv-6697, and *Realtime Data, LLC d/b/a IXO v. Thomson Reuters, et al.*, Civil Action No. 1:11-cv-6698, United States District Court Southern District of New York, filed Aug. 15, 2012, 48 pages.
ChangeLog file for zlib, zlib.net/ChangeLog.txt file, accessed on May 23, 2013, with date references Apr. 11, 1995-Apr. 28, 2013, 26 pages.
2.0.39 Kernel Release History, accessed at lwn.net/2001/1018/a/hist-2.0.39.php3, dated Oct. 14, 2001, 8 pages.
"Linux Kernel," Wikipedia—the Free Encyclopedia, accessed at en.wikipedia.org/wiki/Linux_kernel, accessed on May 9, 2013, 20 pages.
Rubini, A., "Booting the Kernel," accessed at www.linux.it/~rubini/docs/boot/, Jun. 1997, 6 pages.

Zadok, E., et al., "Fast Indexing: Support for Size-Changing Algorithms in Stackable File Systems," Proceedings of the 2001 Annual USENIX Technical Conference, Jun. 2001, 16 pages.
Non-Confidential Brief for Plaintiff-Appellant Realtime Data, LLC d/b/a IXO, filed in *Realtime Data, LLC d/b/a IXO v. Morgan Stanley et al.*, Case Nos. 2013-1092, -1093, -1095, -1097, -1098, -1099, -1100, -1101, and -1103, United States Court of Appeals for the Federal Circuit, filed Mar. 6, 2013, 80 pages.
Non-Confidential Brief for Defendants—Appellees CME Group, Inc., Board of Trade of the City of Chicago, Inc., the New York Mercantile Exchange, Inc., BATS Trading, Inc., and NASDAQ OMX Group, Inc. and NASDAQ OMX PHLX, Inc., filed in *Realtime Data, LLC d/b/a IXO v. CME Group, Inc., et al.*, Case Nos. 13/1093, -1097, and -1100, United States Court of Appeals for the Federal Circuit, filed May 20, 2013, 74 pages.
Non-Confidential Reply Brief for Plaintiff-Appellant Realtime Data, LLC d/b/a IXO, filed in *Realtime Data, LLC d/b/a IXO v. Morgan Stanley, et al.*, Case Nos. 13/1092, -1093, -1095, - 1097, -1098, -1099, -1100, -1101, and -1103, United States Court of Appeals for the Federal Circuit, filed Jun. 19, 2013, 53 pages.
Opinion, with Errata, filed in *Realtime Data, LLC d/b/a IXO v. Morgan Stanley, et al.*, Case Nos. 13/1092, -1093, -1095, -1097, -1098, -1099, -1100, -1101, and -1103, United States Court of Appeals for the Federal Circuit, filed Jan. 27, 2014, 41 pages.
Complaint for Patent Infringement, filed in *Realtime Data, LLC d/b/a IXO v. Microsoft Corporation, et al.*, Case No. 4:14-cv-00827 (E.D. Texas), Dec. 19, 2014, 17 pages.
Complaint for Patent Infringement, filed in *Realtime Data, LLC d/b/a IXO v. Actian Corporation, et al.*, No. 6:15-cv-00463 (E.D. Texas), May 8, 2015, 18 pages.
Complaint for Patent Infringement, filed in *Realtime Data, LLC d/b/a IXO v. Dropbox, Inc.*, No. 6:15-cv-00465 (E.D. Texas), May 8, 2015, 14 pages.
Complaint for Patent Infringement, filed in *Realtime Data, LLC d/b/a IXO v. Echostar Corporation, et al.*, No. 6:15-cv-00466 (E.D. Texas), May 8, 2015, 15 pages.
Complaint for Patent Infringement, filed in *Realtime Data, LLC d/b/a IXO v. Riverbed Technology, Inc., et al.*, No. 6:15-cv-00468 (E.D. Texas), May 8, 2015, 26 pages.
Complaint for Patent Infringement, filed in *Realtime Data, LLC d/b/a IXO v. BMC Software, Inc.*, No. 6:15-cv-00464 (E.D. Texas), May 8, 2015, 17 pages.
Complaint for Patent Infringement, filed in *Realtime Data, LLC d/b/a IXO v. Oracle America, Inc., et al.*, No. 6:15-cv-00467 (E.D. Texas), May 8, 2015, 41 pages.
Complaint for Patent Infringement, filed in *Realtime Data, LLC d/b/a IXO v. SAP America, Inc., et al.*, No. 6:15-cv-00469 (E.D. Texas), May 8, 2015, 34 pages.
Complaint for Patent Infringement, filed in *Realtime Data, LLC d/b/a IXO v. Teradata Corporation, et al.*, No. 6:15-cv-00470 (E.D. Texas), May 8, 2015, 17 pages.
First Amended Complaint for Patent Infringement, filed in *Realtime Data, LLC d/b/a IXO v. SAP America, Inc., et al.*, No. 6:15-cv-00469 (E.D. Texas), Jun. 2, 2015, 50 pages.
Defendants Actian Corporation and Pervasive Software Inc.'s Motion to Dismiss Complaint, filed in *Realtime Data, LLC d/b/a IXO v. Actian Corporation, et al.*, Case No. 6:15-cv-00463-RWS-JDL (E.D. Tex.), filed Jul. 24, 2015; 22 pages.
Defendant Dropbox, Inc.'s Motion to Dismiss for Failure to State a Claim, filed in *Realtime Data, LLC d/b/a IXO v. Actian Corporation, et al.*, Case No. 6:15-cv-00463-RWS-JDL (E.D. Tex.), filed Jul. 24, 2015; 3 pages.
Defendants SAP America Inc., Sybase, Inc., Hewlett-Packard Company, HP Enterprise Services, LLC, Dell Inc., BMC Software, Inc., Echostar Corporation, and Hughes Network Systems, LLC's Motion to Dismiss First Amended Complaint, filed in *Realtime Data, LLC d/b/a IXO v. Actian Corporation, et al.*, Case No. 6:15-cv-00463-RWS-JDL (E.D. Tex.), filed Jul. 24, 2015; 37 pages.
Defendant Riverbed Technology's Motion to Dismiss for Failure to State a Claim, filed in *Realtime Data, LLC d/b/a IXO v. Actian Corporation, et al.*, Case No. 6:15-cv-00463-RWS-JDL (E.D. Tex.), filed Jul. 27, 2015; 3 pages.

(56) References Cited

OTHER PUBLICATIONS

Dell Inc.'s Motion to Dismiss, filed in *Realtime Data, LLC d/b/a IXO v. Actian Corporation, et al.*, Case No. 6:15-cv-00463-RWS-JDL (E.D. Tex.), filed Jul. 28, 2015; 3 pages.
First Amended Complaint for Patent Infringement, filed in *Realtime Data, LLC d/b/a IXO v. Actian Corporation, et al.*, Case No. 6:15-cv-00463-RWS-JDL (E.D. Tex.), filed Jul. 29, 2015; 42 pages.
Realtime Data LLC d/b/a IXO's Answer to Hewlett-Packard Company and HP Enterprise Services, LLC's Counterclaim, filed in *Realtime Data, LLC d/b/a IXO v. Actian Corporation, et al.*, Case No. 6:15-cv-00463-RWS-JDL (E.D. Tex.), filed Aug. 3, 2015; 8 pages.
Defendant's Reply Brief on their Motion to Dismiss First Amended Complaint, filed in *Realtime Data, LLC d/b/a IXO v. Actian Corporation, et al.*, Case No. 6:15-cv-00463-RWS-JDL, filed Sep. 11, 2015; 15 pages.
Defendants Actian Corporation and Pervasive Software Inc.'s Motion to Dismiss First Amended Complaint, filed in *Realtime Data, LLC d/b/a IXO v. Actian Corporation, et al.*, Case No. 6:15-cv-00463-RWS-JDL, filed Sep. 29, 2015; 32 pages.
Defendants Hewlett-Packard Company and HP Enterprise Services, LLC's Answer and Counterclaims to Plaintiff's Second Amended Complaint for Patent Infringement Against Oracle America, Inc., filed in *Realtime Data, LLC d/b/a IXO v. Actian Corporation, et al.*, filed Oct. 1, 2015; 23 pages.
Defendant Oracle America, Inc.'s Answer to Realtime Data LLC's Second Amended Complaint and Counterclaims, filed in *Realtime Data, LLC d/b/a IXO v. Actian Corporation, et al.*, Case No. 6:15-cv-00463-RWS-JDL, filed Oct. 1, 2015; 30 pages.
Defendants SAP America Inc., Sybase, Inc., Hewlett-Packard Company, HP Enterprise Services, LLC, Dell Inc., Echostar Corporation, Hughes Network Systems, LLC, Dropbox, Inc., and Riverbed Technology, Inc.'s Motion to Dismiss Amended Complaints, filed in *Realtime Data, LLC d/b/a IXO v. Actian Corporation, et al.*, Case No. 6:15-cv-00463-RWS-JDL, filed Oct. 1, 2015; 11 pages.
Defendant Teradata Operations, Inc.'s Answer, Affirmative Defenses, and Counterclaims to Plaintiff Realtime Data LLC's Amended Complaint, filed in *Realtime Data, LLC d/b/a IXO v. Actian Corporation, et al.*, Case No. 6:15-cv-00463-RWS-JDL, filed Oct. 2, 2015; 23 pages.
Complaint for Patent Infringement, filed in *Realtime Data, LLC d/b/a IXO v. Apple, Inc.*, Case No. 6:15-cv-00885, filed Oct. 6, 2015; 17 pages.
Plaintiff Realtime Data LLC d/b/a IXO's Opposition to Defendant's Motions to Dismiss Amended Complaints with associated attachments, filed in *Realtime Data, LLC d/b/a IXO v. Actian Corporation, et al.*, Case No. 6:15-cv-00463-RWS-JDL (E.D. Texas), filed Oct. 19, 2015; 200 pages.
Realtime Data LLC, d/b/a IXO's Answer to Hewlett-Packard Company and HP Enterprise Services, LLC's Counterclaims to Second Amended Complaint, filed in *Realtime Data, LLC d/b/a IXO v. Action Corporation, et al.*, Case No. 6:15-cv-00463-RWS-JDL (E.D. Texas), filed Oct. 19, 2015; 9 pages.
Realtime Data LLC, d/b/a IXO's Answer to Oracle America, Inc.'s Counterclaims to Second Amended Complaint, filed in *Realtime Data, LLC d/b/a IXO v. Action Corporation, et al.*, Case No. 6:15-cv-00463-RWS-JDL (E.D. Texas), filed Oct. 19, 2015; 8 pages.
Realtime Data LLC, d/b/a IXO's Answer to Teradata Operations, Inc.'s Counterclaims to First Amended Complaint, filed in *Realtime Data, LLC d/b/a IXO v. Action Corporation, et al.*, Case No. 6:15-cv-00463-RWS-JDL (E.D. Texas), filed Oct. 19, 2015; 9 pages.
Defendants SAP America Inc., SyBase, Inc., Hewlett-Packard Company, HP Enterprise Services, LLC, Dell Inc., Echostar Corporation, Hughes Network Systems, LLC, Dropbox, Inc., and Riverbed Technology, Inc.'s Reply Brief on their Motion to Dismiss Amended Complaints, filed in *Realtime Data, LLC d/b/a IXO v. Action Corporation, et al.*, Case No. 6:15-cv-00463-RWS-JDL (E.D. Texas), filed Oct. 30, 2015; 15 pages.
Reply in Support of Defendants Actian Corporation and Pervasive Software Inc.'s Motion to Dismiss First Amended Complaint, filed in *Realtime Data, LLC d/b/a IXO v. Action Corporation, et al.*, Case No. 6:15-cv-00463-RWS-JDL (E.D. Texas), filed Nov. 6, 2015; 14 pages.
Plaintiff Realtime Data, LLC d/b/a IXO's Sur-Reply to SAP Defendants' Motions to Dismiss, filed in *Realtime Data, LLC d/b/a IXO v. Action Corporation, et al.*, Case No. 6:15-cv-00463-RWS-JDL (E.D. Texas), filed Nov. 9, 2015; 13 pages.
Reply in Support of Defendants Actian Corporation and Pervasive Software Inc.'s Motion to Dismiss First Amended Complaint, filed in *Realtime Data, LLC d/b/a IXO v. Action Corporation, et al.*, Case No. 6:15 cv-00463-RWS-JDL (E.D. Texas), filed Nov. 10, 2015; 13 pages.
Plaintiff Realtime Data LLC d/b/a IXO's Sur-Reply to SAP Defendants' Motions to Dismiss, filed in *Realtime Data, LLC d/b/a IXO v. Action Corporation, et al.*, Case No. 6:15-cv-00463-RWS-JDL (E.D. Texas), filed Nov. 10, 2015; 13 pages.
Report and Recommendation of United States Magistrate Judge regarding Defendant Dell, Inc.'s Motion to Dismiss Failure to State a Claim pursuant to Fed. R. Civ. P. 12(b)(6), filed in *Realtime Data, LLC d/b/a IXO v. Action Corporation, et al.*, Case No. 6:15-cv-00463-RWS-JDL (E.D. Texas), filed Nov. 30, 2015; 12 pages.
Defendants' Objections to the Report and Recommendation of Magistrate Judge (ECF No. 184), filed in *Realtime Data, LLC d/b/a IXO v. Action Corporation, et al.*, Case No. 6:15-cv-00463-RWS-JDL (E.D. Texas), filed Dec. 15, 2015; 13 pages.
Defendant Apple, Inc.'s Answer and Affirmative Defenses to Plaintiff's Complaint for Patent Infringement, filed in *Realtime Data, LLC d/b/a IXO v. Apple, Inc.*, Case No. 6:15-cv-RWS-JDL (E.D. Texas), filed Dec. 17, 2015; 10 pages.
Plaintiff Realtime Data LLC's Response to SAP Defendants' Objections to Magistrate Judge Love's Report and Recommendation on Defendants' Motion to Dismiss, filed in *Realtime Data, LLC d/b/a IXO v. Action Corporation, et al.*, Case No. 6:15-cv-00463-RWS-JDL (E.D. Texas), filed Jan. 4, 2016; 11 pages.
Order Adopting Report and Recommendation of United States Magistrate Judge, filed in *Realtime Data, LLC d/b/a IXO v. Actian Corporation, et al.*, Case No. 6:15-cv-00463-RWS-JDL (E.D. Texas), filed Jan. 21, 2016; 4 pages.
Second Amended Complaint for Patent Infringement Against Riverbed Technology, Inc. and Dell, Inc., filed in *Realtime Data, LLC d/b/a IXO v. Actian Corporation, et al.*, Case No. 6:15-cv-00463-RWS-JDL (E.D. Texas), filed Feb. 2, 2016; 37 pages.
Defendant Dropbox's Answer to Plaintiff Realtime Data LLC d/b/a IXO's Amended Complaint, filed in *Realtime Data, LLC d/b/a IXO v. Actian Corporation, et al.*, Case No. 6:15-cv-00463-RWS-JDL (E.D. Texas), filed Feb. 4, 2016; 10 pages.
Defendants Echostar Corporation's and Hughes Network Systems, LLC's Answer, Affirmative Defenses, and Counterclaims to Plaintiff Realtime Data LLC d/b/a IXO's Amended Complaint, filed in *Realtime Data, LLC d/b/a IXO v. Actian Corporation, et al.*, Case No. 6:15-cv-00463-RWS-JDL (E.D. Texas), filed Feb. 4, 2016; 23 pages.
Defendants SAP America Inc. and SyBase, Inc.'s Answer, Affirmative Defenses, and Counterclaims to Plaintiff's Second Amended Complaint, filed in *Realtime Data, LLC d/b/a IXO v. Actian Corporation, et al.*, Case No. 6:15-cv-00463-RWS-JDL (E.D. Texas), filed Feb. 4, 2016; 35 pages.
Dell Inc.'s Answer, Defenses, and Counterclaims to Plaintiff's Amended Complaint, filed in *Realtime Data, LLC d/b/a IXO v. Actian Corporation, et al.*, Case No. 6:15-cv-00463-RWS-JDL (E.D. Texas), filed Feb. 4, 2016; 28 pages.
Dell Inc.'s Answer, Defenses, and Counterclaims to Plaintiff's Second Amended Complaint, filed in *Realtime Data, LLC d/b/a IXO v. Actian Corporation, et al.*, Case No. 6:15-cv-00463-RWS-JDL (E.D. Tex.), filed Feb. 19, 2016; 18 pages.
Riverbed Technology's Answer, Defenses, and Counterclaims, filed in *Realtime Data, LLC d/b/a IXO v. Actian Corporation, et al.*, Case No. 6:15-cv-00463-RWS-JDL (E.D. Tex.), filed Feb. 19, 2016; 26 pages.
Complaint for Patent Infringement Against Dell Inc., EMC Corporation, iland Internet Solutions Corporation, and Veeam Software

(56) References Cited

OTHER PUBLICATIONS

Corporation, filed in *Realtime Data d/b/a IXO v. Dell Inc., et al.*, Case No. 6:16-cv-00089 (E.D. Texas), filed Feb. 26, 2016; 67 pages.
Complaint for Patent Infringement Against Hewlett Packard Enterprise Co., HP Enterprise Services, LLC, and Silver Peak Systems, Inc., filed in *Realtime Data d/b/a IXO v. Hewlett Packard Enterprise, Co., et al.*, Case No. 6:16-cv-00086 (E.D. Texas), filed Feb. 26, 2016; 49 pages.
Complaint for Patent Infringement Against CenturyLink, Inc. and Veritas Technologies LLC, filed in *Realtime Data d/b/a IXO v. CenturyLink, Inc., et al.*, Case No. 6:16-cv-00087 (E.D. Texas), filed Feb. 26, 2016; 46 pages.
Complaint for Patent Infringement Against Oracle America, Inc., filed in *Realtime Data d/b/a IXO v. Oracle America, Inc.*, Case No. 6:16-cv-00088 (E.D. Texas), filed Feb. 26, 2016; 40 pages.
Realtime Data LLC d/b/a IXO's Answer to Echostar Corporation's and Hughes Network Systems, LLC's Counterclaims, filed *Realtime Data d/b/a IXO v. Actian Corporation, et al.*, Case No. 6:15-cv-000463-RWS-JDL (E.D. Texas), filed Feb. 25, 2016; 8 pages.
Realtime Data LLC d/b/a IXO's Answer to SAP America Inc.'s and Sybase, Inc.'s Counterclaims, filed *Realtime Data d/b/a IXO v. Actian Corporation, et al.*, Case No. 6:15-cv-000463-RWS-JDL (E.D. Texas), filed Feb. 25, 2016; 5 pages.
Realtime Data LLC d/b/a IXO's Answer to Dell, Inc.'s Counterclaims, filed *Realtime Data d/b/a IXO v. Actian Corporation, et al.*, Case No. 6:15-cv-000463-RWS-JDL (E.D. Texas), filed Feb. 25, 2016; 5 pages.
Joint Claim Construction and Prehearing Statement, filed in *Realtime Data d/b/a IXO v. Actian Corporation, et al.*, Case No. 6:15-cv-00463-RWS-JDL (E.D. Tex.), filed Apr. 18, 2016; 26 pages.
Complaint for Patent Infringement against Teradata Operations, Inc., filed in *Realtime Data d/b/a IXO v. Teradata Operations, Inc.*, Case No. 2:16-cv-02743 (C.D. Cal.), filed Apr. 21, 2016; 31 pages.
Defendant Oracle America, Inc.'s Answer to Realtime Data LLC's Complaint and Counterclaims, filed in *Realtime Data LLC d/b/a IXO v. Oracle America, Inc.*, Case No. 6:16-cv-00088-RWS-JDL (E.D. Tex.), filed May 3, 2016; 22 pages.
Defendants' Letter Requesting Permission to File a Motion for Partial Summary Judgment of Invalidity, filed in *Realtime Data LLC d/b/a IXO v. Actian Corporation, et al.*, Case No. 6:15-cv-00463-RWS-JDL (E.D. Tex.) filed Apr. 20, 2016; 6 pages.
Plaintiff's Letter in Opposition to Moving Defendants' Letter Requesting Permission to File a Motion for Partial Summary Judgment, filed in *Realtime Data LLC d/b/a IXO v. Actian Corporation, et al.*, Case No. 6:15-cv-00463-RWS-JDL (E.D. Tex.) filed May 9, 2016; 6 pages.
Amended Complaint for Patent Infringement Against Teradata Operations, Inc., filed in *Realtime Data LLC d/b/a IXO v. Teradata Operations, Inc.*, Case No. 2:16-cv-02743-AG-FFM (C.D. Cal.), filed May 17, 2016; 58 pages.
Defendants Hewlett Packard Enterprise Co. and HP Enterprise Services, LLC's Answer to Plaintiff's Complaint for Patent Infringement and Counterclaims, filed in *Realtime Data LLC d/b/a IXO v. Hewlett Packard Enterprise Co., et al.*, Case No. 6:16-cv-00086-RWS-JDL (E.D. Tex.), filed May 20, 2016; 20 pages.
Plaintiff Realtime Data LLC's Opening Claim Construction Brief, filed in *Realtime Data LLC d/b/a IXO v. Actian Corporation, et al.*, Case No. 6:15-cv-463-RWS-JDL (E.D. Texas), filed May 23, 2016; 37 pages.
The Agreed and Disputed Constructions, as of May 23, 2016, Exhibit 12 to Plaintiff Realtime Data LLC's Opening Claim Construction Brief, filed in *Realtime Data LLC d/b/a IXO v. Actian Corporation, et al.*, Case No. 6:15-cv-463-RWS-JDL (E.D. Texas), filed May 23, 2016; 4 pages.
Plaintiff Realtime Data LLC's Expert Declaration of Dr. Kenneth Zeger, filed in *Realtime Data LLC d/b/a IXO v. Actian Corporation, et al.*, Case No. 6:15-cv-463-RWS-JDL (E.D. Texas), filed May 23, 2016; 21 pages.
Answer, Defenses, and Counterclaims to Plaintiff's Complaint for Patent Infringement, filed in *Realtime Data LLC d/b/a IXO v. Hewlett Packard Enterprise Co., et al.*, Case No. 6:16-cv-00086 (E.D. Texas), filed Jun. 3, 2016; 23 pages.
Defendant Veritas Technologies LLC's Answer, Affirmative Defenses, and Counterclaims, filed in *Realtime Data LLC d/b/a IXO v. Centurylink, Inc., et al.*, Case No. 6:16-cv-00087-RWS-JDL (E.D. Texas), filed Jun. 6, 2016; 30 pages.
Amended Complaint for Patent Infringement Against Dell Inc. and EMC Corporation, filed in *Realtime Data LLC d/b/a IXO v. Dell Inc., et al.*, Case No. 6:16-cv-00089-RWS-JDL (E.D. Texas), filed Jun. 9, 2016; 47 pages.
Savvis Communications Corporations' Answer, Affirmative Defenses, and Counterclaims, filed in *Realtime Data LLC d/b/a IXO v. Savvis Communications Corporation, et al.*, Case No. 6:16-cv-00087-RWS-JDL (E.D. Texas), filed Jun. 13, 2016; 16 pages.
Defendants' Responsive Claim Construction Brief, filed in *Realtime Data LLC d/b/a IXO v. Actian Corporation, et al.*, Case No. 6:16-cv-00463-RWS-JDL (E.D. Texas), filed Jun. 13, 2016; 39 pages.
Declaration of Dr. Charles D. Creusere in Support of Defendants' Motion for Partial Summary Judgment of Indefiniteness, filed in *Realtime Data LLC d/b/a IXO v. Actian Corporation, et al.*, Case No. 6:16-cv-00463-RWS-JDL (E.D. Texas), filed Jun. 13, 2016; 10 pages.
Excerpt from Modern Dictionary of Electronics, Seventh Edition, Boston: Newnes, 1999, Exhibit 1 to Defendants' Responsive Claim Construction Brief, filed in *Realtime Data LLC d/b/a IXO v. Actian Corporation, et al.*, Case No. 6:16-cv-00463-RWS-JDL (E.D. Texas), filed Jun. 13, 2016; 5 pages.
Motion for Partial Summary Judgment of Indefiniteness by Defendants Dell Inc., Echostar Corporation, Hughes Network Systems LLC, Hewlett Packard Enterprise Co., HP Enterprise Services, LLC, Riverbed Technology, Inc., SAP America Inc., and Sybase, Inc., filed in *Realtime Data LLC d/b/a IXO v. Actian Corporation, et al.*, Case No. 6:16-cv-00463-RWS-JDL (E.D. Texas), filed Jun. 13, 2016; 15 pages.
U.S. Appl. No. 60/136,561, filed May 28, 1999, Exhibit C to Motion for Partial Summary Judgment of Indefiniteness by Defendants Dell Inc., Echostar Corporation, Hughes Network Systems LLC, Hewlett Packard Enterprise Co., HP Enterprise Services, LLC, Riverbed Technology, Inc., SAP America Inc., and Sybase, Inc., filed in *Realtime Data LLC d/b/a IXO v. Actian Corporation, et al.*, Case No. 6:16-cv-00463-RWS-JDL (E.D. Texas), filed Jun. 13, 2016; 24 pages.
Declaration of James A. Storer, Ph.D., Exhibit 5 to Defendants' Responsive Claim Construction Brief, filed in *Realtime Data LLC d/b/a IXO v. Actian Corporation, et al.*, Case No. 6:16-cv-00463-RWS-JDL (E.D. Texas), filed Jun. 13, 2016; 37 pages.
Dell Inc.'s Answer, Defenses, and Counterclaims to Plaintiffs Amended Complaint, filed in *Realtime Data LLC d/b/a IXO v. Dell Inc., et al.*, Case No. 6:16-cv-00089-RWS-JDL (E.D. Texas), filed Jun. 23, 2016; 17 pages.
Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 12 pages.
Invalidity Chart for U.S. Pat. No. 7,415,530 based on U.S. Pat. No. 5,247,646 ("Osterlund"), filed as Exhibit A to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 19 pages.
Invalidity Chart for U.S. Pat. No. 7,415,530 based on U.S. Pat. No. 5,479,638 ("Assar"), filed as Exhibit B to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 5 pages.
Invalidity Chart for U.S. Pat. No. 7,415,530 based on U.S. Pat. No. 5,771,354 ("Crawford"), filed as Exhibit C to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 20 pages.

(56) References Cited

OTHER PUBLICATIONS

Invalidity Chart for U.S. Pat. No. 7,415,530 based on U.S. Pat. No. 5,319,682 ("Clark"), filed as Exhibit D to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 20 pages.
513 v. PCT Publication No. WO 00/46688 to Wang et al., filed as Exhibit E to Defendants' Motion for Leave to Supplement Their Invalidity Contentions, filed *Realtime Data LLC d/b/a IXO v. Actian Corporation, et al.*, Case No. 6:15-cv-00463-RWS-JDL (E.D. Texas), filed Jun. 24, 2016; 53 pages.
Invalidity Chart for U.S. Pat. No. 9,116,908 Based on U.S. Pat. No. 5,247,646 ("Osterlund"), filed as Exhibit F to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 16 pages.
Defendant Dell Inc.'s Preliminary Election of Prior Art, filed as Exhibit M to Defendants' Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jun. 24, 2016; 20 pages.
Plaintiff Realtime Data LLC's Reply Claim Construction Brief, filed in *Realtime Data LLC d/b/a IXO v. Actian Corporation, et al.*, Case No. 6:15-cv-00463-RWS-JDL (E.D. Texas), filed Jun. 27, 2016; 15 pages.
Plaintiff Realtime Data LLC's Response to Moving Defendants' Motion for Partial Summary Judgment of Indefiniteness, filed in *Realtime Data LLC d/b/a IXO v. Actian Corporation, et al.*, Case No. 6:15-cv-00463-RWS-JDL (E.D. Texas), filed Jun. 27, 2016; 20 pages.
Moving Defendants' Reply Brief in Support of Their Motion for Partial Summary Judgment of Indefiniteness, filed in *Realtime Data LLC d/b/a IXO v. Actian Corporation, et al.*, Case No. 6:15-cv-00463-RWS-JDL (E.D. Texas), filed Jun. 30, 2016; 9 pages.
Joint Claim Construction Chart—Exhibit A, filed in *Realtime Data LLC d/b/a IXO v. Actian Corporation, et al.*, Case No. 6:15-cv-00463-RWS-JDL (E.D. Texas), filed Jun. 30, 2016; 3 pages.
Joint Claim Construction Chart—Exhibit B, filed in *Realtime Data LLC d/b/a IXO v. Actian Corporation, et al.*, Case No. 6:15-cv-00463-RWS-JDL (E.D. Texas), filed Jun. 30, 2016; 18 pages.
Plaintiff's Notice of Supplemental Facts, filed in *Realtime Data LLC d/b/a IXO v. Actian Corporation, et al.*, Case No. 6:15-cv-00463-RWS-JDL (E.D. Texas), filed Jul. 5, 2016; 3 pages.
Defendants' Motion to Supplement the Claim Construction Record, filed in *Realtime Data LLC d/b/a IXO v. Actian Corporation, et al.*, Case No. 6:15-cv-00463-RWS-JDL (E.D. Texas), and *Realtime Data LLC d/b/a IXO v. Oracle America Inc.*, Case No. 6:16-cv-00088-RWS-JDL (E.D. Texas), filed Jul. 11, 2016; 10 pages.
Joint Claim Construction and Prehearing Statement, filed in *Realtime Data LLC d/b/a IXO v. Oracle America Inc.*, Case No. 6:16-cv-00088-RWS-JDL (E.D. Texas), filed Jul. 13, 2016; 5 pages.
Exhibit A to Joint Claim Construction and Prehearing Statement, filed in *Realtime Data LLC d/b/a IXO v. Oracle America Inc.*, Case No. 6:16-cv-00088-RWS-JDL (E.D. Texas), filed Jul. 11, 2016; 5 pages.
Plaintiff Realtime Data LLC's Response to Defendants' Motion to Supplement the Claim Construction Record, filed in *Realtime Data LLC d/b/a IXO v. Actian Corporation et al.*, Case No. 6:15-cv-00463-RWS-JDL (E.D. Texas), and *Realtime Data LLC d/b/a IXO v. Oracle America, Inc.*, Case No. 6:15-cv-00088-RWS-JDL (E.D. Texas), filed Jul. 14, 2016; 14 pages.
Complaint for Patent Infringement Against Rackspace US, Inc., Netapp, Inc., and Solidfire, Inc., filed in *Realtime Data LLC d/b/a IXO v. Rackspace US, Inc., et al.*, Case No. 6:16-cv-00961 (E.D. Texas), filed Jun. 29, 2016; 216 pages.

Complaint for Patent Infringement Against Fujitsu America, Inc. and Quantum Corporation, filed in *Realtime Data LLC d/b/a IXO v. Fujitsu America, Inc. et al.*, No. 6:16-cv-01035 (E.D. Texas), filed Jul. 21, 2016; 137 pages.
Complaint for Patent Infringement Against Vembu Technologies, Inc., filed in *Realtime Data LLC d/b/a IXO v. Vembu Technologies, Inc.*, No. 6:16-cv-01037 (E.D. Texas), filed Jul. 22, 2016; 86 pages.
Memorandum Opinion and Order, issued in *Realtime Data LLC v. Actian Corporation, et al.*, Case No. 6:16-cv-00088-RWS-JDL (E.D. Texas), issued Jul. 28, 2016; 40 pages.
Defendants' Reply on Their Motion for Leave to Supplement Their Invalidity Contentions, filed in *Realtime Data LLC d/b/a IXO v. Actian Corporation, et al.*, Case No. 6:15-cv-00463-RWS-JDL (E.D. Texas), filed Jul. 25, 2016; 9 pages.
Plaintiff Realtime Data LLC's Opening Claim Construction Brief, filed in *Realtime Data LLC d/b/a IXO v. Oracle America, Inc.*, Case No. 6:16-cv-00088-RWS-JDL (E.D. Texas), filed Jul. 25, 2016; 12 pages.
Expert Declaration of Dr. Kenneth Zeger, filed as Exhibit 1 to Plaintiff Realtime Data LLC's Opening Claim Construction Brief, filed in *Realtime Data LLC d/b/a IXO v. Oracle America, Inc.*, Case No. 6:16-cv-00088-RWS-JDL (E.D. Texas), filed Jul. 25, 2016; 30 pages.
Report and Recommendation of United States Magistrate Judge, issued in *Realtime Data LLC d/b/a IXO v. Actian Corporation, et al.*, Case No. 6:15-cv-00463-RWS-JDL (E.D. Texas), issued Jul. 28, 2016; 12 pages.
Defendant Teradata Operations, Inc.'s Answer to Amended Complaint and Counterclaims, filed in *Realtime Data LLC d/b/a IXO v. Teradata Operations, Inc.*, Case No. 2:16-cv-02743-AG-FFM (C.D. Cal.), filed Aug. 3, 2016; 34 pages.
Defendants Hewlett Packard Enterprise Co. and HP Enterprise Services, LLC's Objections to Report and Recommendation of Magistrate Judge, filed in *Realtime Data LLC d/b/a IXO v. Oracle America, Inc.*, Case No. 6:16-cv-00088-RWS-JDL (E.D. Texas), filed Aug. 11, 2016; 6 pages.
Defendants' Objections to Memorandum Opinion and Order on Claim Constructions and Motion to Reconsider, filed in *Realtime Data LLC d/b/a IXO v. Actian Corporation, et al.*, Case No. 6:15-cv-00463-RWS-JDL (E.D. Texas), filed Aug. 12, 2016; 10 pages.
Defendants' Responsive Claim Construction Brief, filed in *Realtime Data LLC d/b/a IXO v. Oracle America, Inc*, Case No. 6:16-cv-088-RWS-JDL (E.D. Texas), filed Aug. 12, 2016; 8 pages.
Declaration of James A. Storer, Ph.D, filed in *Realtime Data LLC d/b/a IXO v. Oracle America, Inc*, Case No. 6:16-cv-00088-RWS-JDL (E.D. Texas), filed Aug. 12, 2016; 11 pages.
Plaintiff Realtime Data LLC's Reply Claim Construction Brief, filed in *Realtime Data LLC d/b/a IXO v. Oracle America, et al.*, Case No. 6:16-cv-00088-RWs-JDL (E.D. Texas), filed Aug. 19, 2016; 6 pages.
Plantiff Realtime Data LLC's Joint Claim Construction Chart, filed in *Realtime Data LLC d/b/a IXO v. Oracle America, Inc.*, Case No. 6:16-cv-00088-RWS-JDL (E.D. Texas), filed Aug. 26, 2016; 4 pages.
Plantiff Realtime Data LLC's Exhibit A, filed in *Realtime Data LLC d/b/a IXO v. Oracle America, Inc.*, Case No. 6:16-cv-00088-RWS-JDL (E.D. Texas), filed Aug. 26, 2016; 1 page.
Plaintiff Realtime Data Llc's Exhibit B, filed in *Realtime Data LLC d/b/a IXO v. Oracle America, Inc.*, Case No. 6:16-cv-00088-RWS-JDL (E.D. Texas), filed Aug. 26, 2016; 4 pages.
Defendant Dell, Inc.'s Answer and Defenses to Plaintiff's Second Amended Complaint, filed in *Realtime Data LLC d/b/a IXO v. Dell Inc.*, Case No. 6:16-cv-89 (E.D. Texas), filed Aug. 30, 2016; 21 pages.
Defendant EMC Corporation's Answer and Defenses to Plaintiff's Second Amended Complaint, filed in *Realtime Data LLC d/b/a IXO v. Dell Inc.*, Case No. 6:16-cv-89-RWS-JDL (E.D. Texas), filed Aug. 30, 2016; 23 pages.
Plaintiff Realtime Data LLC's Response in Opposition to Defendants' Objections to Memorandum Opinion and Order on Claim Construction and Motion to Reconsider, filed in *Realtime Data LLC*

(56) References Cited

OTHER PUBLICATIONS d/b/a IXO v. Actian Corporation, et al., Case No. 6:15-cv-463-RWS-JDL (E.D. Texas), filed Aug. 29, 2016; 8 pages.
Dell Inc.'s Answer and Defenses to Plaintiff's Second Amended Complaint, filed in Realtime Data LLC d/b/a IXO v. Dell Inc. and EMC Corporation, Case No. 6:16-cv-89-RWS-JDL (E.D. Texas), filed Aug. 30, 2016; 21 pages.
EMC Corporation's Answer and Defenses to Plaintiff's Second Amended Complaint, filed in Realtime Data LLC d/b/a IXO v. Dell Inc. and EMC Corporation, Case No. 6:16-cv-89-RWS-JDL (E.D. Texas), filed Aug. 30, 2016; 23 pages.
Defendants Hewlett Packard Enterprise Co. and HP Enterprise Services, LLC's Answer to Plaintiff's Amended Complaint for Patent Infringement and Counterclaims, filed in Realtime Data LLC d/b/a IXO v. Hewlett Packard Enterprise Co. et al., Case No. 6:16-cv-00086-RWS-JDL (E.D. Texas), filed Sep. 1, 2016; 26 pages.
Answer, Defenses, and Counterclaims to Plaintiff's Amended Complaint for Patent Infringement, filed in Realtime Data LLC d/b/a IXO v. Hewlett Packard Enterprise Co. et al., Case No. 6:16-cv-00086-RWS-JDL (E.D. Texas), filed Sep. 1, 2016; 29 pages.
Savvis Communications Corporation's Answer, Defenses, and Counterclaims to Realtime's Amended Complaint, filed in Realtime Data LLC d/b/a IXO v. Savvis Communications Corporation, and Veritas Technologies LLC, Case No. 6:16-cv-00087-RWS-JDL (E.D. Texas), filed Sep. 2, 2016; 18 pages.
Defendant Veritas Technologies LLC's Answer, Affirmative Defenses, and Counterclaims, filed in Realtime Data LLC d/b/a IXO v. Centurylink, Inc. and Veritas Technologies, Case No. 6:16-00087-RWS-JDL, filed Sep. 2, 2016; 35 pages.
NetApp, Inc.'s and Solidfire, LLC's Answer to Amended Complaint, filed in Realtime Data LLC d/b/a IXO v. Rackspace US, Inc. et al., Case No. 6:16-cv-961 (E.D. Texas), filed Sep. 6, 2016; 61 pages.
Rackspace US Inc.'s Answer to Amended Complaint, filed in Realtime Data LLC d/b/a IXO v. Rackspace US, Inc. et al., Case No. 6:16-cv-961 (E.D. Texas), filed Oct. 25, 2016; 39 pages.
NetApp, Inc.'s and Solidfire, LLC's Answer to Amended Complaint, filed in Realtime Data LLC d/b/a IXO v. Rackspace US, Inc. et al., Case No. 6:16-cv-961 (E.D. Texas), filed Oct. 28, 2016; 66 pages.
Joint Claim Construction and Prehearing Statement, filed in Realtime Data LLC d/b/a IXO v. Apple Inc., Case No. 16-cv-02595-JD (N.D. California), filed Jan. 6, 2017; 6 pages.
Joint Claim Construction and Prehearing Statement Exhibit A, filed in Realtime Data LLC d/b/a IXO v. Apple Inc., Case No. 16-cv-02595-JD (N.D. California), filed Jan. 6, 2017; 27 pages.
Joint Claim Construction and Prehearing Statement Exhibit B, filed in Realtime Data LLC d/b/a IXO v. Apple Inc., Case No. 16-cv-02595-JD (N.D. California), filed Jan. 6, 2017; 17 pages.
Joint Claim Construction and Prehearing Statement Exhibit C, filed in Realtime Data LLC d/b/a IXO v. Apple Inc., Case No. 16-cv-02595-JD (N.D. California), filed Jan. 6, 2017; 28 pages.
Joint Claim Construction and Prehearing Statement, filed in Realtime Data LLC d/b/a IXO v. Teradata Operations, Inc., Case No. 2:16-cv-02743-AG-FFM (C.D. California), filed Jan. 24, 2017; 56 pages.
Joint Claim Construction and Prehearing Statement with attached Exhibit A, filed in Realtime Data LLC d/b/a IXO v. Hwelett Packard Enterprise Co. et al., Case No. 6:16-cv-00086-RWS-JDL (E.D. Texas), filed Jan. 17, 2017; 46 pages.
Joint Claim Construction and Prehearing Statement with attached Exhibit A, filed in Realtime Data LLC d/b/a IXO v. Hwelett Packard Enterprise Co. et al., Case No. 6:16-cv-00087-RWS-JDL (E.D. Texas), filed Jan. 17, 2017; 46 pages.
Joint Claim Construction and Prehearing Statement with attached Exhibit A, filed in Realtime Data LLC d/b/a IXO v. Hwelett Packard Enterprise Co. et al., Case No. 6:16-cv-00089-RWS-JDL (E.D. Texas), filed Jan. 17, 2017; 46 pages.

Complaint for Patent Infringement Against Oracle America, Inc., filed in Realtime Data LLC d/b/a IXO v. Oracle America, Inc., Case No. 6:17-cv-00046 (E.D. Texas), filed Jan. 23, 2017; 58 pages.
Defendant Teradata Operations, Inc.'s Opening Claim Construction Brief, filed in Realtime Data LLC d/b/a IXO v. Teradat Operations, Inc., Case No. 2:16-cv-02743 (C.D. California), filed Feb. 7, 2017; 40 pages.
Exhibit D Accompanying Declaration of Jamie R. Lynn, filed in Realtime Data LLC d/b/a IXO v. Teradat Operations, Inc., Case No. 2:16-cv-02743 (C.D. California), filed Feb. 7, 2017; 43 pages.
Exhibit E Accompanying Declaration of Jamie R. Lynn, filed in Realtime Data LLC d/b/a IXO v. Teradat Operations, Inc., Case No. 2:16-cv-02743 (C.D. California), filed Feb. 7, 2017; 46 pages.
Exhibit H Accompanying Declaration of Jamie R. Lynn, filed in Realtime Data LLC d/b/a IXO v. Teradat Operations, Inc., Case No. 2:16-cv-02743 (C.D. California), filed Feb. 7, 2017; 15 pages.
Exhibit U Accompanying Declaration of Jamie R. Lynn, filed in Realtime Data LLC d/b/a IXO v. Teradat Operations, Inc., Case No. 2:16-cv-02743 (C.D. California), filed Feb. 7, 2017; 7 pages.
Exhibit 10 Accompanying Declaration of Kenneth Zeger, filed in Realtime Data LLC d/b/a IXO v. Teradat Operations, Inc., Case No. 2:16-cv-02743 (C.D. California), filed Feb. 7, 2017; 12 pages.
Plaintiff Realtime Data LLC's Opening Claim Construction Brief, filed in Realtime Data LLC d/b/a IXO v. Teradata Operations, Inc., Case No. 2:16-cv-02743 (C.D. Cal.), filed Feb. 10, 2017; 36 pages.
Expert Declaration of Kenneth Zeger, filed in Realtime Data LLC d/b/a IXO v. Teradata Operations, Inc., Case No. 2:16-cv-02743 (C.D. Cal.), filed Feb. 10, 2017; 49 pages.
Complaint for Patent Infringement, filed in Realtime Data LLC d/b/a IXO v. Echostar Corporation et al., Case No. 6:17-cv-00084 (E.D. Texas), filed Feb. 14, 2017; 39 pages.
Realtime's Opening Claim Construction Brief, filed in Realtime Data LLC d/b/a IXO v. Apple Inc., Case No. 3:16-cv-02595 (N.D. California), filed Feb. 21, 2017; 26 pages.
Complaint for Patent Infringement Against Arconis, Inc., filed in Realtime Data LLC d/b/a IXO v. Acronis, Inc., Case No. 6:17-cv-00118 (E.D. Texas), filed Feb. 27, 2017; 26 pages.
Complaint for Patent Infringement Against Array Networks Inc., filed in Realtime Data LLC d/b/a IXO v. Array Networks Inc., Case No. 6:17-cv-00119 (E.D. Texas), filed Feb. 27, 2017; 33 pages.
Complaint for Patent Infringement Against Barracuda Networks Inc., filed in Realtime Data LLC d/b/a IXO v. Barracuda Networks Inc., Case No. 6:17-cv-00120 (E.D. Texas), filed Feb. 27, 2017; 99 pages.
Complaint for Patent Infringement Against Carbonite Networks Inc. and Evault Inc., filed in Realtime Data LLC d/b/a IXO v. Carbonite, Inc. et al., Case No. 6:17-cv-00121 (E.D. Texas), filed Feb. 27, 2017; 45 pages.
Complaint for Patent Infringement Against Circadence Networks Inc., filed in Realtime Data LLC d/b/a IXO v. Circadence Corporation, Case No. 6:17-cv-00122 (E.D. Texas), filed Feb. 27, 2017; 33 pages.
Complaint for Patent Infringement Against Commvault Systems, Inc. and Spectra Logic Corporation, filed in Realtime Data LLC d/b/a IXO v. CommVault Systems, Inc. et al., Case No. 6:17-cv-00123 (E.D. Texas), filed Feb. 27, 2017; 58 pages.
Complaint for Patent Infringement Against Exinda Networks Inc., filed in Realtime Data LLC d/b/a IXO v. Exinda Inc., Case No. 6:17-cv-00124 (E.D. Texas), filed Feb. 27, 2017; 26 pages.
Complaint for Patent Infringement Against Netgear, Inc., filed in Realtime Data LLC d/b/a IXO v. Netgear, Inc., Case No. 6:17-cv-00125 (E.D. Texas), filed Feb. 27, 2017; 33 pages.
Complaint for Patent Infringement Against Synacor, Inc., filed in Realtime Data LLC d/b/a IXO v. Synacor Inc., Case No. 6:17-cv-00126 (E.D. Texas), filed Feb. 27, 2017; 23 pages.
Joint Claim Constuction and Prehearing Statement and attached Exhibit A, Realtime Data LLC d/b/a IXO v. Rackspace USA, Inc. et al., Case No. 6:16-cv-00961 (E.D. Texas), filed Mar. 7, 2017; 42 pages.
Defendant Apple Inc.'s Responsive Claim Construction Brief, filed in Realtime Data LLC d/b/a IXO v. Apple Inc., Case No. 3:16-cv-02595 (N.D. California), filed Mar. 10, 2017; 25 pages.

(56) References Cited

OTHER PUBLICATIONS

Declaration of Craig Wills, filed in *Realtime Data LLC d/b/a IXO v. Apple Inc.*, Case No. 3:16-cv-02595 (N.D. California), filed Mar. 10, 2017; 10 pages.
Realtime's Reply Claim Construction Brief, filed in *Realtime Data LLC d/b/a IXO v. Apple Inc.*, Case No. 3:16-cv-02595 (N.D. California), filed Mar. 17, 2017; 12 pages.
Proposed Joint Pretrial Order, filed in *Realtime Data LLC v. Actian Corporation et al.*, Case No. 6:15-cv-00463 (E.D. Texas), filed Mar. 30, 2017; 103 pages.
Realtime's Opening Claim Construction Brief, filed in *Realtime Data LLC d/b/a IXO v. Rackspace US, Inc. et al.*, Case No. 6:16-cv-00961 (E.D. Texas), filed Mar. 31, 2017; 32 pages.
Exhibit 10 to Realtime's Opening Claim Construction Brief: Expert Declaration of Dr. Kenneth Zeger, filed in *Realtime Data LLC d/b/a IXO v. Rackspace US, Inc. et al.*, Case No. 6:16-cv-00961 (E.D. Texas), filed Mar. 31, 2017; 47 pages.
Exhibit 14 to Realtime's Opening Claim Construction Brief: Excerpt from the Hutchinson Dictionary of Computing Multimedia and the Internet, filed in *Realtime Data LLC d/b/a IXO v. Rackspace US, Inc. et al.*, Case No. 6:16-cv-00961 (E.D. Texas), filed Mar. 31, 2017; 4 pages.
Complaint for Patent Infringement, filed in *Realtime Data LLC d/b/a IXO v. Riverbed Technology, Inc.*, Case No. 6:17-cv-00198 (E.D. Texas), filed Apr. 3, 2017; 19 pages.
Defendants' Preliminary Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 138 pages.
Non-Confidential Exhibits A1-A7 and A9-A10 to Defendants' Preliminary Invalidity Contentions, submitted in *Realtime Data LLC d/b/a IXO v. Actian Corporation, et al.*, Case No. 6:15-cv-0063-RWS-JDL (E.D. Texas), served Dec. 4, 2015; 743 pages.
Non-Confidential Exhibits B1-B17 and B19 to Defendants' Preliminary Invalidity Contentions, submitted in *Realtime Data LLC d/b/a IXO v. Actian Corporation, et al.*, Case No. 6:15-cv-0063-RWS-JDL (E.D. Texas), served Dec. 4, 2015; 506 pages.
Non-Confidential Exhibits C1-C36 to Defendants' Preliminary Invalidity Contentions, submitted in *Realtime Data LLC d/b/a IXO v. Actian Corporation, et al.*, Case No. 6:15-cv-0063-RWS-JDL (E.D. Texas), served Dec. 4, 2015; 1,445 pages.
Non-Confidential Exhibits D1-D14 and D16 to Defendants' Preliminary Invalidity Contentions, submitted in *Realtime Data LLC d/b/a IXO v. Actian Corporation, et al.*, Case No. 6:15-cv-0063-RWS-JDL (E.D. Texas), served Dec. 4, 2015; 1,052 pages.
Non-Confidential Exhibits E1-E36 to Defendants' Preliminary Invalidity Contentions, submitted in *Realtime Data LLC d/b/a IXO v. Actian Corporation, et al.*, Case No. 6:15-cv-0063-RWS-JDL (E.D. Texas), served Dec. 4, 2015; 1,205 pages.
Katz, et al., "The Bay Area Research Wireless Access Network (BARWAN)," Proceedings of COMPCON '96, 1996; pp. 15-20.
U.S. Appl. No. 60/100,671, "Hybrid Compression Method with Compression Ratio Control," filed Sep. 16, 1998; 50 pages.
Welch, T., "A Technique for High-Performance Data Compression," Computer, vol. 18, Issue 6, 1984; pp. 8-19.
Internet Archive version of the web page www.imatix.com/index.htm, dated May 20, 1998, available at http://web.archive.org/web/19980520033922/http://imatix.com/index.htm; 1 page.
Internet Archive version of the web page www.imatix.com/index.htm, dated Jan. 10, 1998, available at http://web.archive.org/web/19980110141513/http://imatix.com/index.htm; 1 page.
Internet Archive version of the web page www.imatix.com/, dated Jan. 9, 1998, available at https://web.archive.org/web/19980109064903/http://imatix.com/; 1 page.
Internet Archive version of the web page www.imatix.com/, dated Oct. 14, 1997, available at https://web.archive.org/web/19971014195839/http://www.imatix.com/; 1 page.
Internet Archive version of the web page www.imatix.com/, dated Jun. 29, 1997, available at https://web.archive.org/web/19970629063852/http://www.imatix.com/; 2 pages.
Internet Archive version of the web page www.imatix.com/, dated Apr. 16, 1997, available at https://web.archive.org/web/19970416061218/http://imatix.com/; 2 pages.
Internet Archive version of the web page www.imatix.com/, dated Dec. 21, 1996, available at https://web.archive.org/web/19961221064553/http://imatix.com/; 2 pages.
Internet Archive version of the web page www.imatix.com/, dated Nov. 6, 1996, available at https://web.archive.org/web/19961106161211/http://imatix.com/; 2 pages.
"Liberetto, The iMatix Newsletter," vol. III, issue 9, Sep. 1998, available at http://legacy.imatix.com/html/libero/doc/news9809.txt; 9 pages.
"Liberetto, The iMatix Newsletter," vol. III, issue 4, Apr. 1998, available at http://legacy.imatix.com/html/libero/doc/news9804.txt; 8 pages.
"Liberetto, The iMatix Newsletter," vol. III, issue 1, Jan. 1998, available at http://legacy.imatix.com/html/libero/doc/news9801.txt; 7 pages.
"Liberetto, The iMatix Newsletter," vol. II issue 8, Aug. 1997, available at http://legacy.imatix.com/html/libero/doc/news9708.txt; 8 pages.
"Liberetto, The iMatix Newsletter," vol. II, issue 6, Jun. 1997, available at http://legacy.imatix.com/html/libero/doc/news9706.txt; 6 pages.
"Liberetto, The iMatix Newsletter," vol. II, issue 2, Feb. 1997, available at http://legacy.imatix.com/html/libero/doc/news9702.txt; 9 pages.
Internet Archive version of the web page www.seas.upenn.edu/~liefke/, dated Oct. 5, 1999, available at https://web.archive.org/web/19991005050552/http:/www.seas.upenn.edu/~liefke/; 2 pages.
Internet Archive version of the web page www.seas.upenn.edu/~liefke/research.html, dated Jan. 18, 2000, available at https://web.archive.org/web/20000118224540/http://www.seas.upenn.edu/~liefke/research.html; 2 pages.
Internet Archive version of the web page www.seas.upenn.edu/~liefke/xmlzip.html, dated Jan. 19, 2000, available at https://web.archive.org/web/20000119051403/http:/www.seas.upenn.edu/~liefke/xmlzip.html; 4 pages.
Internet Archive version of the web page www.research.att.com/~suciu/strudel/external/NodeExternal,internal.genoid_3.html, dated Mar. 10, 2000, available at https://web.archive.org/web/20000310042016/http:/www.research.att.com/~suciu/strudel/external/NodeExternal,internal.genoid_3.html; 12 pages.
Internet Archive version of the web page www.research.att.com/sw/tools/xmill/, dated Aug. 31, 2000, available at https://web.archive.org/web/20000831200854/http:/www.research.att.com/sw/tools/xmill/; 2 pages.
Internet Archive version of the web page www.research.att.com/sw/tools/xmill/download.html, dated Sep. 25, 2000, available at https://web.archive.org/web/20000925084557/http://www.research.att.com/sw/tools/xmill/download.html; 1 page.
Liefke, et al., "Xmill: an Efficient Compressor for XML Data," Proceedings of the 2000 ACM SIGMOD International Conference on the Management of Data, 2000; pp. 153-164.
"User Manual for XMill," XMill Version 0.7 (1999); 16 pages.
Standard Function Library (SFL) Code, Version 1.4, written Mar. 29, 1993, revised Jan. 2, 1997; 190 pages.
Standard Function Library Documentation, written Jun. 4, 1997, revised Nov. 17, 1997; 1,102 pages. (Submitted in 6 parts.).
Defendants Oracle America, Inc., Hewlett-Packard Company, and HP Enterprise Services, LLC's Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 62 pages.
Non-Confidential Exhibits A3-A4 to Defendants Oracle America, Inc., Hewlett-Packard Company, and HP Enterprise Services, LLC's Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 296 pages.
Non-Confidential Exhibits B3-B4 to Defendants Oracle America, Inc., Hewlett-Packard Company, and HP Enterprise Services, LLC's Invalidity Contentions, submitted in *Realtime Data LLC d/b/a IXO*

(56) References Cited

OTHER PUBLICATIONS v. *Actian Corporation, et al.*, Case No. 6:15-cv-00463-RWS-JDL (E.D. Texas), served Dec. 4, 2015; 1,179 pages.
Non-Confidential Exhibits C4-C7 and C9 to Defendants Oracle America, Inc., Hewlett-Packard Company, and HP Enterprise Services, LLC's Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 3,029 pages.
Non-Confidential Exhibits D4-D7 and D9 to Defendants Oracle America, Inc., Hewlett-Packard Company, and HP Enterprise Services, LLC's Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 3,125 pages.
Non-Confidential Exhibits E1-E4 to Defendants Oracle America, Inc., Hewlett-Packard Company, and HP Enterprise Services, LLC's Invalidity Contentions, submitted in *Realtime Data LLC d/b/a IXO v. Actian Corporation, et al.*, Case No. 6:15-cv-00463-RWS-JDL (E.D. Texas), served Dec. 4, 2015; 1,657 pages.
"Adaptive Lossless Data Compression Algorithm," ECMA Standard ECMA-222, Jun. 1995; 20 pages.
"ALDC1-40S Adaptive Lossless Data Compression," IBM Microelectronics Data Compression Technologies, May 1994; 2 pages.
Amir, et al., "An Application Level Video Gateway," ACM Multimedia, San Francisco, Nov. 1995; 11 pages.
Andrews, et al., "A Mean-Removed Variation of Weighted Universal Vector Quantization for Image Coding," IEEE Data Compression Conference, 1993; pp. 302-309.
AX.25 Link Access Protocol for Amateur Packet Radio, Version 2.2, Tuscon Amateur Packet Radio Corporation, Revision: Jul. 1998; 143 pages.
Baker, et al., "Lossless Data Compression for Short Duration 3D Frames in Positron Emission Tomography," IEEE Nuclear Science Symposium and Medical Imaging Conference, 1993; pp. 1831-1834.
Bassiouni, et al., "A Scheme for Data Compression in Supercomputers," IEEE Supercomputing '88, 1988; pp. 272-278.
Bruckmann, et al., "Selective Medical Image Compression Using Wavelet Techniques," Journal of Computing and Information Technology, vol. 6, No. 2 (1998); 23 pages.
Cheng, et al., "A fast, highly reliable data compression chip and algorithm for storage systems," IBM Journal of Research and Development, vol. 40, No. 6, Nov. 1996; pp. 603-613.
Zhang, et al., "Content-based video retrieval and compression: a unified solution," IEEE Proceedings of the International Conference on Image Processing, Oct. 1997; pp. 13-16.
Craft, D., "A fast hardware data compression algorithm and some algorithmic extensions," IBM Journal of Research and Development, vol. 42, No. 6, Nov. 1998; pp. 733-745.
Sattler, M., *Internet TV with CU-SeeMe*, Indianapolis, IN: sams.net, 1995; 172 pages. (Submitted in 2 parts.).
Danskin J., "Compressing the X Graphics Protocol," Dissertation, Princeton University Department of Computer Science, Jan. 1995; 147 pages.
Fox, et al., "Adapting to Network and Client Variability via On-Demand Dynamic Distillation," Proceedings of the Seventh International Conference on Architectural Support for Programming Languages and Operating Systems, 1996; pp. 160-170.
Fox, et al., "Adapting to Network and Client Variability Using Infrastructional Proxies: Lessons and Perspectives," Abstract, IEEE Personal Communications, vol. 5, No. 4, Aug. 1998; 2 pages.
Bottou, et al., "High Quality Document Image Compression with DjVu," Journal of Electronic Imaging, vol. 7, No. 3, 1998; pp. 410-425.
Howard, et al., "Parallel Lossless Image Compression Using Huffman and Arithmetic Coding," IEEE Data Compression Conference, Mar. 1992; pp. 299-308.
"Hewlett-Packard Journal," Hewlett-Packard Corporation, Jun. 1989; 84 pages.
Hsu, et al., "Automatic Synthesis of Compression Techniques for Heterogeneous Files," Software—Practice and Experience, vol. 25, No. 10, Oct. 1995; pp. 1097-1116.
"Guide to Sharing and Partitioning IBM Tape Library Dataservers," IBM International Technical Support Organization, San Jose Center, Nov. 1996; 276 pages. (Submitted in 2 parts.).
"Add-On Options for the XpressFiles," Intelligent Compression Technologies, 1998, accessible at <http://web.archive.org/web/19980518053418/ictcompress.com/options_X.html>; 2 pages.
"Introducing XpressFiles," Intelligent Compression Technologies, 1998, accessible at <http://web.archive.org/web/19980518053310/ictcompress.com/xpressfiles.html>; 1 page.
"The Technology Behind XpressFiles," Intelligent Compression Technologies, 1998, accessible at <http://web.archive.org/web/19980518053634/ictcompress.com/technical_X.html>; 1 page.
XpressFiles White Paper, Intelligent Compression Technologies, 1999; 3 pages.
"XML-Xpress Product Overview," Intelligent Compression Technologies, 2001, accessible at <http://web.archive.org/web/20020818002535/www.ictcompress.com/products_xmlxpress.html>; 2 pages.
Larmouth, J., "ASN. 1 Complete," Open Systems Solutions, 1999; 387 pages. (Submitted in 4 parts.).
"Magstar and IBM 3590 High Performance Tape Subsystem Technical Guide," IBM International Technical Support Organization, San Jose Center, Nov. 1996; 287 pages. (Submitted in 2 parts.).
McGregor, et al., "Performance Impact of Data Compression on Virtual Private Network Transactions," IEEE Proceedings of the 25th Annual Conference on Local Computer Networks, 2000; 11 pages.
Summers, B., "Official Microsoft NetMeeting Book," Redmond, WA: Microsoft Press, 1998; 374 pages. (Submitted in 5 parts.).
Britton, et al., *Discover Desktop Conferencing with NetMeeting 2.0*, Foster City, CA: IDG Books Worldwide, Inc., 1998; 304 pages. (Submitted in 4 parts.).
Ranganathan, N., "High-Speed VLSI Designs for Lempel-Ziv-Based Data Compression," IEEE Transactions on Circuits and Systems—II: Analog and Digital Signal Processing, vol. 40, No. 2, Feb. 1993; pp. 96-106.
User's Guide, Sidewinder 50 AIT-1 Tape Drive, Seagate Technology, Inc., 1997; 19 pages.
Prosise, J., "Understanding Data Compression," PC Magazine, May 25, 1993; pp. 305-308.
Welch, T., Source Code, University of California, 1985; 23 pages.
Abali, et al., "Memory Expansion Technology (MXT): Software Support and Performance," IBM Journalist of Research and Development, vol. 45, No. 2, Mar. 2001; pp. 287-301.
Anderson, et al., "Codec Squeezes Color Teleconferencing Through Digital Telephone Lines," Electronics, Jan. 26, 1984; pp. 113-115.
Coene, et al., "A Fast Route for Application of Rate-Distortion Optimal Quantization in an MPEG Encoder," IEEE Proceedings of the International Conference on Image Processing, 1996; pp. 825-828.
Franaszek, et al., "Algorithms and Data Structures for Compressed-Memory Machines," IBM Journal of Research and Development, vol. 45, No. 2, Mar. 2001; pp. 245-258.
Franaszek, et al., "On Internal Organization in Compressed Random-Access Memories," IBM Journal of Research and Development, vol. 45, No. 2, Mar. 2001; pp. 259-270.
IBM Technical Disclosure Bulletin, vol. 38, No. 2, Feb. 1995; 3 pages.
"IBM Boosts Your Memory," Geek.com, accessible at <http://www.geek.com/ibm-boosts-your-memory/>, Jun. 26, 2000; 3 pages.
"IBM Research Breakthrough Doubles Computer Memory Capacity," IBM Press Release, Jun. 26, 2000; 3 pages.
IBM Technical Disclosure Bulletin, vol. 37, No. 2B, Feb. 1994; 3 pages.
International Search Reports directed to International Patent Application Nos. PCT/US01/03711 and PCT/US01/03712, dated Jan. 28, 2001 and May 10, 2002; 9 pages.
Murashita, et al., "High-Speed Statistical Compression Using Self-Organized Rules and Predetermined Code Tables," IEEE Proceedings of Data Compression Conference, 1996; p. 449.

(56) References Cited

OTHER PUBLICATIONS

Rice, et al., "Lossless Coding Standards for Space Data Systems," IEEE Conference Record of the Thirtieth Asilomar Conference on Signals, Systems and Computers, 1996; pp. 577-585.
Rice, R., "Some Practical Universal Noiseles Coding Techniques," National Aeronautics and Space Administration, JPL Publication 79-22, 1979; 149 pages.
"ServerWorks to Deliver IBM's Memory eXpansion Technology in Next-Generation Core Logic for Servers," ServerWorks press release, accessible at <http://www.serverworks.com/news/press/000627.html>, Jun. 27, 2000; 1 page.
Smith, et al., "Memory Expansion Technology (MXT): Competitive Impact," IBM Journal of Research and Development, vol. 45, No. 2, Mar. 2001; pp. 303-309.
Tremaine, et al., "IBM Memory Expansion Technology (MXT)," IBM Journal of Research and Development, vol. 45, No. 2, Mar. 2001; pp. 271-285.
Venbrux, et al., "A VLSI Chip Set for High-Speed Lossless Data Compression," IEEE Transactions on Circuits and Systems for Video Technology, vol. 2, No. 4, Dec. 1992; pp. 381-391.
Yeh, P., "The CCSDS Lossless Data Compression Recommendation for Space Applications," Chapter 16, *Lossless Compression Handbook*, Sayood, K., ed., Academic Press, 2003; pp. 311-326.
Martin, J., "HP drive offers data compression," Computerworld, May 9, 1988; p. 76.
Millman, H., "Image and Video Compression," Computerworld, Jan. 18, 1999; p. 78.
"MegaRam Disc Emulator: Revolutionary, Non-rotating, Solid-state Replacement for Fixed and Moving Head Discs," Imperial Technology, Inc., Oct. 1985; 4 pages.
"MegaRam-PC: Solid-State Disk Emulator for the IBM and IBM Compatible Personal Computers," Imperial Technology, Inc., Oct. 1985; 2 pages.
"MegaRam Solid State Disks," Imperial Technology, Inc., accessible via the Internet Archive at <https://web.archive.org/web/19990501183337/http://imperialtech.com/SolidState.html>, May 1, 1999; 3 pages.
"Quantum Rushmore Solid State Disk Drives," Quantum Corporation, accessible via the Internet Archive at <http://web.archive.org/web/19990508051125/http://www.quantum.com/products/ssd/>, May 8, 1999; 3 pages.
"Lucent Opts for Hi/fn Compression and Encryption in Latest Portmaster Products," PR Newswire, May 11, 1999; 2 pages.
7711 to 7751 Migration Application Note, Hi/fn Network Security Processors, Application Note AN-0002-00, Oct. 1, 1998; 8 pages.
9705 Network Software Design Guide Application Note, Stac Electronics, Inc., APP-0012 Revision 1.0, May 1993; 30 pages.
9705/9705A Data Compression Coprocessor Data Sheet, Hi/fn, May 1996; 87 page.
9711 to 7711 Migration Application Note, Hi/fn Network Security Processors, Application Note AN-0007-00, Oct. 1, 1998; 7 pages.
9732AM Data Compression Coprocessor Data Sheet, Hi/fn, PRS-0055 Revision 0.1, May 1999; 58 pages.
Blelloch, G., "Algorithms in the Real World: Lecture Notes (Fall 1997)," Lecture Notes, UC Berkeley, Apr. 23, 1998; 303 pages. (Submitted in 2 parts.).
LeCun, et al., "DjVu: a Compression Method for Distributing Scanned Documents in Color over the Internet," AT&T Labs—Research, Jan. 1999; 2 pages.
9732A Data Compression Coprocessor Data Sheet, Hi/fn, Oct. 1999; 50 pages.
7711 Encryption Processor Data Sheet, Hi/fn Network Security Processors, Jun. 1999; 77 pages.
7751 Encryption Processor Data Sheet, Hi/fn Network Security Processors, Jun. 1999; 84 pages.
9751 Data Compession Processor Data Sheet, Hi/fn, Jun. 1999; 66 pages.
"Hi/fn Encryption Products Power Network Alchemy's Revolutionary VPN Products," Business Wire, Jan. 26, 1999; 2 pages.

"Hi/fn Provides Hardware Encryption for Xedia's New Access Point QPVN Internet Access Platform," Business Wire, Oct. 19, 1998; 2 pages.
"LZW Data Compression," Dr. Dobb's, Oct. 1, 1989; 14 pages.
"New Accelerator Chip From Hi/fn to Speed-Up Virtual Private Networks—'VPNs'," Business Wire, Jan. 26, 1999; 3 pages.
Programming the 7711 for IPSEC Applications Application Note, Hi/fn Network Security Processors, Application Note AN-0002-00, Oct. 1, 1998; 15 pages.
Friend, R., "IP Payload Compression Using LZS, Request for Comments" The Internet Society, Network Working Group, Hi/fn, Inc., Dec. 1998; 9 pages.
Screenshot of hifn.com, accessible via the Internet Archive at <https://web.archive.org/web/19981212025553/http://www.hifn.com/>, Dec. 12, 1998; 1 page.
Wirbel, L., "Volume shipment for Hi/fn encryption processor," Electronic Engineering Times, Issue 1005, May 4, 1998; 2 pages.
"Intelligent Compression Technologies: Intelligent Compression Technologies releases XML compressor, XML-Xpress," M2 Presswire, Jan. 30, 2001; 5 pages.
Form 10—General Form for Registration of Securities, hi/fn, inc., United States Securities and Exchange Commission, filed Dec. 8, 1998; 387 pages. (Submitted in 3 parts.).
Form S-3—Registration Statement Under the Securities Act of 1913, hi/fn, inc., United States Securities and Exchange Commission, filed Feb. 17, 1999; 151 pages.
HP 7979A/7980A/7980XC Tape Drive User's Guide, Hewlett-Packard Corporation, HP Computer Museum, Oct. 1988; 76 pages.
7980A Tape Drive—Documentation, HP Computer Museum, accessible at <http://www.hpmuseum.net/exhibit.php?hwdoc=390>, Sep. 22, 2015; 1 page.
The HP 7980A/7979A ½-inch Tape Drives, Hewlett-Packard Product Specifications, Jun. 1, 1987; 2 pages.
9145A Tape Drive—Documentation, HP Computer Museum, accessible at <http://www.hpmuseum.net/exhibit.php?hwdoc=258>, Sep. 22, 2015; 1 page.
Hp 9145A Tape Drive User's Manual, Edition 1, Hewlett-Packard Corporation, Jul. 1988; 61 pages.
Peripheral Products, HP Computer Museum, accessible at <http://www.hpmuseum.net/exhibit.php?class=4&cat=85>, Sep. 22, 2015; 3 page.
Pall, G., "Microsoft Point-To-Point Compression (MPPC) Protocol, Request for Comments," The Internet Society, Network Working Group, Hi/fn, Inc., Dec. 1998; 9 pages.
"Cisco IOS Data Compression," Cisco Systems White Paper, 1997; 10 pages.
"Reference Software 7751 Encryption Processor," Hi/fn Network Security Processors, Reference Software RS-0001-00, Oct. 1, 1998; 38 pages.
Screenshot of hifn.corn, accessible via the Internet Archive at <https://web.archive.org/web/19981205163011/http://www.hifn.com>, Dec. 5, 1998; 1 page.
TESS Record for Serial No. 78040025, filed Dec. 20, 2000, "Typed Drawing," accessed Nov. 10, 2015; 1 page.
"Compaq Professional Workstation AP500 Key Technologies White Paper," Compaq Computer Corporation, Aug. 1998; 21 pages.
Langdon, G., "An Introduction to Arithmetic Coding," IBM Journal of Research and Development, vol. 28, No. 2, Mar. 1984; pp. 135-149.
"Connecting Your HP SureStore CD-Writer Plus Drive: Windows 95 and Windows NT 4.0," Hewlett-Packard Corporation, 1997; 50 pages.
"Quantum Rushmore Solid State Disk Drives," Quantum Corporation, accessible via the Internet Archive at <http://web.archive.org/web/19980220122303/http://www.quantum.com/products/ssd/>, Feb. 20, 1998; 2 pages.
"MegaRam Solid State Disks," Imperial Technology, Inc., accessible via the Internet Archive at <https://web.archive.org/web/19980206055558/http://imperialtech.com/SolidState.html>, Feb. 6, 1998; 2 pages.

(56) References Cited

OTHER PUBLICATIONS

"Replica—The Fastest, Most Reliable Data Protection for Servers," accessible via the Internet Archive at <http://web.archive.org/web/19970226213335/http://www1.stac.com/soft/replfct.html>, Feb. 26, 1997; 4 pages.

"Object Replication: A Revolutionary Advance in Distributed Data Protection and Recovery," Stac White Paper, 1999; 7 pages.

"Features and Benefits for Replica," Replica for NetWare, 1999; 3 pages.

DjVu 2.2 Reference Library, Aug. 2000 (submitted on compact disc).

"Replica—The Fastest, Most Reliable Data Protection for Servers," accessible via the Internet Archive at <http://web.archive.org/web/19970226213335/http:/www1.stac.com/soft/replcont.html>, Feb. 26, 1997; 1 page.

"Stac Products & Technology," accessible via the Internet Archive at <http://web.archive.org/web/19970226213054/http:/www1.stac.com/soft/softprod.html>, Feb. 26, 1997; 1 page.

"Hi/fn Product Catalog," accessible via the Internet Archive at <http://web.archive.org/19971010233632/http:/www.hifn.com/products/product/index.htm>, Oct. 10, 1997; 1 page.

"Hi/fn Products," accessible via the Internet Archive at <http://web.archive.org/19971010233115/http:/www.hifn.com/products/indexhtm>, Oct. 10, 1997; 1 page.

"Replica Family," accessible via the Internet Archive at <http://web.archive.org/19980212174817/http:/www.stac.com/replica/rep_overview.html>, Feb. 12, 1998; 1 page.

"Stac Web Site Cotents," accessible via the Internet Archive at <http://web.archive.org/19990827224836/http:/www.stac.com/subcontents/sitemap.asp?sitemap>, Aug. 27, 1999; 4 pages.

"Data Compression Procedures for Data Circuit Terminating Equipment (DCE) Using Error Correcting Procedures," International Telecommunication Union Recommendation V.42 bis, 1990; 29 pages.

Stac, Inc., News Articles, dated Mar. 10, 1997 to Feb. 2, 1999; 41 pages.

Orost Archive of Welch Source Code, University of California, 1985; 54 pages.

Sidewinder 50 Product Manual, Rev. A, Seagate Technology, Inc., 1997; 189 pages. (Submitted in 3 parts.).

Form 10-Q Quarterly Report Pursuant to Section 13 or 15(d) of the Security Exchange Act of 1934, Stac Software, Inc., filed Aug. 13, 1999; 16 pages.

"Hi/Fn™ 7711 Encryption Processor™ Shipping in Volume," PR Newswire, Apr. 20, 1998; 2 pages.

"Lucent Technologies Selects," PR Newswire, Mar. 1, 1999; 2 pages.

"Stac backs it up with Replica," INFOSTOR, May 1, 1998; 2 pages.

Notice of Allowance in Commonly-Assigned U.S. Appl. No. 11/651,366, dated Apr. 10, 2009; 7 pgs.

Non-Final Office Action for U.S. Appl. No. 12/684,624, dated Nov. 10, 2010, 5 pgs.

Notice of Allowance for U.S. Appl. No. 12/123,081, dated Feb. 17, 2011, 7 pgs.

Non-Final Office Action for U.S. Appl. No. 12/688,413, dated Sep. 27, 2010, 13 pgs.

Notice of Allowance for U.S. Appl. No. 11/551,211, dated Jan. 31, 2011, 4 pgs.

Notice of Allowance for U.S. Appl. No. 11/551,211, dated Sep. 22, 2010, 4 pgs.

Notice of Allowance for U.S. Appl. No. 11/551,204, dated Jan. 11, 2011, 4 pgs.

Notice of Allowance for U.S. Appl. No. 11/553,419, dated Sep. 22, 2010, 4 pgs.

Non-Final Office Action for U.S. Appl. No. 11/400,008, dated Nov. 23, 2010, 7 pgs.

Notice of Allowance for U.S. Appl. No. 11/651,365, dated Feb. 4, 2010, 8 pgs.

Notice of Allowance for U.S. Appl. No. 11/651,365, dated Nov. 19, 2009, 8 pgs.

Non-Final Office Action for U.S. Appl. No. 09/969,987, dated Aug. 27, 2010, 13 pgs.

Final Office Action for U.S. Appl. No. 09/969,987, dated Jan. 28, 2010, 11 pgs.

Notice of Allowance for U.S. Appl. No. 12/131,631, dated Jun. 22, 2010, 5 pgs.

Final Office Action for U.S. Appl. No. 11/400,008, dated Oct. 30, 2009, 7 pgs.

Final Office Action for U.S. Appl. No. 11/400,008, dated May 11, 2010, 7 pgs.

Notice of Allowance for U.S. Appl. No. 11/551,204, dated Sep. 30, 2010; 4 pages.

Non-Final Office Action for U.S. Appl. No. 11/551,204, dated Jun. 16, 2009, 5 pgs.

Notice of Allowance for U.S. Appl. No. 11/551,204, dated Jun. 21, 2010, 4 pgs.

Non-Final Office Action for U.S. Appl. No. 11/551,204, dated Sep. 22, 2008, 9 pgs.

Notice of Allowance for U.S. Appl. No. 11/551,204, dated Jan. 27, 2010, 4 pgs.

Non-Final Office Action for U.S. Appl. No. 12/690,125, dated Sep. 21, 2010, 12 pgs.

Notice of Allowance for U.S. Appl. No. 11/553,427, dated Mar. 24, 2011, 5 pages.

Notice of Allowance for U.S. Appl. No. 12/703,042, dated May 5, 2011, 8 pages.

Notice of Allowance for U.S. Appl. No. 11/551,211, dated May 6, 2011, 5 pages.

Notice of Allowance for U.S. Appl. No. 11/553,419, dated May 20, 2011, 5 pages.

Final Office Action for U.S. Appl. No. 09/969,987, dated May 24, 2011, 17 pgs.

Notice of Allowance for U.S. Appl. No. 11/553,427, dated May 31, 2011, 5 pages.

Final Office Action for U.S. Appl. No. 12/690,125, dated Jun. 7, 2011, 11 pages.

Final Office Action for U.S. Appl. No. 12/688,413, dated Jun. 7, 2011, 15 pages.

Final Office Action for U.S. Appl. No. 11/400,008, dated Jun. 27, 2011, 6 pages.

Notice of Allowance for U.S. Appl. No. 11/551,204, dated Jul. 11, 2011, 5 pages.

Notice of Allowance for U.S. Appl. No. 12/684,624, dated Jul. 25, 2011, 5 pages.

Non-Final Office Action for U.S. Appl. No. 12/703,042, dated Jul. 28, 2011, 5 pages.

Non-Final Office Action for U.S. Appl. No. 12/857,238, dated Aug. 10, 2011, 6 pages.

Non-Final Office Action for U.S. Appl. No. 13/101,994, dated Aug. 16, 2011, 10 pages.

Notice of Allowance for U.S. Appl. No. 11/551,211, dated Aug. 24, 2011, 5 pages.

Notice of Allowance for U.S. Appl. No. 12/684,624, dated Sep. 1, 2011, 9 pages.

Notice of Allowance for U.S. Appl. No. 12/123,081, dated Sep. 26, 2011, 9 pages.

Notice of Allowance for U.S. Appl. No. 11/551,204, dated Sep. 28, 2011, 5 pages.

Notice of Allowance for U.S. Appl. No. 11/551,211, dated Oct. 18, 2011, 5 pages.

Non-Final Office Action for U.S. Appl. No. 13/154,239, dated Nov. 2, 2011, 6 pages.

Notice of Allowance for U.S. Appl. No. 12/703,042, dated Nov. 15, 2011, 8 pages.

Non-Final Office Action for U.S. Appl. No. 12/688,413, dated Nov. 28, 2011, 14 pages.

Notice of Allowance for U.S. Appl. No. 12/857,238, dated Dec. 30, 2011, 5 pages.

Notice of Allowance for U.S. Appl. No. 11/400,008, dated Feb. 6, 2012, 8 pages.

Non-Final Office Action for U.S. Appl. No. 12/690,125, dated Mar. 8, 2012, 7 pages.

(56) References Cited

OTHER PUBLICATIONS

Notice of Allowance for U.S. Appl. No. 12/703,042, dated Mar. 30, 2012, 8 pages.
Non-Final Office Action for U.S. Appl. No. 09/969,987, dated Apr. 11, 2012, 6 pages.
Notice of Allowance for U.S. Appl. No. 11/553,419, dated Apr. 23, 2012, 6 pages.
Notice of Allowance for U.S. Appl. No. 11/553,427, dated May 7, 2012, 7 pages.
Non-Final Office Action for U.S. Appl. No. 13/118,122, dated May 16, 2012, 9 pages.
Non-Final Office Action for U.S. Appl. No. 13/101,994, dated May 23, 2012, 12 pages.
Notice of Allowance for U.S. Appl. No. 12/857,238, dated May 29, 2012, 5 pages.
Notice of Allowance for U.S. Appl. No. 11/400,008, dated Jun. 21, 2012, 8 pages.
Final Office Action for U.S. Appl. No. 13/154,239, dated Jun. 26, 2012, 14 pages.
Notice of Allowance for U.S. Appl. No. 12/857,238, dated Jul. 12, 2012, 5 pages.
Notice of Allowance for U.S. Appl. No. 12/703,042, dated Jul. 16, 2012, 8 pages.
Non-Final Office Action for U.S. Appl. No. 13/482,800, dated Jul. 20, 2012, 14 pages.
Notice of Allowance for U.S. Appl. No. 11/553,427, dated Nov. 6, 2012, 5 pages.
Notice of Allowance for U.S. Appl. No. 12/703,042, dated Nov. 15, 2012, 9 pages.
Non-Final Office Action for U.S. Appl. No. 12/857,238, dated Nov. 29, 2012, 17 pages.
Final Office Action for U.S. Appl. No. 09/969,987, dated Dec. 4, 2012, 7 pages.
Final Office Action for U.S. Appl. No. 13/101,994, dated Dec. 13, 2012, 5 pages.
Supplemental Notice of Allowability for U.S. Appl. No. 12/703,042, dated Dec. 18, 2012, 6 pages.
Notice of Allowance for U.S. Appl. No. 12/690,125, dated Dec. 28, 2012, 5 pages.
Final Office Action for U.S. Appl. No. 13/118,122, dated Jan. 9, 2013, 11 pages.
Non-Final Office Action for U.S. Appl. No. 11/553,419, dated Jan. 15, 2013, 4 pages.
Non-Final Office Action for U.S. Appl. No. 13/482,800, dated Feb. 19, 2013, 15 pages.
Notice of Allowance for U.S. Appl. No. 12/703,042, dated Mar. 4, 2013, 9 pages.
Non-Final Office Action for U.S. Appl. No. 12/690,125, dated Apr. 15, 2013, 11 pages.
Notice of Allowance for U.S. Appl. No. 13/154,239, dated Apr. 24, 2013, 10 pages.
Notice of Allowance for U.S. Appl. No. 11/553,427, dated May 14, 2013, 6 pages.
Supplemental Notice of Allowance for U.S. Appl. No. 11/553,427, dated May 15, 2013, 6 pages.
Notice of Allowance for U.S. Appl. No. 12/857,238, dated Jun. 17, 2013, 6 pages.
Supplemental Notice of Allowance for U.S. Appl. No. 12/703,042, dated Jun. 18, 2013, 6 pages.
Supplemental Notice of Allowance for U.S. Appl. No. 11/553,427, dated Jul. 2, 2013, 2 pages.
Non-Final Office Action for U.S. Appl. No. 09/969,987, dated Jul. 3, 2013, 8 pages.
Notice of Allowance for U.S. Appl. No. 13/154,211, dated Jul. 11, 2013, 10 pages.
Non-Final Office Action for U.S. Appl. No. 13/118,122, dated Jul. 19, 2013, 12 pages.
Notice of Allowance for U.S. Appl. No. 13/154,239, dated Aug. 2, 2013, 9 pages.
Notice of Allowance for U.S. Appl. No. 13/118,122, dated Sep. 19, 2013, 6 pages.
Notice of Allowance for U.S. Appl. No. 11/553,419, dated Oct. 17, 2013, 7 pages.
Notice of Allowance for U.S. Appl. No. 12/857,238, dated Oct. 23, 2013, 7 pages.
Notice of Allowance for U.S. Appl. No. 13/154,211, dated Oct. 24, 2013, 9 pages.
Final Office Action for U.S. Appl. No. 13/482,800, dated Oct. 25, 2013, 21 pages.
Supplemental Notice of Allowability for U.S. Appl. No. 13/154,211, dated Nov. 26, 2013, 4 pages.
Notice of Allowance for U.S. Appl. No. 13/101,994, dated Dec. 2, 2013, 7 pages.
Notice of Allowance for U.S. Appl. No. 11/553,419, dated Dec. 18, 2013, 6 pages.
Supplemental Notice of Allowability for U.S. Appl. No. 13/154,211, dated Dec. 19, 2013, 4 pages.
Non-Final Office Action for U.S. Appl. No. 14/035,716, dated Dec. 20, 2013, 12 pages.
Notice of Allowance for U.S. Appl. No. 14/035,712, dated Dec. 20, 2013, 8 pages.
Non-Final Office Action for U.S. Appl. No. 14/035,719, dated Dec. 20, 2013, 11 pages.
Final Office Action for U.S. Appl. No. 12/690,125, dated Dec. 27, 2013, 12 pages.
Corrected Notice of Allowability for U.S. Appl. No. 11/553,419, dated Jan. 14, 2014, 2 pages.
Notice of Allowance for U.S. Appl. No. 14/035,561, dated Jan. 16, 2014, 9 pages.
Corrected Notice of Allowability for U.S. Appl, No. 11/553,419, dated Jan. 31, 2014, 2 pages.
Non-Final Office Action for U.S. Appl. No. 13/118,122, dated Feb. 19, 2014, 23 pages.
Notice of Allowance for U.S. Appl. No. 13/101,994, dated Feb. 20, 2014, 5 pages.
Supplemental Notice of Allowance for U.S. Appl. No. 12/857,238, dated Feb. 25, 2014, 2 pages.
Non-Final Office Action for U.S. Appl. No. 14/134,933, dated Feb. 25, 2014, 7 pages.
Non-Final Office Action for U.S. Appl. No. 14/033,245, dated Feb. 26, 2014, 11 pages.
Non-Final Office Action for U.S. Appl. No. 14/134,926, dated Feb. 27, 2014, 16 pages.
Final Office Action for U.S. Appl. No. 09/969,987, dated Apr. 8, 2014, 8 pages.
Non-Final Office Action for U.S. Appl. No. 13/403,785, dated May 9, 2014, 5 pages.
Final Office Action for U.S. Application No. 13/118,122, dated Jun. 18, 2014, 14 pages.
Notice of Allowance for U.S. Appl. No. 14/251,453, dated Jun. 25, 2014; 8 pages.
Final Office Action for U.S. Appl. No. 14/134,933, dated Jun. 27, 2014; 9 pages.
Notice of Allowance for U.S. Appl. No. 14/134,926, dated Jul. 8, 2014, 9 pages.
Notice of Allowance for U.S. Appl. No. 14/033,245, dated Jul. 22, 2014, 13 pages.
Non-Final Office Action for U.S. Appl. No. 14/495,574, dated Oct. 23, 2014; 10 pages.
Non-Final Office Action for U.S. Appl. No. 09/969,987, dated Oct. 23, 2014; 11 pages.
Non-Final Office Action for U.S. Appl. No. 13/403,785, dated Dec. 18, 2014, 17 pages.
Non-Final Office Action for U.S. Appl. No. 14/305,692, dated Feb. 10, 2015, 9 pages.
Non-Final Office Action for U.S. Appl. No. 14/303,276, dated Mar. 12, 2015, 5 pages.
Supplemental Notice of Allowability for U.S. Appl. No. 14/495,574, dated Apr. 7, 2015; 5 pages.
Notice of Allowance for U.S. Appl. No. 14/303,276, dated Jun. 5, 2015; 8 pages.

(56) References Cited

OTHER PUBLICATIONS

Notice of Allowance for U.S. Appl. No. 09/969,987, dated Jul. 2, 2015; 10 pages.
Notice of Allowance for U.S. Appl. No. 14/727,309, dated Sep. 30, 2015; 7 pages.
Non-Final Office Action for U.S. Appl. No. 14/733,565, dated Oct. 19, 2015; 8 pages.
Final Office Action for U.S. Appl. No. 14/305,692, dated Nov. 12, 2015; 10 pages.
Non-Final Office Action for U.S. Appl. No. 14/876,276, dated Jan. 28, 2016; 7 pages.
Non-Final Office Action for U.S. Appl. No. 14/853,581, dated Mar. 15, 2016; 5 pages.
Notice of Allowance for U.S. Appl. No. 14/733,565, dated Mar. 25, 2016; 8 pages.
Notice of Allowance for U.S. Appl. No. 14/727,309, dated Apr. 26, 2016; 7 pages.
Notice of Allowance for U.S. Appl. No. 14/876,276, dated Apr. 26, 2016; 8 pages.
Notice of Allowance for U.S. Appl. No. 14/733,565, dated May 6, 2016; 6 pages.
Non-Final Office Action for U.S. Appl. No. 14/844,973, dated May 17, 2016; 18 pages.
Non-Final Office Action for U.S. Appl. No. 14/727,309, dated Jun. 7, 2016; 15 pages.
Non-Final Office Action for U.S. Appl. No. 14/794,201, dated Aug. 10, 2016; 4 pages.
Non-Final Office Action for U.S. Appl. No. 13/875,884, dated Jun. 3, 2015; 10 pages.
Final Office Action for U.S. Appl. No. 13/875,884, dated Mar. 9, 2016; 8 pages.
Non-Final Office Action for U.S. Appl. No. 14/530,974 dated Dec. 22, 2016; 20 pages.
Notice of Allowance for U.S. Appl. No. 14/727,309, dated Nov. 16, 2016; 9 pages.
Non-Final Office Action for U.S. Appl. No. 14/936,312 dated Jan. 19, 2017; 13 pages.
Non-Final Office Action for U.S. Appl. No. 13/875,884 dated Nov. 10, 2016; 7 pages.
Notice of Allowance for U.S. Appl. No. 14/876,276, dated Dec. 15, 2016; 5 pages.
Final Office Action for U.S. Appl. No. 14/844,973, dated Feb. 14, 2017; 22 pages.
Notice of Allowance for U.S. Appl. No. 14/727,309, dated Feb. 27, 2017; 6 pages.
Non-Final Office Action for U.S. Appl. No. 15/391,240, dated Feb. 17, 2017; 12 pages.
Non-Final Office Action for U.S. Appl. No. 14/305,692, dated Feb. 10, 2017; 10 pages.
Notice of Allowance for U.S. Appl. No. 14/733,565, dated Feb. 14, 2017; 7 pages.
Notice of Allowance for U.S. Appl. No. 14/876,276, dated Feb. 23, 2017; 7 pages.
Notice of Allowance for U.S. Appl. No. 14/853,581, dated Mar. 30, 2017; 5 pages.
Non-Final Office Action for U.S. Appl. No. 14/936,312, dated Apr. 26, 2017; 11 pages.
Final Office Action for U.S. Appl. No. 14/794,201, dated Jun. 1, 2017; 10 pages.
International Search Report for PCT/US00/42018, dated Jul. 31, 2001, 3 pages.
International Search Report for PCT/US01/03712, dated May 10, 2002, 2 pages.
International Search Report for PCT/US01/03711, dated Jan. 28, 2001, 5 pages.
Submission of prior art under 37 CFR 1.501, for U.S. Pat. No. 6,604,158, Mar. 3, 2011, 5 pgs.
Submission of prior art under 37 CFR 1.501, for U.S. Pat. No. 7,415,530, Mar. 3, 2011, 14 pgs.
Submission of prior art under 37 CFR 1.501, for U.S. Pat. No. 6,601,104, Mar. 3, 2011, 5 pgs.
Submission of prior art under 37 CFR 1.501, for U.S. Pat. No. 7,161,506, Mar. 3, 2011, 12 pgs.
Submission of prior art under 37 CFR 1.501, for U.S. Pat. No. 7,395,345, Mar. 3, 2011, 14 pgs.
Submission of prior art under 37 CFR 1.501, for U.S. Pat. No. 7,321,937, Mar. 3, 2011, 14 pgs.
Submission of prior art under 37 CFR 1.501, for U.S. Pat. No. 7,352,300, Mar. 3, 2011, 14 pgs.
Submission of prior art under 37 CFR 1.501, for U.S. Pat. No. 7,378,992, Mar. 3, 2011, 14 pgs.
Ex Parte Reexamination Interview Summary, dated Dec. 3, 2009, for U.S. Reexam App. No. 90/009,428, 4 pgs.
Request for Inter Partes Reexamination of U.S. Pat. No. 7,714,747, Control No. 95/001,517, filed Dec. 30, 2010, 696 pages.
Replacement Request for Inter Partes Reexamination of U.S. Pat. No. 7,417,568, Control No. 95/001,533, filed Mar. 1, 2011, 357 pages.
L. Gannoun, "RTP Payload Format for X Protocol Media Streams," Audio-Visual Transport WG Internet Draft, Internet Engineering Task Force, Mar. 11, 1998, 15 pgs.
Official Order Granting Request for Inter Partes Reexamination of U.S. Pat. No. 6,624,761, Control No. 95/000,464, issued Jul. 24, 2009, 29 pgs.
Non-Final Office Action in Inter Partes Reexamination of U.S. Pat. No. 6,624,761, Control No. 95/000,464, dated Dec. 15, 2009, 20 pgs.
Non-Final Office Action in Inter Partes Reexamination of U.S. Pat. No. 7,321,937, Control No. 95/000,466, dated Jun. 22, 2009, 11 pgs.
Official Order Granting Request for Inter Partes Reexamination of U.S. Pat. No. 7,321,937, Control No. 95/000,466, issued Jun. 22, 2009, 16 pgs.
Official Action Closing Prosecution for Inter Partes Reexamination of U.S. Pat. No. 7,321,937, Control No. 95/000,466, issued Dec. 22, 2009, 20 pgs.
Comments by Third Party Requester to Patent Owner's Response Inter Partes Reexamination of U.S. Pat. No. 7,321,937, Control No. 95/000,466, filed Nov. 10, 2009, 30 pgs.
Supplemental Declaration of Professor James A. Storer, Ph.D. under 37 C.F.R. §1.132 in Inter Partes Reexamination of U.S. Pat. No. 7,321,937, Control No. 95/000,466, executed on Nov. 10, 2009, 16 pgs.
Examiner Interview Summary in Ex Parte Reexamination of U.S. Pat. No. 6,601,104, Control No. 90/009,428, dated Dec. 3, 2009, 3 pgs.
Non-Final Office Action in Ex Parte Reexamination of U.S. Pat. No. 6,601,104, Control No. 90/009,428, dated Nov. 2, 2009, 13 pgs.
Official Order Granting Request for Ex Parte Reexamination of U.S. Pat. No. 6,601,104, Control No. 90/009,428, issued Jun. 1, 2009, 12 pgs.
Declaration of Dr. George T. Ligler under 37 C.F.R. §1.132 in Ex Parte Reexamination of U.S. Pat. No. 6,601,104, Control No. 90/009,428, executed Dec. 28, 2009 16 pgs.
Supplementary Declaration of Dr. George T. Ligler under 37 C.F.R. §1.132 in Ex Parte Reexamination of U.S. Pat. No. 6,601,104, Control No. 90/009,428, executed Dec. 30, 2009 1 pg.
Declaration of Dr. George T. Ligler under 37 C.F.R. §1.132 in Inter Partes Reexamination of U.S. Pat. No. 7,321,937, Control No. 95/000,466, executed Aug. 24, 2009, 30 pgs.
Official Order Granting Request for Inter Partes Reexamination of U.S. Pat. No. 7,161,506, Control No. 95/000,479, issued Aug. 14, 2009, 41 pgs.
Non-Final Office Action in Inter Partes Reexamination of U.S. Pat. No. 7,161,506, Control No. 95/000,479, dated Dec. 15, 2009, 37 pgs.
Official Order Granting Request for Inter Partes Reexamination of U.S. Pat. No. 7,378,992, Control No. 95/000,478, issued Aug. 13, 2009, 60 pgs.
Non-Final Office Action in Inter Partes Reexamination of U.S. Pat. No. 7,378,992, Control No. 95/000,478, dated Dec. 15, 2009, 27 pgs.

(56) References Cited

OTHER PUBLICATIONS

Official Order Granting Request for Inter Partes Reexamination of U.S. Pat. No. 6,604,158 Control No. 95/000,486, issued Aug. 14, 2009, 35 pgs.
Non-Final Office Action in Inter Partes Reexamination of U.S. Pat. No. 6,604,158, Control No. 95/000,486, dated Nov. 12, 2009, 199 pgs.
Right of Appeal Notice in Inter Partes Reexamination of U.S. Pat. No. 6,624,761, Control No. 95/000,464, issued Jan. 6, 2011, 15 pgs.
Action Closing Prosecution in Inter Partes Reexamination of U.S. Pat. No. 6,624,761, Control No. 95/000,464, issued Aug. 27, 2010, 25 pgs.
Right of Appeal Notice in Inter Partes Reexamination of U.S. Pat. No. 7,321,937, Control No. 95/000,466, issued May 24, 2010, 23 pgs.
Final Office Action in Ex Parte Reexamination of U.S. Pat. No. 6,601,104, Control No. 90/009,428, dated Feb. 5, 2010, 16 pgs.
Right of Appeal Notice for Inter Partes Reexamination of U.S. Pat. No. 7,161,506, Control No. 95/000,479, dated Jan. 6, 2011, 18 pgs.
Action Closing Prosecution in Inter Partes Reexamination of U.S. Pat. No. 7,161,506, Control No. 95/000,479, issued Aug. 27, 2010, 34 pgs.
Right of Appeal Notice for Inter Partes Reexamination of U.S. Pat. No. 7,378,992, Control No. 95/000,478, issued Jan. 6, 2011, 15 pgs.
Action Closing Prosecution in Inter Partes Reexamination of U.S. Pat. No. 7,378,992, Control No. 95/000,478, issued Aug. 23, 2010, 31 pgs.
Action Closing Prosecution in Inter Partes Reexamination of U.S. Pat. No. 6,604,158 Control No. 95/000,486, issued Mar. 7, 2011, 257 pgs.
Patent Owner's reply to Office Action in Inter Partes Reexamination of U.S. Patent No. 7,378,992, dated Mar. 15, 2010, 23 pages.
Patent Owner's Reply to Office Action in Inter Partes Reexamination of U.S. Pat. No. 7,161,506, dated Mar. 15, 2010, 23 pages.
Patent Owner's Reply to Action Closing Prosecution of Aug. 23, 2010 in Inter Partes Reexamination of U.S. Pat. No. 7,378,992, dated Sep. 23, 2010, 23 pages.
Patent Owner's Reply to Action Closing Prosecution of Aug. 27, 2010 in Inter Partes Reexamination of U.S. Pat. No. 7,161,506, dated Sep. 27, 2010, 26 pages.
Patent Owner's reply to Action Closing Prosecution of Aug. 27, 2010 in Inter Partes Reexamination of U.S. Pat. No. 6,624,761, dated Sep. 27, 2010, 20 pages.
Corrected Request for Inter Partes Reexamination of U.S. Pat. No. 6,624,761, filed Jun. 15, 2009, 241 pages.
Request for Inter Partes Reexamination of U.S. Pat. No. 7,378,992, filed May 21, 2009, 255 pages.
Request for Inter Partes Reexamination of U.S. Pat. No. 7,161,506, filed May 28, 2009, 455 pages.
Request for Inter Partes Reexamination of U.S. Pat. No. 7,777,651, Control No. 95/001,581, filed Mar. 21, 2011, 2,136 pages.
Request for Inter Partes Reexamination of U.S. Pat. No. 7,400,274, Control No. 95/001,544, filed Feb. 14, 2011, 420 pages.
Action Closing Prosecution in Inter Partes Reexamination of U.S. Pat. No. 7,321,937, Control No. 95/000,466 issued Dec. 22, 2009, 20 pages.
Order Granting request for inter partes reexamination of U.S. Pat. No. 7,400,274 and Non-Final Office Action in Inter Partes reexam of U.S. Pat. No. 7,400,274, Control No. 95/001,544, dated Mar. 25, 2011, 47 pages.
Non-Final Office Action in Inter Partes Reexamination of U.S. Pat. No. 7,400,274, Control No. 95/001,544, dated May 20, 2011, 47 pages.
Order Granting Request for Inter Partes Reexamination of U.S. Pat. No. 7,777,651, Control No. 95/001,581, mailed Jun. 15, 2011, 22 pages.
Non-Final Office Action in Inter Partes Reexamination of U.S. Pat. No. 7,417,568, Control No. 95/001,553, dated May 6, 2011, 105 pages.
Order Granting Reexamination of U.S. Pat. No. 7,714,747, Control No. 95/001,517, mailed Mar. 9, 2011, 21 pages.
Appeal Brief filed in Inter Partes Reexamination of U.S. Pat. No. 6,601,104, Control No. 90/009,428, mailed Sep. 2, 2010, 28 pages.
Examiner's Answer to Appeal Brief in Inter Partes Reexamination of U.S. Patent No. 7,321,937, Control No. 95/000,466, mailed Jul. 18, 2011, 33 pages.
Non-Final Office Action in Inter Partes Reexamination of U.S. Pat. No. 7,777,651, Control No. 95/001,581, dated Jul. 25, 2011, 274 pages.
Non-Final Action Closing Prosecution in Inter Partes Reexamination of U.S. Patent No. 7,714,747, Control No. 95/001,517, dated Sep. 21, 2011, 29 pages.
Definition of "data packet", Academic Press Dictionary of Science and Technology, Copyright 1992, 1996, in Inter Partes Reexamination of U.S. Pat. No. 7,714,747, Control No. 95/001,517, mailed Sep. 21, 2011, 2 pages.
Patent Owner's Reply to Office Action in Inter Partes Reexamination of U.S. Pat. No. 7,777,651, Control No. 95/001,581, dated Sep. 26, 2011, 44 pages.
Examiner's Answer to Appeal Brief in Inter Partes Reexamination of U.S. Pat. No. 6,624,761, Control No. 95/000,464, mailed Sep. 28, 2011, 20 pages.
Examiner's Answer to Appeal Brief in Inter Partes Reexamination of U.S. Pat. No. 7,161,506, Control No. 95/000,479, mailed Sep. 28, 2011, 25 pages.
Examiner's Answer to Appeal Brief in Inter Partes Reexamination of U.S. Pat. No. 7,378,992, Control No. 95/000,478, mailed Sep. 29, 2011, 27 pages.
Decision on Appeal in Ex parte Reexamination of U.S. Pat. No. 6,601,104 B1, Control No. 90/009,428, dated Mar. 18, 2011, 14 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No, 6,624,761, Control No. 95/000,464, dated Oct. 28, 2011, 9 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Patent No, 7,378,992, Control No. 95/000,478, dated Oct. 28, 2011, 10 pages.
Patent Owner's Rebuttal Brief Under 37 C.F.R § 41.71 Retracting the Arguments Made to Overcome the Claim Rejections and Thereby Eliminating the Issues on Appeal in Inter Partes Reexamination of U.S. Pat. No. 7,161,506, Control No. 95/000,479, dated Oct. 28, 2011, 9 pages.
Non-Final Action Closing Prosecution in Inter Partes Reexamination of U.S. Pat. No. 7,400,274, Control No. 95/001,544, dated Nov. 18, 2011, 39 pages.
Non-Final Action Closing Prosecution in Inter Partes Reexamination of U.S. Patent No. 7,417,568, Control No. 95/001,533, dated Dec. 9, 2011, 42 pages.
Patent Owner's Reply to Action Closing Prosecution of Nov. 18, 2011 in Inter Partes Reexamination of U.S. Pat. No. 7,400,274, Control No. 95/001,544, dated Dec. 19, 2011, 9 pages.
Patent Owner's Reply to Action Closing Prosecution of Dec. 9, 2011 in Inter Partes Reexamination of U.S. Pat. No. 7,417,568, Control No. 95/001,533, mailed Dec. 29, 2011, 14 pages.
Notice of Intent to Issue Ex Parte Reexamination Certificate in Ex Parte Reexamination of U.S. Pat. No. 6,601,104, Control No. 90/009,428, mailed Jan. 13, 2012, 5 pages.
Decision on Appeal in Inter Partes Reexamination of U.S. Pat. No. 6,624,761, Control No. 95/000,464, mailed Jan. 18, 2012, 5 pages.
Decision on Appeal in Inter Partes Reexamination of U.S. Pat. No. 7,321,937, Control No. 95/000,466, mailed Jan. 18, 2012, 8 pages.
Decision on Appeal in Inter Partes Reexamination of U.S. Pat. No. 7,378,992, Control No. 95/000,478, mailed Jan. 18, 2012, 5 pages.
Decision on Appeal in Inter Partes Reexamination of U.S. Pat. No. 7,161,506, Control No. 95/000,479, mailed Jan. 18, 2012, 6 pages.
Non-Final Office Action in Inter Partes Reexamination of U.S. Pat. No. 7,777,651, Control No. 95/001,581, dated Jan. 27, 2012, 152 pages.

(56) References Cited

OTHER PUBLICATIONS

Patent Owner's Respondent Brief on Appeal Under 37 C.F.R. § 41.68 in Inter Partes Reexamination of U.S. Pat. No. 7,714,747, Control No. 95/001,517, filed Feb. 17, 2012, 20 pages.
Patent Owner's Reply to Second Non-Final Office Action dated Jan. 27, 2012 in Inter Partes Reexamination of U.S. Pat. No. 7,777,651, Control No. 95/001,581, filed Feb. 24, 2012, 30 pages.
Ex Parte Reexamination Certificate in Ex Parte Reexamination of U.S. Pat. No. 6,601,104, Control No. 90/009,428, issued Feb. 28, 2012, 2 pages.
Examiner's Answer to Appeal Brief in Inter Partes Reexamination of U.S. Pat. No. 7,714,747, Control No. 95/001,517, mailed Mar. 1, 2012, 4 pages.
Right of Appeal Notice in Inter Partes Reexamination of U.S. Pat. No. 7,417,568, Control No. 95/001,533, mailed Mar. 1, 2012, 8 pages.
Right of Appeal Notice in Inter Partes Reexamination of U.S. Pat. No. 7,400,274, Control No. 95/001,544, mailed Mar. 6, 2012, 7 pages.
Request for Inter Partes Reexamination of U.S. Pat. No. 7,321,937, Control No. 95/001,922, filed Mar. 2, 2012, including accompanying Exhibits PA-A to PA-D, PAT-A to PAT-C, CC-A to CC-D, Oth-A, and Form PTO/SB/08a, 2865 pages.
Request for Inter Partes Reexamination of U.S. Pat. No. 6,604,158, Control No. 95/001,923, filed Mar. 2, 2012, including accompanying Exhibits PA-A to PA-D, PAT-A to PAT-B, CC-A to CC-F, Oth-A, and Form PTO/SB/08a, 560 pages.
Request for Inter Partes Reexamination of U.S. Pat. No. 7,352,300, Control No. 95/001,924, filed Mar. 2, 2012, including accompanying Exhibits PA-A to PA-H, PAT-A to PAT-B, CC-A to CC-F, Oth-A, and Form PTO/SB/08a, 1012 pages.
Request for Inter Partes Reexamination of U.S. Pat. No. 7,395,345, Control No. 95/001,925, filed Mar. 2, 2012, including accompanying Exhibits PA-A to PA-C, PAT-A, CC-A to CC-C, Oth-A, and Form PTO/SB/08a, 204 pages.
Request for Inter Partes Reexamination of U.S. Pat. No. 7,161,506, Control No. 95/001,926, filed Mar. 2, 2012, with accompanying Exhibits PA-A to PA-C, PAT-A to PAT-C, CC-A to CC-B, Oth-A to Oth-B, and Form PTO/SB/08a, 2651 pages.
Request for Inter Partes Reexamination of U.S. Pat. No. 7,415,530, Control No.95/001,927, filed Mar. 2, 2012, including accompanying Exhibits PA-A to PA-F, PAT-A to PAT-B, CC-A to CC-O, Oth-A, and Form PTO/SB/08a, 700 pages.
Request for Inter Partes Reexamination of U.S. Pat. No. 7,378,992, Control No. 95/001,928, filed Mar. 2, 2012, including Exhibits PA-A to PA-D, PAT-A to PAT-C, CC-A to CC-B, Oth-A, and Form PTO/SB/08a, 2316 pages.
Official Order Granting Request for Inter Partes Reexamination of U.S. Pat. No. 7,395,345, Control No. 95/001,925, mailed Mar. 19, 2012, 11 pages.
Non-Final Office Action in Inter Partes Reexamination of U.S. Pat. No. 7,395,345, Control No. 95/001,925, dated Mar. 19, 2012, 20 pages.
Notice of Intent to Issue Inter Partes Reexamination Certificate in Inter Partes Reexamination of U.S. Pat. No. 7,321,937, Control No. 95/000,466, mailed Mar. 21, 2012, 7 pages.
Right of Appeal Notice for Inter Partes Reexamination of U.S. Pat. No. 6,604,158, Control No. 95/000,486, mailed Mar. 26, 2012, 253 pages.
Notice of Intent to Issue Inter Partes Reexamination Certificate in Inter Partes Reexamination of U.S. Pat. No. 6,624,761, Control No. 95/000,464, mailed Apr. 3, 2012, 7 pages.
Notice of Intent to Issue Inter Partes Reexamination Certificate in Inter Partes Reexamination of U.S. Pat. No. 7,161,506, Control No. 95/000,479, dated Apr. 4, 2012, 15 pages.
Notice of Intent to Issue Inter Partes Reexamination Certificate in Inter Partes Reexamination of U.S. Pat. No. 7,378,992, Control No. 95/000,478, mailed Apr. 6, 2012, 5 pages.
Official Order Granting Request for Inter Partes Reexamination of U.S. Pat. No. 7,321,937, Control No. 95/001,922, mailed Apr. 20, 2012, 17 pages.
Non-Final Office Action in Inter Partes Reexamination of U.S. Pat. No. 7,321,937, Control No. 95/001,922, dated Apr. 20, 2012, 8 pages.
Official Order Granting Request for Inter Partes Reexamination of U.S. Pat. No. 7,161,506, Control No. 95/001,926, mailed Apr. 25, 2012, 9 pages.
Non-Final Office Action in Inter Partes Reexamination of U.S. Pat. No. 7,161,506, Control No. 95/001,926, dated Apr. 25, 2012, 7 pages.
Official Order Granting Request for Inter Partes Reexamination of U.S. Pat. No. 7,378,992, Control No. 95/001,928, mailed Apr. 25, 2012, 8 pages.
Non-Final Office Action in Inter Partes Reexamination of U.S. Pat. No. 7.378,992, Control No. 95/001,928, dated Apr. 25, 2012, 8 pages.
Official Order Denying Request for Inter Partes Reexamination of U.S. Pat. No. 7,415,530, Control No. 95/001,927, mailed Apr. 27, 2012, 52 pages.
Official Order Granting Request for Inter Partes Reexamination of U.S. Pat. No. 6,604,158, Control No. 95/001,923, mailed May 7, 2012, 14 pages.
Non-Final Office Action in Inter Partes Reexamination of U.S. Pat. No. 6,604,158, Control No. 95/001,923, dated May 7, 2012, 8 pages.
Petition Under 37 C.F.R. §§ 1.181 and 1.182 for Correction of Notice of Intent to Issue Reexamination Certificate in Inter Partes Reexamination of U.S. Pat. No. 7,378,992, Control No. 95/000,478, filed May 9, 2012, 8 pages.
Inter Partes Reexamination Certificate in Inter Partes Reexamination of U.S. Pat. No. 7,321,937, Control No. 95/000,466, issued May 15, 2012, 2 pages.
Official Order Granting Request for Inter Partes Reexamination of U.S. Pat. No. 7,352,300, Control No. 95/001,924, mailed May 17, 2012, 12 pages.
Non-Final Office Action in Inter Partes Reexamination of U.S. Pat. No. 7,352,300, Control No. 95/001,924, dated May 17, 2012, 18 pages.
Patent Owner's Response to Office Action dated Mar. 19, 2012 in Inter Partes Reexamination of U.S. Pat. No. 7,395,345, Control No. 95/001,925, filed May 21, 2012, 21 pages.
Inter Partes Reexamination Certificate in Inter Partes Reexamination of U.S. Pat. No. 7,161,506, Control No. 95/000,479, issued May 22, 2012, 2 pages.
Inter Partes Reexamination Certificate in Inter Partes Reexamination of U.S. Pat. No. 6,624,761, Control No. 95/000,464, issued Jun. 12, 2012, 2 pages.
Action Closing Prosecution in Inter Partes Reexamination of U.S. Pat. No. 7,777,651, Control No. 95/001,581, mailed Jun. 18, 2012, 45 pages.
Patent Owner's Response to Office Action dated Apr. 20, 2012 in Inter Partes Reexamination of U.S. Pat. No. 7,321,937, Control No. 95/001,922, filed Jun. 20, 2012, 11 pages.
Patent Owner's Response to Office Action dated Apr. 25, 2012 in Inter Partes Reexamination of U.S. Pat. No. 7,161,506, Control No. 95/001,926, filed Jun. 25, 2012, 20 pages.
Patent Owner's Response to Office Action dated Apr. 25, 2012 in Inter Partes Reexamination of U.S. Pat. No. 7,378,992, Control No. 95/001,928, filed Jun. 25, 2012, 20 pages.
Patent Owner's Response to Office Action dated May 7, 2012 in Inter Partes Reexamination of U.S. Pat. No. 6,604,158, Control No. 95/001,923, filed Jul. 9, 2012, 19 pages.
Patent Owner's Response to Office Action dated May 17, 2012 in Inter Partes Reexamination of U.S. Pat. No. 7,352,300, Control. No. 95/001,924, filed Jul. 17, 2012, 31 pages.
New Decision on Appeal after Board Decision in Inter Partes Reexamination of U.S. Pat. No. 7,714,747, Control. No. 95/001,517, mailed Jul. 24, 2012, 24 pages.
Right of Appeal Notice for Inter Partes Reexamination of U.S. Pat. No. 7,777,651, Control No. 95/001,581, mailed Aug. 3, 2012, 7 pages.

(56) References Cited

OTHER PUBLICATIONS

Notice of Intent to Issue Inter Partes Reexamination Certificate in Inter Partes Reexamination of U.S. Pat. No. 6,604,158, Control No. 95/000,486, mailed Aug. 30, 2012, 5 pages.
Notice of Intent to Issue Inter Partes Reexamination Certificate in Inter Partes Reexamination of U.S. Pat. No. 7,378,992, Control No. 95/000,478, mailed Aug. 31, 2012, 6 pages.
Decision on Petition for Supervisory Review of Refusal to Order Reexamination for Claims 1-2, 16-21, and 23 (37 CFR §§ 1.927 and 1.181) in Inter Partes Reexamination of U.S. Pat. No. 7,415,530, Control No. 95/001,927, mailed Aug. 31, 2012, 10 pages.
Decision on Petition Under 37 C.F.R. §§ 1.181 and 1.182 for Correction of Notice of Intent to Issue Reexamination Certificate in Inter Partes Reexamination of U.S. Pat. No. 7,378,992, Control No. 95/000,478, mailed Sep. 10, 2012, 6 pages.
Decision on Petition for Supervisory Review of Refusal to Order Reexamination of Claims 5-7, 14-16, and 18-19 (37 CFR §§ 1.927 and 1.181) in Inter Partes Reexamination of U.S. Pat. No. 7,321,937, Control No. 95/001,922, mailed Sep. 10, 2012, 12 pages.
Decision on Petition for Supervisory Review of Refusal to Order Reexamination for Claims 86, 89, 90, 92-96, and 98 (37 CFR §§ 1.927 and 1.181) in Inter Partes Reexamination of U.S. Pat. No. 7,161,506, Control No. 95/001,926, mailed Sep. 21, 2012, 10 pages.
Non-Final Office Action in Inter Partes Reexamination of U.S. Pat. No. 7,415,530, Control No. 95/001,927, dated Sep. 21, 2012, 15 pages.
Patent Owner's Request to Reopen Prosecution Before the Examiner Under 37 C.F.R. § 41.77(b) in Inter Partes Reexamination of U.S. Pat. No. 7,714,747, Control No. 95/001,517, filed Sep. 24, 2012, 29 pages.
Examiner's Answer to Appeal Brief in Ex Parte Reexamination of U.S. Pat. No. 7,400,274, Control No. 95/001,544, mailed Oct. 1, 2012, 17 pages.
Inter Partes Reexam Certificate in Inter Partes Reexamination of U.S. Pat. No. 7,378,992, Control No. 95/000,478, issued Oct. 4, 2012, 2 pages.
Inter Partes Reexam Certificate in Inter Partes Reexamination of U.S. Pat. No. 6,604,158, Control No. 95/000,486, issued Oct. 10, 2012, 2 pages.
Examiner's Answer to Appeal Brief in Inter Partes Reexamination of U.S. Patent No. 7,417,568, Control No. 95/001,533, mailed Oct. 15, 2012, 44 pages.
Non-Final Office Action in Inter Partes Reexamination of U.S. Pat. No. 7,321,937, Control No. 95/001,922, mailed Oct. 18, 2012, 10 pages.
Patent Owner's Rebuttal Brief Under 37 C.F.R § 41.71 in Inter Partes Reexamination of U.S. Pat. No. 7,417,568, Control No. 95/001,533, filed Nov. 15, 2012, 15 pages.
Patent Owner's Response to Office Action dated Oct. 18, 2012 in Inter Partes Reexamination of U.S. Pat. No. 7,321,937, Control No. 95/001,922, filed Nov. 19, 2012, 30 pages.
Patent Owner's Supplemental Amendment Subsequent to Timely Submission of Response to Office Action dated Oct. 18, 2012 in Inter Partes Reexamination of U.S. Pat. No. 7,321,937, Control No. 95/001,922, filed Nov. 27, 2012, 6 pages.
Patent Owner's Response to Office Action dated Sep. 21, 2012 in Inter Partes Reexamination of U.S. Pat. No. 7,415,530, Control No. 95/001,927, filed Dec. 21, 2012, 51 pages.
Action Closing Prosecution in Inter Partes Reexamination of U.S. Pat. No. 7,161,506, Control No. 95/001,926, mailed Mar. 5, 2013, 23 pages.
Action Closing Prosecution in Inter Partes Reexamination of U.S. Pat. No. 7,378,992, Control No. 95/001,928, mailed Mar. 5, 2013, 29 pages.
Examiner's Answer to Appeal Brief in Inter Partes Reexamination of U.S. Pat. No. 7,777,651, Control No. 95/001,581, mailed Mar. 14, 2013, 21 pages.
Decision on Petition to Strike Patent Owner's Rebuttal Brief in Inter Partes Reexamination of U.S. Pat. No. 7,417,568, Control No. 95/001,533, mailed Mar. 15, 2013, 7 pages.

Order Remanding Inter Partes Reexamination Under 37 C.F.R § 41.77(d) to the Examiner in Inter Partes Reexamination of U.S. Pat. No. 7,714,747, Control No. 95/001,517, mailed Mar. 18, 2013, 3 pages.
Decision on Petition Under 37 C.F.R. § 1.183 to Request Examiner Enter Evidence in Inter Partes Reexamination of U.S. Pat. No. 7,417,568, Control No. 95/001,533, mailed Mar. 20, 2013, 7 pages.
Action Closing Prosecution in Inter Partes Reexamination of U.S. Pat. No. 7,415,530, Control No. 95/001,927, mailed Apr. 3, 2013, 24 pages.
Patent Owner's Reply to Action Closing Prosecution of Mar. 5, 2013 in Inter Partes Reexamination of U.S. Pat. No. 7,161,506, Control No. 95/001,926, filed Apr. 5, 2013, 19 pages.
Patent Owner's Reply to Action Closing Prosecution of Mar. 5, 2013 in Inter Partes Reexamination of U.S. Pat. No. 7,378,992, Control No. 95/001,928, filed Apr. 5, 2013, 23 pages.
Action Closing Prosecution in Inter Partes Reexamination of U.S. Pat. No. 7,321,937, Control No. 95/001,922, mailed Apr. 9, 2013, 59 pages.
"Data Transfer Rate (DTR)," accessed at http://searchunifiedcommunications.techtarget.com/definition/data-transfer-rate, published May 18, 2011, 1 page.
"Bandwidth—technical definition," accessed at http://computer.yourdictionary.com/bandwidth, accessed on Mar. 7, 2013, 4 pages.
"Bandwidth—Definition," accessed at http://www.yourdictionary.com/bandwidth, accessed on Mar. 7, 2013, 2 pages.
"Bandwidth," accessed at http://searchenterprisewan.techtarget.com/definitions/bandwidth, published Mar. 24, 2010, 1 page.
Action Closing Prosecution in Inter Partes Reexamination of U.S. Pat. No. 7,352,300, Control No. 95/001,924, mailed Apr. 9, 2013, 30 pages.
Examiner's Determination Under 37 C.F.R. § 41.77(d) in Inter Partes Reexamination of U.S. Pat. No. 7,714,747, Control No. 95/001,517, mailed Apr. 10, 2013, 7 pages.
Patent Owner's Supplemental Response to Office Action dated May 7, 2012 in Inter Partes Reexamination of U.S. Pat. No. 6,604,158, Control No. 95/001,923, filed Apr. 29, 2013, 20 pages.
Patent Owner's Supplemental Response to Office Action dated Mar. 19, 2012 in Inter Partes Reexamination of U.S. Pat. No. 7,395,345, Control No. 95/001,925, filed May 6, 2013, 24 pages.
Patent Owner's Response to Action Closing Prosecution dated Apr. 9, 2013 in Inter Partes Reexamination of U.S. Pat. No. 7,321,937, Control No. 95/001,922, filed May 9, 2013, 13 pages.
Patent Owner's Response to Action Closing Prosecution of Apr. 9, 2013 in Inter Partes Reexamination of U.S. Pat. No. 7,352,300, Control No. 95/001,924, filed May 9, 2013, 29 pages.
Patent Owner's Comments in Response to Examiner's Determination Under 37 C.F.R. § 41.77(e) in Inter Partes Reexamination of U.S. Pat. No. 7,714,747, Control No. 95/001,517, filed May 10, 2013, 20 pages.
Patent Owner's Supplemental Response to Action Closing Prosecution of Apr. 9, 2013 in Inter Partes Reexamination of U.S. Pat. No. 7,321,937, Control No. 95/001,922, filed May 15, 2013, 13 pages.
Right of Appeal Notice in Inter Partes Reexamination of U.S. Pat. No. 7,415,530, Control No. 95/001,927, mailed May 31, 2013, 26 pages.
Petition Under 37 C.F.R. § 1.181 to Expunge Third Party Requester's Improper Submission of Declarations Under 37 C.F.R. § 1.132 and Strike Comments Directed to Examiner's Determination in Inter Partes Reexamination of U.S. Pat. No. 7,714,747, Control No. 95/001,517, filed Jun. 26, 2013, 6 pages.
Notice of Intent to Issue a Reexam Certificate in Inter Partes Reexamination of U.S. Pat. No. 7,415,530, Control No. 95/001,927, mailed Jul. 19, 2013, 5 pages.
Right of Appeal Notice in Inter Partes Reexamination of U.S. Pat. No. 7,321,937, Control No. 95/001,922, mailed Aug. 15, 2013, 12 pages.
Right of Appeal Notice in Inter Partes Reexamination of U.S. Pat. No. 7,161,506, Control No. 95/001,926, mailed Aug. 16, 2013, 11 pages.
Inter Partes Reexamination Certificate in Inter Partes Reexamination of U.S. Pat. No. 7,415,530, Control No. 95/001,927, issued Aug. 16, 2013, 2 pages.

(56) References Cited

OTHER PUBLICATIONS

Right of Appeal Notice in Inter Partes Reexamination of U.S. Pat. No. 7,378,992, Control No. 95/001,928, mailed Aug. 16, 2013, 11 pages.
Right of Appeal Notice in Inter Partes Reexamination of U.S. Pat. No. 7,352,300, Control No. 95/001,925, mailed Aug. 29, 2013, 23 pages.
Action Closing Prosecution in Inter Partes Reexamination of U.S. Pat. No. 7,395,345, Control No. 95/001,925, mailed Sep. 20, 2013, 47 pages.
Decision on Petition(s) Decided Under 37 C.F.R. 1.181 in Inter Partes Reexamination of U.S. Pat. No. 7,714,747, Control No. 95/001,517, mailed Sep. 23, 2013, 3 pages.
Action Closing Prosecution in Inter Partes Reexamination of U.S. Pat. No. 6,604,158, Control No. 95/001,923, mailed Oct. 2, 2013, 18 pages.
Patent Owner's Reply to Action Closing Prosecution of Sep. 20, 2013 in Inter Partes Reexamination of U.S. Pat. No. 7,395,345, Control No. 95/001,925, filed Oct. 21, 2013, 9 pages.
Decision on Appeal in Inter Partes Reexamination of U.S. Pat. No. 7,417,568, Control No. 95/001,533, mailed Nov. 1, 2013, 18 pages.
Decision on Appeal in Inter Partes Reexamination of U.S. Pat. No. 7,400,274, Control No. 95/001,544, mailed Nov. 1, 2013, 12 pages.
Decision on Appeal in Inter Partes Reexamination of U.S. Pat. No. 7,777,651, Control No. 95/001,581, mailed Nov. 1, 2013, 15 pages.
Patent Owner's Reply to Action Closing Prosecution of Oct. 2, 2013 in Inter Partes Reexamination of U.S. Pat. No. 6,604,158, Control No. 95/001,923, filed Nov. 4, 2013, 9 pages.
Notice of Intent to Issue an Inter Partes Reexamination Certificate in Inter Partes Reexamination of U.S. Pat. No. 7,321,937, Control No. 95/001,922, mailed Nov. 13, 2013, 8 pages.
Notice of Intent to Issue an Inter Partes Reexamination Certificate in Inter Partes Reexamination of U.S. Pat. No. 7,378,992, Control No. 95/001,928, mailed Nov. 21, 2013, 10 pages.
Notice of Intent to Issue an Inter Partes Reexamination Certificate in Inter Partes Reexamination of U.S. Pat. No. 7,161,506, Control No. 95/001,926, mailed Nov. 27, 2013, 10 pages.
Declaration of Dr. James W. Modestino under 37 C.F.R. § 1.132 in Inter Partes Reexamination of U.S. Pat. No. 7,417,568, Control No. 95/001,533, executed Nov. 29, 2013; 51 pages.
Declaration of Dr. James W. Modestino under 37 C.F.R. § 1.132 in Inter Partes Reexamination of U.S. Pat. No. 7,400,274, Control No. 95/001,544, executed Nov. 29, 2013; 49 pages.
Declaration of Dr. James W. Modestino under 37 C.F.R. § 1.132 in Inter Partes Reexamination of U.S. Pat. No. 7,777,651, Control No. 95/001,581, executed Nov. 29, 2013; 50 pages.
Patent Owner's Request to Reopen Prosecution Before the Examiner under 37 C.F.R. § 41.77(b) in Inter Partes Reexamination of U.S. Pat. No. 7,417,568, Control No. 95/001,533, filed Dec. 2, 2013, 41 pages.
Patent Owner's Request to Reopen Prosecution Before the Examiner under 37 C.F.R. § 41.77(b) in Inter Partes Reexamination of U.S. Pat. No. 7,777,651, Control No. 95/001,581, filed Dec. 2, 2013, 57 pages.
Patent Owner's Request to Reopen Prosecution Before the Examiner under 37 C.F.R. § 41.77(b) in Inter Partes Reexamination of U.S. Pat. No. 7,400,274, Control No. 95/001,544, filed Dec. 2, 2013, 33 pages.
Inter Partes Reexamination Certificate in Inter Partes Reexamination of U.S. Pat. No. 7,321,937, Control No. 95/001,922, mailed Dec. 5, 2013, 2 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,417,568, Control No. 95/001,533, filed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,400,274, Control No. 95/001,544, filed Jan. 2, 2014, 8 pages.
Patent Owner's Petition Under 37 C.F.R. § 1.182 in Opposition to CME Group's Petition to Strike Patent Owner's Proposed New Claims, in Inter Partes Reexamination of U.S. Pat. No. 7,777,651, Control No. 95/001,581, filed Jan. 2, 2014, 10 pages.
Inter Partes Reexamination Certificate in Inter Partes Reexamination of U.S. Pat. No. 7,161,506, Control No. 95/001,926, mailed Jan. 8, 2014, 2 pages.
Inter Partes Reexamination Certificate in Inter Partes Reexamination of U.S. Pat. No. 7,378,992, Control No. 95/001,928, mailed Jan. 8, 2014, 3 pages.
Examiner's Determination Under 37 C.F.R. § 41.77(d) in Inter Partes Reexamination of U.S. Pat. No. 7,714,747, Control No. 95/001,517, mailed Jan. 14, 2014, 11 pages.
Patent Owner's Petition Under 37 C.F.R. § 1.181 to Strike Third Party Requester's Improper Response Under 37 C.F.R. § 41.77(c), in Inter Partes Reexamination of U.S. Pat. No. 7,417,568, Control No. 95/001,533, filed Jan. 22, 2014, 3 pages.
Patent Owner's Petition Under 37 C.F.R. § 1.181 to Strike Third Party Requester's Improper Response Under 37 C.F.R. § 41.77(c), in Inter Partes Reexamination of U.S. Pat. No. 7,400,274, Control No. 95/001,544, filed Jan. 22, 2014, 3 pages.
Patent Owner's Petition Under 37 C.F.R. § 1.181 to Strike Third Party Requester's Improper Response Under 37 C.F.R. § 41.77(c), in Inter Partes Reexamination of U.S. Pat. No. 7,777,651, Control No. 95/001,581, filed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,417,568, Control No. 95/001,533, filed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,400,274, Control No. 95/001,544, filed Jan. 22, 2014, 3 pages.
Patent Owner's Petition Under 37 C.F.R. § 1.181 to Strike Third Party Requester's Improper Response Under 37 C.F.R. § 1.132, in Inter Partes Reexamination of U.S. Pat. No. 7,777,651, Control No. 95/001,581, filed Jan. 22, 2014, 3 pages.
Patent Owner's Request for Rehearing Under 37 C.F.R. § 41.79, in Inter Partes Reexamination of U.S. Pat. No. 7,714,747, Control No. 95/001,517, filed Feb. 14, 2014, 11 pages.
Patent Owner's Supplemental Reply to Action Closing Prosecution in Inter Partes Reexamination of U.S. Pat. No. 6,604,158, Control No. 95/001,923, filed Feb. 27, 2014, 10 pages.
Patent Owner's Supplemental Reply to Action Closing Prosecution in Inter Partes Reexamination of U.S. Pat. No. 7,395,345, Control No. 95/001,925, filed Feb. 27, 2014, 9 pages.
Corrected Request to Reopen Prosecution Before the Examiner under 37 C.F.R. § 41.77(b) in Inter Partes Reexamination of U.S. Pat. No. 7,417,568, Control No. 95/001,533, mailed Mar. 11, 2014, 48 pages.
Corrected Request to Reopen Prosecution Before the Examiner under 37 C.F.R. § 41.77(b) in Inter Partes Reexamination of U.S. Pat. No. 7,400,274, Control No. 95/001,544, mailed Mar. 11, 2014, 39 pages.
Corrected Request to Reopen Prosecution Before the Examiner under 37 C.F.R. § 41.77(b) in Inter Partes Reexamination of U.S. Pat. No. 7,777,651, Control No. 95/001,581, mailed Mar. 11, 2014, 67 pages.
Right of Appeal Notice Under 37 C.F.R. § 1.953 in Inter Partes Reexamination of U.S. Pat. No. 6,604,158, Control No. 95/001,923, mailed Jun. 9, 2014, 14 pages.
Right of Appeal Notice Under 37 C.F.R. § 1.953 in Inter Partes Reexamination of U.S. Pat. No. 7,395,345, Control No. 95/001,925 mailed Jun. 10, 2014, 10 pages.
Notice of Intent to Issue a Reexamination Certificate in Inter Partes Reexamination of U.S. Pat. No. 7,352,300, Control No. 95/001,924, mailed Jun. 27, 2014, 7 pages.
Inter Partes Reexamination Certificate in Inter Partes Reexamination of U.S. Pat. No. 7,352,300, Control No. 95/001,924, mailed Aug. 4, 2014, 4 pages.
Examiner's Determination Under 37 C.F.R. 41.77(d), in Inter Partes Reexamination of U.S. Pat. No. 7,417,568, Control No. 95/001,533, mailed Oct. 3, 2014; 10 pages.

(56) References Cited

OTHER PUBLICATIONS

Examiner's Determination Under 37 C.F.R. 41.77(d), in Inter Partes Reexamination of U.S. Pat. No. 7,400,274, Control No. 95/001,544, mailed Oct. 10, 2014; 10 pages.
Examiner's Determination Under 37 C.F.R. 41.77(d), in Inter Partes Reexamination of U.S. Pat. No. 7,777,651, Control No. 95/001,581, mailed Oct. 10, 2014; 12 pages.
Comments in Response to Examiner's Determination Under 37 C.F.R. 41.77(e) in Inter Partes Reexamination of U.S. Pat. No. 7,417,568, Control No. 95/001,533, filed Nov. 3, 2014; 30 pages.
Inter Partes Reexamination Certificate in Inter Partes Reexamination of U.S. Pat. No. 7,395,345, Control No. 95/001,925, mailed Nov. 3, 2014; 2 pages.
Comments in Response to Examiner's Determination under 37 C.F.R. 41.77(e) in Inter Partes Reexamination of U.S. Pat. No. 7,400,274, Control No. 95/001,544, filed Nov. 10, 2014; 19 pages.
Comments in Response to Examiner's Determination under 37 C.F.R. 41.77(e) in Inter Partes Reexamination of U.S. Pat. No. 7,777,651, Control No. 95/001,581, filed Nov. 10, 2014; 19 pages.
Patent Owner's Reply to Third Party Requester's Comments Under 37 C.F.R. 41.77(e) in Inter Partes Reexamination of U.S. Pat. No. 7,417,568, Control No. 95/001,533, filed Dec. 3, 2014, 6 pages.
Patent Owner's Reply to Third Party Requester's Comments Under 37 C.F.R. 41.77(e) in Inter Partes Reexamination of U.S. Pat. No. 7,400,274, Control No. 95/001,544, filed Dec. 10, 2014, 6 pages.
Patent Owner's Reply to Third Party Requester's Comments Under 37 C.F.R. 41.77(e) in Inter Partes Reexamination of U.S. Pat. No. 7,777,651, Control No. 95/001,581, filed Dec. 10, 2014, 6 pages.
Decision on Request for Rehearing in Inter Partes Reexamination of U.S. Pat. No. 7,714,747, Control No. 95/001,517, mailed Jan. 6, 2015, 7 pages.
Right of Appeal Notice in Inter Partes Reexamination of U.S. Pat. No. 6,604,158, Control No. 95/001,923, mailed Jan. 9, 2015, 14 pages.
Notice of Intent to Issue a Reexamination Certificate in Inter Partes Reexamination of U.S. Pat. No. 6,604,158, Control No. 95/001,923, issued Mar. 9, 2015, 7 pages.
Inter Partes Reexamination Certificate, in Inter Partes Reexamination of U.S. Pat. No. 6,604,158, Control No. 95/001,923, issued Apr. 17, 2015; 3 pages.
Decision on Appeal No. 2015-007686, in Inter Partes Reexamination of U.S. Pat. No. 7,417,568, Control No. 95/001,533, mailed Oct. 29, 2015; 16 pages.
Decision on Appeal No. 2015-007706, in Inter Partes Reexamination of U.S. Pat. No. 7,777,651, Control No. 95/001,581, mailed Oct. 29, 2015; 16 pages.
Decision on Appeal No. 2015-007687, in Inter Partes Reexamination of U.S. Pat. No. 7,400,274, Control No. 95/001,544, mailed Oct. 29, 2015; 15 pages.
Notice of Intent to Issue Inter Partes Reexamination Certificate, in Inter Partes Reexamination of U.S. Pat. No. 7,777,651, Control No. 95/001,581, mailed Jun. 2, 2016; 5 pages.
Notice of Intent to Issue Inter Partes Reexamination Certificate, in Inter Partes Reexamination of U.S. Pat. No. 7,417,568, Control No. 95/001,533, mailed Jun. 14, 2016; 6 pages.
Inter Partes Reexamination Certificate, in Inter Partes Reexamination of U.S. Pat. No. 7,777,651, Control No. 95/001,581, issued Jul. 8, 2016; 2 pages.
Notice of Intent to Issue Inter Partes Reexamination Certificate, in Inter Partes Reexamination of U.S. Pat. No. 7,400,274, Control No. 95/001,544, mailed Jul. 15, 2016; 5 pages.
Inter Partes Reexamination Certificate, in Inter Partes Reexamination of U.S. Pat. No. 7,417,568, Control No. 95/001,533, issued Jul. 22, 2016; 2 pages.
Inter Partes Reexamination Certificate, in Inter Partes Reexamination of U.S. Pat. No. 7,400,274, Control No. 95/001,544, issued Aug. 1, 2016; 2 pages.
Petition for Inter Partes Review of Claim 48 of U.S. Pat. No. 7,378,992, filed in *Oracle America, Inc.* v. *Realtime Data, LLC*, Case No. IPR2016-00373 (P.T.A.B.), filed Dec. 22, 2015; 69 pages.
Petition for Inter Partes Review of Claims 1, 2, 4, 6, 11-16, 18-20, 22 of U.S. Pat. No. 8,643,513, filed in *Oracle America, Inc.* v. *Realtime Data, LLC*, Case No. IPR2016-00374 (P.T.A.B.), filed Dec. 22, 2015; 68 pages.
Petition for Inter Partes Review of Claims 1-2, 4, 10-12, 18-20 of U.S. Pat. No. 7,415,530, filed in *Oracle America, Inc.* v. *Realtime Data, LLC*, Case No. IPR2016-00375 (P.T.A.B.), filed Dec. 22, 2015; 62 pages.
Petition for Inter Partes Review of Claim 24 of U.S. Pat. No. 7,415,530, filed in *Oracle America, Inc.* v. *Realtime Data, LLC*, Case No. IPR2016-00376 (P.T.A.B.), filed Dec. 22, 2015; 68 pages.
Petition for Inter Partes Review of Claims 1-2, 9, 11, 21-22, 24-25 of U.S. Pat. No. 9,116,908, filed in *Oracle America, Inc.* v. *Realtime Data, LLC*, Case No. IPR2016-00377 (P.T.A.B.), filed Dec. 22, 2015; 65 pages.
Declaration of Professor James A. Storer, filed in *Oracle America, Inc.* v. *Realtime Data, LLC*, Case No. IPR2016-00373 (P.T.A.B.), filed Dec. 22, 2015; 102 pages.
Hsu, et al., "Automatic Synthesis of Compression Techniques for Heterogeneous Files," Software—Practice and Experience, vol. 25, Issue 10, Oct. 1995; pp. 1097-1116.
Storer, J., Data Compression Methods and Theory, Rockville, MD: Computer Science Press, 1988.
Huffman, D., "A Method for the Construction of Minimum-Redundancy Codes," Proceedings of the I.R.E., Sep. 1952, pp. 1098-1101.
Ziv, et al., "A Universal Algorithm for Sequential Data Compression," IEEE Transactions on Information Theory, vol. IT-23, No. 3, May 1977; 337-343.
Ziv, et al., "Compression of Individual Sequences via Variable-Rate Coding," IEEE Transactions on Information Theory, vol. IT-24, No. 5, Sep. 1978; 530-536.
First Amended Complaint for Patent Infringement, filed in *Realtime Data, LLC d/b/a IXO* v. *MetroPCS Texas, LLC, et al.*, Case No. 6:10-cv-00493-LED (E.D. Texas), filed Apr. 11, 2011; 15 pages.
Joint Motion to Stay All Pending Deadlines Between Plaintiff Realtime Data, LLC d/b/a IXO and Defendant Cellco Partnership d/b/a Verizon Wireless, filed in *Realtime Data, LLC d/b/a IXO* v. *MetroPCS Texas, LLC, et al.*, Case No. 6:10-cv-00493-LED (E.D. Texas), filed Sep. 18, 2012; 3 pages.
Joint Motion for Dismissal with Prejudice of Defendant Cellco Partnership d/b/a Verizon Wireless, filed in *Realtime Data, LLC d/b/a IXO* v. *MetroPCS Texas, LLC, et al.*, Case No. 6:10-cv-00493-LED (E.D. Texas), filed Oct. 17, 2012; 2 pages.
Order regarding Joint Motion for Dismissal with Prejudice, filed in *Realtime Data, LLC d/b/a IXO* v. *MetroPCS Texas, LLC, et al.*, Case No. 6:10-cv-00493-LED (E.D. Texas), filed Oct. 19, 2012; 1 page.
Declaration of Professor James A. Storer, filed in *Oracle America, Inc.* v. *Realtime Data, LLC*, Case No. IPR2016-00374 (P.T.A.B.), filed Dec. 22, 2015; 118 pages.
Submission Under 37 C.F.R. 1.114(c) and Preliminary Amendment Under 37 C.F.R. 1.115, filed Oct. 10, 2013, in the prosecution of U.S. Appl. No. 13/154,211; 10 pages.
Declaration of Professor James A. Storer, filed in *Oracle America, Inc.* v. *Realtime Data, LLC*, Case No. IPR2016-00375 (P.T.A.B.), filed Dec. 28, 2015; 82 pages.
Declaration of Professor James A. Storer, filed in *Oracle America, Inc.* v. *Realtime Data, LLC*, Case No. IPR2016-00376 (P.T.A.B.), filed Dec. 28, 2015; 86 pages.
Definition of "bandwidth", Random House Computer & Internet Dictionary, Third Edition, New York: Random House, 1999; p. 45.
Declaration of Professor James A. Storer, filed in *Oracle America, Inc.* v. *Realtime Data, LLC*, Case No. IPR2016-00377 (P.T.A.B.), filed Dec. 28, 2015; 83 pages.
Third Party Requester's Comments to Patent Owner's Response of Jun. 25, 2012 Pursuant to 37 C.F.R. 1.947, Inter Partes Reexamination of U.S. Pat. No. 7,378,992, Control No. 95/001,928, filed Jul. 25, 2012; 21 pages.
Petition for Inter Partes Review of Claims 1-4, 8, 14-17, 21 and 28 of U.S. Pat. No. 6,597,812, filed in *SAP America Inc., et al.* v. *Realtime Data, LLC d/b/a IXO*, Case No. IPR2016-00783 (P.T.A.B.), filed Apr. 1, 2016; 67 pages.

(56) References Cited

OTHER PUBLICATIONS

Declaration of Scott Bennett, Ph.D., filed in *SAP America Inc., et al. v. Realtime Data LLC d/b/a IXO*, Case No. IPR2016-00783 (P.T.A.B.), filed Apr. 1, 2016; 45 pages.
Declaration of Charles D. Creusere in Support of Petition for Inter Partes Review of Claims 1-4, 8, 14-17, 21 and 28 of U.S. Pat. No. 6,597,812, filed in *SAP America Inc., et al. v. Realtime Data LLC d/b/a IXO*, Case No. IPR2016-00783 (P.T.A.B.), filed Apr. 1, 2016; 82 pages.
Nelson, M., *The Data Compression Book*, 1st Edition, San Mateo, CA: M&T Books, 1992; 534 pages.
Randell, B., "Hardware/Software Tradeoffs: A General Design Principle?", Computing Laboratory, The University of Newcastle Upon Tyne, Jan. 25, 1985; 2 pages.
Definition of "consecutive", *Random House Webster's College Dictionary*, 2nd Edition, New York: Random House, 1998; p. 281.
Robinson, et al., "Results of a Prototype Television Bandwidth Compression Scheme," Proceedings of the IEEE, vol. 55, No. 3, Mar. 1967; pp. 356-364.
Petition for Inter Partes Review of U.S. Pat. No. 7,415,530, filed in *Dell Inc., et al. v. Realtime Data LLC d/b/a IXO*, Case No. IPR2016-00878 (P.T.A.B.), filed Apr. 22, 2016; 69 pages.
Declaration of Charles D. Creusere, filed in *Dell Inc., et al. v. Realtime Data LLC d/b/a IXO*, Case No. IPR2016-00878 (P.T.A.B.), filed Apr. 22, 2016; 124 pages.
Sobh, et al., "A Comparison of Compressed and Uncompressed Transmission Modes," University of Pennsylvania Department of Computer and Information Science Technical Report No. MS-CIS-91-41, May 1991; 15 pages.
9704 Data Compression Coprocessor Data Sheet, Stac Electronics, Sep. 1991; 56 pages.
Petition for Inter Partes Review of U.S. Pat. No. 8,643,513, filed in *Riverbed Technology, Inc., et al. v. Realtime Data, LLC*, Case No. IPR2016-00978 (P.T.A.B.), filed Apr. 29, 2016; 65 pages.
Declaration of Charles D. Creusere, Ph.D. Under 37 C.F.R. § 1.68, filed in *Riverbed Technology, Inc., et al. v. Realtime Data, LLC*, Case No. IPR2016-00978 (P.T.A.B.), filed Apr. 29, 2016; 139 pages.
Petition for Inter Partes Review of U.S. Pat. No. 9,116,908, filed in *Dell Inc. al. v. Realtime Data, LLC*, Case No. IPR2016-01002 (P.T.A.B.), filed May 5, 2016; 68 pages.
Declaration of Charles D. Creusere, Ph.D., filed in *Dell Inc. al. v. Realtime Data, LLC*, Case No. IPR2016-01002 (P.T.A.B.), filed May 5, 2016; 105 pages.
Petition for Inter Partes Review of U.S. Pat. No. 7,415,530, filed in *Dell Inc. al. v. Realtime Data, LLC*, Case No. IPR2016-00972 (P.T.A.B.), filed Apr. 29, 2016; 69 pages.
Declaration of Charles D. Creusere, Ph.D., filed in *Dell Inc. al. v. Realtime Data, LLC*, Case No. IPR2016-00972 (P.T.A.B.), filed Apr. 29, 2016; 124 pages.
Petition for Inter Partes Review of U.S. Pat. No. 7,378,992, filed in *Riverbed Technology, Inc. v. Realtime Data, LLC*, Case No. IPR2016-00980 (P.T.A.B.), filed Apr. 29, 2016; 57 pages.
Declaration of Charles D. Creusere, Ph.D., filed in *Dell Inc. al. v. Realtime Data, LLC*, Case No. IPR2016-00980 (P.T.A.B.), filed Apr. 29, 2016; 105 pages.
Institution Decision, mailed in *Oracle America, Inc. et al. v. Realtime Data LLC*, Case No. IPR2016-00373 (P.T.A.B.), mailed Jun. 27, 2016; 32 pages.
Institution Decision, mailed in *Oracle America, Inc. et al. v. Realtime Data LLC*, Case No. IPR2016-00374 (P.T.A.B.), mailed Jun. 27, 2016; 28 pages.
Decision Denying Institution, mailed in *Oracle America, Inc. et al. v. Realtime Data LLC*, Case No. IPR2016-00375 (P.T.A.B.), mailed Jul. 1, 2016; 13 pages.
Decision Denying Institution, mailed in *Oracle America, Inc. et al. v. Realtime Data LLC*, Case No. IPR2016-00376 (P.T.A.B.), mailed Jul. 1, 2016; 18 pages.
Decision Denying Institution, mailed in *Oracle America, Inc. et al. v. Realtime Data LLC*, Case No. IPR2016-00377 (P.T.A.B.), mailed Jul. 1, 2016; 16 pages.
Petition for Inter Partes Review of U.S. Pat. No. 7,181,608 Pursuant to 35 U.S.C. 311-319, 37 C.F.R. 42, filed in *Apple Inc. v. Realtime Data LLC*, Case No. IPR2016-01365 (P.T.A.B.), filed Jul. 8, 2016; 77 pages.
File History of U.S. Pat. No. 7,181,608, U.S. Appl. No. 09/776,267, filed Feb. 2, 2001; 507 pages.
Declaration of Dr. Charles J. Neuhauser, filed in *Apple Inc. v. Realtime Data LLC*, Case No. IPR2016-01365 (P.T.A.B.), filed Jul. 8, 2016; 174 pages.
Burrows, et al., "On-Line Data Compression in a Log-structured File System," Fifth International Conference on Architectural Support for Programming Languages and Operating Systems, Oct. 12-15, 1992; 27 pages.
Excerpts from Hennessy, et al., Computer Architecture—A Quantitative Approach, San Mateo, CA: Morgan Kaufmann Publishers, 1990; p. 403-425, 535-538.
Prosise, J., "DOS 6: The Ultimate Software Bundle?", PC Magazine, vol. 12, No. 7, Apr. 13, 1993; 29 pages. (Submitted in 2 parts.).
Excerpts from Microsoft Press Computer Dictionary, Third Edition, Redmond, WA: Microsoft Press, 1997; pp. 194-196.
Exceprts from Shanley, et al., PCI System Architecture, Fourth Edition, New York: Addison Wesley, 1999; pp. 7-13.
Storer, et al., "Data Compression via Textual Substitution," Journal of the Association for Computing Machinery, vol. 29, No. 4, Oct. 1982; 24 pages.
Petition for Inter Partes Review of U.S. Pat. No. 8,090,936 Pursuant to 35 U.S.C. 311-319, 37 C.F.R. 42, filed in *Apple Inc. v. Realtime Data LLC*, Case No. IPR2016-01366 (P.T.A.B.), filed Jul. 8, 2016; 77 pages.
File History of U.S. Pat. No. 8,090,936, U.S. Patent Application No. 11/551,204, filed Oct. 19, 2006; 970 pages.
Declaration of Dr. Charles J. Neuhauser, filed in *Apple Inc. v. Realtime Data LLC*, Case No. IPR2016-01366 (P.T.A.B.), filed Jul. 8, 2016; 157 pages.
Defendant Oracle America's Exchange of Preliminary Claim Constructions and Extrinsic Evidence, filed in *Realtime Data LLC d/b/a IXO v. Actian Corporation, et al.*, Case No. 6:15-cv-00463-RWS-JDL (E.D. Texas), filed Mar. 21, 2016; 8 pages.
Roshal, E., "User's Manual, RAR 2.50 32-bit Consol version (Unix and Windows)," 1999; 15 pages.
Aramvith, et al., "MPEG-1 and MPEG-2 Video Standards," Academic Press, 1999; 25 pages.
Vrc 5074 System Controller Data Sheet, Revision 1.0, NEC, Jun. 1998; 3 pages.
NEC VRC5074 System Controller Data Sheet, Revision 1.0, Jun. 1998; 3 pages.
Petition for Inter Partes Review of U.S. Pat. No. 7,415,530, filed in *Oracle America, Inc. v. Realtime Data LLC*, Case No. IPR2016-01671 (P.T.A.B.), filed Sep. 6, 2016; 67 pages.
Petition for Inter Partes Review of U.S. Pat. No. 9,116,908, filed in *Oracle America, Inc. v. Realtime Data LLC*, Case No. IPR2016-01672 (P.T.A.B.), filed Sep. 6, 2016; 69 pages.
Petition for Inter Partes Review of U.S. Pat. No. 8,880,862, filed in *Apple, Inc. v. Realtime Data LLC*, Case No. IPR2016-01737 (P.T.A.B.), filed Sep. 9, 2016; 83 pages.
Declaration of Dr. Charles J. Neuhauser, filed in *Apple Inc. v. Realtime Data LLC*, Case No. IPR2016-01737 (P.T.A.B.), filed Sep. 9, 2016; 347 pages.
Excerpt from Microsoft Press Computer Dictionary, Third Edition, Redmond, WA: Microsoft Press, 1997; p. 384.
Excerpt from Microsoft Press Computer Dictionary, Third Edition, Redmond, WA: Microsoft Press, 1997; p. 148.
Excerpt from Microsoft Press Computer Dictionary, Third Edition, Redmond, WA: Microsoft Press, 1997; p. 395.
Excerpt from Microsoft Press Computer Dictionary, Third Edition, Redmond, WA: Microsoft Press, 1997; p. 137.
Excerpts from Loudon, K., Mastering Algorithms with C, Sebastopol, CA: O'Reilley Media, Inc., 1999; pp. 365-421.
Excerpts from Barr, M., Programming Embedded Systems in C and C++, Sebastol, CA: O'Reilley & Associates, Inc., 1999; pp. 57-83.
Excerpts from Pearce, E., Windows NT in a Nutshell, Sebastol, CA: O'Reilley & Associates, Inc., 1997; pp. 8-9, 52-55, 317-327.

(56) References Cited

OTHER PUBLICATIONS

Excerpts from O'Reilley, et al., Windows 98 in a Nutshell, Sebastol, CA: O'Reilley & Associates, Inc., 1999; pp. 109-112.
Excerpts from Microsoft Press Computer Dictionary, Third Edition, Redmond, WA: Microsoft Press, 1997; p. 72, 27-28, 341, 384-386.
Petition for Inter Partes Review of U.S. Pat. No. 8,880,862, filed in *Apple, Inc. v. Realtime Data LLC*, Case No. IPR2016-01738 (P.T.A.B.), filed Sep. 9, 2016; 82 pages.
Declaration of Dr. Charles J. Neuhauser, filed in *Apple Inc. v. Realtime Data LLC*, Case No. IPR2016-01739 (P.T.A.B.), filed Sep. 9, 2016; 101 pages.
Petition for Inter Partes Review of U.S. Pat. No. 8,880,862, filed in *Apple, Inc. v. Realtime Data LLC*, Case No. IPR2016-01739 (P.T.A.B.), filed Sep. 9, 2016; 77 pages.
Patent Owner Response, filed in *Oracle America, Inc. v. Realtime Data LLC*, Case No. IPR2016-00374 (P.T.A.B.), filed Sep. 15, 2016; 71 pages.
Declaration of Kenneth A. Zeger, Ph.D., filed in *Oracle America, Inc. v. Realtime Data LLC*, Case No. IPR2016-00374 (P.T.A.B.), filed Sep. 15, 2016; 115 pages.
Excerpt from IBM Dictionary of Computing, International Business Machines Corporation, 1994; p. 27.
Storer, A., "An Introduction to Data Structures and Algorithms," Waltham, MA: Springer Science & Business Media, LLC, 2012; pp. 1-27, 76-80, 91, 164.
Freedman, A., "The Computer Glossary: The Complete Illustrated Dictionary, Ninth Edition," New York, NY: AMACOM, 2001; pp. 140, 147.
IEEE 100: The Authoritative Dictionary of IEEE Standards Terms, Seventh Edition, New York, NY: Institute of Electrical and Electronics Engineers, Inc., 2000; pp. 455, 860, 861.
Excerpts from Microsoft Computer Dictionary, Fifth Edition, Redmond, WA, Microsoft Corporation: 2002; pp. 30, 417.
Deposition of James A. Storer, Ph.D., filed in *Oracle America, Inc. v. Realtime Data LLC*, Case Nos. IPR2016-00373 and TPR2016-00374 (P.T.A.B.), filed Sep. 15, 2016; 63 pages.
Excerpts from Pfaffenberger, B., "Webster's New World Dictionary of Computer Terms, Sixth Edition," New York, NY: Simon & Schuster, Inc., 1997; pp. 29, 186, 195, 411.
Internet Archive version of the web page www.nist.gov/dads/HTML/prefix.html, dated Jun. 20, 2001, available at https://web.archive.org/web/20090130084909/http://nist.gov/dads/HTML/prefix.html; 1 page.
Internet Archive version of the web page www.nist.gov/dads/, dated Feb. 3, 2009, available at https://web.archive.org/web/20090130084909/http://nist.gov/dads/; 26 pages.
Excerpt from Webster's New World College Dictionary, Fourth Edition, Foster City, CA: IDG Books Worldwide, Inc., 2001; p. 1133.
Excerpt from Webster's II New College Dictionary, Boston, MA: Houghton Mifflin Company, 1995; p. 871.
Patent Owner Response, filed in *Oracle America, Inc. v. Realtime Data LLC*, Case No. IPR2016-00373 (P.T.A.B.), filed Sep. 15, 2016; 69 pages.
Declaration of Kenneth A. Zeger, Ph.D., filed in *Oracle America, Inc. v. Realtime Data LLC*, Case No. IPR2016-00373 (P.T.A.B.), filed Sep. 15, 2016; 99 pages.
Petition for Inter Partes Review of U.S. Pat. No. 8,880,862, filed in *Oracle America, Inc. v. Realtime Data LLC*, Case No. IPR2017-00108 (P.T.A.B.), filed Oct. 24, 2016; 72 pages.
Declaration of Dr. James A. Storer, filed in *Oracle America, Inc. v. Realtime Data LLC*, Case No. IPR2017-00108 (P.T.A.B.), filed Oct. 24, 2016; 107 pages.
Defendants' Technology Tutorial Reference Book, filed in *Realtime Data LLC d/b/a IXO v. Actian Corporation, et al.*, Case No. 6:16-cv-00463-RWS-JDL (E.D. Texas), filed May 19, 2016; 85 pages.
Decision Granting Institution of Inter Partes Review, filed in *Dell, Inc. et al. v. Realtime Data LLC*, Case No. IPR2016-00972 (P.T.A.B.), filed Nov. 1, 2016; 21 pages.

Decision Institution of Inter Partes Review, filed in *Riverbed Technology, Inc. et al. v. Realtime Data LLC*, Case No. IPR2016-00978 (P.T.A.B.), filed Nov. 1, 2016; 31 pages.
Decision Institution of Inter Partes Review, filed in *Riverbed Technology, Inc. et al. v. Realtime Data LLC*, Case No. IPR2016-00980 (P.T.A.B.), filed Nov. 1, 2016; 29 pages.
Petition for Inter Partes Review of U.S. Pat. No. 6,597,812 to Fallon, filed in *Oracle America, Inc. v. Realtime Data LLC*, Case No. IPR2017-00167 (P.T.A.B.), filed Nov. 2, 2016; 65 pages.
Declaration of Professor James A. Storer, Ph.D, filed in *Oracle America, Inc. v. Realtime Data LLC*, Case No. IPR2017-00167 (P.T.A.B.), filed Nov. 2, 2016; 93 pages.
Petition for Inter Partes Review of U.S. Pat. No. 6,597,812 to Fallon, filed in *Oracle America, Inc. v. Realtime Data LLC*, Case No. IPR2017-00168 (P.T.A.B.), filed Nov. 2, 2016; 84 pages.
Declaration of Professor James A. Storer, Ph.D, filed in *Oracle America, Inc. v. Realtime Data LLC*, Case No. IPR2017-00168 (P.T.A.B.), filed Nov. 2, 2016; 111 pages.
Decision Institution of Inter Partes Review, filed in *Dell, Inc. et al. v. Realtime Data LLC*, Case No. IPR2016-01002 (P.T.A.B.), filed Nov. 4, 2016; 19 pages.
Absolute Astronomy, "Hard Disk," Absoluteastronomy.com, accessed at http://www.absoluteastronomy.com/topics/Hard_disk on May 23, 2013; 13 pages.
Fitchard, Kevin, "The Future of Mobile Networks: Beyond 4G," Businessweek.com, accessed at http://www.businessweek.com/articles/2012-12-19/the-future-of-mobile-networks-beyond-4g on May 23, 2013; 6 pages.
Quick Turn Flash, "USB Flash Drive Facts," Quickturnflash.com, accessed at http://quickturnflash.com/Flash-Drive-Resources/usb-flash-drive-facts.html on May 23, 2013; 4 pages.
Wikibooks, "Communication Networks/History of Networking," Wikibooks.org, accessed at http://en.wikibooks.org/wiki/Communication-Networks/History_of_Networking on May 23, 2013; 2 pages.
Wikipedia, "4G," Wikipedia.org, accessed at http://en.wikipedia.org/wiki/4G on May 23, 2013; 17 pages.
Wikipedia, "Central Processing Unit," Wikipedia.org, accessed at http://en.wikipedia.org/wiki/Central_processing_unit on May 23, 2013; 14 pages.
Wikipedia, "Computer Data Storage," Wikipedia.org, accessed at http://en.wikipedia.org/wiki/Computer_data_storage on May 23, 2013; 14 pages.
Wikipedia, "Database," Wikipedia.org, accessed at http://en.wikipedia.org/wiki/Database_System on May 23, 2013; 19 pages.
Wikipedia, "Orthogonal Frequency-Division Multiplexing," Wikipedia.org, accessed at http://en.wikipedia.org/wiki/Orthogonal_frequency-dividsion_multiplexing on May 23, 2013; 13 pages.
Wikipedia, "Removable Media," Wikipedia.org, accessed at http://en.wikipedia.org/wiki/Removable_media on May 23, 2013; 2 pages.
Wikipedia, "USB Flash Drive," Wikipedia.org, accessed at http://en.wikipedia.org/wiki/USB_flash drive on May 23, 2013; 17 pages.
Decision Granting Institution of Inter Partes Review, filed in *Apple, Inc. v. Realtime Data LLC*, Case No. IPR2016-01366 (P.T.A.B.), filed Jan. 12, 2017; 17 pages.
Internet Archive version of the web page http://www.faqs.org/faqs/compression-faq/part1/section-7.html, dated Nov. 28, 1999, available at https://web.archive.org/web/19991128233045/http://www.faqs.org/faqs/compression-faq/partl/section-7.html; 14 pages.
Declaration of Leonard Laub, filed in *Hewlett-Packard Enterprise Company et al. v. Realtime Data LLC d/b/a IXO*, Case No. IPR2016-00783 (P.T.A.B.), filed Jan. 5, 2017; 96 pages.
Petition for Inter Partes Review of U.S. Pat. No. 7,358,867, filed in *Teradata Operations, Inc. v. Realtime Data LLC d/b/a IXO*, Case No. IPR2017-00557 (P.T.A.B.), filed Dec. 30, 2016; 76 pages.
Declaration of Charles D. Creusere, Ph.D., filed in *Teradata Operations, Inc. v. Realtime Data LLC d/b/a IXO*, Case No. IPR2017-00557 (P.T.A.B.), filed Dec. 30, 2016; 137 pages.
Excerpt from McGraw-Hill Dictionary of Scientific and Technical Terms, Fifth Edition, McGraw-Hill 1994; p. 616.
Excerpts from Microsoft Press Computer Dictionary, Third Edition, Microsoft Corporation 1997; pp. 71, 162, 485.

(56) References Cited

OTHER PUBLICATIONS

Declaration of Scott Bennett, Ph.D., filed in *Teradata Operations, Inc. v. Realtime Data LLC d/b/a IXO*, Case No. IPR2017-00557 (P.T.A.B.), filed Dec. 30, 2016; 158 pages.
Underwood, "Extensions of the UNIX File Command and Magic File for File Type Identification," Georgia Tech Research Institute 2009; 25 pages.
AT&T UNIX System V User's Manual vol. I, AT&T 1986; 798 pages.
FreeBSDGeneral Commands Manual, FreeBSD Man Pages 2000; 7 pages.
Petition for Inter Partes Review of U.S. Pat. No. 7,161,506, filed in *Teradata Operations, Inc. v. Realtime Data LLC d/b/a IXO*, Case No. IPR2017-00806 (P.T.A.B.), filed Jan. 30, 2016; 57 pages.
Declaration of Charles D. Creusere, filed in *Teradata Operations, Inc. v. Realtime Data LLC d/b/a IXO*, Case No. IPR2017-00806 (P.T.A.B.), filed Jan. 30, 2016; 102 pages.
Realtime's Appeal Brief Under 37 C.F.R. § 41.67, filed in Inter Partes Reexamination of U.S. Pat. No. 7,161,506, Control No. 95/000,479, mailed Apr. 21, 2011; 53 pages.
Excerpts from Microsoft Press Computer Dictionary, Third Edition, Microsoft Corporation 1997; pp. 71, 162, 307, 383, 485.
Verdict Form, filed in *Realtime Data LLC d/b/a IXO v. T-Mobile U.S.A., Inc.*, Case No. 6:10-cv-00493-RC-JDL, filed Feb. 11, 2013; 9 pages.
Jury Instructions, filed in *Realtime Data LLC d/b/a IXO v. T-Mobile U.S.A., Inc.*, Case No. 6:10-cv-00493-RC-JDL, filed Feb. 11, 2013; 34 pages.
Transcript of Jury Trial for *Realtime Data LLC d/b/a IXO v. T-Mobile U.S.A., Inc.*, Case No. 6:10-cv-00493-RC-JDL, dated Feb. 8, 2013; 319 pages.
Order Granting in part Plaintiff's Motion for Judgement as a Matter of Law as to.Invalidity, filed in *Realtime Data LLC d/b/a IXO v. T-Mobile U.S.A., Inc.*, Case No. 6:10-cv-00493-RC-JDL, filed Mar. 4, 2013; 17 pages.
Declaration of Scott Bennett, filed in *Teradata Operations, Inc. v. Realtime Data LLC d/b/a IXO*, Case No. IPR2017-00806 (P.T.A.B.), filed Jan. 30, 2016; 158 pages.
Petition for Inter Partes Review of U.S. Pat. No. 9,054,728, filed in *Teradata Operations, Inc. v. Realtime Data LLC d/b/a IXO*, Case No. IPR2017-00808 (P.T.A.B.), filed Jan. 30, 2016; 66 pages.
Declaration of Charles D. Creusere, filed in *Teradata Operations, Inc. v. Realtime Data LLC d/b/a IXO*, Case No. IPR2017-00808 (P.T.A.B.), filed Jan. 30, 2016; 114 pages.
Excerpts from Merriam-Webster's Collegiate Dictionary, Tenth Edition, Merriam-Webster Inc. 2000; pp. 12, 53, 56, 913, 918.
Excerpts from Merriam-Webster's Collegiate Dictionary, Deluxe Edition, Merriam-Webster Inc. 1998; pp. 19, 81, 86, 1436, 1444.
Oracle's Reply to Patent Owner's Response to the Petition, filed in *Oracle America, Inc. v. Realtime Data LLC*, Case No. IPR2016-00373 (P.T.A.B.), filed Feb. 2, 2017; 28 pages.
Transcript of Markman Hearing in *Realtime Data LLC v. CME Group Inc., et al.*, Case No. 1.11-cv-06697-KBF (S.D. New York), filed May 14, 2012; 200 pages.
Deposition of Kenneth A. Zeger, Ph.D., filed in *Oracle America v. Realtime Data LLC.*, Case No. IPR2016-00373 (P.T.A.B.), filed Feb. 2, 2017; 94 pages.
Oracle's Reply to Patent Owner's Response to the Petition, filed in *Oracle America, Inc. v. Realtime Data LLC*, Case No. IPR2016-00374 (P.T.A.B.), filed Feb. 2, 2017; 34 pages.
Supplemental Declaration of Professor James A. Storer, Ph.D., filed in *Oracle America, Inc. v. Realtime Data LLC*, Case No. IPR2016-00374 (P.T.A.B.), filed Feb. 2, 2017; 3 pages.
Patent Owner's Response, filed in *Riverbed Technology, Inc. et al. v. Realtime Data LLC*, Case No. IPR2016-00980 (P.T.A.B.), filed Feb. 8, 2017; 51 pages.
Declaration of Kenneth A. Zeger, Ph.D., filed in *Riverbed Technology, Inc. et al. v. Realtime Data LLC*, Case No. IPR2016-00980 (P.T.A.B.), filed Feb. 8, 2017; 59 pages.
Sachs, "Using Curves and Histograms," Digital Light and Color 1996; 19 pages.
Oral Deposition of Charles D. Creusere, Ph.D., filed in *Riverbed Technology, Inc. et al. v. Realtime Data LLC*, Case No. IPR2016-00980 (P.T.A.B.), filed Feb. 8, 2017; 110 pages.
Patent Owner's Response, filed in *Riverbed Technology, Inc. et al. v. Realtime Data LLC*, Case No. IPR2016-00978 (P.T.A.B.), filed Feb. 8, 2017; 58 pages.
Declaration of Kenneth A. Zeger, Ph.D., filed in *Riverbed Technology, Inc. et al. v. Realtime Data LLC*, Case No. IPR2016-00978 (P.T.A.B.), filed Feb. 8, 2017; 72 pages.
Excerpt from The American Heritage Dictionary of the English Language, Third Edition, Houghton Mifflin Company 1992; p. 1782.
Excerpt from Webster's New World College Dictionary, Fourth Edition, Macmillian USA 1999; p. 1421.
Excerpts from Microsoft Computer Dictionary, Fourth Edition, Microsoft Corporation 1999; pp. 126.
Corrected Patent Owner's Response, filed in *Dell, Inc. et al. v. Realtime Data LLC*, Case No. IPR2016-00972 (P.T.A.B.), filed Feb. 14, 2017; 60 pages.
Oral Deposition of Charles D. Creusere, Ph.D., filed in *Dell, Inc. et al. v. Realtime Data LLC*, Case No. IPR2016-00972 (P.T.A.B.), filed Feb. 8, 2017; 65 pages.
Excerpts from Newton's Telecom Dictionary, Eleventh Edition, Harry Newton 1996; pp. 423 and 682.
Declaration of Kenneth A. Zeger, Ph.D., filed in *Dell, Inc. et al. v. Realtime Data LLC*, Case No. IPR2016-00972 (P.T.A.B.), filed Feb. 8, 2017; 156 pages.
Corrected Patent Owner's Response, filed in *Dell, Inc. et al. v. Realtime Data LLC*, Case No. IPR2016-01002 (P.T.A.B.), filed Feb. 14, 2017; 55 pages.
Declaration of Kenneth A. Zeger, Ph.D., filed in *Dell, Inc. et al. v. Realtime Data LLC*, Case No. IPR2016-01002 (P.T.A.B.), filed Feb. 14, 2017; 135 pages.
Decision Institution of Inter Partes Review, filed in *Oracle America, Inc. v. Realtime Data LLC*, Case No. IPR2016-01671 (P.T.A.B.), filed Mar. 8, 2017; 11 pages.
Petition for Inter Partes Review of U.S. Pat. No. 7,415,530 under 35 U.S.C. §§ 311-319 and 37 C.F.R. § 42.100 et seq.,filed in *NetApp Inc. v. Realtime Data LLC*, Case No. IPR2017-01195 (P.T.A.B.), filed Mar. 30, 2017; 74 pages.
Declaration of Daniel Hirschberg, filed in *NetApp Inc. v. Realtime Data LLC*, Case No. IPR2017-01195 (P.T.A.B.), filed Mar. 30, 2017; 63 pages.
Lelewer et al., "Data Compression," ACM Computing Surveys, vol. 19, No. 3, Sep. 1987; 36 pages.
Petition for Inter Partes Review of U.S. Pat. No. 9,116,908 under 35 U.S.C. §§ 311-319 and 37 C.F.R. § 42.100 et seq.,filed in *NetApp Inc. v. Realtime Data LLC*, Case No. IPR2017-01196 (P.T.A.B.), filed Mar. 30, 2017; 75 pages.
Declaration of Daniel Hirschberg, filed in *NetApp Inc. v. Realtime Data LLC*, Case No. IPR2017-01196 (P.T.A.B.), filed Mar. 30, 2017; 60 pages.
HPE, HPES, and Teradata's Reply to Patent Owner's Response to the Petition, filed in *HPE et al. v. Realtime Data LLC*, Case No. IPR2016-00783 (P.T.A.B.), filed Apr. 5, 2017; 35 pages.
Supplemental Declaration of Charles D. Creusere in Support of HPE, HPES, and Teradata's Reply to Patent Owner's Response to the Petition, filed in *HPE et al. v. Realtime Data LLC*, Case No. IPR2016-00783 (P.T.A.B.), filed Apr. 5, 2017; 5 pages.
Transcript of Feb. 23, 2017 Deposition of Leonard Laub, filed in *HPE et al. v. Realtime Data LLC*, Case No. IPR2016-00783 (P.T.A.B.), filed Apr. 5, 2017; 151 pages.
Patent Owner Realtime Data, LLC d/b/a IXO's Response, filed in *Apple, Inc. v. Realtime Data, LLC d/b/a IXO*, Case No. IPR2016-01366, filed Apr. 6, 2017; 58 pages.
Expert Declaration of Dr. Godmar Back in Support of the Patent Owner's Response, filed in *Apple, Inc. v. Realtime Data, LLC d/b/a IXO*, Case No. IPR2016-01366, filed Apr. 6, 2017; 53 pages.
Excerpt from The American Heritage Dictionary, Second College Edition, Boston, MA, Houghton Mifflin Company: 1982; p. 499.

(56) References Cited

OTHER PUBLICATIONS

Excerpts from Dictionary of Computer and Internet Words: An A to Z Guide to Hardware, Software, and Cyberspace, Boston, MA, Houghton Mifflin Company: 2001; pp. 161, 259.
Excerpts from IEEE Standard Computer Dictionary: A Compilation of IEEE Standard Computer Glossaries, The Institute of Electrical and Electronics Engineers: 1990; pp. 87, 122, 192.
Excerpt from IEEE Standard Glossary of Computer Hardware Terminology, The Institute of Electrical and Electronics Engineers: 1994; p. 71.
Excerpt from IEEE Standard Glossary of Software Engineering Terminology, The Institute of Electrical and Electronics Engineers: 1990; pp. 33, 44, 71.
Excerpts from Microsoft Computer Dictionary, Fifth Edition, Redmond, WA, Microsoft Corporation: 2002; pp. 210, 315, 499.
Excerpts from Oxford Dictionary of Computing, Oxford University Press, Market House Books Ltd.: 2004; pp. 262-263.
Excerpt from McKusick et al., "The Design and Implementation of the 4.4BSD Operating System," Addison-Wesley Longman, Inc.: 1996; p. 535.
Petition for Inter Partes Review of U.S. Pat. No. 9,054,728, filed in *NetApp, Inc. et al. v. Realtime Data LLC*, Case No. IPR2017-01354 (P.T.A.B.), filed May 2, 2017; 69 pages.
Declaration of Daniel Hirschberg, filed in *NetApp, Inc. et al. v. Realtime Data LLC*, Case No. IPR2017-01354 (P.T.A.B.), filed May 2, 2017; 59 pages.
Reply to Office Action in Inter Partes Reexamination of U.S. Pat. No. 7,161,506, Control No. 95/000,479, filed Mar. 15, 2010, 23 pgs.
Unix Command Webpage, retrieved from http://web-beta.archive.org/web/web/20010810082609/; 14 pages.
Petitioners' Reply, filed in *Riverbed Technology, Inc. et al. v. Realtime Data LLC*, Case No. IPR2016-00980 (P.T.A.B.), filed May 10, 2017; 22 pages.
Deposition Transcript of Kenneth A. Zeger held Apr. 19, 2017, filed in *Riverbed Technology, Inc. et al. v. Realtime Data LLC*, Case No. IPR2016-00980 (P.T.A.B.), filed May 10, 2017; 102 pages.
Petitioners' Reply, filed in *Dell, Inc. et al. v. Realtime Data LLC*, Case No. IPR2016-01002 (P.T.A.B.), filed May 10, 2017; 31 pages.
Deposition Transcript of Kenneth A. Zeger held Apr. 10, 2017, filed in *Dell, Inc. et al. v. Realtime Data LLC*, Case No. IPR2016-01002 (P.T.A.B.), filed May 10, 2017; 216 pages.
Exhibit 1 to the Apr. 10, 2017 Deposition of Kenneth A. Zeger, filed in *Dell, Inc. et al. v. Realtime Data LLC*, Case No. IPR2016-01002 (P.T.A.B.), filed May 10, 2017; 1 page.
Exhibit 2 to the Apr. 10, 2017 Deposition of Kenneth A. Zeger, filed in *Dell, Inc. et al. v. Realtime Data LLC*, Case No. IPR2016-01002 (P.T.A.B.), filed May 10, 2017; 1 page.
Petitioners' Reply, filed in *Riverbed Technology, Inc. et al. v. Realtime Data LLC*, Case No. IPR2016-00978 (P.T.A.B.), filed May 10, 2017; 34 pages.
Excerpt from Newton's Telecom Dictionary, Eleventh Edition, Harry Newton 1996; p. 145.
Petitioners' Reply, filed in *Dell Inc. et al. v. Realtime Data LLC*, Case No. IPR2016-00972 (P.T.A.B.), filed May 10, 2017; 35 pages.
English Translation of JP 05088793 A.
U.S. Appl. No. 14/577,286, Fallon et al., "System and Methods for Video and Audio Data Distribution," filed Dec. 19, 2014. (Abandoned—Submit Copy).
Updated Court Docket History for 6:10-cv-00493-LED-JDL, *Realtime Data, LLC d/b/a IXO, v. T-Mobile, USA Inc.*
Updated Court Docket History for 1:11-cv-06696-RJH, *Realtime Data, LLC d/b/a IXO, v. Morgan Stanley et al.*
Updated Court Docket History for 1:11-cv-06697-UA, *Realtime Data, LLC d/b/a IXO, v. CME Group Inc. et al.*
Updated Court Docket History for 1:11-cv-06698-UA, *Realtime Data, LLC d/b/a IXO, v. Thomson Reuters et al.*
Update Court Docket History for *Realtime Data, LLC d/b/a IXO v. Actian Corporation, et al.*, Case No. 6:15-cv-00463 (E.D. Texas), downloaded Apr. 3, 2017, 50 pages.
Updated Court Docket History for *Realtime Data, LLC d/b/a IXO v. Hewlett Packard Enterprise Co., et al.*, No. 6:16-cv-00086 (E.D. Texas), downloaded Apr. 3, 2017, 11 pages.
Updated Court Docket History for *Realtime Data, LLC d/b/a IXO v. Oracle America, Inc.*, No. 6:16-cv-00088 (E.D. Texas), downloaded Apr. 3, 2017; 15 pages.
Updated Court Docket History for *Realtime Data, LLC d/b/a IXO v. CenturyLink, Inc., et al.*, No. 6:16-cv-00087 (E.D. Texas), downloaded Apr. 3, 2017; 11 pages.
Updated Court Docket History for *Realtime Data, LLC d/b/a IXO v. Dell, Inc., et al.*, No. 6:16-cv-00089 (E.D. Texas), downloaded Apr. 3, 2017; 12 pages.
Updated Court Docket History for *Realtime Data, LLC d/b/a IXO v. Teradata Operations, Inc.*, Case No. 2:16-cv-02743 (C.D. Cal), downloaded Apr. 3, 2017; 7 pages.
Updated Court Docket History for *Realtime Data, LLC d/b/a IXO v. Rackspace US, Inc., et al.*, No. 6:16-cv-00961 (E.D. Texas), downloaded Apr. 3, 2017; 13 pages.
Updated Court Docket History for *Realtime Data, LLC d/b/a IXO v. Fujitsu America, Inc., et al.*, No. 6:16-cv-01035 (E.D. Texas), downloaded Apr. 3, 2017; 6 pages.
Updated Court Docket History for *Realtime Data, LLC d/b/a IXO v. Vembu Technologies, Inc.*, No. 6:16-cv-01037 (E.D. Texas), downloaded Apr. 3, 2017; 4 pages.
Updated Court Docket History for *Realtime Data, LLC d/b/a IXO v. Apple, Inc.*, Case No. 6:15-cv-00885 (E.D. Texas), downloaded Sep. 22, 2016, 4 pages.
Court Docket History for *Realtime Data, LLC d/b/a IXO v. Microsoft Corporation, et al.*, Case No. 4:14-cv-00827 (E.D. Texas), downloaded Oct. 28, 2015, 5 pages.
Court Docket History for *Realtime Data, LLC d/b/a IXO v. Dropbox, Inc.*, Case No. 6:15-cv-00465 (E.D. Texas), downloaded Feb. 17, 2016, 6 pages.
Court Docket History for *Realtime Data, LLC d/b/a IXO v. Echostar Corporation, et al.*, Case No. 6:15-cv-00466 (E.D. Texas), downloaded Feb. 17, 2016, 3 pages.
Court Docket History for *Realtime Data, LLC d/b/a IXO v. Riverbed Technology, Inc., et al.*, Case No. 6:15-cv-00468 (E.D. Texas), downloaded Feb. 17, 2016, 3 pages.
Court Docket History for *Realtime Data, LLC d/b/a IXO v. BMC Software, Inc.*, Case No. 6:15-cv-00464 (E.D. Texas), downloaded Feb. 17, 2016, 3 pages.
Court Docket History for *Realtime Data, LLC d/b/a IXO v. Oracle America, Inc.*, et al., Case No. 6:15-cv-00467 (E.D. Texas), downloaded Feb. 17, 2016, 4 pages.
Court Docket History for *Realtime Data, LLC d/b/a IXO v. SAP America, Inc., et al.*, Case No. 6:15-cv-00469 (E.D. Texas), downloaded Feb. 17, 2016, 5 pages.
Court Docket History for *Realtime Data, LLC d/b/a IXO v. Teradata Corporation, et al.*, Case No. 6:15-cv-00470 (E.D. Texas), downloaded Feb. 17, 2016, 6 pages.
Motion to Dismiss Pursuant to Fed. R. Civ. P. 12(b)(6) for Lack of Patentable Subject Matter Under 35 U.S.C. § 101, filed in *Realtime Data, LLC d/b/a IXO v. Commvault Systems, Inc. et al.*, Case No. 6:17-cv-123 (E.D. Texas), filed Jun. 2, 2017; 27 pages.
Plaintiff Realtime Data LLC's Opposition to Commvault's Motion to Dismiss Pursuant to Fed. R. Civ. P. 12(b)(6) and Under 35 U.S.C. § 101, filed in *Realtime Data, LLC d/b/a IXO v. Commvault Systems, Inc. et al.*, Case No. 6:17-cv-123 (E.D. Texas); filed Jun. 19, 2017 27 pages.
Complaint for Patent Infringement Against Array Networks Inc., filed in *Realtime Data, LLC d/b/a IXO v. Array Networks Inc.*, Case No. 1:17-cv-00800 (D. Delaware), filed Jun. 21, 2017; 38 pages.
Complaint for Patent Infringement Against Barracuda Networks Inc., filed in *Realtime Data, LLC d/b/a IXO v. Barracuda Networks Inc.*, Case No. 1:17-cv-00893 (D. Delaware), filed Jul. 5, 2017; 115 pages.
Complaint for Patent Infringement against Commvault Systems, Inc. and Spectra Logic Corporation, filed in *Realtime Data, LLC d/b/a IXO v. CommVault Systems, Inc. et al.*, Case No. 1:17-cv-00925 (D. Delaware), filed Jul. 10, 2017; 79 pages.

(56) References Cited

OTHER PUBLICATIONS

Complaint for Patent Infringement Against Acronis, Inc., filed in *Realtime Data, LLC d/b/a IXO v. Acronis, Inc.*, Case No. 1:17-cv-11279 (D. Mass), filed Jul. 12, 2017; 24 pages.
Non-Final Office Action for U.S. Appl. No. 14/727,309, dated Jun. 8, 2017; 19 pages.
Final Office Action for U.S. Appl. No. 15/391,240, dated Jun. 16, 2017; 14 pages.
Notice of Allowance for U.S. Appl. No. 13/875,884, dated Jun. 21, 2017; 11 pages.
Non-Final Office Action for U.S. Appl. No. 15/584,865, dated Jun. 30, 2017; 6 pages.
Petition for Inter Partes Review, filed in *NetApp, Inc. et al. v. Realtime Data LLC*, Case No. IPR2017-01663 (P.T.A.B.), filed Jun. 22, 2017; 59 pages.
Declaration of Daniel Hirschberg, filed in *NetApp, Inc. et al. v. Realtime Data LLC*, Case No. IPR2017-01663 (P.T.A.B.), filed Jun. 22, 2017; 68 pages.
Non-Final Office Action directed to U.S. Appl. No. 11/400,533, dated Jul. 10, 2007; 7 pages.
Declaration of Scott Bennett, Ph.D., filed in *NetApp, Inc. et al. v. Realtime Data LLC*, Case No. IPR2017-01663 (P.T.A.B.), filed Jun. 22, 2017; 16 pages.
Petition for Inter Partes Review, filed in *NetApp, Inc. et al. v. Realtime Data LLC*, Case No. IPR2017-01660 (P.T.A.B.), filed Jun. 22, 2017; 58 pages.
Declaration of Daniel Hirschberg, filed in *NetApp, Inc. et al. v. Realtime Data LLC*, Case No. IPR2017-01660 (P.T.A.B.), filed Jun. 22, 2017; 67 pages.
Decision Institution of Inter Partes Review, filed in *Veritas Technologies LLC v. Realtime Data LLC*, Case No. IPR2017-00365 (P.T.A.B.), filed Jun. 2, 2017; 11 pages.
Declaration of Daniel Hirschberg, filed in *Rackspace US Inc. v. Realtime Data LLC*, Case No. IPR2017-01627 (P.T.A.B.), filed Jun. 16, 2017; 63 pages.
Petition for Inter Partes Review of U.S. Pat. No. 7,415,530 Under 35 U.S.C. §§ 311-319 and 37 C.F.R. § 42.100 et seq., filed in *Rackspace US, Inc. v. Realtime Data LLC*, Case No. IPR2017-01627 (P.T.A.B.), filed Jun. 16, 2017; 75 pages.
Declaration of Daniel Hirschberg, filed in *Rackspace US Inc. v. Realtime Data LLC*, Case No. IPR2017-01629 (P.T.A.B.), filed Jun. 16, 2017; 59 pages.
Petition for Inter Partes Review of U.S. Pat. No. 9,116,908 Under 35 U.S.C. §§ 311-319 and 37 C.F.R. § 42.100 et seq., filed in *Rackspace US, Inc. v. Realtime Data LLC*, Case No. IPR2017-01629 (P.T.A.B.), filed Jun. 16, 2017; 78 pages.
Petition for Inter Partes Review Under 35 U.S.C. § 311-319 and 37 C.F.R. § 42.100 et seq., filed in *NetApp, Inc. et al. v. Realtime Data LLC*, Case No. IPR2017-01664 (P.T.A.B.), filed Jun. 23, 2017; 74 pages.
Declaration of Daniel Hirschberg, filed in *NetApp, Inc. et al. v. Realtime Data LLC*, Case No. IPR2017-01664 (P.T.A.B.), filed Jun. 23, 2017; 70 pages.
Transcript of Deposition of Dr. Godmar Back, filed in *Apple Inc. v. Realtime Data LLC*, Case No. IPR2016-01366 (P.T.A.B.), filed Jun. 27, 2017 98 pages.
Petitioner's Reply to Patent Owner's Response, filed in *Apple Inc. v. Realtime Data LLC*, Case No. IPR2016-01366 (P.T.A.B.), filed Jun. 27, 2017 36 pages.
Excerpt from Microsoft Computer Dictionary, Fifth Edition, Redmond, WA, Microsoft Corporation: 2002; p. 192.
Excerpt from the Computer Desktop Encyclopedia, Second Edition, Point Pleasant, PA, The Computer Language Company Inc.: 1999; p. 300.
Petition for Inter Partes Review of U.S. Pat. No. 7,161,506, filed in *Veritas Technologies LLC v. Realtime Data, LLC d/b/a IXO*, Case No. IPR2017-01688 (P.T.A.B.), filed Jun. 28, 2017; 57 pages.
Declaration of Charles D. Creusere, Ph.D., filed in *Veritas Technologies LLC v. Realtime Data, LLC d/b/a IXO*, Case No. IPR2017-01688 (P.T.A.B.), filed Jun. 28, 2017; 113 pages.

Amendment Transmittal Form filed in U.S. Appl. No. 10/668,768, dated Aug. 20, 2004; 7 pages.
Petition for Inter Partes Review of U.S. Pat. No. 9,054,728, filed in *Veritas Technologies LLC v. Realtime Data, LLC d/b/a IXO*, Case No. IPR2017-01690 (P.T.A.B.), filed Jun. 28, 2017; 74 pages.
Declaration of Charles D. Creusere, Ph.D., filed in *Veritas Technologies LLC v. Realtime Data, LLC d/b/a IXO*, Case No. IPR2017-01690 (P.T.A.B.), filed Jun. 28, 2017; 139 pages.
Petition for Inter Partes Review of U.S. Pat. No. 7,358,867 Under 35 U.S.C. §§ 311-319 and 37 C.F.R. § 42.100 et seq., filed in *Rackspace US, Inc. v. Realtime Data LLC*, Case No. IPR2017-01691 (P.T.A.B.), filed Jun. 28, 2017; 64 pages.
Declaration of Dr. Robert Akl, D.S.C. Under 37 C.F.R. § 1.68 (Exhibit #1002), filed in *Rackspace US, Inc. v. Realtime Data LLC*, Case No. IPR2017-01691 (P.T.A.B.), filed Jun. 28, 2017; 116 pages.
Petition for Inter Partes Review of U.S. Pat. No. 8,717,204, filed in *Commvault Systems, Inc. v. Realtime Data LLC*, Case No. IPR2017-01710 (P.T.A.B.), filed Jun. 30, 2017; 81 pages.
Declaration of Professor James Storer, Ph.D., filed in *Commvault Systems, Inc. v. Realtime Data LLC*, Case No. IPR2017-01710 (P.T.A.B.), filed Jun. 30, 2017; 82 pages.
Postel, J., "User Data Protocol," RFC 768, Network Working Group Aug. 28, 1980; 3 pages.
Socolofsky, T., "A TCP/IP Tutorial," RFC 1180, Network Working Group Jan. 1991; 28 pages.
Excerpts from Internetworking With TCP/IP vol. III: Client-Server Programming and Applications, Douglas Comer et al., Prentice Hall, Upper Saddle River, NJ, 2001; pp. 9-21.
Excerpts from Introduction to Automata Theory, Languages, and Computation, John Hoperoft et al., Addison-Wesley, Reading, Massachussetts, 1979; pp. 13-54.
Deskside Power Challenge and Challenge L Owner's Guide, Silicon Graphics, Inc., 1994; 194 pages.
Graham, "Trading a Stock vs. Stock Options Part One," Investopedia.com, Jul. 30, 2003; 3 pages.
Bradner, S., "The Internet Standards Process—Revision 3," RFC 2026, Network Working Group Oct. 1996; 36 pages.
Internet Archive version of the web page http://www.acm.org:80/pubs/contents/proceedings/mod/342009/, dated Aug. 16, 2000; 30 pages.
Internet Archive version of the web page http://www.cs.purdue.edu:80/homes/comer/netbooks.html, dated Dec. 8, 2000; 7 pages.
MyPearsonStore Webpage for Internetworking with TCP/IP, vol. III: Client-Server Programming and Applications, Linux/Posix Sockets Version, available at http://www.mypearsonstore.com/bookstore/internetworking-with-tcp-ip-vol.-iii-client-server-9780130320711.
Declaration of Bridget A. Smith, filed in *Commvault Systems, Inc. v. Realtime Data LLC*, Case No. IPR2017-01710 (P.T.A.B.), filed Jun. 30, 2017; 5 pages.
Petition for Covered Business Method Review of U.S. Pat. No. 8,717,204, filed in *Commvault Systems, Inc. v. Realtime Data LLC*, Case No. CBM2017-00061 (P.T.A.B.), filed Jun. 30, 2017; 78 pages.
Declaration of Professor James Storer, Ph.D., filed in *Commvault Systems, Inc. v. Realtime Data LLC*, Case No. CBM2017-00061 (P.T.A.B.), filed Jun. 30, 2017; 36 pages.
Postal Addressing Standards—Contents, Publication 28, Nov. 1997; 128 pages.
Excerpts from the Progress of Invention in the Nineteenth Century, Edward W. Byrn, Munn & Co., Publishers 1900; pp. 15-31.
Excerpts from Comprehensive Dictionary of Electrical Engineering, CRC Press LLC 1999; pp. 249-250.
Inter Partes Reexamination Certificate in Inter Partes Reexamination of U.S. Pat. No. 7,777,651, issued Jul. 8, 2016; 2 pages.
Mayer, American Telegraphy and Encyclopedia of the Telegraph: Systems, Apparatus, Operation, Mayer Publishing Company, New York NY 1912; 101 pages.
Hacker, "MP3: The Definitive Guide," First Edition, O'Reilly Mar. 2000; 8 pages.
Schulzrinne et al., "RTP: A Transport Protocol for Real-Time Applications," RFC 1889, Network Working Group Jan. 1996; 75 pages.

(56) References Cited

OTHER PUBLICATIONS

Inter Partes Reexamination of U.S. Pat. No. 6,601,104 (Control No. 95/009,428), Ex Parte Reexamination Certificate issued Feb. 28, 2012.
*Dell Inc., et al.* v. *Realtlime Data, LLC,* IPR2016-01002, U.S. Pat. No. 9,116,908, Final Written Decision Oct. 31, 2017.
*Apple Inc.* v. *Realtime Data, LLC d/b/a IXO,* IPR2016-01365, U.S. Pat. No. 7,181,608, Oral Hearing Sep. 20, 2017.
*Apple Inc.* v. *Realtime Data, LLC d/b/a IXO,* IPR2016-01366, U.S. Pat. No. 8,090,936, Oral Hearing Sep. 20, 2017.
*Apple Inc.* v. *Realtime Data, LLC d/b/a IXO,* IPR2016-01737, U.S. Pat. No. 8,880,862, Petitioner's Reply Aug. 30, 2017.
*Apple Inc.* v. *Realtime Data, LLC d/b/a IXO,* IPR2016-01738, U.S. Pat. No. 8,880,862, Petitioner's Reply Aug. 31, 2017.
*Apple Inc.* v. *Realtime Data, LLC d/b/a IXO,* IPR2016-01739, U.S. Pat. No. 8,880,862, Petitioner's Reply Aug. 30, 2017.
*Dell Inc. et al.* v. *Realtime Data LLC,* IPR2017-00176, U.S. Pat. No. 7,161,506, Patent Owner's Response filed Sep. 22, 2017.
*Dell Inc. et al.* v. *Realtime Data LLC,* IPR2017-00176, U.S. Pat. No. 9,054,728, Patent Owner's Response filed Sep. 22, 2017.
*Veritas Technologies LLC* v. *Realtime Data LLC d/b/a IXO,* IPR2017-00364, U.S. Pat. No. 9,116,908, Terminated (Joined with IPR2016-01002).
*Teradata Operations, Inc.* v. *Realtime Data LLC d/b/a IXO,* IPR2017-00557, U.S. Pat. No. 7,358,867, Patent Owner's Response filed Sep. 26, 2017.
*NetApp Inc. et al.* v. *Realtime Data LLC,* IPR2017-01354, U.S. Pat. No. 9,054,728, Patent Owner's Preliminary Response Aug. 15, 2017.
*NetApp Inc. et al.* v. *Realtime Data LLC,* IPR2017-01663, U.S. Pat. No. 7,378,992, Patent Owner's Preliminary Response Oct. 30, 2017.
*NetApp Inc. et al.* v. *Realtime Data LLC,* IPR2017-01660, U.S. Pat. No. 7,161,506, Patent Owner's Preliminary Response Oct. 30, 2017.
*NetApp Inc. et al.* v. *Realtime Data LLC,* IPR2017-01664, U.S. Pat. No. 8,643,513, Patent Owner's Preliminary Response Oct. 31, 2017.
*Veritas Technologies LLC* v. *Realtime Data LLC d/b/a IXO,* IPR2017-01688, U.S. Pat. No. 7,161,506, Filed Jun. 28, 2017.
*Veritas Technologies LLC* v. *Realtime Data LLC d/b/a IXO,* IPR2017-01690, U.S. Pat. No. 9,054,728, Filed Jun. 28, 2017.
*CommVault Systems, Inc.* v. *Realtime Data LLC d/b/a IXO,* IPR2017-01710, U.S. Pat. No. 8,717,204, Patent Owner's Preliminary Response Oct. 27, 2017.
*CommVault Systems, Inc.* v. *Realtime Data LLC d/b/a IXO,* CBM2017-00061, U.S. Pat. No. 8,717,204, Patent Owner's Preliminary Response Oct. 27, 2017.
*CommVault Systems, Inc.* v. *Realtime Data LLC,* IPR2017-02006, U.S. Pat. No. 7,415,530, Filed Aug. 28, 2017.
*CommVault Systems, Inc.* v. *Realtime Data LLC,* IPR2017-02007, U.S. Pat. No. 9,116,908, Filed Aug. 28, 2017.
*Unified Patents Inc.* v. *Realtime Data LLC d/b/a IXO,* IPR2017-02129, U.S. Pat. No. 8,717,204, Filed Sep. 22, 2017.
*CommVault Systems, Inc.* v. *Realtime Data LLC d/b/a IXO,* IPR2017-02178, U.S. Pat. No. 9,054,728, Filed Sep. 26, 2017.
*Realtime Data LLC d/b/a IXO* v. *Actian Corporation, et al.,* No. 6:15-cv-00463 (E.D. Texas), Order to submit claim constructions Apr. 10, 2017.
*Realtime Data LLC d/b/a IXO* v. *Carbonite, Inc. et al.,* No. 6:17-cv-00121 (E.D. Texas), Answer and counterclaim May 9, 2017.
*Realtime Data LLC d/b/a IXO* v. *Exinda Inc.,* No. 6:17-cv-00124 (E.D. Texas), Amended answer to Complaint May 30, 2017.
*Realtime Data LLC d/b/a IXO* v. *Synacor Inc.,* No. 6:17-cv-00126 (E.D. Texas), Answer to Complaint May 5, 2017.
*Realtime Data LLC* v. *Riverbed Technology, Inc.,* No. 3:17-cv-03182 (N.D. Cal.), Case stayed Aug. 22, 2017.
*Realtime Data LLC d/b/a IXO* v. *Acronis, Inc.,* No. 1:17-cv-11279 (D. Mass.), Answer to Amended Complaint Oct. 6, 2017.
*Realtime Data LLC d/b/a IXO* v. *Dish Network Corporation et al.,* No. 6:17-cv-00421 (E.D. Texas), Answer to Amended Complaint Sep. 26, 2017.
*Realtime Data LLC d/b/a IXO* v. *Sling TV LLC et al.,* No. 1:17-cv-02097 (D. Colorado), Answer to Amended Complaint Oct. 24, 2017.
*Realtime Adaptive Streaming LLC* v. *Amazon.com et al.,* No. 6:17-cv-00549 (E.D. Texas), Filed Sep. 27, 2017.
*Realtime Adaptive Streaming LLC* v. *EchoStar Technologies, LLC et al.,* No. 6:17-cv-00567 (E.D. Texas), Filed Oct. 10, 2017.
*Realtime Adaptive Streaming LLC* v. *Hulu, LLC,* No. 2:17-cv-07611 (C.D. California), Filed Oct. 17, 2017.
*Realtime Data LLC d/b/a IXO* v. *Code42 Software, Inc.,* No. 1:17-cv-02479 (D. Colorado), Filed Oct. 17, 2017.
*Realtime Adaptive Streaming LLC* v. *Cisco Systems, Inc.,* No. 6:17-cv-00591 (E.D. Texas), Filed Oct. 18, 2017.
*Realtime Data LLC* v. *Nexenta Systems, Inc.,* No. 2:17-cv-07690 (C.D. California), Filed Oct. 20, 2017.
*Realtime Adaptive Streaming LLC* v. *Brightcove Inc. et al.,* No. 1:17-cv-01519 (D. Delaware), Filed Oct. 26, 2017.
*Realtime Adaptive Streaming LLC* v. *Haivision Network Video Inc. et al.,* No. 1:17-cv-01520 (D. Delaware), Filed Oct. 26, 2017.
*Realtime Data LLC d/b/a IXO* v. *Cohesity Inc.,* No. 1:17-cv-01543 (D. Delaware), Filed Oct. 31, 2017.
*Realtime Data LLC d/b/a IXO* v. *Pure Storage, Inc.,* No. 1:17-cv-01544 (D. Delaware), Filed Oct. 31, 2017.
*Realtime Data LLC* v. *Netgear Inc.,* No. 3:17-cv-06397 (N.D. California), Transferred in Nov. 6, 2017.
*Realtime Data LLC d/b/a IXO* v. *Fortinet, Inc.,* No. 1:99-cv-de276 (D. Delaware), Filed Nov. 10, 2017.
*Realtime Data LLC d/b/a IXO* v. *Barracuda Networks, Inc.,* No. 3:17-cv-06701 (N.D. California), Transferred in from E.D. Texas—Nov. 27, 2017.
*CommVault Systems, Inc.* v. *Realtime Data LLC d/b/a IXO,* IPR2017-01710, U.S. Pat. No. 8,717,204, Trial Instituted Jan. 18, 2018.
*CommVault Systems, Inc.* v. *Realtime Data LLC d/b/a IXO,* CBM2017-0061, U.S. Pat. No. 8,717,204, Institution Denied Jan. 18, 2018.
*CommVault Systems, Inc.* v. *Realtime Data LLC,* IPR2017-2017-02006, U.S. Pat. No. 7,415,530, Institution Denied Mar. 19, 2018.
*CommVault Systems, Inc.* v. *Realtime Data LLC,* IPR2017-02129, U.S. Pat. No. 9,116,908, Institution Denied Mar. 15, 2018.
*Pure Storage, Inc.* v. *Realtime Data, LLC,* IPR2018-00549, U.S. Pat. No. 9,667,751, Filed Jan. 30, 2018.
*EchoStar Corporation et al.* v. *Realtime Data LLC,* IPR2018-00612, U.S. Pat. No. 8,717,204, Filed Feb. 13, 2018.
*Realtime Data LLC d/b/a IXO* v. *Thomson Reuters Corporation et al.* No. 1:11-cv-06698-RJH (S.D. New York) (transferred from E.D. Texas; 6:09-cv-00333-LED), Case Terminated Nov. 9, 2012; Opinion of the Court of Appeals for the Federal Circuit.
*Realtime Data LLC d/b/a IXO* v. *Morgan Stanley et al.,* No. 1:11-cv-06696-RJH (S.D. New York) (transferred from E.D. Texas; 6:09-cv-00326-LED), Case Terminated Nov. 9, 2012; Opinion of the Court of Appeals for the Federal Circuit.
*Realtime Data LLC d/b/a IXO* v. *CME Group Inc., et al.,* No. 1:11-cv-06697-RJH (S.D. New York) (transferred from E.D. Texas; No. 6:09-cv-00327-LED), Case Terminated Nov. 9, 2012; Opinion of the Court of Appeals for the Federal Circuit.
*Chicago Board Options Exchange, Inc.,* v. *Realtime Data LLC d/b/a IXO,* No. 09-cv-4486 (N.D. Ill.), Dismissed.
*Realtime Data LLC d/b/a IXO* v. *Exinda Inc.,* No. 6:17-cv-00124 (E.D. Texas), Joint Claim Construction Jan. 16, 2018.
*Realtime Data LLC d/b/a IXO* v. *Synacor Inc.,* No. 6:17-cv-00126 (E.D. Texas), Updated Joint Claim Construction Apr. 3, 2018.
*Realtime Adaptive Streaming LLC* v. *Haivision Network Video Inc. et al.,* No. 1:17-cv-01520 (D. Delaware), Second Amended.
*Realtime Data LLC* v. *Netgear Inc.,* No. 3:17-cv-06397 (N. D. California), Case stayed Jan. 28, 2018.
*Realtime Adaptive Streaming LLC* v. *Adobe Systems Incorporated,* 1:18-cv-10355 (D. Mass), Filed Feb. 23, 2018.
Defendants Dish Technologies L.L.C. and Dish Network L.L.C.'s Answer, Affirmative Defenses, Counterclaims, and Jury Demand to Plaintiff Realtime Adaptive Streaming L.L.C.'s Second Amended

(56) References Cited

OTHER PUBLICATIONS

Complaint, filed in *Realtime Adaptive Streaming, LLC* v. *Sling TV L.L.C. et al.*, Case No. 1:17-cv-02097 (D. Colorado), filed Mar. 21, 2018; 26 pages.
Amended Complaint for Patent Infringement, filed in *Realtime Adaptive Streaming LLC* v. *Apple Inc.*, Case No. 1:17-cv-02869 (D. Colorado), Case No. 1:17-cv-02869 (D. Colorado), filed Mar. 26, 2018; 69 pages.
Defendant's Responsive Claim Construction Brief and Exhibits F-G, filed in *Realtime Data LLC* v. *Echostar Corp. et al.*, Case No. 6:17-cv-00084 (E.D. Texas), filed Mar. 15, 2018; 39 pages.
Expert Declaration of H. V. Jagadish, Ph.D. in Support of Defendant's Responsive Claim Construction Brief, filed in *Realtime Data LLC* v. *Echostar Corp. et al.*, Case No. 6:17-cv-00084 (E.D. Texas), filed Mar. 15, 2018; 49 pages.
Realtime's Reply Claim Construction Brief, filed in *Realtime Data LLC* v. *Echostar Corp. et al.*, Case No. 6:17-cv-00084 (E.D. Texas), filed Mar. 23, 2018; 14 pages.
Joint Claim Construction Chart and Exhibits A-B, filed in *Realtime Data LLC* v. *Echostar Corp. et al.*, Case No. 6:17-cv-00084 (E.D. Texas), filed Mar. 29, 2018; 12 pages.
Updated Joint Claim Construction Chart and Exhibits A-B, filed in *Realtime Data LLC* v. *Echostar Corp. et al.*, Case No. 6:17-cv-00084 (E.D. Texas), filed Apr. 3, 2018; 11 pages.
Defendant Synacor, Inc.'s Responsive Claim Construction Brief, filed in *Realtime Data LLC d/b/a IXO* v. *Synacor, Inc.*, Case No. 6:17-cv-00126 (E.D. Texas), filed Mar. 15, 2018; 13 pages.
Realtime's Reply Claim Construction Brief, filed in *Realtime Data LLC d/b/a IXO* v. *Synacor, Inc.*, Case No. 6:17-cv-00126 (E.D. Texas), filed Mar. 23, 2018; 5 pages.
Apple Inc.'s Answer, Defenses, and Counterclaims to Realtime's Amended Complaint, filed in *Realtime Adaptive Streaming LLC* v. *Sling TV, L.L.C. et al.*, Case No. 1:17-cv-02097 (D. Colorado), filed Apr. 10, 2018; 36 pages.
Final Written Decision, filed in *Apple, Inc.* v. *Realtime Data LLC*, Case No. IPR2016-01737 (P.T.A.B.), filed Mar. 13, 2018; 63 pages.
Final Written Decision, filed in *Apple, Inc.* v. *Realtime Data LLC*, Case No. IPR2016-01739 (P.T.A.B.), filed Mar. 13, 2018; 48 pages.
Final Written Decision, filed in *Apple, Inc.* v. *Realtime Data LLC*, Case No. IPR2016-01738 (P.T.A.B.), filed Mar. 16, 2018; 75 pages.
Decision Denying Institution of Inter Partes Review, filed in *Commvault Systems, Inc.* v. *Realtime Data LLC*, Case No. IPR2017-02006 (P.T.A.B.), filed Mar. 19, 2018; 19 pages.
Decision Denying Institution of Inter Partes Review, filed in *Unified Patents, Inc.* v. *Realtime Data LLC*, Case No. IPR2017-02129 (P.T.A.B.), filed Mar. 27, 2018; 20 pages.
Decision Denying Institution of Inter Partes Review, filed in *Commvault Systems, Inc.* v. *Realtime Data LLC*, Case No. IPR2017-02128 (P.T.A.B.), filed Apr. 10, 2018; 16 pages.
Petition for Inter Partes Review, filed in *Unified Patents Inc.* v. *Realtime Adaptive Streaming, LLC*, Case No. IPR2018-00883 (P.T.A.B.), filed Apr. 6, 2018; 75 pages.
Declaration of Dr. Iain Richardson in Support Petition for Inter Partes Review, filed in *Unified Patents Inc.* v. *Realtime Adaptive Streaming, LLC*, Case No. IPR2018-00883 (P.T.A.B.), filed Apr. 6, 2018; 79 pages.
Itu-T: Transmission of Non-Telephone Signals, "Information Technology—Generic Coding of Moving Pictures and Associated Audio Information: Video," Document H.262, Jul. 10, 1995; 211 pages.
International Organization for Standardisation, "MPEG Press Release," London, Nov. 6, 1992; 5 pages.
Itu-T: Line Transmission of Non-Telephone Signals, Video Codec for Audiovisual Services At px64 kbits, Document H.261, Mar. 1-12, 1993; 29 pp.
Complaint for Patent Infringement, filed in *Realtime Adaptive Streaming LLC* v. *Wowza Media Systems, LLC*, Case No. 1:18-cv-00927 (D. Colorado), filed Apr. 20, 2018; 66 pages.
Inter Partes Reexamination of U.S. Pat. No. 7,321,937 (Control No. 95/000,453), Terminated.

*SAP America Inc.*, v. *Realtime Data, LLC d/b/a IXO*, IPR2016-00783, U.S. Pat. No. 6,597,812, Appeal filed Nov. 3, 2017.
*Dell Inc., et al.* v. *Realtime Data, LLC*, IPR2016-00972, U.S. Pat. No. 7,415,530, Oral Hearing Jul. 25, 2017.
*Apple Inc.* v. *Realtime Data, LLC d/b/a IXO*, IPR2016-01737, U.S. Pat. No. 8,880,862, Oral Hearing Jan. 8, 2018.
*Apple Inc.* v. *Realtime Data, LLC d/b/a IXO*, IPR2016-01738, U.S. Pat. No. 8,880,862, Oral Hearing Jan. 8, 2018.
*Apple Inc.* v. *Realtime Data, LLC d/b/a IXO*, IPR2016-01739, U.S. Pat. No. 8,880,862, Oral Hearing Jan. 8, 2018.
*Oracle America Inc.* v. *Realtime Data, LLC d/b/a IXO*, IPR2017-00108, U.S. Pat. No. 9,054,728, Terminated Apr. 11, 2017.
*Dell Inc. et al.* v. *Realtime Data LLC*, IPR2017-00176, U.S. Pat. No. 7,161,506, Oral hearing Feb. 20, 2018.
*Dell Inc. et al.* v. *Realtime Data LLC*, IPR2017-00179, U.S. Pat. No. 9,054,728, Oral hearing Feb. 20, 2018.
*Teradata Operations, Inc.* v. *Realtime Data LLC d/b/a IXO*, IPR2017-00557, U.S. Pat. No. 7,358,867, Oral Hearing Feb. 20, 2018.
*CommVault Systems, Inc.* v. *Realtime Data LLC d/b/a IXO*, IPR2017-00061, U.S. Pat. No. 8,717,204, Institution Denied Jan. 18, 2018.
*CommVault Systems, Inc.* v. *Realtime Data LLC*, IPR2017-02006, U.S. Pat. No. 7,415,530, Patent Owner's Preliminary Response Dec. 22, 2017.
*Unified Patents Inc.* v. *Realtime Data LLC d/b/a IXO*, IPR2017-02129, U.S. Pat. No. 8,717,204, Patent Owner's Sur-Reply Feb. 14, 2018.
*CommVault Systems, Inc.* v. *Realtime Data LLC d/b/a IXO*, IPR2017-02178, U.S. Pat. No. 9,054,728, Patent Owner's Preliminary Response Jan. 12, 2018.
*Acronis, Inc.* v. *Realtime Data LLC*, IPR2018-00703, U.S. Pat. No. 9,054,72, Filed Feb. 26, 2018.
*Realtime Data LLC d/b/a IXO* v. *Echostar Corporation et al.*, No. 6:17-cv-00084 (E.D. Texas), Claim Construction Brief Feb. 21, 2018.
*Realtime Data LLC d/b/a IXO* v. *Synacor Inc.*, No. 6:17- cv-00126 (E.D. Texas), Claim Construction Brief Feb. 21, 2018.
*Realtime Data LLC d/b/a IXO* v. *Sling TV LLC et al.*, No. 1:17-cv-02097 (D. Colorado), Answer to Amended Complaint Dec. 4, 2017.
*Realtime Data LLC* v. *Netgear Inc.*, No. 3:17-cv-06397 (N.D. California), Scheduling Conference Jan. 3, 2018.
*Realtime Adaptive Streaming LLC* v. *Apple Inc.*, No. 1:17-cv-02869 (D. Colorado), Filed Nov. 30, 2017.
*Realtime Data LLC* v. *Nexenta Systems, Inc.*, No. 5:18-cv- 00574 (N.D. California), Transferred in Jan. 26, 2018.
Answer of the Amazon Defendants to First Amended Complaint of Realtime Adaptive Streaming LLC, filed in *Realtime Adaptive Streaming LLC* v. *Amazon. com, Inc. et al.*, Case No. 6:17-cv-00549 (E.D. Texas), filed Dec. 15, 2017; 20 pages.
Final Judgement, filed in *Realtime Data LLC d/b/a IXO* v. *Rackspace US, Inc. et al.*, Case No. 6:16-cv-00961 (E.D. Texas), filed Feb. 1, 2018; 1 page.
Realtime's Opening Claim Construction Brief, filed in *Realtime Data LLC* v. *Echostar Corporation et al.*, Case No. 6:17-cv-00084 (E.D. Texas), filed Feb. 21, 2018; 20 pages.
Expert Declaration of Dr. Kenneth Zeger in Support of Realtime's Claim Construction Brief, filed in *Realtime Data LLC* v. *Echostar Corporation et al.*, Case No. 6:17-cv-00084 (E.D. Texas), filed Feb. 21, 2018; 18 pages.
Complaint for Patent Infringement, filed in *Realtime Adaptive Streaming LLC* v. *Adobe Systems Inc.*, Case No. 1:18-cv-10355 (D. Mass), filed Feb. 23, 2018; 103 pages.
Defendant Polycom's Answer to Realtime Adaptive Streaming LLC's Original Complaint, filed in *Realtime Adaptive Streaming LLC* v. *Polycom, Inc.*, Case No. 1:17-cv-02692 (D. Colorado), filed Mar. 2, 2018; 26 pages.
Complaint for Patent Infringement, filed in *Realtime Adaptive Streaming LLC* v. *Samsung Electronics Co., Ltd. et al.*, Case No. 6:18-cv-00113 (E.D. Texas), filed Mar. 9, 2018; 136 pages.
Final Office Action for U.S. Appl. No. 14/727,309, dated Feb. 14, 2018; 22 pages.
Non-Final Office Action for U.S. Appl. No. 14/305,692, dated Mar. 8, 2018; 18 pages.

(56) References Cited

OTHER PUBLICATIONS

Petition for Inter Partes Review of U.S. Pat. No. 8,717,204, filed in *Echostar Corporation et al. v. Realtime Data LLC*, Case No. IPR2018-00612 (P.T.A.B.), filed Feb. 13, 2018; 74 pages.
Declaration of Professor James A. Storer, Ph.D., filed in *Echostar Corporation et al. v. Realtime Data LLC*, Case No. IPR2018-00612 (P.T.A.B.), filed Feb. 13, 2018; 105 pages.
State Machine Design, AMD publication No. 90005, Rev. A, Jun. 1993; 13 pages.
Clarke et al., "A Language for Compositional Specification and Verification of Finite State Hardware Controllers," Proceedings of the IEEE, vol. 79, No. 9, Sep. 1991; pp. 1283-1292.
Coraor et al., "A General Model for Memory-Based Finite-State Machines," IEEE Transactions on Computers, vol. C-36, No. 2, Feb. 1987; pp. 175-184.
Avnur, "Finite State Machines for Real-Time Software Engineering," Computing & Control Engineering Journal, Nov. 1990; pp. 273-278.
Lin et al., "Finite State Machine has Unlimited Concurrency," IEEE Transactions on Circuits and Systems, vol. 38, No. 5, May 1991; pp. 465-475.
Petition for Inter Partes Review of U.S. Pat. No. 8,502,707, filed in *Echostar Corporation et al. v. Realtime Data LLC*, Case No. IPR2018-00613 (P.T.A.B.), filed Feb. 13, 2018; 82 pages.
Declaration of Professor James A. Storer, Ph.D, filed in *Echostar Corporation et al. v. Realtime Data LLC*, Case No. IPR2018-00613 (P.T.A.B.), filed Feb. 13, 2018; 134 pages.
Petition for Inter Partes Review of U.S. Pat. No. 9,054,728, filed in *Echostar Corporation et al. v. Realtime Data LLC*, Case No. IPR2018-00614 (P.T.A.B.), filed Feb. 13, 2018; 78 pages.
Declaration of Professor James A. Storer, Ph.D., filed in *Echostar Corporation et al. v Realtime Data LLC*, Case No. IPR2018-00614 (P.T.A.B.), filed Feb. 13, 2018; 122 pages.
Excerpt from UNIX User's Manual, Release 3.0, Bell Laboratories, Jun. 1980; 5 pages.
Excerpt from UNIX Programmer's Manual, 4.2 Berkeley Software Distribution, Bell Telephone Laboratories Inc., Aug. 1983; 7 pages.
Petition for Inter Partes Review of U.S. Pat. No. 8,717,204, filed in *Riverbed Technology, Inc. v. Realtime Data LLC*, Case No. IPR2018-00656 (P.T.A.B.), filed Feb. 15, 2018; 82 pages.
Declaration of Professor James Storer, Ph.D., filed in *Riverbed Technology, Inc. v. Realtime Data LLC*, Case No. IPR2018-00656 (P.T.A.B.), filed Feb. 15, 2018; 82 pages.
Petition for Inter Partes Review of U.S. Pat. No. 9,054,728, filed in *Acronis, Inc. v. Realtime Data LLC*, Case No. IPR2018-00703 (P.T.A.B.), filed Feb. 26, 2018; 91 pages.
Declaration of Professor Charles G. Boncelet Jr., filed in *Acronis, Inc. v. Realtime Data LLC*, Case No. IPR2018-00703 (P.T.A.B.), filed Feb. 26, 2018; 91 pages.
Petition for Inter Partes Review of U.S. Pat. No. 8,717,204, filed in *Acronis, Inc. v. Realtime Data LLC*, Case No. IPR2018-00706 (P.T.A.B.), filed Feb. 26, 2018; 60 pages.
Declaration of Professor Charles G. Boncelet Jr., filed in *Acronis, Inc. v. Realtime Data LLC*, Case No. IPR2018-00706 (P.T.A.B.), filed Feb. 26, 2018; 64 pages.
Decision Denying Institution of Inter Partes Review, filed in *Commvault Systems, Inc. v. Realtime Data LLC*, Case No. IPR2017-02007 (P.T.A.B.), filed Mar. 15, 2018; 18 pages.
Excerpt from Microsoft Computer Dictionary, Fifth Edition, Redmond, WA, Microsoft Corporation: 2002; p. 297.
Inter Partes Reexamination of U.S. Pat. No. 7,378,992 (Control No. 95/000,464), Inter Partes Reexamination Certificate issued Oct. 4, 2012.
*Apple Inc. v. Realtime Data, LLC d/b/a IXO*, IPR2016-01365, U.S. Pat. No. 7,181,608, Final Written Decision Jan. 17, 2018.
*Apple Inc. v. Realtime Data, LLC d/b/a IXO*, IPR2016-01366, U.S. Pat. No. 8,090,936, Final Written Decision Jan. 11, 2018.
*Dell Inc. et al. v. Realtime Data LLC*, U.S. Pat. No. 7,161,506, Hearing scheduled Feb. 20, 2018.
*Dell Inc. et al. v. Realtime Data LLC*, U.S. Pat. No. 9,054,728, Hearing scheduled Feb. 20, 2018.
*NetApp Inc. v. Realtime Data LLC*, IPR2017-01354, U.S. Pat. No. 9,054,728, Institution Denied Nov. 14, 2017.
*NetApp Inc. v. Realtime Data LLC*, IPR2017-01663, U.S. Pat. No. 7,378,992, Terminated Jan. 5, 2018.
*NetApp Inc. v. Realtime Data LLC*, IPR2017-01660, U.S. Pat. No. 7,161,506, Institution Denied Jan. 25, 2018.
*NetApp Inc. v. Realtime Data LLC*, IPR2017-01664, U.S. Pat. No. 8,643,513, Terminated Jan. 5, 2018.
*Veritas Technologies LLC v. Realtime Data LLC d/b/a IXO*, IPR2017-01688, U.S. Pat. No. 7,161,506, Joined with IPR2017-00176; hearing scheduled Jan. 20, 2018.
*Veritas Technologies LLC v. Realtime Data LLC d/b/a IXO*, IPR2017-01690, U.S. Pat. No. 9,054,728, Joined with IPR2017-00179; hearing scheduled Jan. 20, 2018.
*CommVault Systems, Inc. v. Realtime Data LLC*, IPR2017-02007, U.S. Pat. No. 9,116,908, Patent Owner's Preliminary Response Dec. 22, 2017.
*Unified Patents Inc. v. Realtime Data LLC d/b/a IXO*, IPR2017-02129, U.S. Pat. No. 8,717,204, Patent Owner's Preliminary Response Jan. 5, 2018.
*Realtime Data LLC d/b/a IXO v. Rackspace US, Inc., et al.*, No. 6:16-cv-00961 (E.D. Texas), Motion for partial dismissal Aug. 1, 2017.
*Realtime Data LLC d/b/a IXO v. Echostar Corporation et al.*, No. 6:17-cv-00084 (E.D. Texas), Answer to Amended Complaint Sep. 5, 2017.
*Realtime Data LLC d/b/a IXO v. Synacor Inc.*, No. 6:17- cv-00126 (E.D. Texas), Joint Claim Construction Jan. 16, 2018.
*Realtime Adaptive Streaming LLC v. Amazon.com et al.*, No. 6:17-cv-00549 (E.D. Texas), Answer to Amended Complaint Dec. 1, 2017.
*Realtime Adaptive Streaming LLC v. Haivision Network Video Inc. et al.*, No. 1:17-cv-01520 (D. Delaware), Amended Complaint Dec. 1, 2017.
*Realtime Data LLC v. Netgear Inc.*, No. 3:17-cv-06397 (N.D. California), Scheduling Conference Scheduled Jan. 3, 2018.
*Realtime Adaptive Streaming LLC et al. v. Polycom, Inc.*, No. 1:17-cv-02692 (D. Colorado), Filed Nov. 10, 2017.
Complaint for Patent Infringement, filed in *Realtime Data LLC d/b/a IXO v. Sling TV L.L.C. et al.*, Case No. 1:17-cv-02097 (D. Colorado), filed Aug. 31, 2017; 34 pages.
Defendents Echostar Corp.'s and Hughes Network Systems, LLC's Answer, Affirmative Defenses, and Counterclaims, filed in *Realtime Data LLC d/b/a IXO v. Echostar Corporation et al.*, Case No. 6:17-cv-84 (E.D. Texas), filed Sep. 5, 2017; 38 pages.
Amended Complaint for Patent Infringement, filed in *Realtime Data LLC d/b/a IXO v. Echostar Technologies LLC et al.*, Case No. 6:17-cv-00421 (E.D. Texas), filed Sep. 12, 2017; 40 pages.
Notice of Dismissal Without Prejudice, filed in *Realtime Data LLC v. Barracuda Networks, Inc.*, Case No. 1:17-cv-00893 (D. Delaware), filed Sep. 14, 2017; 1 page.
Defendants Echostar Technologies LLC's and Dish Network LLC's Answer, Affirmative Defenses, and Counterclaims to Plaintiff Realtime Data LLC's Amended Complaint, filed in *Realtime Data LLC d/b/a IXO v. Echostar Technologies LLC et al.*, Case No. 6:17-cv-00421 (E.D. Texas), filed Sep. 26, 2017; 28 pages.
Complaint for Patent Infringement, filed in *Realtime Adaptive Streaming LLC v. Amazon.com, Inc. et al.*, Case No. 6:17-cv-00549 (E.D. Texas), filed Sep. 27, 2017; 31 pages.
Defendant Acronis, Inc.'s Answer, Separate Defenses, and Counterclaims to Plaintiff's Amended Complaint, filed in *Realtime Data LLC d/b/a IXO v. Acronis, Inc.*, Case No. 1:17-cv-11279 (D. Massachusetts), filed Oct. 6, 2017; 20 pages.
Amended Complaint for Patent Infringement, filed in *Realtime Adaptive Streaming LLC v. Sling TV LLC et al.*, Case No. 1:17-cv-02097 (D. Colorado), filed Oct. 10, 2017; 25 pages.
Complaint for Patent Infringement, filed in *Realtime Adaptive Streaming LLC v. Echostar Technologies LLC et al.*, Case No. 6:17-cv-00567 (E.D. Texas), filed Oct. 10, 2017; 29 pages.

(56) References Cited

OTHER PUBLICATIONS

Complaint for Patent Infringement, filed in *Realtime Data LLC d/b/a IXO v. Code42 Software, Inc.*, Case No. 1:17-cv-02479 (D. Colorado), filed Oct. 17, 2017; 23 pages.
Complaint for Patent Infringement, filed in *Realtime Adaptive Streaming LLC v. Hulu, LLC*, Case No. 2:17-cv-07611 (C.D. California), filed Oct. 17, 2017; 43 pages.
Final Judgement, filed in *Realtime Data LLC v. Riverbed Technology, Inc.*, Case No. 6:17-cv-00198 (E.D. Texas), filed Oct. 17, 2017; 1 page.
Complaint for Patent Infringement Against Cisco, filed in *Realtime Adaptive Streaming LLC v. Cisco Systems, Inc.*, Case No. 6:17-cv-00591 (E.D. Texas), filed Oct. 18, 2017; 53 pages.
Complaint for Patent Infringement Against Nexenta, filed in *Realtime Data LLC d/b/a DCO v. Nexenta Systems, Inc.*, Case No. 2:17-cv-07690 (C.D. California), filed Oct. 20, 2017; 27 pages.
Defendants Sling TV LLC and Sling Media LLC's Answer, Affirmative Defenses, Counterclaims, and Jury Demand to Plaintiff Realtime Adaptive Streaming LLC's Amended Complaint, filed in *Realtime Adaptive Streaming LLC v. Sling TV LLC et al.*, Case No. 1:17-cv-02097 (D. Colorado), filed Oct. 24, 2017; 19 pages.
Complaint for Patent Infringement, filed in *Realtime Adaptive Streaming LLC v Brightcove Inc. et al.*, Case No. 1:17-cv-01519 (D. Delaware), filed Oct. 26, 2017; 54 pages.
Complaint for Patent Infringement, filed in *Realtime Adaptive Streaming LLC v. Haivision Network Video Inc. et al.*, Case No. 1:17-cv-01520 (D. Delaware), filed Oct. 26, 2017; 101 pages.
Complaint for Patent Infringement Against Cohesity, filed in *Realtime Data LLC d/b/a ECO v. Cohesity Inc.*, Case No. 1:17-cv-01543 (D. Delaware), filed Oct. 31, 2017; 25 pages.
Complaint for Patent Infringement Against Pure Storage, Inc., filed in *Realtime Data LLC d/b/a IXO v. Pure Storage, Inc.*, Case No. 1:17-cv-01544 (D. Delaware), filed Oct. 31, 2017; 30 pages.
Complaint for Patent Infringement, filed in *Realtime Adaptive Streaming LLC v. Polycom, Inc.*, Case No. 1:17-cv-02692 (D. Colorado), filed Nov. 10, 2017; 87 pages.
Complaint for Patent Infringement, filed in *Realtime Data LLC d/b/a IXO v. Fortinet, Inc.*, Case No. 1:99-cv-de276 (D. Delaware), filed Nov. 10, 2017; 34 pages.
Complaint for Patent Infringement Against Reduxio Systems, filed in *Realtime Data LLC d/b/a IXO v. Reduxio Systems, Inc.*, Case No. 1:17-cv-01676 (D. Delaware), filed Nov. 20, 2017; 27 pages.
Complaint for Patent Infringement, filed in *Realtime Adaptive Streaming LLC v. Netflix, Inc. et al.*, Case No. 1:17-cv-01692 (D. Delaware), filed Nov. 21, 2017; 71 pages.
Complaint for Patent Infringement, filed in *Realtime Adaptive Streaming LLC v. Sony Electronics Inc. et al.*, Case No. 1:17-cv-01693 (D. Delaware), filed Nov. 21, 2017; 133 pages.
Complaint for Patent Infringement, filed in *Realtime Adaptive Streaming LLC v. Apple Inc.*, Case No. 1:17-cv-02869 (D. Colorado), filed Nov. 30, 2017; 63 pages.
Complaint for Patent Infringement against Egnyte, Inc., filed in *Realtime Data LLC d/b/a IXO v. Egnyte, Inc.*, Case No. 1:17-cv-01750 (D. Delaware), filed Dec. 5, 2017; 31 pages.
Complaint for Patent Infringement against IXSystems, Inc., filed in *Realtime Data LLC d/b/a IXO v. IXSystems Inc.*, Case No. 1:17-cv-01769 (D. Delaware), filed Dec. 5, 2017; 26 pages.
Final Office Action for U.S. Appl. No. 14/305,692, dated Aug. 10, 2017; 16 pages.
Notice of Allowance for U.S. Appl. No. 15/584,865, dated Aug. 16, 2017; 5 pages.
Supplemental Notice of Allowability for U.S. Appl. No. 15/584,865, dated Sep. 5, 2017; 2 pages.
Non-Final Office Action for U.S. Appl. No. 14/844,973, dated Sep. 13, 2017; 6 pages.
Final Office Action for U.S. Appl. No. 14/936,312, dated Nov. 3, 2017; 13 pages.
Petition for Inter Partes Review of U.S. Pat. No. 7,415,530, filed in *Commvault Systems, Inc. v. Realtime Data LLC*, Case No. IPR2017-02006 (P.T.A.B.), filed Aug. 28, 2017; 78 pages.
Wood et al., "DASD Trends: Cost, Performance, and Form Factor," Proceedings of the IEEE, Apr. 1993; pp. 573-585.
SPARCstation 20 Service Manual, Sun Microsystems, Jul. 1996; 266 pages.
Declaration of Professor James Storer, Ph.D., filed in *Commvault Systems, Inc. v. Realtime Data LLC*, Case No. IPR2017-02006 (P.T.A.B.), filed Aug. 28, 2017; 100 pages.
Thompson, "V.42bis and Other Ziv-Lempel Variants," University of Minnesota Duluth Computer Science, Apr. 1991, Technical Report 91-02; 15 pages.
Excerpts from Haskell et al., Digital Video: An Introduction to MPEG-2, Kluwer Academic Publishers, 1996; 107 pages.
Petition for Inter Partes Review of U.S. Pat. No. 9,116,908, filed in *Commvault Systems, Inc. v. Realtime Data LLC*, Case No. IPR2017-02007 (P.T.A.B.), filed Aug. 28, 2017; 71 pages.
Declaration of Professor James Storer, Ph.D., filed in *Commvault Systems, Inc. v. Realtime Data LLC*, Case No. IPR2017-02007 (P.T.A.B.), filed Aug. 28, 2017; 94 pages.
Petitioner's Reply to Patent Owner's Response, filed in *Apple Inc. v. Realtime Data LLC*, Case No. IPR2016-01737 (P.T.A.B.), filed Aug. 30, 2017; 34 pages.
Declaration of Dr. Charles J. Neuhauser, filed in *Apple Inc. v. Realtime Data LLC*, Case No. IPR2016-01737 (P.T.A.B.), filed Aug. 30, 2017; 184 pages.
Excerpt from the Dictionary of Computing & Digital Media Terms & Acryonyms, 1999; p. 86.
Excerpt from Prentice Hall's Illustrated Dictionary of Computer, Third Edition, 1998; p. 183.
Petitioner's Reply to Patent Owner's Response, filed in *Apple Inc. v. Realtime Data LLC*, Case No. IPR2016-01738 (P.T.A.B.), filed Aug. 31, 2017; 35 pages.
Excerpt from the Microsoft Press Computer Dictionary, Third Edition, 1997; p. 229.
Excerpt from the Microsoft Press Computer Dictionary, Third Edition, 1997; p. 12.
Petitioner's Reply to Patent Owner's Response, filed in *Apple Inc. v. Realtime Data LLC*, Case No. IPR2016-01739 (P.T.A.B.), filed Aug. 30, 2017; 33 pages.
Decision Institution of Inter Partes Review, filed in *Teradata Operations, Inc. v. Realtime Data LLC*, Case No. IPR2017-00806 (P.T.A.B.), filed Aug. 14, 2017; 31 pages.
Decision Institution of Inter Partes Review, filed in *Teradata Operations, Inc. v. Realtime Data LLC*, Case No. IPR2017-00808 (P.T.A.B.), filed Aug. 14, 2017; 31 pages.
Patent Owner's Response, filed in *Dell Inc. et al. v. Realtime Data LLC*, Case No. IPR2017-00176 (P.T.A.B.), filed Sep. 22, 2017; 25 pages.
Deposition Transcript of Dr. Charles D. Creusere, filed in *Dell Inc. et al. v Realtime Data LLC*, Case No. IPR2017-00176 (P.T.A.B.), filed Sep. 22, 2017, 57 pages.
Declaration of Kenneth A. Zeger, Ph.D., filed in *Dell Inc. et al. v. Realtime Data LLC*, Case No. IPR2017-00176 (P.T.A.B.), filed Sep. 22, 2017; 44 pages.
Declaration of Kenneth A. Zeger, Ph.D., filed in *Dell Inc. et al. v. Realtime Data LLC*, Case No. IPR2017-00179 (P.T.A.B.), filed Sep. 22, 2017; 44 pages.
Patent Owner's Response, filed in *Dell Inc. et al. v. Realtime Data LLC*, Case No. IPR2017-00179 (P.T.A.B.), filed Sep. 22, 2017; 32 pages.
Petition for Inter Partes Review, filed in *Unified Patents Inc. v. Realtime Data LLC*, Case No. IPR2017-02129 (P.T.A.B.), filed Sep. 22, 2017; 84 pages.
Declaration of Albert Wegener, filed in *Unified Patents Inc. v. Realtime Data LLC*, Case No. IPR2017-02129 (P.T.A.B.), filed Sep. 22, 2017; 176 pages.
Chi et al., "Compression Proxy Server: Design and Implementation," *Proceedings of USITS 99: The $2^{nd}$ USENIX Symposium on Internet Technologies & Systems*, Oct. 11-14, 1999; 13 pages.
Spencer et al., "Effects of MPEG Compression on the Quality and Diagnostic Accuracy of Digital Echocardiography Studies," Journal of the American Society of Echocardiography, vol. 13 No. 1, Jan. 2000; pp. 51-57.

(56) References Cited

OTHER PUBLICATIONS

Nelson, "LZW Data Compression," Dr. Dobb's The World of Software Development, Oct. 1, 1989; 12 pages.
Nikolaidis et al., "Copyright Protection of Images Using Robust Digital Signatures," IEEE International Conference on Acoustics, Speech, and Signal Processing Conference Proceedings, May 9, 1996; 4 pages.
Declaration of Scott Bennett, Ph.D., filed in *Unified Patents Inc. v. Realtime Data LLC*, Case No. IPR2017-02129 (P.T.A.B.), filed Sep. 22, 2017; 54 pages.
Petition for Inter Partes Review of U.S. Pat. No. 9,054,728, filed in *Commvault Systems, Inc. v. Realtime Data LLC*, Case No. IPR2017-02178 (P.T.A.B.), filed Sep. 26, 2017; 80 pages.
Declaration of Professor James Storer, Ph.D., filed in *Commvault Systems, Inc. v. Realtime Data LLC*, Case No. IPR2017-02178 (P.T.A.B.), filed Sep. 26, 2017; 102 pages.
Bodson et al., "Measurement of Data Compression in Advanced Group 4 Facsimile Systems," Proceedings of the IEEE, vol. 73, No. 4, Apr. 1985; pp. 731-739.
Moffat et al., "Lossless Compression for Text and Images," International Journal of High Speed Electronics and Systems, vol. 8, No. 1, 1997; pp. 179-231.
ITU-T Recommendation Series T: Terminal Equipments and Protocols for Telematic Services, "Standardization of Group 3 Facsimile Terminals for Document Transmission," Document T.4, Geneva, 1997; 60 pages.
ITU-T Recommendation Series T: Terminal Equipments and Protocols for Telematic Services, "Procedures for document facsimile transmission in the general switched telephone network," Document T.30, Geneva, 1997; 176 pages.
Hunter et al., "International Digital Facsimile Coding Standards," Proceedings of the IEEE, vol. 68, No. 7, Jul. 1980; pp. 854-867.
McIntyre et al., "Internet Fax T.30 Feature Mapping," Network Working Group, RFC 2880, Aug. 2000; 37 pages.
"Text Recognition and Optical Scanning," Encyclopedia of Microcomputers, vol. 18, Marcel Dekker, Inc., 1996; pp. 157-181.
Alsulaiman, "An Investigation of Storage and Communication Codes for an Electronic Library," Iowa State University, 1987; 452 pages.
Patent Owner's Response, filed in *Teradata Operations, Inc. v. Realtime Data LLC*, Case No. IPR2017-00557 (P.T.A.B.), filed Sep. 26, 2017; 47 pages.
Deposition Transcript of Dr. Charles D. Creusere, filed in *Teradata Operations, Inc. v. Realtime Data LLC*, Case No. IPR2017-00557 (P.T.A.B.), filed Sep. 26, 2017; 48 pages.
Declaration of Kenneth A. Zeger, Ph.D., filed in *Teradata Operations, Inc. v. Realtime Data LLC*, Case No. IPR2017-00557 (P.T.A.B.), filed Sep. 26, 2017; 48 pages.
Decision Denying Institution of Inter Partes Review, filed in *NetApp Inc. v. Realtime Data LLC*, Case No. IPR2017-01195 (P.T.A.B.), filed Oct. 12, 2017; 14 pages.
Decision Denying Institution of Inter Partes Review, filed in *NetApp Inc. v. Realtime Data LLC*, Case No. IPR2017-01196 (P.T.A.B.), filed Oct. 13, 2017; 15 pages.
Patent Owner's Preliminary Respone, filed in *Commvault Systems, Inc. v. Realtime Data LLC*, Case No. IPR2017-01710 (P.T.A.B.), filed Oct. 27, 2017; 30 pages.
Patent Owner's Preliminary Response, filed in *NetApp Inc. v. Realtime Data LLC*, Case No. IPR2017-01663 (P.T.A.B.), filed Oct. 30, 2017; 51 pages.
Patent Owner's Preliminary Response, filed in *NetApp Inc. v. Realtime Data LLC*, Case No. IPR2017-01660 (P.T.A.B.), filed Oct. 30, 2017; 50 pages.
Patent Owner's Preliminary Response, filed in *NetApp Inc. v. Realtime Data LLC*, Case No. IPR2017-01664 (P.T.A.B.), filed Oct. 31, 2017; 57 pages.
Final Written Decision, filed in *Dell Inc. et al. v. Realtime Data LLC*, Case No. IPR2016-01002 (P.T.A.B.), filed Oct. 31, 2017; 32 pages.

Final Written Decision, filed in *Hewlett-Packard Enterprise Co. et al. v. Realtime Data LLC*, Case No. IPR2016-00783 (P.T.A.B.), filed Sep. 28, 2017; 48 pagea.
Final Written Decision, filed in *Riverbed Technology, Inc. et al. v. Realtime Data LLC*, Case No. IPR2016-00980 (P.T.A.B.), filed Oct. 27, 2017; 40 pages.
Final Written Decision, filed in *Riverbed Technology, Inc. et al. v. Realtime Data LLC*, Case No. IPR2016-00978 (P.T.A.B.), filed Oct. 30, 2017; 44 pages.
Final Judgement, filed in *Realtime Data LLC v. Actian Corporation et al.*, Case No. 6:15-cv-00463 (E.D. Texas), filed Dec. 6, 2017; 1 page.
First Amended Complaint for Patent Infringement Against Amazon.com, Inc., filed in *Realtime Adaptive Streaming LLC v. Amazon.com, Inc. et al.*, Case No. 6:17-cv-00549 (E.D. Texas), filed Dec. 1, 2017; 52 pages.
Final Judgement, filed in *Realtime Adaptive Streaming LLC v. Echostar Technologies LLC et al.*, Case No. 6:17-cv-00567 (E.D. Texas), filed Nov. 8, 2017; 1 page.
First Amended Complaint for Patent Infringement, filed in *Realtime Adaptive Streaming LLC v. Hulu, LLC*, Case No. 2:17-cv-07611 (C.D. California), filed Dec. 29, 2017; 80 pages.
First Amended Complaint for Patent Infringement Against Cisco, filed in *Realtime Adaptive Streaming LLC v. Cisco Systems, Inc.*, Case No. 6:17-cv-00591 (E.D. Texas), filed Nov. 30, 2017; 78 pages.
First Amended Complaint for Patent Infringement, filed in *Realtime Adaptive Streaming LLC v. Brightcove Inc. et al.*, Case No. 1:17-cv-01519 (D. Delaware), filed Dec. 1, 2017; 76 pages.
First Amended Complaint for Patent Infringement, filed in *Realtime Adaptive Streaming LLC v. Haivision Network Video Inc. et al.*, Case No. 1:17-cv-01520 (D. Delaware), filed Dec. 1, 2017; 128 pages.
First Amended Complaint for Patent Infringement Against Cohesity, Inc., filed in *Realtime Data LLC d/b/a IXO v. Cohesity Inc.*, Case No. 1:17-cv-01543 (D. Delaware), filed Dec. 12, 2017; 30 pages.
First Amended Complaint for Patent Infringement Against Pure Storage, Inc., filed in *Realtime Data LLC d/b/a IXO v. Pure Storage, Inc.*, Case No. 1:17-cv-01544 (D. Delaware), filed Dec. 12, 2017; 36 pages.
Exhibit A to Joint Claim Construction and Prehearing Statement, filed in *Realtime Data LLC d/b/a IXO v. Exinda Inc.*, Case No. 6:17-cv-00124 (E.D. Texas), filed Jan. 16, 2018; 2 pages.
Exhibit A to Joint Claim Construction and Prehearing Statement, filed in *Realtime Data LLC d/b/a IXO v. Synacor Inc.*, Case No. 6:17-cv-00126 (E.D. Texas), filed Jan. 17, 2018; 12 pages.
Plaintiff Riverbed Technology, Inc.'s Answer to Realtime Data LLC d/b/a IXO's Counterclaims, Affirmative Defenses, and Counterclaims in Reply, filed in *Riverbed Technology, Inc. v. Realtime Data LLC d/b/a IXO*, Case No. 3:17-cv-03182 (N.D. California), filed Nov. 29, 2017; 11 pages.
Acronis, Inc.'s Preliminary Invalidity Disclosures, filed in *Realtime Data LLC d/b/a IXO v. Acronis, Inc.*, Case No. 1:17-cv-11279 (D. Massachusetts), filed Dec. 4, 2017; 70 pages.
Exhibits to Acronis, Inc.'s Preliminary Invalidity Disclosures, filed in *Realtime Data LLC d/b/a IXO v. Acronis, Inc.*, Case No. 1:17-cv-11279 (D. Massachusetts), filed Dec. 4, 2017; 8391 pages. (Submitted in 3 parts).
First Amended Complaint for Patent Infringement Against Code42 Software, Inc., filed in *Realtime Data LLC d/b/a IXO v. Code42 Software, Inc.*, Case No. 1:17-cv-02479 (D. Colorado), filed Jan. 18, 2018; 28 pages.
First Amended Complaint Jury Trial Requested, filed in *Realtime Data LLC d/b/a LXO v. Nexenta Systems, Inc.*, Case No. 2:17-cv-07690 (C.D. California), filed Jan. 18, 2018; 32 pages.
Defendant Egnyte, Inc.'s Answer to Plaintiffs Complaint for Patent Infringement, and Defendant's Affirmative Defenses and Counterclaims, filed in *Realtime Technologies, Inc. v. Egnyte, Inc.*, Case No. 1:17-cv-01750 (D. Delaware), filed Jan. 29, 2018; 12 pages.
Non-Final Office Action for U.S. Appl. No. 15/391,240, dated Jan. 17, 2018; 19 pages.
Notice of Allowance for U.S. Appl. No. 14/844,973, dated Feb. 6, 2018; 7 pages.

(56) References Cited

OTHER PUBLICATIONS

Petitioners' Reply to Patent Owner Response, filed in *Dell Inc. et al. v. Realtime Data LLC d/b/a IXO*, Case No. IPR2017-00176 (P.T.A.B.), filed Dec. 6, 2017; 34 pages.
Deposition of Kenneth A. Zeger, filed in *Dell Inc. et al. v. Realtime Data LLC d/b/a IXO*, Case No. IPR2017-00176 (P.T.A.B.), filed Dec. 6, 2017; 332 pages.
Petitioners' Reply to Patent Owner Response, filed in *Dell Inc. et al. v. Realtime Data LLC d/b/a IXO*, Case No. IPR2017-00179 (P.T.A.B.), filed Dec. 6, 2017; 35 pages.
Petitioner's Reply, filed in *Teradata Operations, Inc. v. Realtime Data LLC d/b/a IXO*, Case No. IPR2017-00557 (P.T.A.B.), filed Dec. 5, 2017; 33 pages.
Deposition of Kenneth A. Zeger, filed in *Teradata Operations, Inc. v. Realtime Data LLC d/b/a IXO*, Case No. IPR2017-00557 (P.T.A.B.), filed Dec. 5, 2017; 65 pages.
Institution of Inter Partes Review, filed in *Veritas Technologies, LLC v. Realtime Data LLC*, Case No. IPR2017-01688 (P.T.A.B.), filed Nov. 21, 2017; 10 pages.
Institution of Inter Partes Review, filed in *Veritas Technologies, LLC v. Realtime Data LLC d/b/a IXO*, Case No. IPR2017-01690 (P.T.A.B.), filed Dec. 15, 2017; 11 pages.
Patent Owner's Preliminary Response, filed in *Commvault Systems, Inc. v. Realtime Data LLC*, Case No. IPR2017-02006 (P.T.A.B.), filed Dec. 22, 2017; 48 pages.
Patent Owner's Preliminary Response, filed in *Commvault Systems, Inc. v. Realtime Data LLC*, Case No. IPR2017-02007 (P.T.A.B.), filed Dec. 22, 2017; 49 pages.
Final Written Decision, filed in *Apple, Inc. v. Realtime Data LLC*, Case No. IPR2016-01365 (P.T.A.B.), filed Jan. 17, 2018; 46 pages.
Final Written Decision, filed in *Apple, Inc. v. Realtime Data LLC*, Case No. IPR2016-01366 (P.T.A.B.), filed Jan. 11, 2018; 47 pages.
Decision Institution of Inter Partes Review, filed in *Commvault Systems, Inc. v. Realtime Data LLC*, Case No. IPR2017-01710 (P.T.A.B.), filed Jan. 18, 2018; 23 pages.
Decision Denying Institution of Covered Business Method Patent Review, filed in *Commvault Systems, Inc. v. Realtime Data LLC*, Case No. CBM2017-00061 (P.T.A.B.), filed Jan. 18, 2018; 10 pages.
Patent Owner's Preliminary Response, filed in *Unified Patents, Inc. v. Realtime Data, LLC*, Case No. IPR2017-02129 (P.T.A.B.), filed Jan. 5, 2018; 41 pages.
Patent Owner's Preliminary Response, filed in *Commvault Systems, Inc. v. Realtime Data LLC*, Case No. IPR2017-02178 (P.T.A.B.), filed Jan. 12, 2018; 49 pages.
Decision Denying Institution of Inter Partes Review, filed in *NetApp Inc. v. Realtime Data LLC*, Case No. IPR2017-01660 (P.T.A.B.), filed Jan. 25, 2018; 15 pages.
Petition for Inter Partes Review of U.S. Pat. No. 9,667,751 Under 35 U.S.C. §§ 311-319 and C.F.R. § 42.100 et seq., filed in *Pure Storage, Inc. v. Realtime Data, LLC*, Case No. IPR2018-00549 (P.T.A.B.), filed Jan. 30, 2018; 83 pages.
Pastrick, S., "Double—No—Triple Your Hard Disk Space With On-the-Fly Data Compression Utilities," PC Magazine, Jan. 28, 1992; pp. 261-262 and 275-283.
Feder et al., "Universal Prediction of Individual Sequences," vol. 38, No. 4, IEEE Transactions on Information Theory, Jul. 1992; pp. 1258-1270.
Marcus et al., "Finite-State Modulation Codes for Data Storage," vol. 10, No. 1, IEEE Journal on Selected Areas in Communications, Jan. 1992; pp. 5-37.
Declaration of Irfan Essa, Ph.D. Under 37 C.F.R. § 1.68, filed in *Pure Storage, Inc. v. Realtime Data, LLC*, Case No. IPR2018-00549 (P.T.A.B.), filed Jan. 30, 2018; 229 pages.
Updated Court Docket History for *Realtime Data LLC d/b/a IXO v. Hewlett Packard Enterprise Co., et al.*, No. 6:16-cv-00086 (E.D. Texas), downloaded Feb. 1, 2018; 9 pages.
Updated Court Docket History for *Realtime Data LLC d/b/a IXO v. CenturyLink, Inc., et al.*, No. 6:16-cv-00087 (E.D. Texas), downloaded Feb. 1, 2018; 11 pages.

Updated Court Docket History for *Realtime Data LLC d/b/a IXO v. Dell, Inc., et al.*, No. 6:16-cv-00089 (E.D. Texas), downloaded Feb. 1, 2018; 12 pages.
Updated Court Docket History for *Realtime Data LLC d/b/a IXO v. Teradata Operations, Inc.*, Case No. 2:16-cv-02743 (C.D. Cal), downloaded Feb. 1, 2018; 8 pages.
Updated Court Docket History for *Realtime Data LLC d/b/a IXO v. Rackspace US, Inc., et al.*, No. 6:16-cv-00961 (E.D. Texas), downloaded Feb. 1, 2018; 30 pages.
Updated Court Docket History for *Realtime Data LLC d/b/a IXO v. Exinda Inc.*, No. 6:17-cv-00124 (E.D. Texas), downloaded Feb. 1, 2018; 4 pages.
Updated Court Docket History for *Realtime Data LLC d/b/a IXO v. Synacor Inc.*, No. 6:17-cv-00126 (E.D. Texas), downloaded Feb. 1, 2018; 4 pages.
Updated Court Docket History for *Realtime Data LLC v. Fujitsu America, Inc. et al.*, No. 3:17-cv-02109 (N.D. Cal.), downloaded Feb. 1, 2018; 7 pages.
Updated Court Docket History for *Realtime Data LLC v. Silver Peak Systems, Inc.*, No. 4:17-cv-02373 (N.D. Cal.), downloaded Feb. 1, 2018; 10 pages.
Updated Court Docket History for *Realtime Data LLC v. Riverbed Technology, Inc.*, No. 3:17-cv-03182 (N.D. Cal.), downloaded Feb. 1, 2018; 7 pages.
Updated Court Docket History for *Realtime Data LLC d/b/a IXO v. Array Networks Inc.*, No. 1:17-cv-00800 (D. Del.), downloaded Feb. 1, 2018; 2 pages.
Updated Court Docket History for *Realtime Data LLC d/b/a IXO v. CommVault Systems, Inc.*, No. 1:17-cv-00925 (D. Del.), downloaded Feb. 1, 2018; 5 pages.
Updated Court Docket History for *Realtime Data LLC d/b/a IXO v. Acronis, Inc.*, No. 1:17-cv-11279 (D. Mass.), downloaded Feb. 1, 2018; 5 pages.
Court Docket History for *Realtime Data LLC d/b/a IXO v. Sling TV LLC et al.*, Case No. 1:17-cv-02097 (D. Colorado), downloaded Feb. 1, 2018; 6 pages.
Court Docket History for *Realtime Adaptive Streaming LLC v. Amazon.com et al.*, Case No. 6:17-cv-00549 (E.D. Texas), downloaded Feb. 1, 2018; 4 pages.
Court Docket History for *Realtime Adaptive Streaming LLC v. Hulu, LLC*, Case No. 2:17-cv-07611 (C.D. California), downloaded Feb. 1, 2018; 5 pages.
Court Docket History for *Realtime Data LLC d/b/a IXO v. Code42 Software, Inc.*, Case No. 1:17-cv-02479 (D. Colorado), downloaded Feb. 1, 2018; 3 pages.
Court Docket History for Realtime *Adaptive Streaming LLC v. Cisco Systems, Inc.*, Case No. 6:17-cv-00591 (E.D. Texas), downloaded Feb. 1, 2018; 4 pages.
Court Docket History for *Realtime Adaptive Streaming LLC v. Brightcove Inc. et al.*, Case No. 1:17-cv-01519 (D. Delaware), downloaded Feb. 1, 2018; 4 pages.
Court Docket History for *Realtime Adaptive Streaming LLC v. Haivision Network Video Inc. et al.*, Case No. 1:17-cv-01520 (D. Delaware), downloaded Feb. 1, 2018; 4 pages.
Court Docket History for *Realtime Data LLC d/b/a IXO v. Cohesity Inc.*, Case No. 1:17-cv-01543 (D. Delaware), downloaded Feb. 1, 2018; 3 pages.
Court Docket History for *Realtime Data LLC d/b/a IXO v. Pure Storage, Inc.*, Case No. 1:17-cv-01544 (D. Delaware), downloaded Feb. 1, 2018; 3 pages.
Court Docket History for *Realtime Data LLC v. Netgear Inc.*, Case No. 3:17-cv-06397 (N. D. California), downloaded Feb. 1, 2018; 7 pages.
Court Docket History for *Realtime Adaptive Streaming LLC et al. v. Polycom, Inc.*, Case No. 1:17-cv-02692 (D. Colorado), downloaded Feb. 1, 2018; 3 pages.
Court Docket History for *Realtime Data LLC d/b/a IXO v. Fortinet, Inc.*, Case No. 1- 17-cv-01635 (D. Delaware), downloaded Feb. 1, 2018; 2 pages.
Court Docket History for *Realtime Data LLC d/b/a IXO v. Barracuda Networks, Inc.*, Case No. 3:17-cv-06701 (N.D. California), downloaded Feb. 1, 2018; 10 pages.

(56) References Cited

OTHER PUBLICATIONS

Court Docket History for *Realtime Adaptive Streaming LLC* v. *Apple Inc.*, Case No. 1:17-cv-02869 (D. Colorado), downloaded Feb. 1, 2018; 3 pages.
Court Docket History for *Realtime Data LLC d/b/a IXO* v. *Egnyte, Inc.*, Case No. 1:17- cv-01750 (D. Delaware), downloaded Feb. 1, 2018; 2 pages.
Court Docket History for *Realtime Data LLC d/b/a IXO* v. *IXSystems Inc.*, Case No. 1:17-cv-01769 (D. Delaware), downloaded Feb. 1, 2018; 2 pages.
Court Docket History for *Realtime Data LLC d/b/a IXO* v. *Carbonite, Inc. et al.*, Case No. 1:17-cv-12499 (D. Mass), downloaded Feb. 1, 2018; 9 pages.
Court Docket History for *Realtime Data LLC* v. *Nexenta Systems, Inc.*, Case No. 3:18- cv-00574 (N.D. California), downloaded Feb. 1, 2018; 4 pages.
Court Docket History for *Realtime Data LLC d/b/a IXO* v. *Oracle America, Inc.*, No. 6:16-cv-00088 (E.D. Texas), downloaded Aug. 11, 2017; 15 pages.
Court Docket History for *Realtime Data LLC d/b/a IXO* v. *Fujitsu America, Inc., et al.*, No. 6:16-cv-01035 (E.D. Texas), downloaded Aug. 11, 2017; 6 pages.
Court Docket History for *Realtime Data LLC d/b/a IXO* v. *Oracle America, Inc.*, No. 6:17-cv-00046 (E.D. Texas), downloaded Aug. 11, 2017; 3 pages.
Court Docket History for *Realtime Data LLC d/b/a IXO* v. *Echostar Corporation et al.*, No. 6:17-cv-00084 (E.D. Texas), downloaded Aug. 11, 2017; 7 pages.
Court Docket History for *Realtime Data LLC d/b/a IXO* v. *Acronis, Inc.*, No. 6:17-cv-00118 (E.D. Texas), downloaded Aug. 11, 2017; 4 pages.
Court Docket History for *Realtime Data LLC d/b/a IXO* v. *Array Networks, Inc.* No. 6:17-cv-00119 (E.D. Texas), downloaded Aug. 11, 2017; 4 pages.
Court Docket History for *Realtime Data LLC d/b/a IXO* v. *Circadence Corporation*, No. 6:17-cv-00122 (E.D. Texas), downloaded Aug. 11, 2017; 3 pages.
Court Docket History for *Realtime Data LLC d/b/a IXO* v. *CommVault Systems, Inc. et al.*, No. 6:17-cv-00123 (E.D. Texas), downloaded Aug. 11, 2017; 7 pages.
Final Court Docket History for *Realtime Data LLC d/b/a IXO* v. *Actian Corporation, et al.*, Case No. 6:15-cv-00463 (E.D. Texas), downloaded Feb. 1, 2018; 63 pages.
Final Court Docket History for *Realtime Data LLC d/b/a IXO* v. *Barracuda Networks, Inc.*, No. 6:17-cv-00120 (E.D. Texas), downloaded Feb. 1, 2018; 7 pages.
Final Court Docket History for *Realtime Data LLC d/b/a IXO* v. *Carbonite, Inc. et al.*, No. 6:17-cv-00121 (E.D. Texas), downloaded Feb. 1, 2018; 8 pages.
Final Court Docket History for *Realtime Data LLC d/b/a IXO* v. *Netgear, Inc.*, No. 6:17-cv-00125 (E.D. Texas), downloaded Feb. 1, 2018; 4 pages.
Final Court Docket History for *Realtime Data LLC d/b/a IXO* v. *Riverbed Technology, Inc.*, No. 6:17-cv-00198 (E.D. Texas), downloaded Feb. 1, 2018; 5 pages.
Final Court Docket History for *Realtime Data LLC d/b/a IXO* v. *Barracuda Networks, Inc.*, No. 1:17-cv-00893 (D. Del.), downloaded Feb. 1, 2018; 3 pages.
Final Court Docket History for *Realtime Data LLC d/b/a IXO* v. *Dish Network Corporation et al.*, No. 6:17-cv-00421 (E.D. Texas), downloaded Feb. 1, 2018; 4 pages.
Final Court Docket History for *Realtime Adaptive Streaming LLC* v. *EchoStar Technologies, LLC et al.*, Case No. 6:17-cv-00567 (E.D. Texas), downloaded Feb. 1, 2018; 2 pages.
Final Court Docket History for *Realtime Data LLC* v. *Nexenta Systems, Inc.*, Case No. 2:17-cv-07690 (C.D. California), downloaded Feb. 1, 2018; 4 pages.
Complaint for Patent Infringement, filed in *Realtime Data LLC d/b/a IXO* v. *Huawei Technologies, Co., Ltd. et al.*, Case No. 6:18-cv-00182 (E.D. Texas), filed Apr. 27, 2018; 45 pages.
Memorandum Opinion and Order, filed in *Realtime Data LLC d/b/a IXO* v. *Echostar Corporation et al.*, Case No. 6:17-cv-00084 (E.D. Texas), filed Apr. 25, 2018; 16 pages.
Memorandum Opinion and Order, filed in *Realtime Data LLC* v. *Synacor, Inc.*, Case No. 6:17-cv-00126 (E.D. Texas), filed Apr. 25, 2018; 15 pages.
Complaint for Patent Infringement, filed in *Realtime Adaptive Streaming LLC* v. *Google LLC et al.*, Case No. 2:18-cv-03629 (C.D. California), filed Apr. 30, 2018; 69 pages.
Complaint for Patent Infringement, filed in *Realtime Data LLC d/b/a IXO* v. *International Business Machines Corporation*, Case No. 6:18-cv-00188 (E.D. Texas), filed Apr. 30, 2018; 38 pages.
Complaint for Patent Infringement, filed in *Realtime Data LLC d/b/a IXO* v. *Cloudera, Inc.*, Case No. 1:18-cv-00653 (D. Delaware), filed Apr. 30, 2018; 40 pages.
Complaint for Patent Infringement, filed in *Realtime Adaptive Streaming LLC* v. *Avaya Inc.*, Case No. 1:18-cv-01046 (D. Colorado), filed May 4, 2018; 42 pages.
Complaint for Patent Infringement, filed in *Realtime Adaptive Streaming LLC* v. *Broadcom Corporation et al.*, Case No. 1:18-cv-01048 (D. Colorado), filed May 4, 2018; 44 pages.
Notice of Allowance for U.S. Appl. No. 14/936,312, dated Mar. 22, 2018; 10 pages.
Notice of Allowability for U.S. Appl. No. 14/794,201, dated Apr. 23, 2018; 5 pages.
Inter Partes Reexamination of U.S. Pat. No. 6,604,158 (Control No. 95/000,486), Inter Partes Reexamination Certificate issued Oct. 10, 2012.
Inter Partes Reexamination of U.S. Pat. No. 7,321,937 (Control No. 95/000,466), Inter Partes Reexamination Certificate issued May 15, 2012.
Inter Partes Reexamination of U.S. Pat. No. 6,604,158 (Control No. 95/000,453), Terminated.
Ex Parte Reexamination of U.S. Pat. No. 6,601,104 (Control No. 90/009,428), Ex Parte Reexamination Certificate issued Feb. 28, 2012.
Inter Partes Reexamination of U.S. Pat. No. 7,378,992 (Control No. 95/000,478), Inter Partes Reexamination Certificate issued Oct. 4, 2012.
Inter Partes Reexamination of U.S. Pat. No. 6,624,761 (Control No. 95/000,464), Inter Partes Reexamination Certificate issued Jun. 12, 2012.
Inter Partes Reexamination of U.S. Pat. No. 7,161,506 (Control No. 95/000,479), Inter Partes Reexamination Certificate issued May 22, 2012.
Inter Partes Reexamination of U.S. Pat. No. 7,714,747 (Control No. 95/001,517), Appeal to the Court of Appeals for the Federal Circuit dismissed Jun. 4, 2015.
Inter Partes Reexamination of U.S. Pat. No. 7,417,568 (Control No. 95/001,533), Inter Partes Reexamination Certificate issued Jul. 22, 2016.
Inter Partes Reexamination of U.S. Pat. No. 7,777,651 (Control No. 95/001,581), Inter Partes Reexamination Certificate issued Jul. 8, 2016.
Inter Partes Reexamination of U.S. Pat. No. 7,400,274 (Control No. 95/001,544), Inter Partes Reexamination Certificate issued Aug. 1, 2016.
Inter Partes Reexamination of U.S. Pat. No. 7,321,937 (Control No. 95/001,922), Inter Partes Reexamination Certificate issued Dec. 5, 2013.
Inter Partes Reexamination of U.S. Pat. No. 6,604,158 (Control No. 95/001,923), Inter Partes Reexamination Certificate issued Apr. 17, 2015.
Inter Partes Reexamination of U.S. Pat. No. 7,352,300 (Control No. 95/001,924), Inter Partes Reexamination Certificate issued Aug. 4, 2014.
Inter Partes Reexamination of U.S. Pat. No. 7,395,345 (Control No. 95/001,925), Inter Partes Reexamination Certificate issued Nov. 3, 2014.
Inter Partes Reexamination of U.S. Pat. No. 7,161,506 (Control No. 95/001,926), Inter Partes Reexamination Certificate issued Jan. 8, 2014.

(56) References Cited

OTHER PUBLICATIONS

Inter Partes Reexamination of U.S. Pat. No. 7,415,530 (Control No. 95/001,927), Inter Partes Reexamination Certificate issued Aug. 16, 2013.
Inter Partes Reexamination of U.S. Pat. No. 7,378,992 (Control No. 95/001,928), Inter Partes Reexamination Certificate issued Jan. 8, 2014.
*Oracle America, Inc. v. Realtime Data, LLC*, IPR2016-0037, U.S. Pat. No. 7,378,992, Terminated Apr. 28, 2017.
*Apple Inc. v. Realtime Data, LLC d/b/a IXO*, U.S. Pat. No. 7,181,608, Notice of Appeal Feb. 1, 2018.
*Oracle America Inc. v. Realtime Data LLC*, U.S. Pat. No. 9,116,908, Terminated (Joined with IPR2016-01002).
*Apple Inc. v. Realtime Data, LLC d/b/a IXO*, IPR2016-01739, U.S. Pat. No. 8,880,862, Final Written Decision Mar. 16, 2018.
*Teradata Operation, Inc. v. Realtime Data LLC d/b/a IXO*, IPR2017-00557, U.S. Pat. No. 7,358,867, Oral Hearing Feb. 20, 2018.
*Teradata Operations, Inc. v. Realtime Data LLC d/b/a IXO*, IPR2017-00808, U.S. Pat. No. 7,161,506, Consolidated with IPR2017-00176.
*NetApp Inc. v. Realtime Data LLC*, IPR2017-01196, U.S. Pat. No. 7,415,530, Institution Denied Oct. 12, 2017.
*EchoStar Corporation et al. v. Realtime Data LLC*, IPR2018-00613, U.S. Pat. No. 8,502,707, Filed Feb. 13, 2018.
*EchoStar Corporation et al. v. Realtime Data LLC*, IPR2018-00614, U.S. Pat. No. 9,054,728, Filed Feb. 13, 2018.
*Chicago Board Options Exchange, Inc., v. Realtime Data LLC d/b/a IXO*, No. 09-cv-4486 (N.D. Ill.), Dismissed.
*Realtime Data, LLC d/b/a IXO v. Actian Corporation, et al.*, No. 6:15-cv-00463 (E.D. Texas), Final judgement Dec. 6, 2017.
*Realtime Data, LLC d/b/a IXO v. Riverbed Technology, Inc., et al.*, No. 6:15-cv-00468 (E.D. Texas), Consolidated with Case No. 12.
*Realtime Data, LLC d/b/a IXO v. SAP America, Inc., et al.*, No. 6:15-cv-00469 (E.D. Texas), Consolidated with Case No. 12.
*Realtime Data LLC d/b/a IXO v. Oracle America, Inc.*, No. 6:16-cv-00088 (E.D. Texas), Final Judgment all claims dismissed May 15, 2017.
*Realtime Data LLC d/b/a IXO v. Echostar Corporation et al.*, No. 6:17-cv-00084 (E.D. Texas), Updated Joint Claim Construction Apr. 3, 2018.
*Realtime Data LLC d/b/a IXO v. Acronis, Inc.*, No. 6:17-cv-00118 (E.D. Texas), Final Judgment case dismissed Aug. 1, 2017.
*Realtime Data LLC d/b/a IXO v. Circadence Corporation*, No. 6:17-cv-00122 (E.D. Texas), Final Judgment case dismissed Apr. 25, 2017.
*Realtime Adaptive Streaming LLC v. Hulu, LLC*, No. 2:17-cv-07611 (C.D. California), Amended Complaint Dec. 29, 2017.
*Realtime Data LLC d/b/a IXO v. Code42 Software, Inc.*, No. 1:17-cv-02479 (D. Colorado), Amended Complaint Jan. 18, 2018.
*Realtime Data LLC d/b/a IXO v. Carbonite, Inc. et al.*, No. 1:17-cv-12499 (D. Mass), Transferred in Dec. 19, 2017.
*Realtime Data LLC v. Nexenta Systems, Inc.*, No. 3:18-cv-00574 (N.D. California), Transferred in Jan. 26, 2018.
*Realtime Adaptive Streaming LLC v. Adobe Systems Incorporated*, 1:18-cv-10355 (D. Mass), Answer to Complaint May 18, 2018.
*Realtime Data LLC d/b/a IXO v. International Business Machines Corporation*, 6:18-cv-188 (E.D. Texas), Filed Apr. 30, 2018.
*Realtime Adaptive Streaming LLC v. Avaya Inc.*, 1:18-cv-01046 (D. Colorado), Filed May 4, 2018.
*Realtime Adaptive Streaming LLC v. Intel Corporation*, 1:18-cv-01175 (D. Colorado), Filed May 15, 2018.
Answer and Affirmative Defenses by Defendant Adobe Systems Inc., filed in *Realtime Adaptive Streaming LLC v. Adobe Systems Inc.*, Case No. 1:18-cv-10355 (D. Mass), filed May 18, 2018; 24 pages.
Final Judgement, filed in *Realtime Data LLC d/b/a IXO v. Exinda, Inc.*, Case No. 6:17-cv-00124 (E.D. Texas), filed May 25, 2018; 1 page.
Complaint for Patent Infringement, filed in *Realtime Adaptive Streaming LLC v. Advanced Micro Devices*, Case No. 1:18-cv-01173 (D. Colorado), filed May 15, 2018; 45 pages.
Complaint for Patent Infringement, filed in *Realtime Adaptive Streaming LLC v. Intel Corporation*, Case No. 1:18-cv-01175 (D. Colorado), filed May 15, 2018; 44 pages.
Complaint for Patent Infringement, filed in *Realtime Adaptive Streaming LLC v. Mitel Networks, Inc.*, Case No. 1:18-cv-01177 (D. Colorado), filed May 15, 2018; 45 pages.
Complaint for Patent Infringement, filed in *Realtime Adaptive Streaming LLC v. LG Electronics Inc. et al.*, Case No. 6:18-cv-00215 (E.D. Texas), filed May 15, 2018; 45 pages.
Complaint for Patent Infringement, filed in *Realtime Adaptive Streaming LLC v. Cox Communications, Inc.*, Case No. 8:18-cv-00942 (C.D. California), filed May 31, 2018; 60 pages.
Complaint for Patent Infringement, filed in *Realtime Adaptive Streaming LLC v. Charter Communications, Inc. et al.*, Case No. 1:18-cv-01345 (D. Colorado), filed Jun. 1, 2018; 56 pages.
Complaint for Patent Infringement, filed in *Realtime Adaptive Streaming LLC v. Facebook, Inc.*, Case No. 1:18-cv-01373 (D. Colorado), filed Jun. 5, 2018; 26 pages.
Final Written Decision, filed in *Dell Inc. et al. v. Realtime Data LLC*, Case No. IPR2016-00972 (P.T.A.B.), filed May 15, 2018; 35 pages.
Final Written Decision, filed in *Dell Inc. et al. v. Realtime Data LLC*, Case No. IPR2017-00176 (P.T.A.B.), filed May 25, 2018; 46 pages.
Final Written Decision, filed in *Dell Inc. et al. v. Realtime Data LLC*, Case No. IPR2017-00179 (P.T.A.B.), filed May 25, 2018; 35 pages.
Patent Owner's Response, filed in *Commvault Systems, Inc. v. Realtime Data LLC*, Case No. IPR2017-01710 (P.T.A.B.), filed May 24,2018; 44 pages.
Patent Owner's Motion to Amend, filed in *Commvault Systems, Inc. v. Realtime Data LLC*, Case No. IPR2017-01710 (P.T.A.B.), filed May 24,2018; 35 pages.
Declaration of Kenneth A. Zeger, Ph.D., in Support of Patent Owner's Response, filed in *Commvault Systems, Inc. v. Realtime Data LLC*, Case No. IPR2017-01710 (P.T.A.B.), filed May 24,2018; 48 pages.
Transcript of Deposition of James Storer, PhD., filed in *Commvault Systems, Inc. v. Realtime Data LLC*, Case No. IPR2017-01710 (P.T.A.B.), filed May 24,2018; 52 pages.
Petition for Inter Partes Review, filed in *Hulu, LLC v. Realtime Adaptive Streaming LLC*, Case No. IPR2018-01090 (P.T.A.B.), filed May 18, 2018; 71 pages.
Declaration of James A. Storer, PhD., filed in *Hulu, LLC v. Realtime Adaptive Streaming LLC*, Case No. IPR2018-01090 (P.T.A.B.), filed May 18, 2018; 125 pages.
English-language translation of Japanese Patent No. H 11-331305; 75 pages.
Spanias et al., Audio Signal Processing and Coding, John Wiley & Sons, Inc., 2007; pp. 1-11, 263-342.
Westwater et al., Real-Time Video Compression Techniques and Algorithms, Kluwer Academic Publishers, 1997; p. 1.
Salomon, D., A Guide to Data Compression Methods, Springer Science+Business Media New York, 2002; pp. ix-xii, 1-7.
Le Gall, D. "MPEG: A Video Compression Standard for Multimedia Applications,"Inications of the ACM, vol. 34, No. 4, Apr. 1991; pp. 47-58.
Petition for Inter Partes Review, filed in *Hulu, LLC et al. v. Realtime Adaptive Streaming LLC*, Case No. IPR2018-01170 (P.T.A.B.), filed Jun. 1, 2018; 75 pages.
Declaration of James A. Storer, PhD., filed in *Hulu, LLC et al. v. Realtime Adaptive Streaming LLC*, Case No. IPR2018-01170 (P.T.A.B.), filed Jun. 1, 2018; 132 pages.
Petition for Inter Partes Review, filed in *Hulu, LLC et al. v. Realtime Adaptive Streaming LLC*, Case No. IPR2018-01169 (P.T.A.B.), filed Jun. 4, 2018; 78 pages.
Declaration of James A. Storer, PhD., filed in *Hulu, LLC et al. v. Realtime Adaptive Streaming LLC*, Case No. IPR2018-01169 (P.T.A.B.), filed Jun. 4, 2018; 132 pages.
Petition for Inter Partes Review, filed in *Hulu, LLC et al. v. Realtime Adaptive Streaming LLC*, Case No. IPR2018-01187 (P.T.A.B.), filed Jun. 4, 2018; 85 pages.

(56) References Cited

OTHER PUBLICATIONS

Declaration of James A. Storer, PhD., filed in *Hulu, LLC et al. v. Realtime Adaptive Streaming LLC*, Case No. IPR2018-01187 (P.T.A.B.), filed Jun. 4, 2018; 159 pages.
Pennebaker et al., JPEG Still Image Data Compression Standard, Chapter 2, Chapter 5, and Appendix A, Van Nostrand Reinhold, 1993; 241 pages.
Golston, J., "Comparing Media Codecs for Video Content," Embedded Systems Conference, San Francisco, 2004; 18 pages.
"Video Coding for low bit rate communication," ITU-T Series H: Audiovisual and Multimedia Systems, H.263, Feb. 1998; 167 pages.
Petition for Inter Partes Review, filed in *Hulu, LLC v. Realtime Adaptive Streaming LLC*, Case No. IPR2018-01195 (P.T.A.B.), filed Jun. 5, 2018; 74 pages.
Declaration of James A. Storer, PhD., filed in *Hulu, LLC v. Realtime Adaptive Streaming LLC*, Case No. IPR2018-01195 (P.T.A.B.), filed Jun. 5, 2018; 133 pages.
Complaint for Patent Infringement, filed in *Realtime Adaptive Streaming LLC v. Comcast Cable Communications, LLC*, Case No. 1:18-cv-01446 (D. Colorado), filed Jun. 11, 2018; 46 pages.
Notice of Allowability for U.S. Appl. No. 14/794,201, dated May 25, 2018; 2 pages.
*Oracle America, Inc. v. Realtime Data, LLC*, IPR2016-00373, U.S. Pat. No. 7,378,992, Terminated Apr. 28, 2017.
*Oracle America, Inc. v. Realtime Data, LLC*, IPR2016-00374, U.S. Pat. No. 8,643,513, Terminated Apr. 28, 2017.
*Oracle America, Inc. v. Realtime Data, LLC*, IPR2016-00375, U.S. Pat. No. 7,415,530, Institution Denied Jul. 1, 2016.
*Oracle America, Inc. v. Realtime Data, LLC*, IPR2016-00376, U.S. Pat. No. 7,415,530, Institution Denied Jul. 1, 2016.
*Oracle America, Inc. v. Realtime Data, LLC*, IPR2016-00377, U.S. Pat. No. 9,116,908, Institution Denied Jul. 1, 2016.
*SAP America Inc., et al. v. Realtime Data, LLC d/b/a IXO*, IPR2016-00783, U.S. Pat. No. 6,597,812, Appeal filed Nov. 3, 2017.
*Dell Inc., et al. v. Realtime Data, LLC*, IPR2016-00878, U.S. Pat. No. 7,415,530, Dismissed Jun. 21, 2016.
*Dell Inc., et al. v. Realtime Data, LLC*, IPR2016-00972, U.S. Pat. No. 7,415,530, Final Written Decision May 15, 2018.
*Riverbed Technology, Inc. et al. v. Realtime Data, LLC*, IPR2016-00978, U.S. Pat. No. 8,643,513, Appeal filed Nov. 3, 2017.
*Riverbed Technology, Inc. et al. v. Realtime Data, LLC*, IPR2016-00980, U.S. Pat. No. 7,378,992, Appeal filed Nov. 3, 2017.
*Dell Inc., et al. v. Realtime Data, LLC*, IPR2016-01002, U.S. Pat. No. 9,116,908, Final Written Decision Oct. 31, 2017.
*Apple Inc. v. Realtime Data, LLC d/b/a IXO*, IPR2016-01365, U.S. Pat. No. 7,181,608, Notice of Appeal Feb. 1, 2018.
*Apple Inc. v. Realtime Data, LLC d/b/a IXO*, IPR2016-01366, U.S. Pat. No. 8,090,936, Notice of Appeal Feb. 1, 2018.
*Oracle America Inc. v. Realtime Data LLC*, IPR2016-01671, U.S. Pat. No. 7,415,530, Terminated (Joined with IPR2016-00972).
*Oracle America Inc. v. Realtime Data LLC*, IPR2016-01672, U.S. Pat. No. 9,116,908, Terminated (Joined with IPR2016-01002).
*Apple Inc. v. Realtime Data, LLC d/b/a IXO*, IPR2016-01737, U.S. Pat. No. 8,880,862, Final Written Decision Mar. 13, 2018.
*Apple Inc. v. Realtime Data, LLC d/b/a IXO*, IPR2016-01738, U.S. Pat. No. 8,880,862, Final Written Decision Mar. 16, 2018.
*Apple Inc. v. Realtime Data, LLC d/b/a IXO*, IPR2016-01739, U.S. Pat. No. 8,880,862, Notice of Appeal Apr. 13, 2018.
*Oracle America Inc. v. Realtime Data LLC*, IPR2017-00108, U.S. Pat. No. 9,054,728, Terminated Apr. 11, 2017.
*Oracle America Inc. v. Realtime Data LLC*, IPR2017-00167, U.S. Pat. No. 6,597,812, Terminated Apr. 11, 2017.
*Oracle America Inc. v. Realtime Data LLC*, IPR2017-00168, U.S. Pat. No. 6,597,812, Terminated Apr. 11, 2017.
*Dell Inc. et al. v. Realtime Data LLC*, IPR2017-00176, U.S. Pat. No. 7,161,506, Final Written Decision May 25, 2018.
*Dell Inc. et al. v. Realtime Data LLC*, IPR2017-00179, U.S. Pat. No. 9,054,728, Final Written Decision May 25, 2018.
*Veritas Technologies LLC v. Realtime Data LLC d/b/a IXO*, IPR2017-00364, U.S. Pat. No. 9,116,908, Terminated (Joined with IPR2016-01002).
*Veritas Technologies LLC v. Realtime Data LLC d/b/a IXO*, IPR2017-00365, U.S. Pat. No. 7,415,530, Terminated (Joined with IPR2016-00972).
*Veritas Technologies LLC v. Realtime Data LLC d/b/a IXO*, IPR2017-00366, U.S. Pat. No. 8,643,513, Terminated (Joined with IPR2016-00978).
*Teradata Operations, Inc. v. Realtime Data LLC d/b/a IXO*, IPR2017-00557, U.S. Pat. No. 7,358,867, Final Written Decision Jun. 25, 2018.
*Teradata Operations, Inc. v. Realtime Data LLC d/b/a IXO*, IPR2017-00806, U.S. Pat. No. 7,161,506, Consolidated with IPR2017-00176.
*Teradata Operations, Inc. v. Realtime Data LLC d/b/a IXO*, IPR2017-00808, U.S. Pat. No. 9,054,728, Consolidated with IPR2017-00179.
*NetApp Inc. v. Realtime Data LLC*, IPR2017-01195, U.S. Pat. No. 7,415,530, Institution Denied Oct. 12, 2017.
*NetApp Inc. v. Realtime Data LLC*, IPR2017-01196, U.S. Pat. No. 9,116,908, Institution Denied Oct. 13, 2017.
*NetApp Inc. et al. v. Realtime Data LLC*, IPR2017-01354, U.S. Pat. No. 9,054,728, Institution Denied Nov. 14, 2017.
*Rackspace US, Inc. v. Realtime Data LLC*, IPR2017-01627, U.S. Pat. No. 7,415,530, Terminated Aug. 24, 2017.
*Rackspace US, Inc. v. Realtime Data LLC*, IPR2017-01629, U.S. Pat. No. 9,116,908, Terminated Aug. 24, 2017.
*NetApp Inc. et al. v. Realtime Data LLC*, IPR2017-01663, U.S. Pat. No. 7,378,992, Terminated Jan. 5, 2018.
*NetApp Inc. et al. v. Realtime Data LLC*, IPR2017-01660, U.S. Pat. No. 7,161,506, Institution Denied Jan. 25, 2018.
*NetApp Inc. et al. v. Realtime Data LLC*, IPR2017-01664, U.S. Pat. No. 8,643,513, Terminated Jan. 5, 2018.
*Veritas Technologies LLC v. Realtime Data LLC d/b/a IXO*, IPR2017-01688, U.S. Pat. No. 7,161,506, Joined with IPR2017-00176; oral hearing Jan. 20, 2018.
*Veritas Technologies LLC v. Realtime Data LLC d/b/a IXO*, IPR2017-01690, U.S. Pat. No. 9,054,728, Joined with IPR2017-00179; oral hearing Jan. 20, 2018.
*Rackspace US, Inc. v. Realtime Data LLC d/b/a IXO*, IPR2017-01691, U.S. Pat. No. 7,358,867, Terminated Aug. 24, 2017.
*CommVault Systems, Inc. v. Realtime Data LLC d/b/a IXO*, IPR2017-01710, U.S. Pat. No. 8,717,204, Patent Owner's Response May 24, 2018.
*CommVault Systems, Inc. v. Realtime Data LLC d/b/a IXO*, CBM2017-00061, U.S. Pat. No. 8,717,204, Institution Denied Jan. 18, 2018.
*CommVault Systems, Inc. v. Realtime Data LLC*, IPR2017-02006, U.S. Pat. No. 7,415,530, Institution Denied Mar. 19, 2018.
*CommVault Systems, Inc. v. Realtime Data LLC*, IPR2017-02007, U.S. Pat. No. 9,116,908, Institution Denied Mar. 15, 2018.
*Unified Patents Inc. v. Realtime Data LLC d/b/a IXO*, IPR2017-02129, U.S. Pat. No. 8,717,204, Institution Denied Mar. 27, 2018.
*CommVault Systems, Inc. v. Realtime Data LLC d/b/a IXO*, IPR2017-02178, U.S. Pat. No. 9,054,728, Trial Instituted Apr. 10, 2018.
*Pure Storage, Inc. v. Realtime Data, LLC*, IPR2018-00549, U.S. Pat. No. 9,667,751, POPR May 11, 2018.
*EchoStar Corporation et al. v. Realtime Data LLC*, IPR2018-00612, U.S. Pat. No. 8,717,204, POPR Jun. 7, 2018.
*EchoStar Corporation et al. v. Realtime Data LLC*, IPR2018-00613, U.S. Pat. No. 8,502,707, POPR Jun. 18, 2018.
*EchoStar Corporation et al. v. Realtime Data LLC*, IPR2018-00614, U.S. Pat. No. 9,054,728, POPR Jun. 18, 2018.
*Riverbed Technology, Inc. et al. v. Realtime Data LLC*, IPR2018-00656, U.S. Pat. No. 8,717,204, Filed Feb. 15, 2018.
*Acronis, Inc. v. Realtime Data LLC*, IPR2018-00703, U.S. Pat. No. 9,054,728, Filed Feb. 26, 2018.
*Acronis, Inc. v. Realtime Data LLC*, IPR2018-00706, U.S. Pat. No. 8,717,204, Filed Feb. 26, 2018.
*Unified Patents Inc. v. Realtime Adaptive Streaming LLC*, IPR2018-00883, U.S. Pat. No. 8,934,535, Filed Apr. 6, 2018.
*Hulu, LLC v. Realtime Adaptive Streaming LLC*, IPR2018-01090, U.S. Pat. No. 8,867,610, Filed May 18, 2018.
*Hulu, LLC et al. v. Realtime Adaptive Streaming LLC*, IPR2018-01169, U.S. Pat. No. 8,934,535, Filed Jun. 4, 2018.

(56) References Cited

OTHER PUBLICATIONS

*Hulu, LLC et al.* v. *Realtime Adaptive Streaming LLC*, IPR2018-01170, U.S. Pat. No. 8,934,535, Filed Jun. 1, 2018.
*Hulu, LLC et al.* v. *Realtime Adaptive Streaming LLC*, IPR2018-01187, U.S. Pat. No. 9,769,477, Filed Jun. 4, 2018.
*Hulu, LLC et al.* v. *Realtime Adaptive Streaming LLC*, IPR2018-01195, U.S. Pat. No. 8,867,610, Filed Jun. 5, 2018.
*Sony Corporation et al.* v. *Realtime Adaptive Streaming LLC*, IPR2018-01299, U.S. Pat. No. 9,762,907, Filed Jun. 28, 2018.
*Sling TV LLC et al.* v. *Realtime Adaptive Streaming LLC*, IPR2018-01331, U.S. Pat. No. 8,867,610, Filed Jul. 3, 2018.
*Sling TV LLC et al.* v. *Realtime Adaptive Streaming LLC*, IPR2018-01332, U.S. Pat. No. 8,934,535, Filed Jul. 3, 2018.
*Sling TV LLC et al.* v. *Realtime Adaptive Streaming LLC*, IPR2018-01342, U.S. Pat. No. 8,934,535, Filed Jul. 3, 2018.
*Cisco Systems, Inc.* v. *Realtime Adaptive Streaming LLC*, IPR2018-01384, U.S. Pat. No. 8,934,535, Filed Jul. 12, 2018.
*Sony Corp. et al.* v. *Realtime Adaptive Streaming LLC*, IPR2018-01413, U.S. Pat. No. 9,769,477, Filed Jul. 31, 2018.
*Sony Corp. et al.* v. *Realtime Adaptive Streaming LLC*, IPR2018-01439, U.S. Pat. No. 8,929,442, Filed Aug. 2, 2018.
*Realtime Data LLC d/b/a IXO* v. *Packeteer, Inc. et al.*, No. 6:08-cv-00144-LED (E.D. Texas), Dismissed.
*Realtime Data LLC d/b/a IXO* v. *Thomson Reuters Corporation et al.* No. 1:11-cv-06698-RJH (S.D. New York) (transferred from E.D. Texas; 6:09-cv-00333-LED), Case Terminated Nov. 9, 2012; Opinion of the Court of Appeals for the Federal Circuit received Jan. 27, 2014.
*Realtime Data LLC d/b/a IXO* v. *Morgan Stanley et al.*, No. 1:11-cv-06696-RJH (S.D. New York) (transferred from E.D. Texas; 6:09-cv-00326-LED), Case Terminated Nov. 9, 2012; Opinion of the Court of Appeals for the Federal Circuit received Jan. 27, 2014.
*Realtime Data LLC d/b/a IXO* v. *CME Group Inc., et al.*, No. 1:11-cv-06697-RJH (S.D. New York) (transferred from E.D. Texas; No. 6:09-cv-00327-LED), Case Terminated Nov. 9, 2012; Opinion of the Court of Appeals for the Federal Circuit received Jan. 27, 2014.
*Chicago Board Options Exchange, Inc.*, v. *Realtime DAta LLC d/b/a IXO*, No. 09-cv-4486 (N.D. Ill.), Dismissed.
*Thomson Reuters Corporation* v. *Realtime Data, LLC d/b/a IXO*, No. 1:09-cv-07868-RMB (S.D.N.Y.), Consolidated with Case No. 2.
*Realtime Data, LLC d/b/a IXO* v. *CME Group Inc., et al. (II)*, No. 6:10-cv-246 (E.D. Texas), Consolidated with Case No. 4.
*Realtime Data LLC d/b/a IXO* v. *Thomson Reuters Corporation et al. (II)*, No. 6:10-cv-247 (E.D. Texas), Consolidated with Case No. 2.
*Realtime Data, LLC d/b/a IXO* v. *Morgan Stanley, et al. (II)*, No. 6:10-cv-248 (E.D. Texas), Consolidated with Case No. 3.
*Realtime Data, LLC d/b/a IXO* v. *MetroPCS Texas, LLC et al.*, No. 6:10-cv-00493 (E.D. Texas), Appeal Terminated.
*Realtime Data, LLC d/b/a IXO* v. *Microsoft Corporation, et al.*, No. 4:14-cv-00827 (E.D. Texas), Dismissed May 1, 2015.
*Realtime Data, LLC d/b/a IXO* v. *Actian Corporation, et al.*, No. 6:15-cv-00463 (E.D. Texas), Final judgement Dec. 16, 2017.
*Realtime Data, LLC d/b/a IXO* v. *Dropbox, Inc.*, No. 6:15-cv-00465 (E.D. Texas), Dismissed Feb. 22, 2016.
*Realtime Data, LLC d/b/a IXO* v. *Echostar Corporation, et al.*, No. 6:15-cv-00466 (E.D. Texas), Consolidated with Case No. 12.
*Realtime Data, LLC d/b/a IXO* v. *Riverbed Technology, Inc., et al.*, No. 6:15-cv-00468 (E.D. Texas), Cosolidated with Case No. 12.
*Realtime Data, LLC d/b/a IXO* v. *BMC Software, Inc.*, No. 6:15-cv-00464 (E.D. Texas), Terminated Oct. 5, 2015.
*Realtime Data, LLC d/b/a IXO* v. *Oracle America, Inc., et al.*, No. 6:15-cv-00467 (E.D. Texas), Consolidated with Case No. 22.
*Realtime Data, LLC d/b/a IXO* v. *SAP America, Inc.m et al.*, No. 6:15-cv-00469 (E.D. Texas), Consolidated with Case No. 12.
*Realtime Data, LLC d/b/a IXO* v. *Teradata Corporation, et al.*, No. 5:16-cv-01836 (N.D. Cal.) (transferred from E.D. Texas; 6:15-cv-00470), Case dismissed May 18, 2016.
*Realtime Data, LLC d/b/a IXO* v. *Apple Inc.*, No. 3:16-cv-02595 (transferred from E.D. Texas; 6:15-cv-00885), Stayed pending inter partes review Mar. 27, 2017.
*Realtime Data LLC d/b/a IXO* v. *Hewlett Packard Enterprise Co., et al.*, No. 6:16-cv-00086 (E.D. Texas), Case Stayed Feb. 3, 2017.
*Realtime Data LLC d/b/a IXO* v. *Oracle America, Inc.*, No. 6:16-cv-00088 (E.D. Texas), Final Judgement all claims dismissed May 15, 2017.
*Realtime Data LLC d/b/a IXO* v. *CenturyLink, Inc., et al.*, No. 6:16-cv-00087 (E.D. Texas), Stayed pending inter partes review Mar. 1, 2017.
*Realtime Data LLC d/b/a IXO* v. *Dell, Inc., et al.*, No. 6:16-cv-00089 (E.D. Texas), Stayed pending inter partes review Feb. 7, 2017.
*Realtime Data LLC d/b/a IXO* v. *Teradata Operations, Inc.*, No. 2:16-cv-02743 (C.D. Cal.), Stayed pending inter partes review Feb. 25, 2017.
*Realtime Data LLC d/b/a IXO* v. *Rackspace US, Inc., et al.*, No. 6:16-cv-00961 (E.D. Texas), Final Judgement case dismissed Feb. 1, 2018.
*Realtime Data LLC d/b/a IXO* v. *Fujitsu America, Inc. et al.*, No. 6:16-cv-01035 (E.D. Texas), Transferred to N.D. California—Case No. 41.
*Realtime Data LLC d/b/a IXO* v. *Vembu Technologies, Inc.*, No. 6:16-cv-01037 (E.D. Texas), Consolidated with Case No. 26.
*Realtime Data LLC d/b/a IXO* v. *Oracle America, Inc.*, No. 6:17-cv-00046 (E.D. Texas), Final Judgment case dismissed May 8, 2017.
*Realtime Data LLC d/b/a IXO* v. *Echostar Corporation et al.*, No. 6:17-cv-00084 (E.D. Texas), Memorandum Opinion and Order Apr. 25, 2018.
*Realtime Data LLC d/b/a IXO* v. *Acronis, Inc.*, No. 6:17-cv-00118 (E.D. Texas), Final Judgment case dismissed Jun. 23, 2017.
*Realtime Data LLC d/b/a IXO* v. *Array Networks, Inc.*, No. 6:17-cv-00119 (E.D. Texas), Final Judgment case dismissed Jun. 23, 2017.
*Realtime Data LLC d/b/a IXO* v. *Barracuda Networks, Inc.*, No. 6:17-cv-00120 (E.D. Texas), Transferred to N.D. California—Case No. 63.
*Realtime Data LLC d/b/a IXO* v. *Carbonite, Inc. et al.*, No. 6:17-cv-00121 (E.D. Texas), Transferred to D. Mass—Case No. 67.
*Realtime Data LLC d/b/a IXO* v. *Circadence Corporation*, No. 6:17-cv-00122 (E.D. Texas), Final Judgement case dismissed May 25, 2018.
*Realtime Data LLC d/b/a IXO* v. *CommVault Systems, Inc. et al.*, No. 6:17-cv-00123 (E.D. Texas), Final Judgement case dismissed Jul. 13, 2017.
*Realtime Data LLC d/b/a IXO* v. *Exinda Inc.*, No. 6:17-cv-00124 (E.D. Texas), Final Judgement case dismissed May 25, 2018.
*Realtime Data LLC d/b/a IXO* v. *NETGEAR, Inc.*, No. 6:17-cv-00125 (E.D. Texas), Transferred to N.D. California—Case No. 60.
*Realtime Data LLC d/b/a IXO* v. *Synacor Inc.*, No. 6:17-cv-00126 (E.D. Texas), Memorandum Opinion Apr. 25, 2018.
*Realtime Data LLC d/b/a IXO* v. *Riverbed Technology, Inc.*, No. 6:17-cv-00198 (E.D. Texas), Final Judgement Case Dismissed Oct. 17, 2017.
*Realtime Data LLC* v. *Fujitsu America, Inc. et al.*, No. 3:17-cv-02109 (N.D. Cal.), Motion to stay granted Jul. 31, 2017.
*Realtime Data LLC* v. *Silver Peak Systems, Inc.*, No. 4:17-cv-02373 (N.D. Cal.), Motion to stay granted Jul. 10, 2017.
*Realtime Data LLC* v. *Riverbed Technology, Inc.*, No. 3:17-cv-03182 (N.D. Cal.), Case stayed Jan. 25, 2018.
*Realtime Data LLC d/b/a IXO* v. *Array Networks Inc.*, No. 1:17-cv-00800 (D. Del.), Answer to Complaint Jul. 14, 2017.
*Realtime Data LLC d/b/a IXO* v. *Barracuda Networks, Inc.*, No. 1:17-cv-00893 (D. Del.), Terminated Sep. 14, 2017.
*Realtime Data LLC d/b/a IXO* v. *CommVault Systems, Inc.*, No. 1:17-cv-00925 (D. Del.), Filed Jul. 10, 2017.
*Realtime Data LLC d/b/a IXO* v. *Acronis, Inc.*, No. 1:17-cv-11279 (D. Mass.), Preliminary Invalidity Contentions Dec. 4, 2017.
*Realtime Data LLC d/b/a IXO* v. *DISH Network Corporation et al.*, No. 6:17-cv-00421 (E.D. Texas), Final Judgement Case Dismissed Nov. 8, 2017.

(56) References Cited

OTHER PUBLICATIONS

*Realtime Data LLC d/b/a IXO* v. *Sling TV LLC et al.*, No. 1:17-cv-02097 (D. Colorado), Answer to Counterclaims Apr. 10, 2018.
*Realtime Adaptive Streaming LLC* v. *Amazon.com et al.*, No. 6:17-cv-00549 (E.D. Texas), Answer to Amended Complaint Dec. 15, 2017.
*Realtime Adaptive Streaming LLC* v. *EchoStar Technologies, LLC et al.*, No. 6:17-cv-00567 (E.D. Texas), Final judgement case dismissed Nov. 8, 2017.
*Realtime Adaptive Streaming LLC* v. *Hulu, LLC*, No. 2:17-ccv-07611 (C.D. California), Amended Complaint Dec. 29, 2017.
*Realtime Data LLC d/b/a IXO* v. *Code42 Software, Inc.*, No. 1:17-cv-02479 (D. Colorado), Joint Stipulation to Dismiss Jun. 25, 2018.
*Realtime Adaptive Streaming LLC* v. *Cisco Systems, Inc.*, No. 6:17-cv-00591 (E.D. Texas), Amended Complaint Nov. 30, 2017.
*Realtime Data LLC* v. *Nexenta Systems, Inc.*, No. 2:17-cv-07690 (C.D. California), Transferred to N.D. California—Case No. 68.
*Realtime Adaptive Streaming LLC* v. *Brightcove Inc. et al.*, No. 1:17-cv-01519 (D. Delaware), Amended Complaint Dec. 1, 2017.
*Realtime Adaptive Streaming LLC* v. *Haivision Network Video Inc. et al.*, No. 1:17-cv-01520 (D. Delaware), Second Amended Complaint Feb. 6, 2018.
*Realtime Data LLC d/b/a IXO* v. *Cohesity Inc.*, No. 1:17-cv-01543 (D. Delaware), Amended Complaint Dec. 12, 2017.
*Realtime Data LLC d/b/a IXO* v. *Pure Storage, Inc.*, No. 1:17-cv-01544 (D. Delaware), Amended Complaint Dec. 12, 2017.
*Realtime Data LLC* v. *Netgear Inc.*, No. 3:17-cv-06397 (N.D. California), Case Dismissed May 18, 2018.
*Realtime Adaptive Streaming LLC et al.* v. *Polycom, Inc.*, No. 1:17-cv-02692 (D. Colorado), Answer to Complaint Mar. 2, 2018.
*Realtime Data LLC d/b/a IXO* v. *Fortinet, Inc.*, No. 1:17-cv-01635 (D. Delaware), Filed Nov. 10, 2017.
*Realtime Data LLC d/b/a IXO* v. *Barracuda Networks, Inc.*, No. 3:17-cv-06701 (N.D. California), Case stayed Jan. 25, 2018.
*Realtime Adaptive Streaming LLC* v. *Apple Inc.*, No. 1:17-cv-02869 (D. Colorado), Answer and Counterclaims, Apr. 9, 2018.
*Realtime Data LLC d/b/a IXO* v. *Egnyte, Inc.*, No. 1:17-cv-01750 (D. Delaware), Answer and Counterclaims Jan. 30, 2018.
*Realtime Data LLC d/b/a IXO* v. *IXSystems Inc.*, No. 1:17-cv-01769 (D. Delaware), Filed Dec. 5, 2017.
*Realtime Data LLC d/b/a IXO* v. *Carbonite, Inc. et al.*, No. 1:17-cv-112499 (D. Mass), Transferred in Dec. 19, 2017.
*Realtime Data LLC* v. *Nexenta Systems, Inc.*, No. 3:18-cv-00574 (N.D. California), Amended Complaint Jun. 15, 2018.
*Realtime Adaptive Streaming LLC* v. *Adobe Systems Incorporated*, 1:18-cv-10355 (D. Mass), Closed without judgement Jun. 4, 2018.
*Realtime Adaptive Streaming LLC* v. *Samsung Electronics Co., Ltd. et al.*, 6:18-cv-00113 (E.D. Texas), Filed Mar. 9, 2018.
*Realtime Adaptive Streaming LLC* v. *Wowza Media Systems LLC*, 1:18-cv-00927 (D. Colorado), Filed Apr. 20, 2018.
*Realtime Data LLC d/b/a IXO* v. *Huawei Technologies, Co., Ltd. et al.*, 6:18-cv-00182 (E.D. Texas), Filed Apr. 27, 2018.
*Realtime Adaptive Streaming LLC* v. *Google LLC et al.*, 2:18-cv-03629 (C.D. California), Filed Apr. 30, 2018.
*Realtime Data LLC d/b/a IXO* v. *International Business Machines Corporation*, 6:18-cv-00188 (E.D. Texas), Filed Apr. 30, 2018.
*Realtime Data LLC d/b/a IXO* v. *Cloudera, Inc.*, 1:18-cv-00653 (D. Delaware), Filed Apr. 30, 2018.
*Realtime Adaptive Streaming LLC* v. *Avaya Inc.*, 1:18-cv-01046 (D. Colorado), Answer to Complaint Jul. 3, 2018.
*Realtime Adaptive Streaming LLC* v. *Broadcom Corporation et al.*, 1:18-cv-01048 (D. Colorado), Filed May 4, 2018.
*Realtime Adaptive Streaming LLC* v. *LG Electronics Inc. et al.*, 6:18-cv-00215 (E.D. Texas), Filed May 15, 2018.
*Realtime Adaptive Streaming LLC* v. *Advanced Micro Devices, Inc.*, 1:18-cv-01173 (D. Colorado), Filed May 15, 2018.
*Realtime Adaptive Streaming LLC* v. *Intel Corporation*, 1:18-cv-01175 (D. Colorado), Answer to complaint Jul. 3, 2018.
*Realtime Adaptive Streaming LLC* v. *Intel Corporation*, 1:18-cv-01177 (D. Colorado), Filed May 15, 2018.
*Realtime Adaptive Streaming LLC* v. *Cox Communications, Inc.*, 8:18-cv-00942 (C.D. California), Filed May 31, 2018.
*Realtime Adaptive Streaming LLC* v. *Charter Communications, Inc. et al.*, 1:18-cv-01345 (D. Colorado), Filed Jun. 1, 2018.
*Realtime Data LLC d/b/a IXO* v. *Facebook, Inc.*, 1:18-cv-01373 (D. Colorado), Filed Jun. 5, 2018.
*Realtime Adaptive Streaming, LLC* v. *Comcast Cable Communications, LLC d/b/a Xfinity et al.*, 1:18-cv-01446 (D. Colorado), Filed Jun. 11, 2018.
*Realtime Data LLC d/b/a IXO* v. *Riverbed Technology, Inc.*, 3:18-cv-03605 (N.D. California), Filed Jun. 15, 2018.
*Realtime Data LLC d/b/a IXO* v. *Synacor, Inc.*, 6:18-cv-00283 (E.D. Texas), Filed Jun. 19, 2018.
Second Amended Complaint, filed in *Realtime Data LLC d/b/a IXO* v. *Nexenta Systems, Inc.*, Case No. 3:18-cv-00574 (N.D. California), filed Jun. 15, 2018; 29 pages.
Defendate Avaya Inc.'s Answer, Affirmative Defenses, and Counterclaims to Plaintiff Realtime Adaptive Streaming LLC's Complaint, filed in *Realtime Adaptive Streaming LLC* v. *Avaya Inc.*, Case No. 1:18-cv-01046 (D. Colorado), filed Jul. 3, 2018; 21 pages.
Complaint for Patent Infringement, filed in *Realtime Adaptive Streaming LLC* v. *Comcast Cable Communications LLC et al.*, Case No. 1:18-cv-01446 (D. Colorado), filed Jun. 11, 2018; 46 pages.
Defendant Intel Corporation's Answer and Counterclaims to Complaint for Patent Infringement, filed in *Realtime Adaptive Streaming LLC* v. *Intel Corporation*, Case No. 1:18-cv-01175 (D. Colorado), filed Jul. 3, 2018; 20 pages.
Defendants Echostar Corporation's and Hughes Network Systems, LLC's Answer, Affirmative Defences, and Counterclaims to Plaintiff Realtime Data LLC's Second Amended Complaint, filed in *Realtime Data, LLC d/b/a IXO* v. *Echostar Corporation et al.*, Case No. 6:17-cv-00084 (E.D. Texas), filed Aug. 1, 2018; 47 pages.
Non-Final Office Action for U.S. Appl. No. 15/837,718, dated Jun. 21, 2018; 5 pages.
Final Written Decision filed in *Teradata Operations, Inc.* v. *Realtime Data LLC*, Case No. IPR2017-00557 (P.T.A.B.), filed Jun. 25, 2018; 74 pages.
Petition for Inter Partes Review of U.S. Pat. No. 9,762,907, filed in *Sony Corp. et al.* v. *Realtime Adaptive Streaming LLC*, Case No. IPR2018-01299 (P.T.A.B.), filed Jun. 28, 2018; 60 pages.
Declaration of Dr. Chandrait Bajaj, filed in *Sony Corp. et al.* v. *Realtime Adaptive Streaming LLC*, Case No. IPR2018-01299 (P.T.A.B.), filed Jun. 28, 2018; 46 pages.
Shi et al., "Image and Video Compression for Multimedia Engineering: Fundamentals, Algorithms, and Standards," CRC Press, 2000; 512 pages (submitted in 3 parts).
Dovstam, "Video Coding in H.26L," Royal Institute of Technology, Apr. 2000; 83 pages.
Girod et al., "Comparison of the H.263 and H.261 Video Compresson Standards," SPIE Proceedings vol. CR60, Standards and Common Interfaces for Video Information Systems, Oct. 25-26, 1905; 19 pages.
Westwater et al., "Real-Time Video Compression Techniques and Algorithms," Kluwer Academic Publishers, 1997; 170 pages.
Witten et al., "Arithmetic Coding for Data Compression," Communications of the ACM, vol. 30, No. 6, Jun. 1987; 21 pages.
"Information Technology—Generic Coding of Audio-Visual Objects Part 1: Systems," International Organization for Standardization, ISO/IEC 14496-1, May 15, 1998; 282 pages.
Provisional U.S. Appl. No. 60/157,468, filed Oct. 1, 1999; 24 pages.
Gao et al., "A Programmable Router Architecture Supporting Control Plane Extensibility," CMU-CS-0-109, Mar. 2000, 22 pages.
Petition for Inter Partes Review of U.S. Pat. No. 8,867,610, filed in *Sling TV LLC et al.* v. *Realtime Adaptive Streaming LLC*, Case No. IPR2018-01331 (P.T.A.B.), filed Jul. 3, 2018; 86 pages.
Declaration of Professor Scott T. Acton, Ph.D., filed in *Sling TV LLC et al.* v. *Realtime Adaptive Streaming LLC*, Case No. IPR2018-01331 (P.T.A.B.), filed Jul. 3, 2018; 86 pages.
Held, "Data Compression Techniques and Applications, Hardware and Software Considerations," Second Edition, John Wiley & Sons, 1987;125 pages.

(56) References Cited

OTHER PUBLICATIONS

Fahie, "A History of Electric Telegraphy, to the Year 1837," E & F.N. Spon, 1884; 595 pages (submitted in 2 parts).
"Mr Bain's Electric Printing Telegraph," Long Mecanics Mag, Journal of the Franklin Institute, vol. 8, No. 1, Jul. 1, 1944; 5 pages.
Shannon, "Communication Theory of Secrecy Systems," Bell System Technical Journal, Jul. 1948; 60 pages.
Tekalp, "Digital Video Processing," Prentice Hall Signal Processing Signals, 1995; 105 pages.
Bovik, "Handbook of Image & Vido Processing," Academic Press, 2000; 75 pages.
Taylor, "DVD Demystified," McGraw-Hill, 1998; 446 pges.
Petition for Inter Partes Review of U.S. Pat. No. 8,934,535, filed in *Sling TV LLC et al. v. Realtime Adaptive Streaming LLC*, Case No. IPR2018-01332 (P.T.A.B.), filed Jul. 3, 2018; 75 pages.
Declaration for Professor Scott T. Acton, Ph.D., filed in *Sling TV LLC et al. v. Realtime Adaptive Streaming LLC*, Case No. IPR2018-01332 (P.T.A.B.), filed Jul. 3, 2018; 158 pages.
Zhang et al., "Video Staging: A Proxy-Server-Based Approach to End-to-End Video Delivery over Wide-Area Networks," IEEE/ACM Transactions on Networking, vol. 8, No. 4, Aug. 2000; 14 pages.
"Information technology—Coding of moving pictures and associated audio for digital storage media at up to about 1.5 Mbit/s—Part 2: Video," International Standard ISO/IEC 11172-2, Nov. 1, 2003; 138 pages.
"Information Technology—Generic Coding of Moving Pictures and Associated Audio," International Organization for Standardization, ISO/IEC N0702, Mar. 25, 1994; 212 pages.
Gringeri et al., "Traffic Shaping, Bandwidth Allocation, and Quality Assessment for MPEG Video Distribution over Broadband Networks," IEEE Network, Nov. 1998; 14 pages.
Petition for Inter Partes Revied of U.S. Pat. No. 8,934,535, filed in *Sling TV LLC et al. v. Realtime Adaptive Streaming LLC*, Case No. IPR2018-01342 (P.T.A.B.), filed Jul. 3, 2018; 73 pages.
Declaration of Professor Scott T. Acton, Ph.D., filed in *Sling TV LLC et al. v. Realtime Adaptive Streaming LLC*, Case No. IPR2018-01342 (P.T.A.B.), filed Jul. 3, 2018; 159 pages.
Patent Owner's Preliminary Response, filed in *Acronis, Inc. v. Realtime Data LLC*, Case No. IPR2018-00703 (P.T.A.B.), filed Jul. 10, 2018; 67 pages.
Patent Owner's Preliminary Response, filed in *Acronis, Inc. v. Realtime Data LLC*, Case No. IPR2018-00706 (P.T.A.B.), filed Jul. 10, 2018; 50 pages.
Petition for Inter Partes Review, filed in *Cisco Systems, Inc. v. Realtime Adaptive Streaming, LLC*, Case No. IPR2018-01384 (P.T.A.B.), filed Jul. 12, 2018; 148 pages.
Declaration of Joseph P. Havlicek, Ph.D., filed in *Cisco Systems, Inc. v. Realtime Adaptive Streaming, LLC*, Case No. IPR2018-01384 (P.T.A.B.), filed Jul. 12, 2018; 148 pages.
Agi et al., "An Empirical Study of Secure MPEG Video Transmissions,"ISOC-SNDSS 1996, IEEE; 8 pages.
Shen, "A Study of Real-Time and Rate Scalable Image and Video Compression," Purdue University, Dec. 1997; 134 pages.
Shen et al., "Parallel Approaches to Real-Time MPEG Video Compression," Purdue University, 1996; 38 pages.
Garg, "Methods for Matching Compressed Video to ATM Networks," Indian Institute of Technology, Mar. 7, 1998; 11 pages.
Kolarov et al., "Low Complexity Real-Time Video Encoding for Soft Set-Top Box Platforms," NCTA, Technical Program of the Cable 2K Conference, May 2000; 10 pages.
Watkinson, The MPEG Handbook: MPEG-1, MPEG-2, MPEG-4, Focal Press, 2001; pp. 1-5, 20-21, 257-261, and 340-355.
IBM Dictionary of Computing, Tenth Edition, McGraw-Hill, Inc., Aug. 1993; pp. 268-269.
Morris, "MPEG-2: The Main Profile," Circuits and Systems Tutorials, IEEE Press, 1996; pp. 107-120.
Patent Owner's Preliminary Response, filed in *Unified Patent, Inc. v. Realtime Adaptive Streaming LLC*, Case No. IPR2018-00883 (P.T.A.B.), filed Jul. 12, 2018; 45 pages.

Decision Institution of Inter Partes Review, filed in *Pure Storage, Inc. v. Realtime Data LLC*, Case No. IPR2018-00549 (P.T.A.B.), filed Jul. 23, 2018; 34 pages.
Microsoft Press Computer Dictionary, Third Edition, Microsoft Corporation, 1997; p. 55.
Petition for Inter Partes Review, filed in *Sony Corporation et al. v. Realtime Adaptive Streaming LLC*, Case No. IPR2018-01413 (P.T.A.B.), filed Jul. 31, 2018; 71 pages.
Declaration of Dr. Chandrajit Bajaj, filed in *Sony Corporation et al. v. Realtime Adaptive Streaming LLC*, Case No. IPR2018-01413 (P.T.A.B.), filed Jul. 31, 2018; 51 pages.
Hoang, "Fast and Efficient Algorithms for Text and Video Compression," Brown University CS-97-06, May 1997; 188 pages.
Petition for Inter Partes Review, filed in *Sony Corporation et al. v. Realtime Adaptive Streaming LLC*, Case No. IPR2018-01439 (P.T.A.B.), filed Aug. 2, 2018; 69 pages.
Declaration of Dr. Chandrajit Bajaj, filed in *Sony Corporation et al. v. Realtime Adaptive Streaming LLC*, Case No. IPR2018-01439 (P.T.A.B.), filed Aug. 2, 2018; 58 pages.
Decision Denying Petitioner's Request filed in *Apple, Inc. v. Realtime Data LLC*, Case No. IPR2016-01737 (P.T.A.B.), filed Aug. 21, 2018; 5 pages.
Decision for Institution of Inter Pates Review, *EchoStar Corporation et al. v. Realtime Data LLC*, Case No. IPR2018-00612 (P.T.A.B.), filed Aug. 28, 2018; 22 pages.
Decision Instituting Inter Partes Review of U.S. Pat. No. 8,717,204 and Granting Motion for Joinder, filed in *Riverbed Technology, Inc. v. Realtime Data LLC*, Case No. IPR2018-00656 (P.T.A.B.), entered Aug. 30, 2018; 9 pages.
Second Amended Complaint for Patent Infringement Against Amazon.com, Inc., filed in *Realtime Adaptive Streaming LLC v. Amazon.com, Inc. et al.*, Case No. 6:17-cv-00549 (E.D. Texas), filed Sep. 4, 2018; 53 pages.
Second Amended Complaint for Patent Infringement against Cisco, filed in *Realtime Adaptive Streaming LLC v. Cisco Systems, Inc. et al.*, Case No. 6:17-cv-00591 (E.D. Texas), filed Sep. 4, 2018; 79 pages.
Order Denying Motions as Moot, filed in *Realtime Adaptive Streaming LLC v. Cisco Systems, Inc. et al.*, Case No. 6:17-cv-00591 (E.D. Texas), filed Sep. 5, 2018; 2 pages.
Order Staying Case, filed in *Realtime Adaptive Streaming LLC v. Cisco Systems, Inc. et al.*, Case No. 6:17-cv-00591 (E.D. Texas), filed Sep. 14, 2018; 1 page.
Realtime Data LLC d/b/a IXO's First Amended Answer and Counterclaims, filed in *Riverbed Technology, Inc. v. Realtime Data LLC d/b/a IXO*, Case No. 3:17-cv-03182 (N.D. California), filed Sep. 10, 2018; 35 pages.
Realtime's Notice of Voluntary Dismissal Without Prejudice, filed in *Realtime Data, LLC v. Riverbed Technology, Inc.*, Case No. 3:18-cv-03605 (N.D. California), filed Sep. 10, 2018; 2 pages.
Order, filed in *Realtime Adaptive Streaming LLC v. International Business Machine Corporation*, Case No. 3:18-cv-00188 (N.D. California), filed Sep. 10, 2018; 1 page.
Complaint filed in *Realtime Data, LLC, D/B/A IXO v. Scality, Inc.*, 1:18-cv-12188, Oct. 22, 2018, 35 pages.
Order filed in *Realtime Data LLC d/b/a IXO v. Echostar Corporation et al.*, No. 6:17-cv-00084 (E.D. Texas), filed Aug. 24, 2018; 3 pages.
Declaration of James A. Storer, Ph.D. filed in *Netflix Inc. v. Realtime Adaptive Streaming LLC*, IPR2018-01630, filed Sep. 24, 2018, 158 pages.
Intel Corporation 1994 Annual Report filed in *Netflix Inc. v. Realtime Adaptive Streaming LLC*, IPR2018-01630, filed Sep. 24, 2018, 36 pages.
Declaration of Sylvia D. Hall-Ellis, Ph.D filed in *Netflix Inc. v. Realtime Adaptive Streaming LLC*, IPR2018-01630, Sep. 24, 2018 130 pages.
Petition for Inter Partes Review filed in *Netflix Inc. v. Realtime Adaptive Streaming LLC*,IPR2018-01630, Sep. 24, 2018, 90 pages.
Complaint filed in *Realtime Data LLC, D/B/A IXO v. Zerto, Inc. et al.*, 1:18-cv-01491, Sep. 26, 2018, 33 pages.
First Amended Complaint filed in *Realtime Data LLC, D/B/A IXO v. Comcast et al.*, 1:18-cv-01446, filed Sep. 21, 2018, 61 pages.

(56) References Cited

OTHER PUBLICATIONS

Excerpt from Westwater. Real-Time Video Compression, 1997, filed in *Netflix Inc. v. Realtime Adaptive Streaming LLC*, IPR2018-01817, filed Sep. 28, 2018, 42 pages.
Excerpt from Spanias, Audio Signal Processing and Coding, 2007, filed in *Netflix Inc. v. Realtime Adaptive Streaming LLC*, IPR2018-01817, filed Sep. 28, 2018, 103 pages.
Jeremiah Golston, Comparing Media Codecs, 2004, filed in *Netflix Inc. v. Realtime Adaptive Streaming LLC*, IPR2018-01817, filed Sep. 28, 2018, 18 pages.
Complaint filed in *Realtime Data LLC, D/B/A IXO v. Hytrust, Inc.* 1:18-cv-01540, filed Oct. 4, 2018, 35 pages.
ITU-T recommendation H.263, 1998, filed in *Netflix Inc. v. Realtime Adaptive Streaming LLC*, IPR2018-01817, filed Sep. 28, 2018, 167 pages.
Salomon, A Guide to Data Compresion Methods, 2002, pp. 1-7, filed in *Netflix Inc. v. Realtime Adaptive Streaming LLC*, IPR2018-01817, filed Sep. 28, 2018, 13 pages.
Declaration of James A. Storer, Ph.D filed in *Netflix Inc. v. Realtime Adaptive Streaming LLC*, IPR2018-01817, filed Sep. 28, 2018, 149 pages.
Declaration of Sylvia D. Hall-Ellis, Ph.D filed in *Netflix Inc. v. Realtime Adaptive Streaming LLC*, IPR2018-01817, Oct. 9, 2018, 135 pages.
Petition for Inter Partes Review, files in *Netflix Inc. v. Realtime Adaptive Streaming LLC*,IPR2018-01817, Oct. 9, 2018, 71 pages.
Complaint filed in *Realtime Data, LLC, D/B/A IXO v. Hypergrid, Inc.*, 1:18-cv-01566, Oct. 11, 2018, 32 pages.
Complaint filed in *Realtime Data, LLC, D/B/A IXO v. Exagrid Systems, Inc.*, 1:18-cv-01544, Oct. 5, 2018, 34 pages.
Complaint filed in *Realtime Data, LLC, D/B/A IXO v. Sungard Availability Services, LP, et al.*, 1:18-cv-12227, Oct. 25, 2018, 30 pages.
Complaint filed in *Realtime Data, LLC, D/B/A IXO v. Infinite Io, Inc.*, 1:18-cv-01621, Oct. 18, 2018, 32 pages.
Joint Stipulation of Dismissal, filed in *Realtime Data, LLC, D/B/A IXO v. Apple, Inc.*, 16-cv-02595, Oct. 15, 2018, 32 pages.
Order Granting Stipulated Motion to Dismiss, filed in *Realtime Data, LLC, D/B/A IXO v. Facebook, Inc.*, 1:18-cv-01373, Oct. 15, 2018, 1 page.
MS Computer Dictionary, 1999, pp. 19 and 390, filed in *Netflix Inc. v. Realtime Adaptive Streaming LLC*, IPR2018-01817, filed Sep. 28, 2018, 2 pages.
Petition for Inter Partes Review, filed in *Netflix, Inc. v. Realtime Adaptive Streaming LLC*, Case No. IPR2019-00209 (P.T.A.B.), filed Nov. 11, 2018; 91 pages.
Hitachi Vantara Corporation's and Hitachi LTD.'s Answer to Complaint for Patent Infringement and Hitachi Ventara's Counterclaims, *Realtime Data, LLC d/b/a IXO v. Hitachi Vantara Corporation and Hitachi, LTD.*, Case No. 1-18-cv-01164 (D. Delaware), Filed Dec. 3, 2018, 15 pages.
Institution Decision, *Netflix, Inc. v. Realtime Data LLC*, Case No. IPR2018-01170 (P.T.A.B.), entered Dec. 3, 2018; 20 pages.
Report and Recommendation of United States Magistrate Judge, entered in *Realtime Adaptive Streaming v. Netflix, Inc., et al.*, Case No. 17-cv-01692 (D. Delaware) entered Dec. 12, 2018; 36 pages.
Report and Recommendation of United States Magistrate Judge, entered in *Realtime Adaptive Straming LLC v. Haivison Network Video, Inc.*, Case No. 1:17-cv-01520 (D. Delaware), entered Dec. 12, 2018; 27 pages.
Complaint for Patent Infringement, filed in *Realtime Data LLC d/b/a IXO v. Quest Software, Inc.*, Case No. 1:18-cv-01964 (D. Delaware), filed Dec. 12, 2018; 33 pages.
Complaint for Patent Infringement, filed in *Realtime Data LLC d/b/a IXO v. Solarwinds Worldwide, LLC.*, Case No. 1:18-cv-01995 (D. Delaware), filed Dec. 17, 2018; 32 pages.
Declaration of Storer, filed in *Netflix v. Realtime Adaptive Streaming LLC*, Case No. IPR2019-00209 (P.T.A.B.), filed Nov. 11, 2018, 172 pages.

* cited by examiner

Sector Map Definition

| Sector Map | |
|---|---|
| Type | 2 bits |
| C Type | 3 bits |
| C Info | 19 bits |
| Sector Count | 8 bits |
| LBA | 32 bits |

ASYMMETRIC DATA DECOMPRESSION SYSTEMS

CROSS-REFERENCE TO RELATED APPLICATIONS

This application is a continuation of U.S. patent application Ser. No. 14/876,276, filed on Oct. 6, 2015 (now U.S. Pat. No. 9,769,477), which is a continuation of U.S. patent application Ser. No. 14/733,565, filed on Jun. 8, 2015 (now U.S. Pat. No. 9,762,907), which is a continuation of U.S. patent application Ser. No. 14/577,286, filed on Dec. 19, 2014 (now abandoned), which is a continuation of U.S. patent application Ser. No. 14/134,933, filed on Dec. 19, 2013 (now U.S. Pat. No. 8,929,442), which is a continuation of U.S. patent application Ser. No. 14/033,245, filed on Sep. 20, 2013 (now U.S. Pat. No. 8,934,535), which is a continuation of U.S. patent application Ser. No. 13/154,239, filed on Jun. 6, 2011 (now U.S. Pat. No. 8,553,759), which is a continuation of U.S. patent application Ser. No. 12/123,081, filed on May 19, 2008 (now U.S. Pat. No. 8,073,047), which is a continuation of U.S. patent application Ser. No. 10/076,013, filed on Feb. 13, 2002 (now U.S. Pat. No. 7,386,046), which claims the benefit of U.S. Provisional Application No. 60/268,394, filed on Feb. 13, 2001, each of which is fully incorporated herein by reference.

BACKGROUND

1. Technical Field

The present invention relates generally to data compression and decompression and, in particular, to a system and method for compressing and decompressing data based on an actual or expected throughput (bandwidth) of a system that employs data compression. Additionally the present invention relates to the subsequent storage, retrieval, and management of information in data storage devices utilizing either compression and/or accelerated data storage and retrieval bandwidth.

2. Description of the Related Art

There are a variety of data compression algorithms that are currently available, both well-defined and novel. Many compression algorithms define one or more parameters that can be varied, either dynamically or a-priori, to change the performance characteristics of the algorithm. For example, with a typical dictionary based compression algorithm such as Lempel-Ziv, the size of the dictionary can affect the performance of the algorithm. Indeed, a large dictionary may be employed to yield very good compression ratios but the algorithm may take a long time to execute. If speed were more important than compression ratio, then the algorithm can be limited by selecting a smaller dictionary, thereby obtaining a much faster compression time, but at the possible cost of a lower compression ratio. The desired performance of a compression algorithm and the system in which the data compression is employed, will vary depending on the application.

Thus, one challenge in employing data compression for a given application or system is selecting one or more optimal compression algorithms from the variety of available algorithms. Indeed, the desired balance between speed and efficiency is typically a significant factor that is considered in determining which algorithm to employ for a given set of data. Algorithms that compress particularly well usually take longer to execute whereas algorithms that execute quickly usually do not compress particularly well.

Accordingly, a system and method that would provide dynamic modification of compression system parameters so as to provide an optimal balance between execution speed of the algorithm (compression rate) and the resulting compression ratio, is highly desirable.

Yet another problem within the current art is data storage and retrieval bandwidth limitations. Modern computers utilize a hierarchy of memory devices. In order to achieve maximum performance levels, modern processors utilize onboard memory and on board cache to obtain high bandwidth access to both program and data. Limitations in process technologies currently prohibit placing a sufficient quantity of onboard memory for most applications. Thus, in order to offer sufficient memory for the operating system(s), application programs, and user data, computers often use various forms of popular off-processor high speed memory including static random access memory (SRAM), synchronous dynamic random access memory (SDRAM), synchronous burst static ram (SBSRAM). Due to the prohibitive cost of the high-speed random access memory, coupled with their power volatility, a third lower level of the hierarchy exists for non-volatile mass storage devices. While mass storage devices offer increased capacity and fairly economical data storage, their data storage and retrieval bandwidth is often much less in relation to the other elements of a computing system.

Computers systems represent information in a variety of manners. Discrete information such as text and numbers are easily represented in digital data. This type of data representation is known as symbolic digital data. Symbolic digital data is thus an absolute representation of data such as a letter, figure, character, mark, machine code, or drawing.

Continuous information such as speech, music, audio, images and video, frequently exists in the natural world as analog information. As is well known to those skilled in the art, recent advances in very large scale integration (VLSI) digital computer technology have enabled both discrete and analog information to be represented with digital data. Continuous information represented as digital data is often referred to as diffuse data. Diffuse digital data is thus a representation of data that is of low information density and is typically not easily recognizable to humans in its native form.

Modern computers utilize digital data representation because of its inherent advantages. For example, digital data is more readily processed, stored, and transmitted due to its inherently high noise immunity. In addition, the inclusion of redundancy in digital data representation enables error detection and/or correction. Error detection and/or correction capabilities are dependent upon the amount and type of data redundancy, available error detection and correction processing, and extent of data corruption.

One outcome of digital data representation is the continuing need for increased capacity in data processing, storage, and transmittal. This is especially true for diffuse data where increases in fidelity and resolution create exponentially greater quantities of data. Data compression is widely used to reduce the amount of data required to process, transmit, or store a given quantity of information. In general, there are two types of data compression techniques that may be utilized either separately or jointly to encode/decode data: lossless and lossy data compression.

Over the last decade, computer processor performance has improved by at least a factor of 50. During this same period, magnetic disk storage has only improved by a factor of 5. Thus one additional problem with the existing art is that memory storage devices severely limit the performance of consumer, entertainment, office, workstation, servers, and mainframe computers for all disk and memory intensive operations.

For example, magnetic disk mass storage devices currently employed in a variety of home, business, and scientific computing applications suffer from significant seek-time access delays along with profound read/write data rate limitations. Currently the fastest available (15,000) rpm disk drives support only a 40.0 Megabyte per second data rate (MB/sec). This is in stark contrast to the modern Personal Computer's Peripheral Component Interconnect (PCI) Bus's input/output capability of 512 MB/sec and internal local bus capability of 1600 MB/sec.

Another problem within the current art is that emergent high performance disk interface standards such as the Small Computer Systems Interface (SCSI-3), iSCSI, Fibre Channel, AT Attachment UltraDMA/100+, Serial Storage Architecture, and Universal Serial Bus offer only higher data transfer rates through intermediate data buffering in random access memory. These interconnect strategies do not address the fundamental problem that all modern magnetic disk storage devices for the personal computer marketplace are still limited by the same typical physical media restriction. In practice, faster disk access data rates are only achieved by the high cost solution of simultaneously accessing multiple disk drives with a technique known within the art as data striping and redundant array of independent disks (RAID).

RAID systems often afford the user the benefit of increased data bandwidth for data storage and retrieval. By simultaneously accessing two or more disk drives, data bandwidth may be increased at a maximum rate that is linear and directly proportional to the number of disks employed. Thus another problem with modern data storage systems utilizing RAID systems is that a linear increase in data bandwidth requires a proportional number of added disk storage devices.

Another problem with most modern mass storage devices is their inherent unreliability. Many modern mass storage devices utilize rotating assemblies and other types of electromechanical components that possess failure rates one or more orders of magnitude higher than equivalent solid state devices. RAID systems employ data redundancy distributed across multiple disks to enhance data storage and retrieval reliability. In the simplest case, data may be explicitly repeated on multiple places on a single disk drive, on multiple places on two or more independent disk drives. More complex techniques are also employed that support various trade-offs between data bandwidth and data reliability.

Standard types of RAID systems currently available include RAID Levels 0, 1, and 5. The configuration selected depends on the goals to be achieved. Specifically data reliability, data validation, data storage/retrieval bandwidth, and cost all play a role in defining the appropriate RAID data storage solution. RAID level 0 entails pure data striping across multiple disk drives. This increases data bandwidth at best linearly with the number of disk drives utilized. Data reliability and validation capability are decreased. A failure of a single drive results in a complete loss of all data. Thus another problem with RAID systems is that low cost improved bandwidth requires a significant decrease in reliability.

RAID Level 1 utilizes disk mirroring where data is duplicated on an independent disk subsystem. Validation of data amongst the two independent drives is possible if the data is simultaneously accessed on both disks and subsequently compared. This tends to decrease data bandwidth from even that of a single comparable disk drive. In systems that offer hot swap capability, the failed drive is removed and a replacement drive is inserted. The data on the failed drive is then copied in the background while the entire system continues to operate in a performance degraded but fully operational mode. Once the data rebuild is complete, normal operation resumes. Hence, another problem with RAID systems is the high cost of increased reliability and associated decrease in performance.

RAID Level 5 employs disk data striping and parity error detection to increase both data bandwidth and reliability simultaneously. A minimum of three disk drives is required for this technique. In the event of a single disk drive failure, that drive may be rebuilt from parity and other data encoded on disk remaining disk drives. In systems that offer hot swap capability, the failed drive is removed and a replacement drive is inserted. The data on the failed drive is then rebuilt in the background while the entire system continues to operate in a performance degraded but fully operational mode. Once the data rebuild is complete, normal operation resumes.

Thus another problem with redundant modern mass storage devices is the degradation of data bandwidth when a storage device fails. Additional problems with bandwidth limitations and reliability similarly occur within the art by all other forms of sequential, pseudo-random, and random access mass storage devices. Typically mass storage devices include magnetic and optical tape, magnetic and optical disks, and various solid-state mass storage devices. It should be noted that the present invention applies to all forms and manners of memory devices including storage devices utilizing magnetic, optical, neural and chemical techniques or any combination thereof.

Yet another problem within the current art is the application and use of various data compression techniques. It is well known within the current art that data compression provides several unique benefits. First, data compression can reduce the time to transmit data by more efficiently utilizing low bandwidth data links. Second, data compression economizes on data storage and allows more information to be stored for a fixed memory size by representing information more efficiently.

For purposes of discussion, data compression is canonically divided into lossy and lossless techniques. Lossy data compression techniques provide for an inexact representation of the original uncompressed data such that the decoded (or reconstructed) data differs from the original unencoded/uncompressed data. Lossy data compression is also known as irreversible or noisy compression. Negentropy is defined as the quantity of information in a given set of data. Thus, one obvious advantage of lossy data compression is that the compression ratios can be larger than that dictated by the negentropy limit, all at the expense of information content. Many lossy data compression techniques seek to exploit various traits within the human senses to eliminate otherwise imperceptible data. For example, lossy data compression of visual imagery might seek to delete information content in excess of the display resolution or contrast ratio of the target display device.

On the other hand, lossless data compression techniques provide an exact representation of the original uncompressed data. Simply stated, the decoded (or reconstructed) data is identical to the original unencoded/uncompressed data. Lossless data compression is also known as reversible or noiseless compression. Thus, lossless data compression has, as its current limit, a minimum representation defined by the entropy of a given data set.

A rich and highly diverse set of lossless data compression and decompression algorithms exist within the current art. These range from the simplest "adhoc" approaches to highly sophisticated formalized techniques that span the sciences of information theory, statistics, and artificial intelligence. One fundamental problem with almost all modern approaches is the compression ratio to encoding and decoding speed achieved. As previously stated, the current theoretical limit for data compression is the entropy limit of the data set to be encoded. However, in practice, many factors actually limit the compression ratio achieved. Most modern compression algorithms are highly content dependent. Content dependency exceeds the actual statistics of individual elements and often includes a variety of other factors including their spatial location within the data set.

Of popular compression techniques, arithmetic coding possesses the highest degree of algorithmic effectiveness, and as expected, is the slowest to execute. This is followed in turn by dictionary compression, Huffman coding, and run-length coding with respectively decreasing execute times. What is not apparent from these algorithms, that is also one major deficiency within the current art, is knowledge of their algorithmic efficiency. More specifically, given a compression ratio that is within the effectiveness of multiple algorithms, the question arises as their corresponding efficiency.

Within the current art there also presently exists a strong inverse relationship between achieving the maximum (current) theoretical compression ratio, which we define as algorithmic effectiveness, and requisite processing time. For a given single algorithm the effectiveness over a broad class of data sets including text, graphics, databases, and executable object code is highly dependent upon the processing effort applied. Given a baseline data set, processor operating speed and target architecture, along with its associated supporting memory and peripheral set, we define algorithmic efficiency as the time required to achieve a given compression ratio. Algorithmic efficiency assumes that a given algorithm is implemented in an optimum object code representation executing from the optimum places in memory. This is almost never achieved in practice due to limitations within modern optimizing software compilers. It should be further noted that an optimum algorithmic implementation for a given input data set may not be optimum for a different data set. Much work remains in developing a comprehensive set of metrics for measuring data compression algorithmic performance, however for present purposes the previously defined terms of algorithmic effectiveness and efficiency should suffice.

Various solutions to this problem of optimizing algorithmic implementation are found in U.S. Pat. Nos. 6,195,024 and 6,309,424, issued on Feb. 27, 2001 and Oct. 30, 2001, respectively, to James Fallon, both of which are entitled "Content Independent Data Compression Method and System," and are incorporated herein by reference. These patents describe data compression methods that provide content-independent data compression, wherein an optimal compression ratio for an encoded stream can be achieved regardless of the data content of the input data stream. As more fully described in the above incorporated patents, a data compression protocol comprises applying an input data stream to each of a plurality of different encoders to, in effect, generate a plurality of encoded data streams. The plurality of encoders are preferably selected based on their ability to effectively encode different types of input data. The final compressed data stream is generated by selectively combining blocks of the compressed streams output from the plurality of encoders based on one or more factors such as the optimal compression ratios obtained by the plurality of decoders. The resulting compressed output stream can achieve the greatest possible compression, preferably in real-time, regardless of the data content.

Yet another problem within the current art relates to data management and the use of existing file management systems. Present computer operating systems utilize file management systems to store and retrieve information in a uniform, easily identifiable, format. Files are collections of executable programs and/or various data objects. Files occur in a wide variety of lengths and must be stored within a data storage device. Most storage devices, and in particular, mass storage devices, work most efficiently with specific quantities of data. For example, modern magnetic disks are often divided into cylinders, heads and sectors. This breakout arises from legacy electro-mechanical considerations with the format of an individual sector often some binary multiple of bytes (512, 1024, . . . ). A fixed or variable quantity of sectors housed on an individual track. The number of sectors permitted on a single track is limited by the number of reliable flux reversals that can be encoded on the storage media per linear inch, often referred to as linear bit density. In disk drives with multiple heads and disk media, a single cylinder is comprised of multiple tracks.

A file allocation table is often used to organize both used and unused space on a mass storage device. Since a file often comprises more than one sector of data, and individual sectors or contiguous strings of sectors may be widely dispersed over multiple tracks and cylinders, a file allocation table provides a methodology of retrieving a file or portion thereof. File allocation tables are usually comprised of strings of pointers or indices that identify where various portions of a file are stored.

In-order to provide greater flexibility in the management of disk storage at the media side of the interface, logical block addresses have been substituted for legacy cylinder, head, sector addressing. This permits the individual disk to optimize its mapping from the logical address space to the physical sectors on the disk drive. Advantages with this technique include faster disk accesses by allowing the disk manufacturer greater flexibility in managing data interleaves and other high-speed access techniques. In addition, the replacement of bad media sectors can take place at the physical level and need not be the concern of the file allocation table or host computer. Furthermore, these bad sector replacement maps are definable on a disk by disk basis.

Practical limitations in the size of the data required to both represent and process an individual data block address, along with the size of individual data blocks, governs the type of file allocation tables currently in use. For example, a 4096 byte logical block size (8 sectors) employed with 32 bit logical block addresses. This yields an addressable data space of 17.59 Terabytes. Smaller logical blocks permit more efficient use of disk space. Larger logical blocks support a larger addressable data space. Thus one limitation within the current art is that disk file allocation tables and associated file management systems are a compromise between efficient data storage, access speed, and addressable data space.

Data in a computer has various levels of information content. Even within a single file, many data types and formats are utilized. Each data representation has specific meaning and each may hold differing quantities of information. Within the current art, computers process data in a native, uncompressed, format. Thus compressed data must often be decompressed prior to performing various data processing functions or operations. Modern file systems have been designed to work with data in its native format. Thus another significant problem within the current art is that file systems are not able to randomly access compressed data in an efficient manner.

Further aggravating this problem is the fact that when data is decompressed, processed and recompressed it may not fit back into its original disk space, causing disk fragmentation or complex disk space reallocation requirements. Several solutions exist within the current art including file by file and block structured compressed data management.

In file by file compression, each file is compressed when stored on disk and decompressed when retrieved. For very small files this technique is often adequate, however for larger files the compression and decompression times are too slow, resulting in inadequate system level performance. In addition, the ability to access randomly access data within a specific file is lost. The one advantage to file by file compression techniques is that they are easy to develop and are compatible with existing file systems. Thus file by file compressed data management is not an adequate solution.

Block structured disk compression operates by compressing and decompressing fixed block sizes of data. Block sizes are often fixed, but may be variable in size. A single file usually is comprised of multiple blocks, however a file may be so small as to fit within a single block. Blocks are grouped together and stored in one or more disk sectors as a group of Blocks (GOBs). A group of blocks is compressed and decompressed as a unit, thus there exists practical limitations on the size of GOBs. Most compression algorithms achieve a higher level of algorithmic effectiveness when operating on larger quantities of data. Restated, the larger the quantity of data processed with a uniform information density, the higher the compressions ratio achieved. If GOBs are small compression ratios are low and processing time short. Conversely, when GOBS are large compression ratios are higher and processing time is longer. Large GOBs tend to perform in a manner analogous to file by file compression. The two obvious benefits to block structured disk compression are pseudo-random data access and reduced data compression/decompression processing time.

Several problems exist within the current art for the management of compressed blocks. One method for storage of compressed files on disk is by contiguously storing all GOBs corresponding to a single file. However as files are processed within the computers, files may grow or shrink in size. Inefficient disk storage results when a substantial file size reduction occurs. Conversely when a file grows substantially, the additional space required to store the data may not be available contiguously. The result of this process is substantial disk fragmentation and slower access times.

An alternate method is to map compressed GOBs into the next logical free space on the disk. One problem with this method is that average file access times are substantially increased by this technique due to the random data storage. Peak access delays may be reduced since the statistics behave with a more uniform white spectral density, however this is not guaranteed.

A further layer of complexity is encountered when compressed information is to be managed on more than one data storage device. Competing requirements of data access bandwidth, data reliability/redundancy, and efficiency of storage space are encountered.

These and other limitations within the current art are solved with the present invention.

SUMMARY OF THE INVENTION

The present invention is directed to a system and method for compressing and decompressing based on the actual or expected throughput (bandwidth) of a system employing data compression and a technique of optimizing based upon planned, expected, predicted, or actual usage.

In one aspect of the present invention, a system for providing bandwidth sensitive data compression comprises:
a data compression system for compressing and decompressing data input to the system;
a plurality of compression routines selectively utilized by the data compression system; and
a controller for tracking the throughput of the system and generating a control signal to select a compression routine based on the system throughput. In a preferred embodiment, when the controller determines that the system throughput falls below a predetermined throughput threshold, the controller commands the data compression engine to use a compression routine providing a faster rate of compression so as to increase the throughput.

In another aspect, a system for providing bandwidth sensitive data compression comprises a plurality of access profiles, operatively accessible by the controller that enables the controller to determine a compression routine that is associated with a data type of the data to be compressed. The access profiles comprise information that enables the controller to select a suitable compression algorithm that provides a desired balance between execution speed (rate of compression) and efficiency (compression ratio).

In yet another aspect, a system comprises a data storage controller for controlling the compression and storage of compressed data to a storage device and the retrieval and decompression of compressed data from the storage device. The system throughput tracked by the controller preferably comprises a number of pending access requests to a storage device.

In another aspect, the system comprises a data transmission controller for controlling the compression and transmission of compressed data, as well as the decompression of compressed data received over a communication channel. The system throughput tracked by the controller comprises a number of pending transmission requests over the communication channel.

In yet another aspect of the present invention, a method for providing bandwidth sensitive data compression in a data processing system, comprises the steps of:
compressing data using an first compression routine providing a first compression rate;
tracking the throughput of the data processing system to determine if the first compression rate provides a throughput that meets a predetermined throughput threshold; and
compressing data using a second compression routine providing a second compression rate that is greater than the first compression rate, if the tracked throughput does not meet the predetermined throughput threshold.

Preferably, the first compression routine comprises a default asymmetric routine and wherein the second compression routine comprises a symmetric routine.

In another aspect, the method comprises processing a user command to load a user-selected compression routine for compressing data.

In another aspect, the method further comprises processing a user command to compress user-provided data and automatically selecting a compression routine associated with a data type of the user-provided data.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

Figure 1:
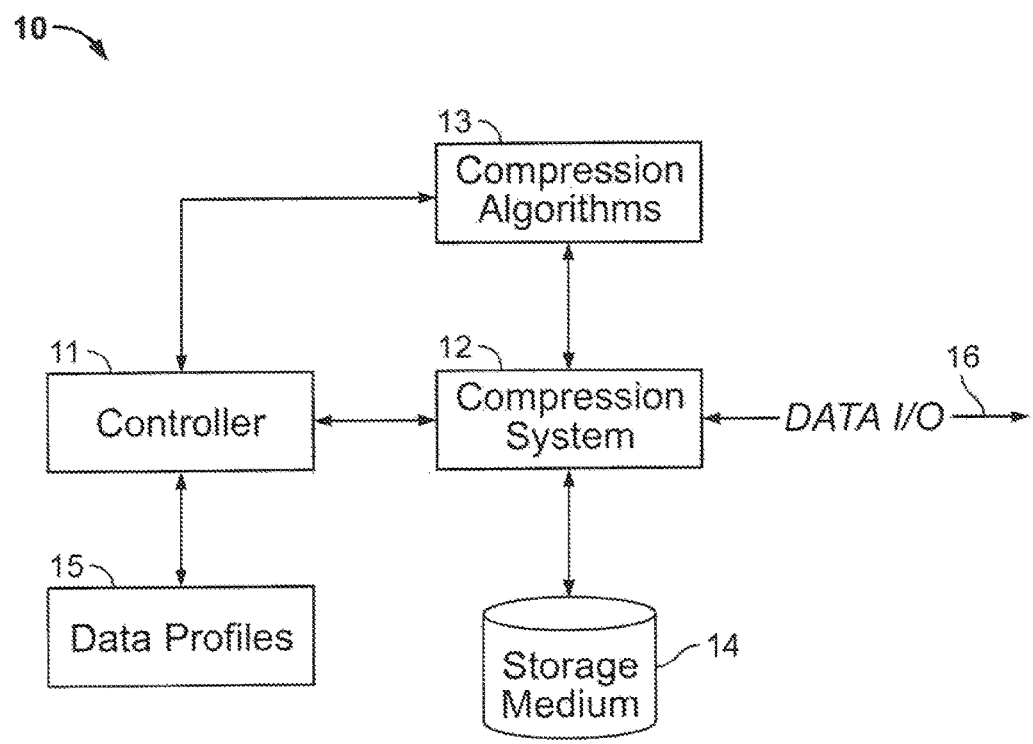
FIG. 1 is a high-level block diagram of a system for providing bandwidth sensitive data compression/decompression according to an embodiment of the present invention.

The present invention is directed to a system and method for compressing and decompressing based on the actual or expected throughput (bandwidth) of a system employing data compression. Although one of ordinary skill in the art could readily envision various implementations for the present invention, a preferred system in which this invention is employed comprises a data storage controller that preferably utilizes a real-time data compression system to provide "accelerated" data storage and retrieval bandwidths. The concept of "accelerated" data storage and retrieval was introduced in U.S. patent application Ser. No. 09/266,394, filed Mar. 11, 1999, entitled "System and Methods For Accelerated Data Storage and Retrieval," now U.S. Pat. No. 6,601,104, and U.S. patent application Ser. No. 09/481,243, filed Jan. 11, 2000, entitled "System and Methods For Accelerated Data Storage and Retrieval," now U.S. Pat. No. 6,604,158, both of which are commonly assigned and incorporated herein by reference.

In general, as described in the above-incorporated applications, "accelerated" data storage comprises receiving a digital data stream at a data transmission rate which is greater than the data storage rate of a target storage device, compressing the input stream at a compression rate that increases the effective data storage rate of the target storage device and storing the compressed data in the target storage device. For instance, assume that a mass storage device (such as a hard disk) has a data storage rate of 20 megabytes per second. If a storage controller for the mass storage device is capable of compressing (in real time) an input data stream with an average compression rate of 3:1, then data can be stored in the mass storage device at a rate of 60 megabytes per second, thereby effectively increasing the storage bandwidth ("storewidth") of the mass storage device by a factor of three. Similarly, accelerated data retrieval comprises retrieving a compressed digital data stream from a target storage device at the rate equal to, e.g., the data access rate of the target storage device and then decompressing the compressed data at a rate that increases the effective data access rate of the target storage device. Advantageously, providing accelerated data storage and retrieval at (or close to) real-time can reduce or eliminate traditional bottlenecks associated with, e.g., local and network disk accesses.

In a preferred embodiment, the present invention is implemented for providing accelerated data storage and retrieval. In one embodiment, a controller tracks and monitors the throughput (data storage and retrieval) of a data compression system and generates control signals to enable/disable different compression algorithms when, e.g., a bottleneck occurs so as to increase the throughput and eliminate the bottleneck.

In the following description of preferred embodiments, two categories of compression algorithms are defined—an "asymmetrical" data compression algorithm and a "symmetrical" data compression algorithms. An asymmetrical data compression algorithm is referred to herein as one in which the execution time for the compression and decompression routines differ significantly. In particular, with an asymmetrical algorithm, either the compression routine is slow and the decompression routine is fast or the compression routine is fast and the decompression routine is slow. Examples of asymmetrical compression algorithms include dictionary-based compression schemes such as Lempel-Ziv.

On the other hand, a "symmetrical" data compression algorithm is referred to herein as one in which the execution time for the compression and the decompression routines are substantially similar. Examples of symmetrical algorithms include table-based compression schemes such as Huffman. For asymmetrical algorithms, the total execution time to perform one compress and one decompress of a data set is typically greater than the total execution time of symmetrical algorithms. But an asymmetrical algorithm typically achieves higher compression ratios than a symmetrical algorithm.

It is to be appreciated that in accordance with the present invention, symmetry may be defined in terms of overall effective bandwidth, compression ratio, or time or any combination thereof. In particular, in instances of frequent data read/writes, bandwidth is the optimal parameter for symmetry. In asymmetric applications such as operating systems and programs, the governing factor is net decompression bandwidth, which is a function of both compression speed, which governs data retrieval time, and decompression speed, wherein the total governs the net effective data read bandwidth. These factors work in an analogous manner for data storage where the governing factors are both compression ratio (storage time) and compression speed. The present invention applies to any combination or subset thereof, which is utilized to optimize overall bandwidth, storage space, or any operating point in between.

Referring now to FIG. 1, a high-level block diagram illustrates a system for providing bandwidth sensitive data compression/decompression according to an embodiment of the present invention. In particular, FIG. 1 depicts a host system 10 comprising a controller 11 (e.g., a file management system), a compression/decompression (or data compression) system 12, a plurality of compression algorithms 13, a storage medium 14, and a plurality of data profiles 15. The controller tracks and monitors the throughput (e.g., data storage and retrieval) of the data compression system 12 and generates control signals to enable/disable different compression algorithms 13 when the throughput falls below a predetermined threshold. In one embodiment, the system throughput that is tracked by the controller 11 preferably comprises a number of pending access requests to the memory system.

The data compression system 12 is operatively connected to the storage medium 14 using suitable protocols to write and read compressed data to and from the storage medium 14. It is to be understood that the storage medium 14 may comprise any form of memory device including all forms of sequential, pseudo-random, and random access storage devices. The storage medium 14 may be volatile or non-volatile in nature, or any combination thereof. Storage medium as known within the current art include all forms of random access memory, magnetic and optical tape, magnetic and optical disks, along with various other forms of solid-state mass storage media. Thus it should be noted that the current invention applies to all forms and manners of storage media including, but not limited to, storage mediums utilizing magnetic, optical, and chemical techniques, or any combination thereof. The data compression system 12 preferably operates in real-time (or substantially real-time) to compress data to be stored on the storage medium 14 and to decompress data that is retrieved from the storage medium 14. The data compression system 12 may maintain the compressed data to be stored on the storage medium 14 and the decompressed data that is retrieved from the storage medium 14 for subsequent data processing, storage, or transmittal. In addition, the data compression system 12 may receive data (compressed or not compressed) via an I/O (input/output) port 16 that is transmitted over a transmission line or communication channel from a remote location, and then process such data (e.g., decompress or compress the data). The data compression system 12 may further transmit data (compressed or decompressed) via the I/O port 16 to another network device for remote processing or storage.

The controller 11 utilizes information comprising a plurality of data profiles 15 to determine which compression algorithms 13 should be used by the data compression system 12. In a preferred embodiment, the compression algorithms 13 comprise one or more asymmetric algorithms. As noted above, with asymmetric algorithms, the compression ratio is typically greater than the compression ratios obtained using symmetrical algorithms. Preferably, a plurality of asymmetric algorithms are selected to provide one or more asymmetric algorithms comprising a slow compress and fast decompress routine, as well as one or more asymmetric algorithms comprising a fast compress and slow decompress routine.

The compression algorithms 13 further comprise one or more symmetric algorithms, each having a compression rate and corresponding decompression rate that is substantially equal. Preferably, a plurality of symmetric algorithms are selected to provide a desired range of compression and decompression rates for data to be processed by a symmetric algorithm.

In a preferred embodiment, the overall throughput (bandwidth) of the host system 10 is one factor considered by the controller 11 in deciding whether to use an asymmetrical or symmetrical compression algorithm for processing data stored to, and retrieved from, the storage medium 14. Another factor that is used to determine the compression algorithm is the type of data to be processed. In a preferred embodiment, the data profiles 15 comprise information regarding predetermined access profiles of different data sets, which enables the controller 11 to select a suitable compression algorithm based on the data type. For instance, the data profiles may comprise a map that associates different data types (based on, e.g., a file extension) with preferred one(s) of the compression algorithms 13. For example, preferred access profiles considered by the controller 11 are set forth in the following table.

| Access Profile 1: | Access Profile 2 | Access Profile 3 |
|---|---|---|
| Data is written to a storage medium once (or very few times) but is read from the storage medium many times | Data is written to the storage medium often but read few Times | The amount of times data is read from and written to the storage medium is substantially the same. |

With Access Profile 1, the decompression routine would be executed significantly more times than the corresponding compression routine. This is typical with operating systems, applications and websites, for example. Indeed, an asymmetrical application can be used to (offline) compress an (OS) operating system, application or Website using a slow compression routine to achieve a high compression ratio. After the compressed OS, application or website is stored, the asymmetric algorithm is then used during runtime to decompress, at a significant rate, the OS, application or website launched or accessed by a user.

Therefore, with data sets falling within Access Profile 1, it is preferable to utilize an asymmetrical algorithm that provides a slow compression routine and a fast decompression routine so as to provide an increase in the overall system performance as compared the performance that would be obtained using a symmetrical algorithm. Further, the compression ratio obtained using the asymmetrical algorithm would likely be higher than that obtained using a symmetrical algorithm (thus effectively increasing the storage capacity of the storage device).

With Access Profile 2, the compression routine would be executed significantly more times than the decompression routine. This is typical with a system for automatically updating an inventory database, for example, wherein an asymmetric algorithm that provides a fast compression routine and a slow decompression routine would provide an overall faster (higher throughput) and efficient (higher compression ratio) system performance than would be obtained using a symmetrical algorithm.

With Access Profile 3, where data is accessed with a similar number of reads and writes, the compression routine would be executed approximately the same number of times as the decompression routine. This is typical of most user-generated data such as documents and spreadsheets. Therefore, it is preferable to utilize a symmetrical algorithm that provides a relatively fast compression and decompression routine. This would result in an overall system performance that would be faster as compared to using an asymmetrical algorithm (although the compression ratio achieved may be lower).

The following table summarizes the three data access profiles and the type of compression algorithm that would produce optimum throughput.

| Access Profile | Example Data Types | Compression Algorithm | Compressed Data Characteristics | Decompression Algorithm |
|---|---|---|---|---|
| 1. Write few, Read many | Operating systems, Programs, Web sites | Asymmetrical (Slow compress) | Very high compression ratio | Asymmetrical (Fast decompress) |

| Access Profile | Example Data Types | Compression Algorithm | Compressed Data Characteristics | Decompression Algorithm |
|---|---|---|---|---|
| 2. Write many, Read few | Automatically updated inventory database | Asymmetrical (Fast compress) | Very high compression ratio | Asymmetrical (Slow decompress) |
| 3. Similar number of Reads and Writes | User generated documents | Symmetrical | Standard compression ratio | Symmetrical |

In accordance with the present invention, the access profile of a given data set is known a priori or determined prior to compression so that the optimum category of compression algorithm can be selected. As explained below, the selection process may be performed either manually or automatically by the controller 11 of the data compression system 12. Further, the decision regarding which routines will be used at compression time (write) and at decompression time (read) is preferably made before or at the time of compression. This is because once data is compressed using a certain algorithm, only the matching decompression routine can be used to decompress the data, regardless of how much processing time is available at the time of decompression.

Figure 2:
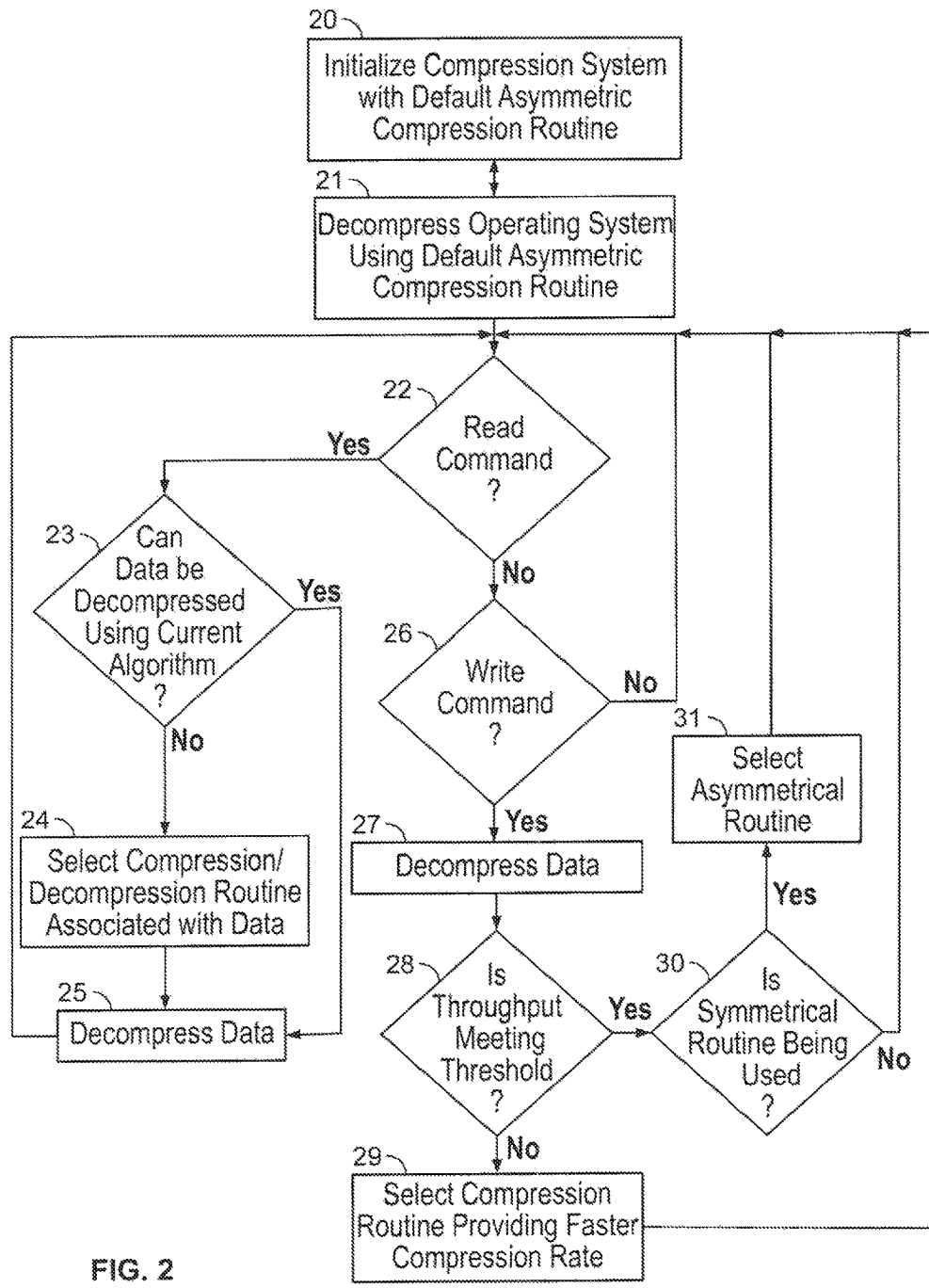
FIG. 2 is a flow diagram of a method for providing bandwidth sensitive data compression/decompression according to one aspect of the present invention.

Referring now to FIG. 2, a flow diagram illustrates a method for providing bandwidth sensitive data compression according to one aspect of the present invention. For purposes of illustration, it is assumed that the method depicted in FIG. 2 is implemented with a disk controller for providing accelerated data storage and retrieval from a hard disk on a PC (personal computer). The data compression system is initialized during a boot-up process after the PC is powered-on and a default compression/decompression routine is instantiated (step 20).

In a preferred embodiment, the default algorithm comprises an asymmetrical algorithm since an operating system and application programs will be read from hard disk memory and decompressed during the initial use of the host system 10. Indeed, as discussed above, an asymmetric algorithm that provides slow compression and fast decompression is preferable for compressing operating systems and applications so as to obtain a high compression ratio (to effectively increase the storage capacity of the hard disk) and fast data access (to effectively increase the retrieval rate from the hard disk). The initial asymmetric routine that is applied (by, e.g., a vendor) to compress the operating system and applications is preferably set as the default. The operating system will be retrieved and then decompressed using the default asymmetric routine (step 21).

During initial runtime, the controller will maintain use the default algorithm until certain conditions are met. For instance, if a read command is received (affirmative result in step 22), the controller will determine whether the data to be read from disk can be compressed using the current routine (step 23). For this determination, the controller could, e.g., read a flag value that indicates the algorithm that was used to compress the file. If the data can be decompressed using the current algorithm (affirmative determination in step 23), then the file will be retrieved and decompressed (step 25). On the other hand, if the data cannot be decompressed using the current algorithm (negative determination in step 23), the controller will issue the appropriate control signal to the compression system to load the algorithm associated with the file (step 24) and, subsequently, decompress the file (step 25).

If a write command is received (affirmative result in step 26), the data to be stored will be compressed using the current algorithm (step 27). During the process of compression and storing the compressed data, the controller will track the throughput to determine whether the throughput is meeting a predetermined threshold (step 28). For example, the controller may track the number of pending disk accesses (access requests) to determine whether a bottleneck is occurring. If the throughput of the system is not meeting the desired threshold (e.g., the compression system cannot maintain the required or requested data rates)(negative determination in step 28), then the controller will command the data compression system to utilize a compression routine providing faster compression (e.g., a fast symmetric compression algorithm) (step 29) so as to mitigate or eliminate the bottleneck.

If, on the other hand, the system throughput is meeting or exceeding the threshold (affirmative determination in step 28) and the current algorithm being used is a symmetrical routine (affirmative determination in step 30), in an effort to achieve optimal compression ratios, the controller will command the data compression system to use an asymmetric compression algorithm (step 31) that may provide a slower rate of compression, but provide efficient compression.

This process is repeated such that whenever the controller determines that the compression system can maintain the required/requested data throughput using a slow (highly efficient) asymmetrical compression algorithm, the controller will allow the compression system to operate in the asymmetrical mode. This will allow the system to obtain maximum storage capacity on the disk. Further, the controller will command the compression system to use a symmetric routine comprising a fast compression routine when the desired throughput is not met. This will allow the system to, e.g., service the backlogged disk accesses. Then, when the controller determines that the required/requested data rates are subsequently lower and the compression system can maintain the data rate, the controller can command the compression system to use a slower (but more efficient) asymmetric compression algorithm.

With the above-described method depicted in FIG. 2, the selection of the compression routine is performed automatically by the controller so as to optimize system throughput. In another embodiment, a user that desires to install a program or text files, for example, can command the system (via a software utility) to utilize a desired compression routine for compressing and storing the compressed program or files to disk. For example, for a power user, a GUI menu can be displayed that allows the user to directly select a given algorithm. Alternatively, the system can detect the type of data being installed or stored to disk (via file extension, etc.) and automatically select an appropriate algorithm using the Access Profile information as described above. For instance, the user could indicate to the controller that the data being installed comprises an application program which the controller would determine falls under Access Profile 1. The controller would then command the compression engine to utilize an asymmetric compression algorithm employing a slow compression routine and a fast decompression routine. The result would be a one-time penalty during program installation (slow compression), but with fast access to the data on all subsequent executions (reads) of the program, as well as a high compression ratio.

It is to be appreciated that the present invention may be implemented in any data processing system, device, or apparatus using data compression. For instance, the present invention may be employed in a data transmission controller in a network environment to provide accelerated data transmission over a communication channel (i.e., effectively increase the transmission bandwidth by compressing the data at the source and decompressing data at the receiver, in real-time).

Further, the present invention can be implemented with a data storage controller utilizing data compression and decompression to provided accelerated data storage and retrieval from a mass storage device. Exemplary embodiments of preferred data storage controllers in which the present invention may be implemented are described, for example, in U.S. patent application Ser. No. 09/775,905, filed on Feb. 2, 2001, entitled "Data Storewidth Accelerator", now U.S. Pat. No. 6,748,457, which is commonly assigned and fully incorporated herein by reference.

Figure 3:
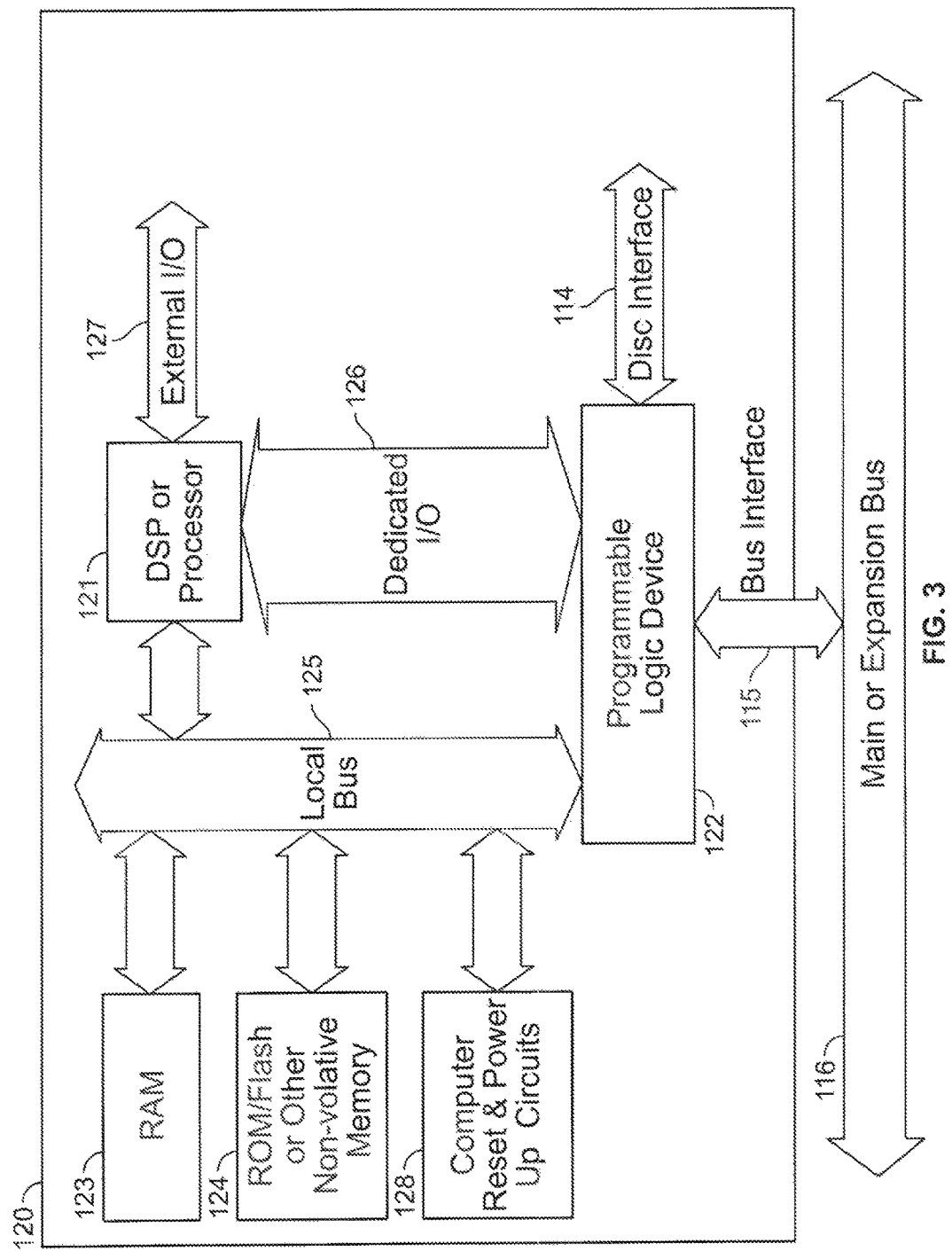
FIG. 3 is a block diagram of a preferred system for implementing a bandwidth sensitive data compression/decompression method according to an embodiment of the present invention.

FIG. 3 illustrates a preferred embodiment of a data storage controller 120 as described in the above-incorporated U.S. Ser. No. 09/775,905, now U.S. Pat. No. 6,748,457, for implementing a bandwidth sensitive data compression protocol as described herein. The data storage controller 120 comprises a DSP (digital signal processor) 121 (or any other micro-processor device) that implements a data compression/decompression routine. The DSP 121 preferably employs a plurality of symmetric and asymmetric compression/decompression as described herein. The data storage controller 120 further comprises at least one programmable logic device 122 (or volatile logic device). The programmable logic device 122 preferably implements the logic (program code) for instantiating and driving both a disk interface 114 and a bus interface 115 and for providing full DMA (direct memory access) capability for the disk and bus interfaces 114, 115. Further, upon host computer power-up and/or assertion of a system-level "reset" (e.g., PCI Bus reset), the DSP 121 initializes and programs the programmable logic device 122 before of the completion of initialization of the host computer. This advantageously allows the data storage controller 120 to be ready to accept and process commands from the host computer (via the bus 116) and retrieve boot data from the disk (assuming the data storage controller 120 is implemented as the boot device and the The data storage controller 120 further comprises a plurality of memory devices including a RAM (random access memory) device 123 and a ROM (read only memory) device 124 (or FLASH memory or other types of non-volatile memory). The RAM device 123 is utilized as on-board cache and is preferably implemented as SDRAM. The ROM device 124 is utilized for non-volatile storage of logic code associated with the DSP 121 and configuration data used by the DSP 121 to program the programmable logic device 122.

The DSP 121 is operatively connected to the memory devices 123, 124 and the programmable logic device 122 via a local bus 125. The DSP 121 is also operatively connected to the programmable logic device 122 via an independent control bus 126. The programmable logic device 122 provides data flow control between the DSP 121 and the host computer system attached to the bus 116, as well as data flow control between the DSP 121 and the storage device. A plurality of external I/O ports 127 are included for data transmission and/or loading of one or more programmable logic devices. Preferably, the disk interface 114 driven by the programmable logic device 122 supports a plurality of hard drives.

The storage controller 120 further comprises computer reset and power up circuitry 128 (or "boot configuration circuit") for controlling initialization (either cold or warm boots) of the host computer system and storage controller 120. A preferred boot configuration circuit and preferred computer initialization systems and protocols are described in U.S. patent application Ser. No. 09/775,897, filed on Feb. 2, 2001, entitled "System and Methods For Computer Initialization," published as U.S. Patent Publication No. US 2001-0047473 A1, now abandoned, which is commonly assigned and incorporated herein by reference. Preferably, the boot configuration circuit 128 is employed for controlling the initializing and programming the programmable logic device 122 during configuration of the host computer system (i.e., while the CPU of the host is held in reset). The boot configuration circuit 128 ensures that the programmable logic device 122 (and possibly other volatile or partially volatile logic devices) is initialized and programmed before the bus 116 (such as a PCI bus) is fully reset. In particular, when power is first applied to the boot configuration circuit 128, the boot configuration circuit 28 generates a control signal to reset the local system (e.g., storage controller 120) devices such as a DSP, memory, and I/O interfaces. Once the local system is powered-up and reset, the controlling device (such as the DSP 121) will then proceed to automatically determine the system environment and configure the local system to work within that environment. By way of example, the DSP 121 of the disk storage controller 120 would sense that the data storage controller 120 is on a PCI computer bus (expansion bus) and has attached to it a hard disk on an IDE interface. The DSP 121 would then load the appropriate PCI and IDE interfaces into the programmable logic device 122 prior to completion of the host system reset. Once the programmable logic device 122 is configured for its environment, the boot device controller is reset and ready to accept commands over the computer/expansion bus 116.

It is to be understood that the data storage controller 120 may be utilized as a controller for transmitting data (compressed or uncompressed) to and from remote locations over the DSP I/O ports 127 or bus 116, for example. Indeed, the I/O ports 127 of the DSP 121 may be used for transmitting data (compressed or uncompressed) that is either retrieved from the disk or received from the host system via the bus 116, to remote locations for processing and/or storage. Indeed, the I/O ports 127 may be operatively connected to other data storage controllers or to a network communication channels. Likewise, the data storage controller 120 may receive data (compressed or uncompressed) over the I/O ports 127 of the DSP 121 from remote systems that are connected to the I/O ports 127 of the DSP, for local processing by the data storage controller 120. For instance, a remote system may remotely access the data storage controller 120 (via the I/O ports of the DSP or the bus 116) to utilize the data compression, in which case the data storage controller 120 would transmit the compressed data back to the system that requested compression.

In accordance with the present invention, the system (e.g., data storage controller 120) preferably boots-up in a mode using asymmetrical data compression. It is to be understood that the boot process would not be affected whether the system boots up defaulting to an asymmetrical mode or to a symmetrical mode. This is because during the boot process of the computer, it is reading the operating system from the disk, not writing. However, once data is written to the disk using a compression algorithm, it must retrieve and read the data using the corresponding decompression algorithm.

As the user creates, deletes and edits files, the data storage controller 120 will preferably utilize an asymmetrical compression routine that provides slow compression and fast decompression. Since using the asymmetrical compression algorithm will provide slower compression than a symmetrical algorithm, the file system of the computer will track whether the data storage controller 120 has disk accesses pending. If the data storage controller 120 does have disk accesses pending and the system is starting to slow down, the file management system will command the data storage controller 120 to use a faster symmetrical compression algorithm. If there are no disk access requests pending, the file management system will leave the disk controller in the mode of using the asymmetrical compression algorithm.

If the data storage controller 120 was switched to using a symmetrical algorithm, the file management system will preferably signal the controller to switch back to a default asymmetrical algorithm when, e.g., the rate of the disk access requests slow to the point where there are no pending disk accesses.

At some point a user may decide to install software or load files onto the hard disk. Before installing the software, for example, as described above, the user could indicate to the data storage controller 120 (via a software utility) to enter and remain in an asymmetric mode using an asymmetric compression algorithm with a slow compression routine and a very fast decompression routine. The disk controller would continue to use the asymmetrical algorithm until commanded otherwise, regardless of the number of pending disk accesses. Then, after completing the software installation, the user would then release the disk controller from this "asymmetrical only" mode of operation (via the software utility).

Again, when the user is not commanding the data storage controller 120 to remain in a certain mode, the file management system will determine whether the disk controller should use the asymmetrical compression algorithms or the symmetrical compression algorithms based on the amount of backlogged disk activity. If the backlogged disk activity exceeds a threshold, then the file management system will preferably command the disk controller to use a faster compression algorithm, even though compression performance may suffer. Otherwise, the file management system will command the disk controller to use the asymmetrical algorithm that will yield greater compression performance.

It is to be appreciated that the data compression methods described herein by be integrated or otherwise implemented with the content independent data compression methods described in the above-incorporated U.S. Pat. Nos. 6,195,024 and 6,309,424.

Figures 4A, 4B:
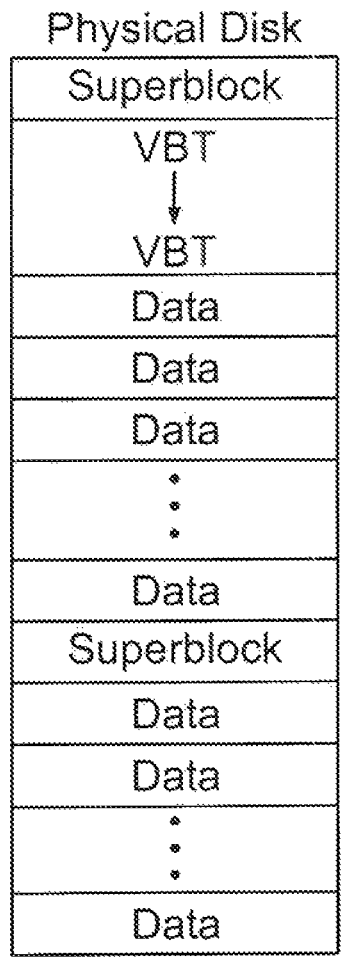
FIG. 4A is a diagram of a file system format of a virtual and/or physical disk according to an embodiment of the present invention.
FIG. 4B is a diagram of a data structure of a sector map entry of a virtual block table according to an embodiment of the present invention.

FIG. 4A is a diagram of a file system format of a virtual and/or physical disk according to an embodiment of the present invention.

In yet another embodiment of the present invention, a virtual file management system is utilized to store, retrieve, or transmit compressed and/or accelerated data. In one embodiment of the present invention, a physical or virtual disk is utilized employing a representative file system format as illustrated in FIG. 4A. As shown in FIG. 4A, a virtual file system format comprises one or more data items. For instance, a "Superblock" denotes a grouping of configuration information necessary for the operation of the disk management system. The Superblock typically resides in the first sector of the disk. Additional copies of the Superblock are preferably maintained on the disk for backup purposes. The number of copies will depend on the size of the disk. One sector is preferably allocated for each copy of the Superblock on the disk, which allows storage to add additional parameters for various applications. The Superblock preferably comprises information such as (i) compress size; (ii) virtual block table address; (iii) virtual block table size; (iv) allocation size; (v) number of free sectors (approximate); (vi) ID ("Magic") number; and (vii) checksum.

The "compress size" refers to the maximum uncompressed size of data that is grouped together for compression (referred to as a "data chunk"). For example, if the compress size is set to 16 k and a 40 k data block is sent to the disk controller for storage, it would be divided into two 16 k chunks and one 8 k chunk. Each chunk would be compressed separately and possess its own header. As noted above, for many compression algorithms, increasing the compression size will increase the compression ratio obtained. However, even when a single byte is needed from a compressed data chunk, the entire chunk must be decompressed, which is a tradeoff with respect to using a very large compression size.

The "virtual block table address" denotes the physical address of the virtual block table. The "virtual block table size" denotes the size of the virtual block table.

The "allocation size" refers to the minimum number of contiguous sectors on the disk to reserve for each new data entry. For example, assuming that 4 sectors are allowed for each allocation and that a compressed data entry requires only 1 sector, then the remaining 3 sectors would be left unused. Then, if that piece of data were to be appended, there would be room to increase the data while remaining contiguous on the disk. Indeed, by maintaining the data contiguously, the speed at which the disk can read and write the data will increase. Although the controller preferably attempts to keep these unused sectors available for expansion of the data, if the disk were to fill up, the controller could use such sectors to store new data entries. In this way, a system can be configured to achieve greater speed, while not sacrificing disk space. Setting the allocation size to 1 sector would effectively disable this feature.

The "number Of free sectors" denotes the number of physical free sectors remaining on the disk. The ID ("Magic) number" identifies this data as a Superblock. The "checksum" comprises a number that changes based on the data in the Superblock and is used for error checking. Preferably, this number is chosen so that all of the words in the Superblock (including the checksum) added up are equal to zero.

FIG. 4B is a diagram of a data structure of a sector map entry of a virtual block table according to an embodiment of the present invention.

The "virtual block table" (VET) comprises a number of "sector map" entries, one for each grouping of compressed data (or chunks). The VET may reside anywhere on the disk. The size of the VBT will depend on how much data is on the disk. Each sector map entry comprises 8 bytes. Although there is preferably only one VBT on the disk, each chunk of compressed data will have a copy of its sector map entry in its header. If the VBT were to become corrupted, scanning the disk for all sector maps could create a new one.

The term "type" refers to the sector map type. For example, a value of "00" corresponds to this sector map definition. Other values are preferably reserved for future redefinitions of the sector map.

A "C Type" denotes a compression type. A value of "000" will correspond to no compression. Other values are defined as required depending on the application. This function supports the use of multiple compression algorithms along with the use of various forms of asymmetric data compression.

The "C Info" comprises the compression information needed for the given compression type. These values are defined depending on the application. In addition, the data may be tagged based on its use—for example operating system "00", Program "01", or data "10". Frequency of use or access codes may also be included. The size of this field may be greatly expanded to encode statistics supporting these items including, for example, cumulative number of times accessed, number of times accessed within a given time period or CPU clock cycles, and other related data.

The "sector count" comprises the number of physical sectors on the disk that are used for this chunk of compressed data. The "LBA" refers to the logical block address, or physical disk address, for this chunk of compressed data.

Referring back to FIG. 4A, each "Data" block represent each data chunk comprising a header and compressed data. The data chunk may up anywhere from 1 to 256 sectors on the disk. Each compressed chunk of data is preferably preceded on the disk by a data block header that preferably comprises the following information: (i) sector map; (ii) VBI; (iii) ID ("Magic") Number; and (iv) checksum.

The "sector map" comprises a copy of the sector map entry in the VBT for this data chunk. The "VBI" is the Virtual Block Index, which is the index into the VBT that corresponds to this data chunk. The "ID ("Magic") Number" identifies this data as a data block header. The "checksum" number will change based on the data in the header and is used for error checking. This number is preferably chosen such that the addition of all the words in the header (including the checksum) will equal zero.

It should be noted that the present invention is not limited to checksums but may employ any manner of error detection and correction techniques, utilizing greatly expanded fields error detection and/or correction.

It should be further noted that additional fields may be employed to support encryption, specifically an identifier for encrypted or unencrypted data along with any parameters necessary for routing or processing the data to an appropriate decryption module or user.

The virtual size of the disk will depend on the physical size of the disk, the compress size selected, and the expected compression ratio. For example, assume there is a 75 GB disk with a selected compress size expecting a 3:1 compression ratio, the virtual disk size would be 225 GB. This will be the maximum amount of uncompressed data that the file system will be able to store on the disk.

If the number chosen is too small, then the entire disk will not be utilized. Consider the above example where a system comprises a 75 GB disk and a 225 GB virtual size. Assume that in actuality during operation the average compression ratio obtained is 5:1. Whereas this could theoretically allow 375 GB to be stored on the 75 GB disk, in practice, only 225 GB would be able to be stored on the disk before a "disk full" message is received. Indeed, with a 5:1 compression ratio, the 225 GB of data would only take up 45 GB on the disk leaving 30 GB unused. Since the operating system would think the disk is full, it would not attempt to write any more information to the disk.

On the other hand, if the number chosen is too large, then the disk will fill up when the operating system would still indicate that there was space available on the disk. Again consider the above example where a system comprises a 75 GB disk and a 225 GB virtual size. Assume further that during operation, the average compression ratio actually obtained is only 2:1. In this case, the physical disk would be full after writing 150 GB to it, but the operating system would still think there is 75 GB remaining. If the operating system tried to write more information to the disk, an error would occur.

Thus, in another embodiment of the present invention, the virtual size of the disk is dynamically altered based upon the achieved compression ratio. In one embodiment, a running average may be utilized to reallocate the virtual disk size. Alternatively, certain portions of the ratios may already be known—such as a preinstalled operating system and programs. Thus, this ratio is utilized for that portion of the disk, and predictive techniques are utilized for the balance of the disk or disks.

Yet in another embodiment, users are prompted for setup information and the computer selects the appropriate virtual disk(s) size or selects the best method of estimation based on, e.g., a high level menu of what is the purpose of this computer: home, home office, business, server. Another submenu may ask for the expected data mix, word, excel, video, music, etc. Then, based upon expected usage and associated compression ratios (or the use of already compressed data in the event of certain forms of music and video) the results are utilized to set the virtual disk size.

It should be noted that the present invention is independent of the number or types of physical or virtual disks, and indeed may be utilized with any type of storage.

It is to be understood that the systems and methods described herein may be implemented in various forms of hardware, software, firmware, special purpose processors, or a combination thereof. In particular, the present invention may be implemented as an application comprising program instructions that are tangibly embodied on a program storage device (e.g., magnetic floppy disk, RAM, ROM, CD ROM, etc.) and executable by any device or machine comprising suitable architecture. It is to be further understood that, because some of the constituent system components and process steps depicted in the accompanying Figures are preferably implemented in software, the actual connections between such components and steps may differ depending upon the manner in which the present invention is programmed. Given the teachings herein, one of ordinary skill in the related art will be able to contemplate these and similar implementations or configurations of the present invention.

Although illustrative embodiments have been described herein with reference to the accompanying drawings, it is to be understood that the present system and method is not limited to those precise embodiments, and that various other changes and modifications may be affected therein by one skilled in the art without departing from the scope or spirit of the invention. All such changes and modifications are intended to be included within the scope of the invention as defined by the appended claims.

What is claimed is:
1. A system, comprising:
one or more different asymmetric data decompression algorithms, wherein each algorithm of the one or more different asymmetric data decompression algorithms utilizes one or more asymmetric data decompression routines of a plurality of different asymmetric data decompression routines, wherein a first asymmetric data decompression routine of the plurality of different asymmetric data decompression routines is configured to produce decompressed data with a higher data rate for a given data throughput than a second asymmetric data decompression routine of the plurality of different asymmetric data decompression routines; and a processor configured:
- to analyze one or more data parameters from one or more data blocks containing video data, wherein at least one data parameter relates to an expected or anticipated throughput of a communications channel; and
- to select two or more different data decompression routines from among a plurality of different data decompression routines based upon, at least in part, the one or more data parameters relating to the expected or anticipated throughput of the communications channel.

2. The system of claim 1, wherein the expected or anticipated throughput of the communications channel is known apriori.

3. The system of claim 1, wherein at least one of the one or more different asymmetric data decompression routines utilizes a lossless data decompression algorithm.

4. The system of claim 1, wherein at least one of the selected two or more different data decompression routines comprises:
a standardized data decompression algorithm capable of decompressing the video data.

5. The system of claim 1, wherein at least one of the one or more data parameters comprises a resolution of the one or more data blocks containing video data.

6. The system of claim 1, wherein at least one of the one or more data parameters comprises an attribute or a value related to a format or a syntax of video data contained in the one or more data blocks containing video data.

7. The system of claim 1, wherein the selected two or more different data decompression routines utilize a content-dependent data decompression routine.

8. The system of claim 7, wherein the content-dependent data decompression routine utilizes an arithmetic algorithm.

9. The system of claim 1, wherein the selected two or more different data decompression routines are configured to perform decompression in real-time or substantially real-time.

10. The system of claim 1, wherein the communications channel comprises a distributed network.

11. The system of claim 10, wherein the distributed network comprises the Internet.

12. The system of claim 1, wherein the selected two or more different data decompression routines are utilized to decompress the one or more data blocks containing video data to create one or more decompressed data blocks, and
wherein a descriptor is associated with the one or more decompressed data blocks that indicates the selected two or more different data decompression routines.

13. The system of claim 1, wherein the selected two or more different data decompression routines are utilized to decompress the one or more data blocks containing video data to create one or more decompressed data blocks, and
wherein a descriptor indicating the selected two or more different data decompression routines is included with the one or more decompressed data blocks.

14. The system of claim 1, wherein at least one of the one or more data parameters comprises a video data profile.

* * * * *